(12) United States Patent
Hosek

(10) Patent No.: US 11,996,316 B2
(45) Date of Patent: *May 28, 2024

(54) ROBOT HAVING ARM WITH PARALLEL PATHS

(71) Applicant: Persimmon Technologies Corporation, Wakefield, MA (US)

(72) Inventor: Martin Hosek, Salem, NH (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/141,673

(22) Filed: May 1, 2023

(65) Prior Publication Data

US 2023/0335429 A1    Oct. 19, 2023

Related U.S. Application Data

(60) Division of application No. 17/155,185, filed on Jan. 22, 2021, now Pat. No. 11,640,919, which is a
(Continued)

(51) Int. Cl.
*B25J 9/04* (2006.01)
*B25J 18/04* (2006.01)
(Continued)

(52) U.S. Cl.
CPC ........ *H01L 21/68735* (2013.01); *B25J 9/042* (2013.01); *B25J 9/043* (2013.01);
(Continued)

(58) Field of Classification Search
CPC ....................................................... B25J 9/043
See application file for complete search history.

(56) References Cited

U.S. PATENT DOCUMENTS 4,865,577 A   9/1989   Freudenstein ................ 474/141
4,895,554 A   1/1990   Isamu .......................... 474/141
(Continued)

FOREIGN PATENT DOCUMENTS

CN       1765004 A     4/2004
CN     101908497 A    12/2010
(Continued)

*Primary Examiner* — Gerald McClain
(74) *Attorney, Agent, or Firm* — Harrington & Smith

(57) ABSTRACT

An apparatus including at least one drive; a first robot arm having a first upper arm, a first forearm and a first end effector. The first upper arm is connected to the at least one drive at a first axis of rotation. A second robot arm has a second upper arm, a second forearm and a second end effector. The second upper arm is connected to the at least one drive at a second axis of rotation which is spaced from the first axis of rotation. The first and second robot arms are configured to locate the end effectors in first retracted positions for stacking substrates located on the end effectors at least partially one above the another. The first and second robot arms are configured to extend the end effectors from the first retracted positions in a first direction along parallel first paths located at least partially directly one above the other. The first and second robot arms are configured to extend the end effectors in at least one second direction along second paths spaced from one another which are not located above one another. The first upper arm and the first forearm have different effective lengths. The second upper arm and the second forearm have different effective lengths.

41 Claims, 78 Drawing Sheets

Related U.S. Application Data division of application No. 15/846,401, filed on Dec. 19, 2017, now Pat. No. 10,950,484, which is a division of application No. 15/017,970, filed on Feb. 8, 2016, now Pat. No. 10,224,232, which is a continuation-in-part of application No. 14/827,506, filed on Aug. 17, 2015, now Pat. No. 9,840,004, which is a continuation of application No. 13/833,732, filed on Mar. 15, 2013, now Pat. No. 9,149,936.

(60) Provisional application No. 62/112,820, filed on Feb. 6, 2015, provisional application No. 61/762,063, filed on Feb. 7, 2013, provisional application No. 61/754,125, filed on Jan. 18, 2013.

(51) Int. Cl.
  H01L 21/677 (2006.01)
  H01L 21/687 (2006.01)

(52) U.S. Cl.
  CPC ........ B25J 18/04 (2013.01); H01L 21/67742 (2013.01); *Y10S 901/14* (2013.01); *Y10S 901/27* (2013.01)

(56) References Cited

U.S. PATENT DOCUMENTS

| | | | |
|---|---|---|---|
| 4,917,556 A | 4/1990 | Stark et al. | 414/217 |
| 5,083,896 A | 1/1992 | Uehara et al. | |
| 5,374,147 A | 12/1994 | Hiroki et al. | |
| 5,382,803 A | 1/1995 | Asakawa | |
| 5,584,647 A | 12/1996 | Uehara et al. | |
| 5,950,495 A | 9/1999 | Ogawa | |
| 6,109,860 A | 8/2000 | Ogawa et al. | |
| 6,126,381 A | 10/2000 | Bacchi et al. | |
| 6,155,768 A | 12/2000 | Bacchi et al. | |
| 6,315,512 B1 | 11/2001 | Tabrizi et al. | 414/217 |
| 6,360,144 B1 | 3/2002 | Bacchi et al. | |
| 6,533,530 B1 | 3/2003 | Zenpo | |
| 6,547,510 B1 | 4/2003 | Beaulieu | |
| 6,601,468 B2 | 8/2003 | Grover et al. | 74/490.03 |
| 6,663,333 B2 | 12/2003 | Kinnard et al. | 414/217 |
| 6,748,293 B1 | 6/2004 | Larsen | |
| 6,837,883 B2 | 1/2005 | Moll et al. | 606/1 |
| 7,114,907 B2 | 10/2006 | Ogawa et al. | |
| 7,306,423 B2 | 12/2007 | Ogawa et al. | |
| 7,837,425 B2 | 11/2010 | Saeki et al. | 414/744.5 |
| 7,988,399 B2 | 8/2011 | van Der Meulen | 414/217 |
| 8,322,963 B2 | 12/2012 | Hudgens et al. | 414/226.01 |
| 8,562,271 B2 | 10/2013 | Hofmeister | 414/939 |
| 8,784,033 B2 | 7/2014 | Kremerman | |
| 8,882,430 B2 | 11/2014 | Yazawa | |
| 9,117,865 B2 | 8/2015 | Hudgens | |
| 9,190,306 B2 | 11/2015 | Blank | |
| 9,248,568 B2 | 2/2016 | Caveney | |
| 9,457,464 B2 | 10/2016 | Kremerman | |
| 9,761,478 B2 | 9/2017 | Caveney | |
| 10,204,817 B2 | 2/2019 | Caveney | |
| 10,224,232 B2 | 3/2019 | Hosek | |
| 10,500,719 B2 | 12/2019 | Muthukamatchi | |
| 2002/0020355 A1 | 2/2002 | Saeki | |
| 2003/0012624 A1 | 1/2003 | Kinnard et al. | 414/217 |
| 2007/0020082 A1 | 1/2007 | Caveney et al. | 414/744.5 |
| 2009/0003976 A1 | 1/2009 | Hofmeister et al. | 414/217 |
| 2009/0053016 A1 | 2/2009 | van der Meulen | 414/217 |
| 2009/0263215 A1 | 10/2009 | Hudgens et al. | |
| 2010/0178147 A1* | 7/2010 | Kremerman | B25J 9/043 414/800 |
| 2012/0045308 A1* | 2/2012 | Kremerman | B25J 9/126 414/744.5 |
| 2012/0141235 A1 | 6/2012 | Krupyshev | |
| 2012/0232690 A1 | 9/2012 | Gilchrist et al. | 700/228 |
| 2013/0071218 A1 | 3/2013 | Hosek et al. | |
| 2013/0121798 A1 | 5/2013 | Hosek | |
| 2013/0156534 A1 | 6/2013 | Furukawa | |
| 2014/0113364 A1 | 4/2014 | Kim et al. | |
| 2014/0150592 A1 | 6/2014 | Kremerman | |
| 2014/0205416 A1 | 7/2014 | Hosek et al. | |
| 2014/0286741 A1 | 9/2014 | Kremerman et al. | |
| 2014/0365011 A1 | 12/2014 | Hosek et al. | 700/259 |
| 2015/0013910 A1 | 1/2015 | Krupyshev et al. | |
| 2015/0071737 A1 | 3/2015 | Hofmeister et al. | 901/27 |

FOREIGN PATENT DOCUMENTS

| | | |
|---|---|---|
| CN | 102326244 A | 1/2012 |
| CN | 102416625 A | 4/2012 |
| CN | 103862463 A | 6/2014 |
| JP | 64-56983 U | 10/1989 |
| JP | H06-338554 A | 12/1994 |
| JP | H-09285982 A | 11/1997 |
| JP | 10217167 A | 8/1998 |
| JP | H-11186364 A | 7/1999 |
| JP | H-11354480 A | 12/1999 |
| JP | 2000072248 A * | 3/2000 |
| JP | 2000-100894 A | 4/2000 |
| JP | H-2001157974 A | 6/2001 |
| JP | 2001-217296 A | 8/2001 |
| JP | 2004288718 A | 10/2004 |
| JP | 2004288719 A | 10/2004 |
| JP | 2005161416 A | 6/2005 |
| JP | 2005229087 A | 8/2005 |
| JP | 2007511104 A | 4/2007 |
| JP | 2010-040947 A | 2/2010 |
| JP | 2010527149 A | 8/2010 |
| KR | 20-0422315 | 7/2006 |
| KR | 10-0753290 | 8/2007 |
| TW | 20144440114 A | 11/2014 |
| WO | WO-99/56920 A1 | 11/1999 |
| WO | WO-00/18547 A1 | 4/2000 |
| WO | WO-02/34477 A1 | 5/2002 |
| WO | WO-2008144664 A1 | 11/2008 |
| WO | WO-2012/129254 A2 | 9/2012 |
| WO | WO-2014/113364 A1 | 7/2014 |

* cited by examiner

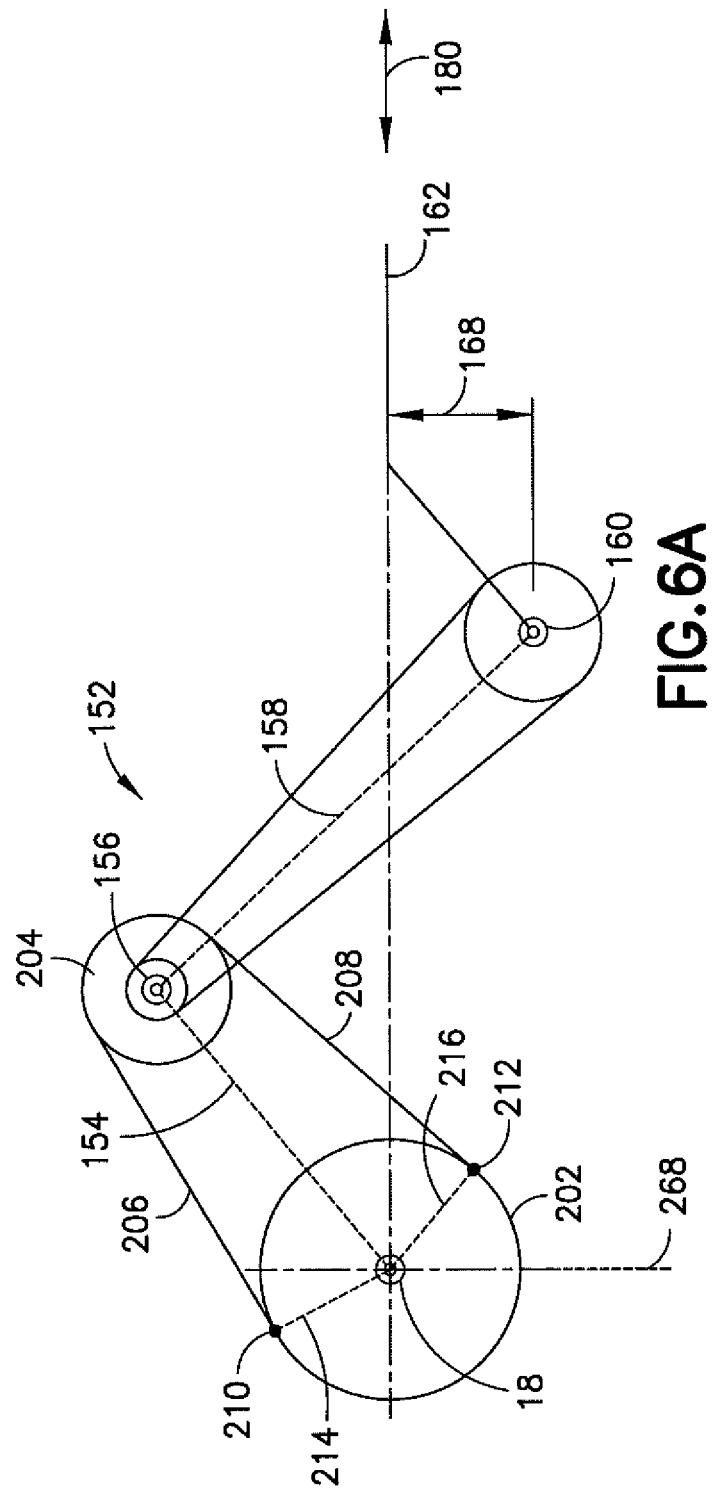

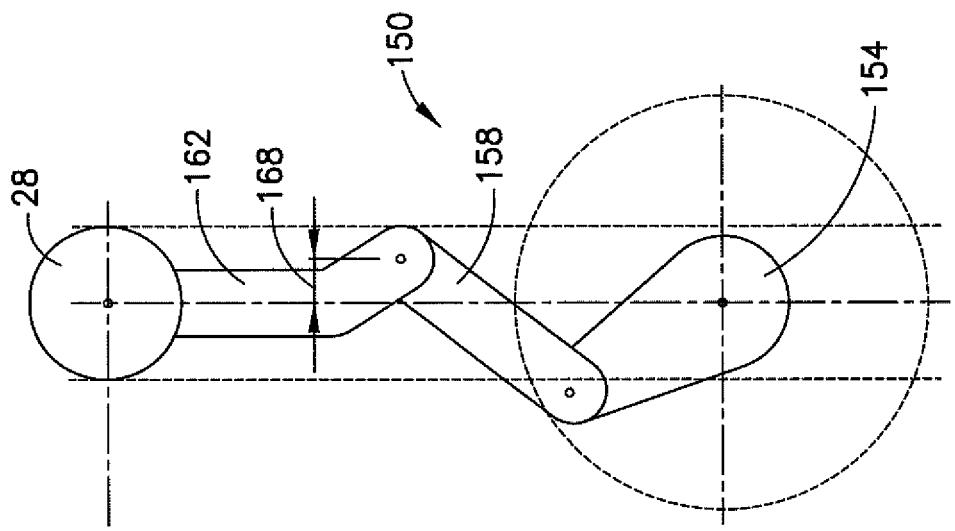
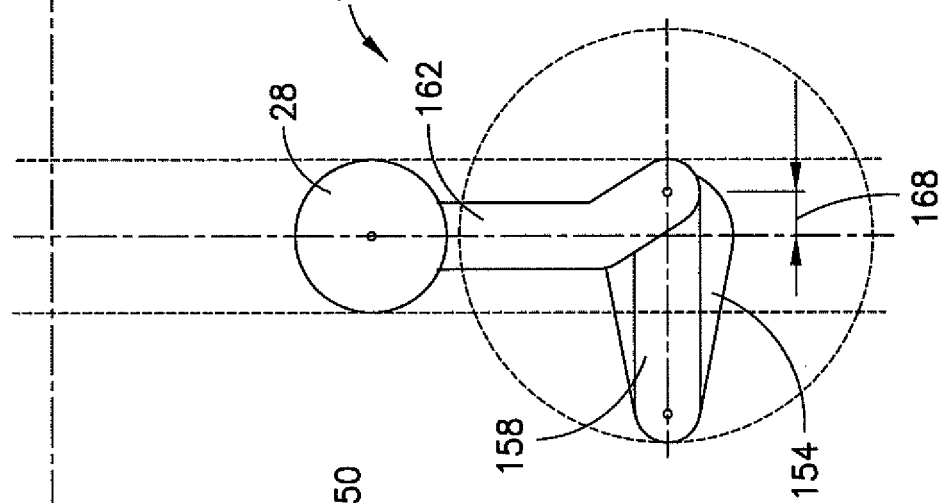
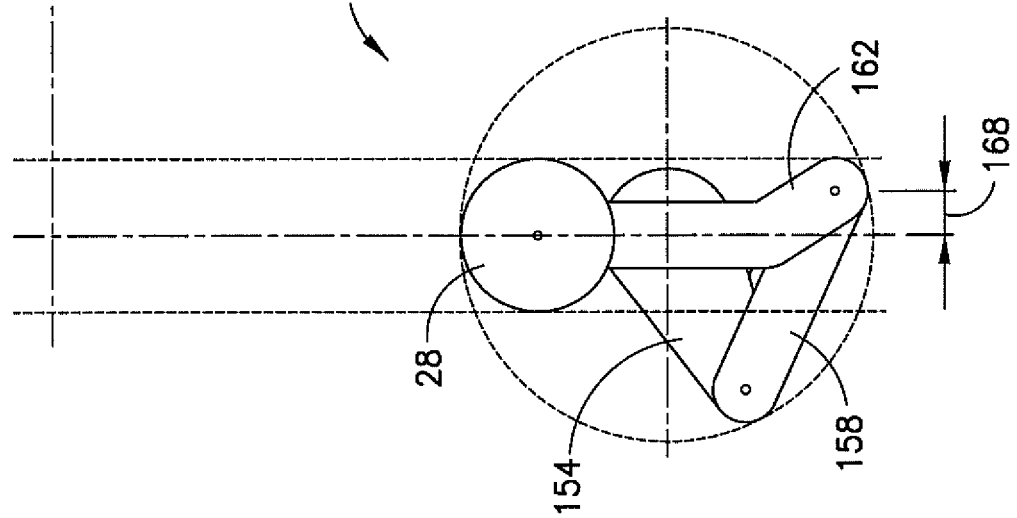

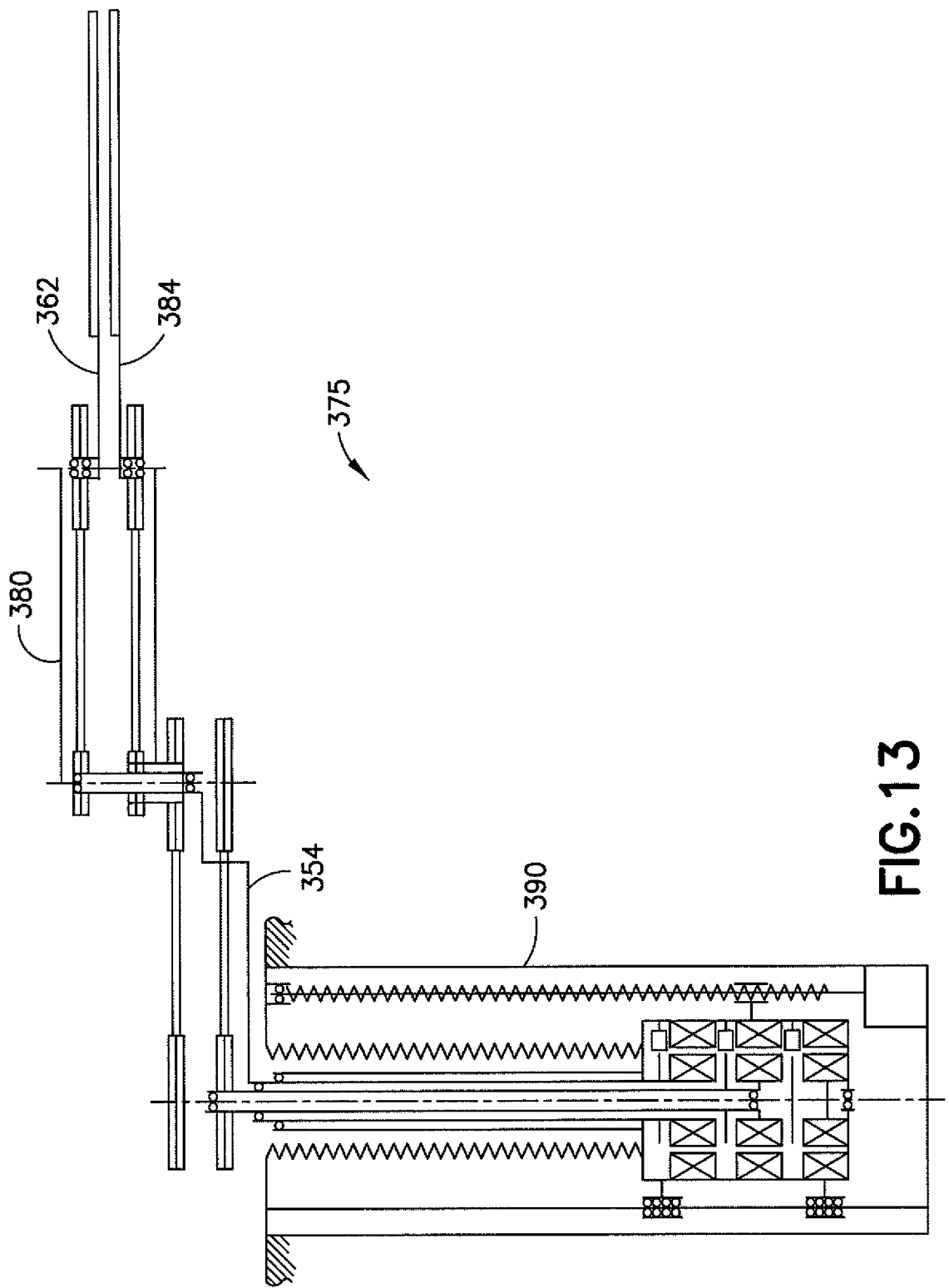

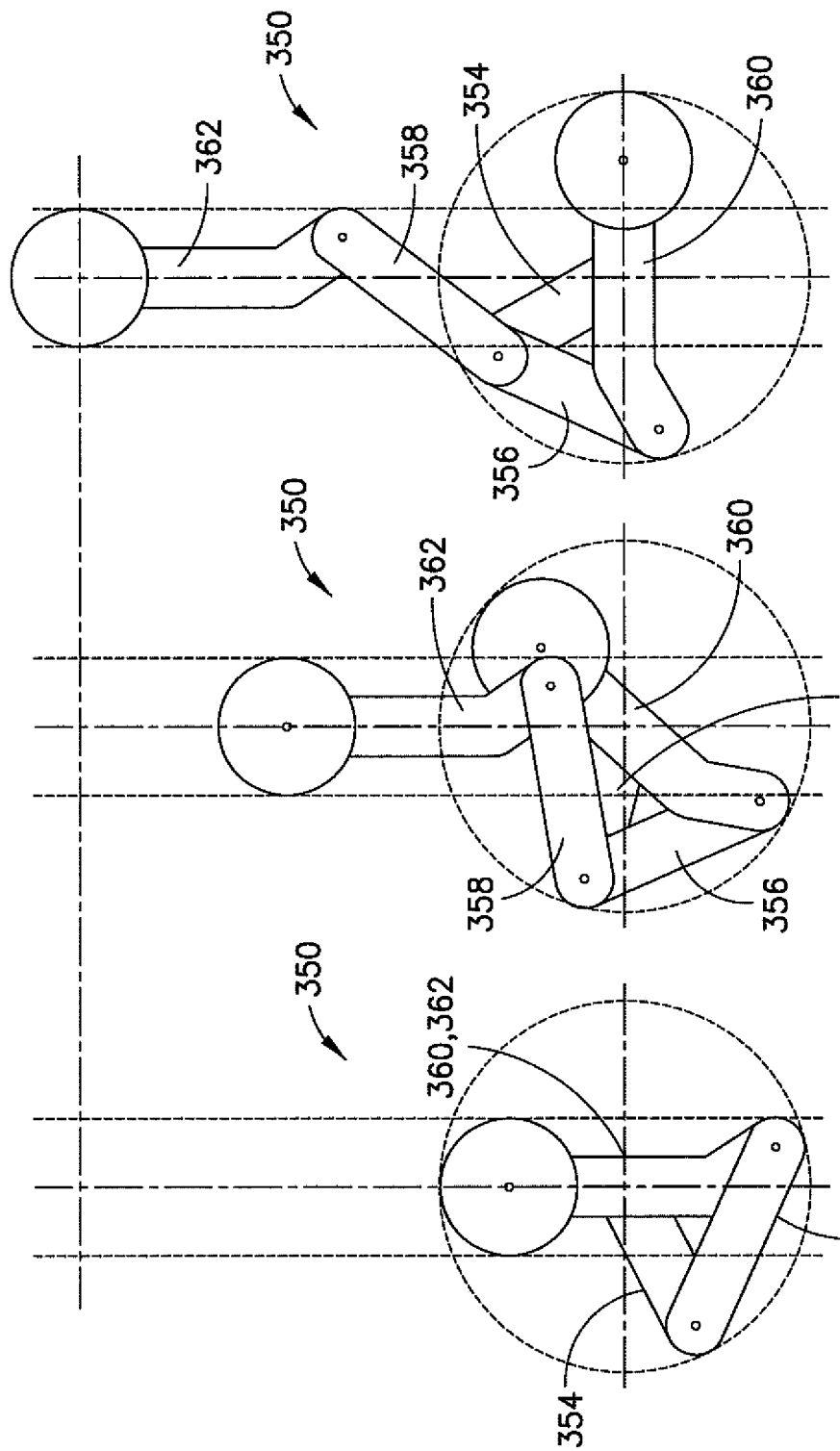

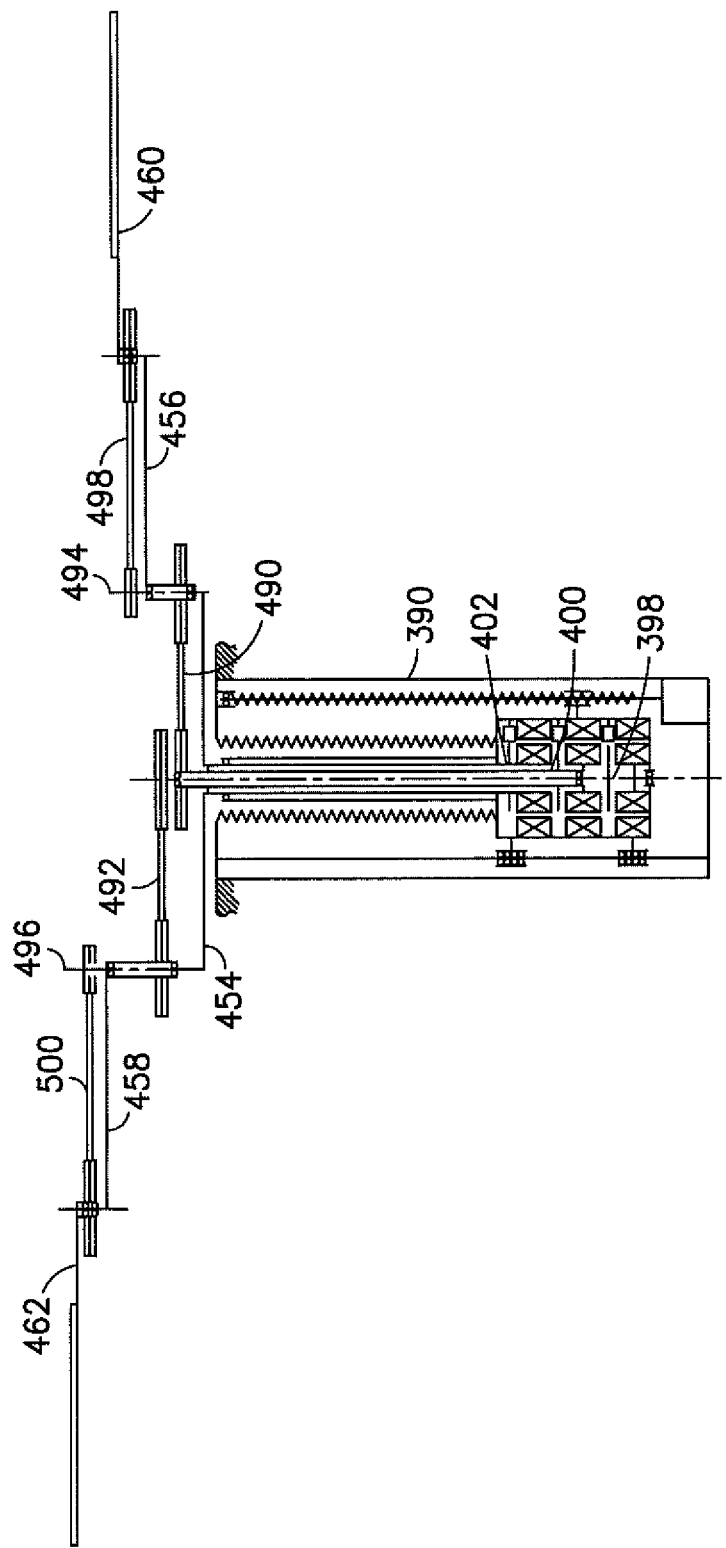

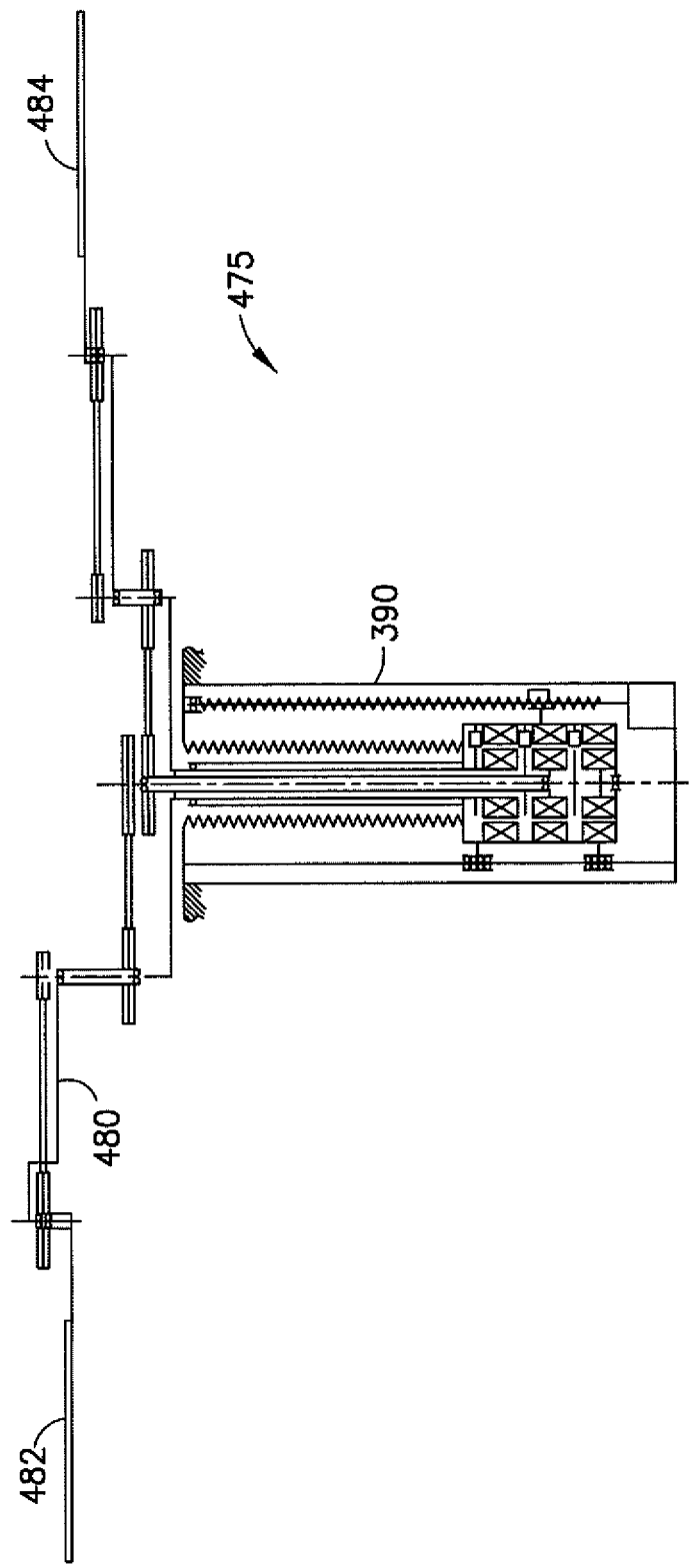

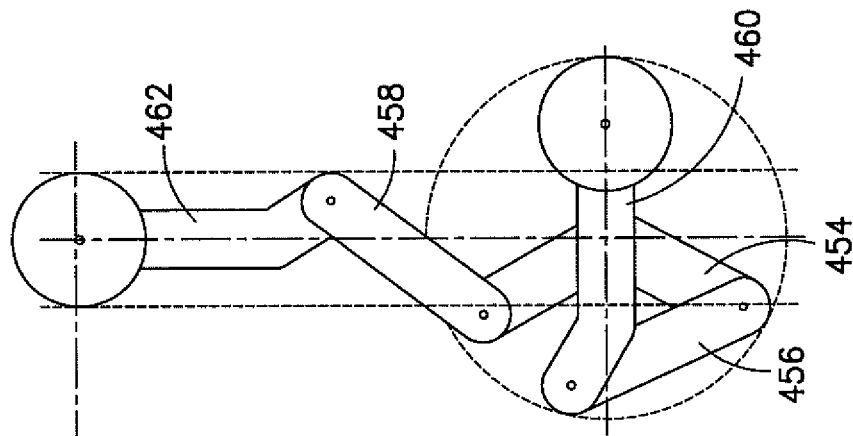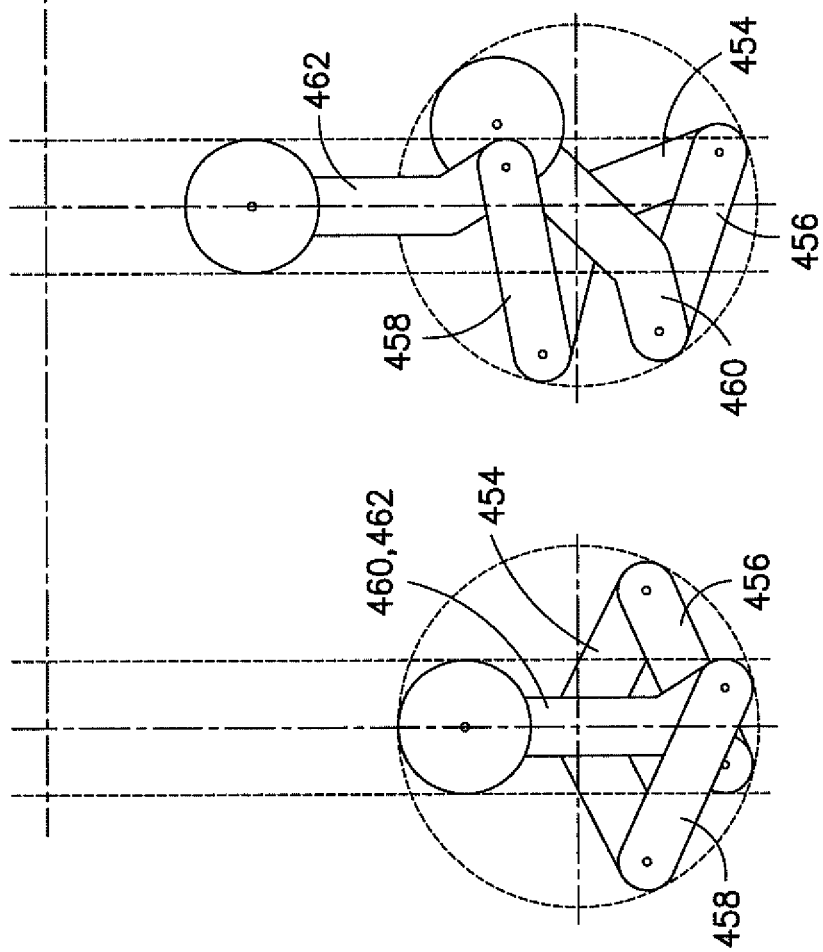

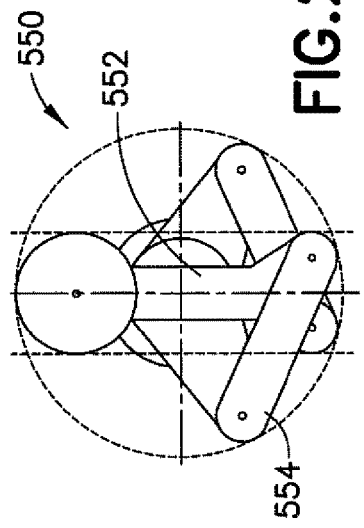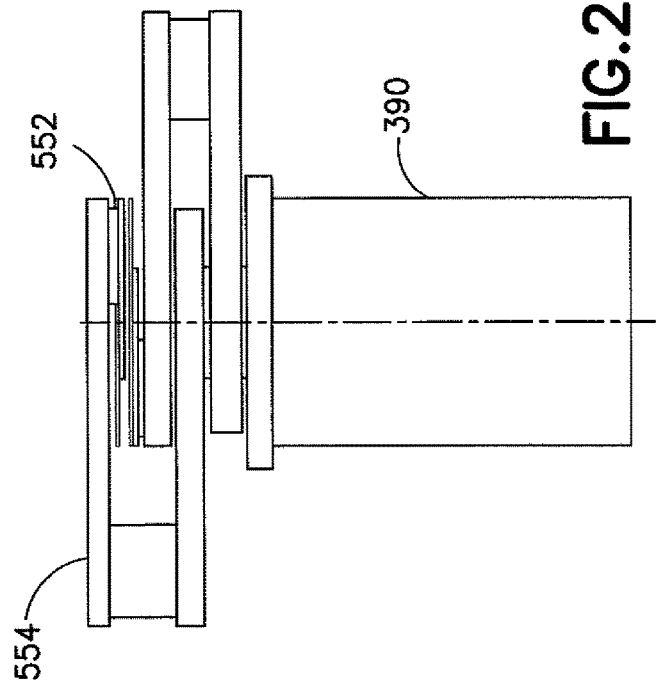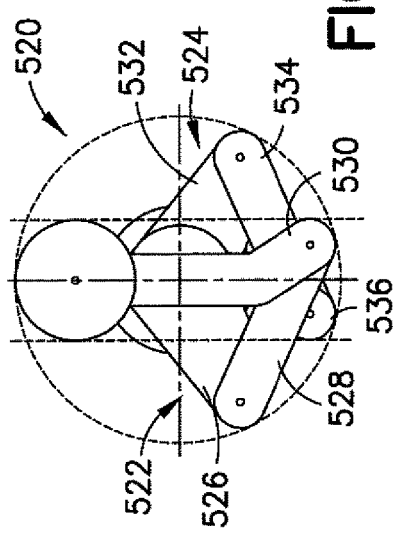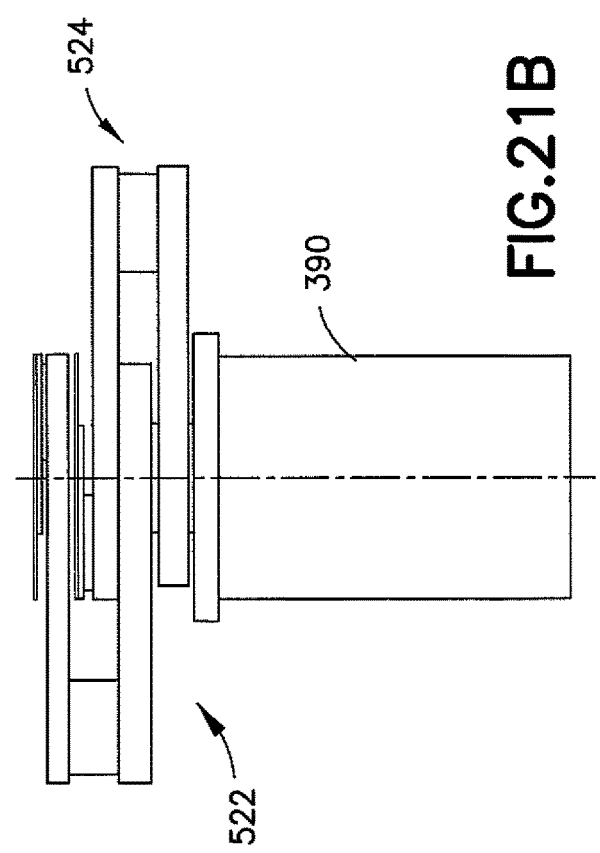

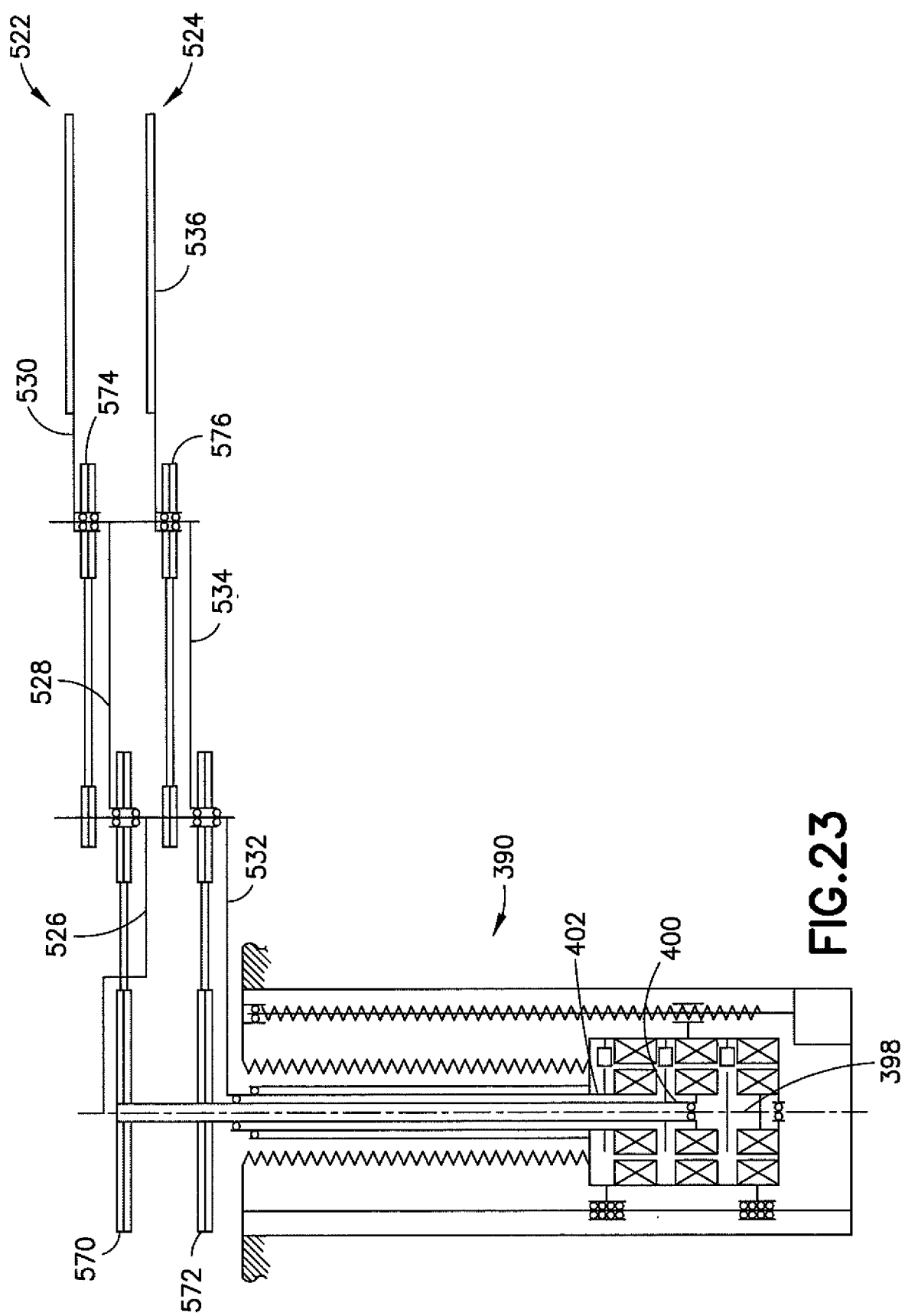

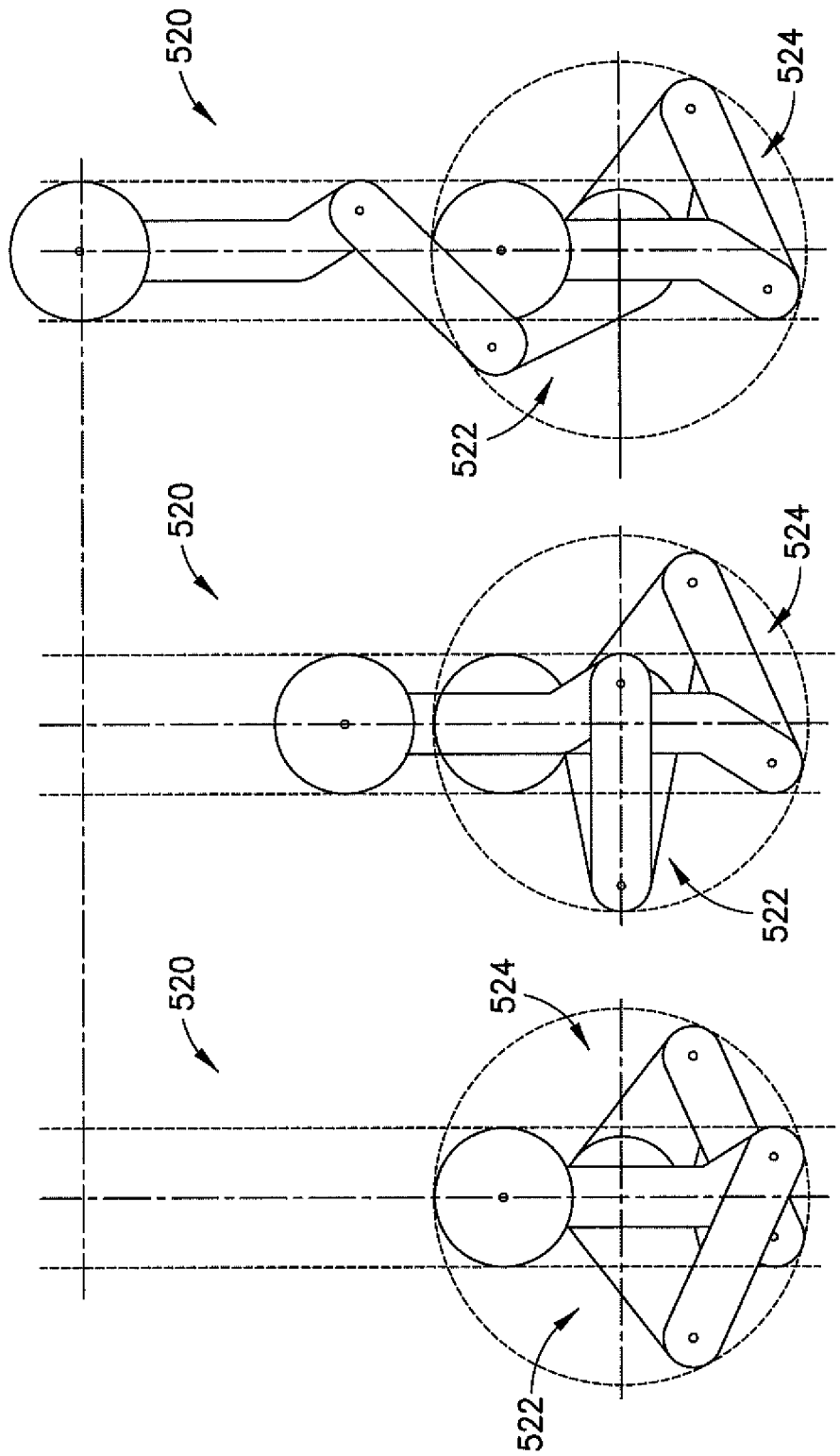

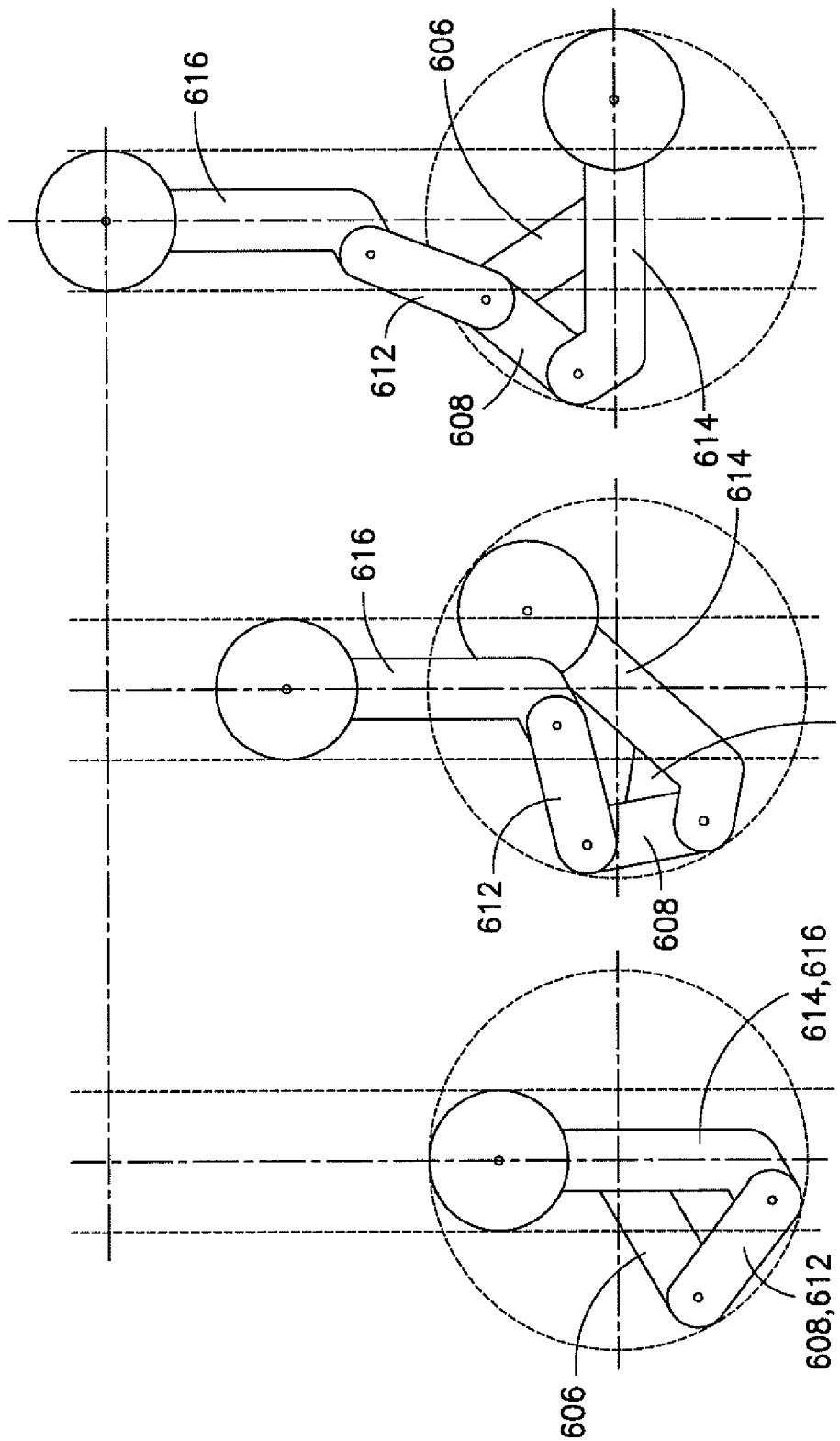

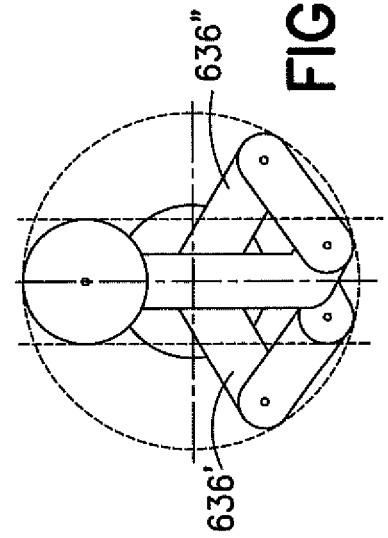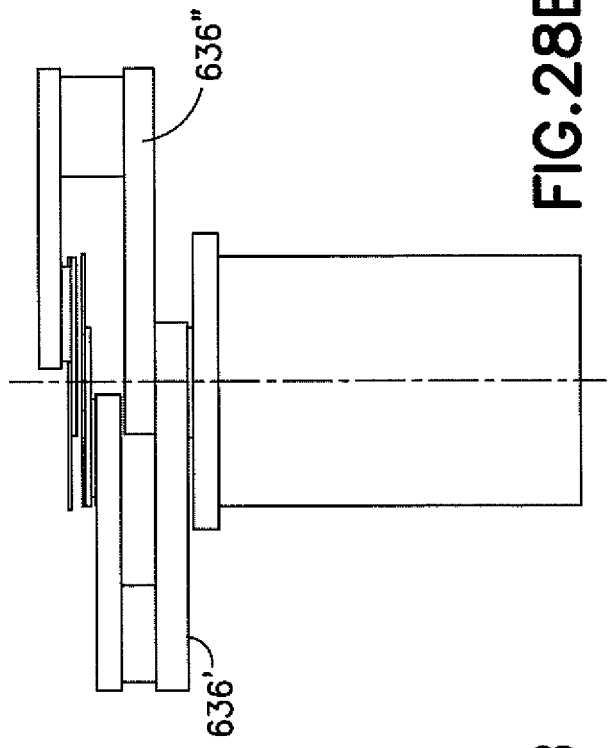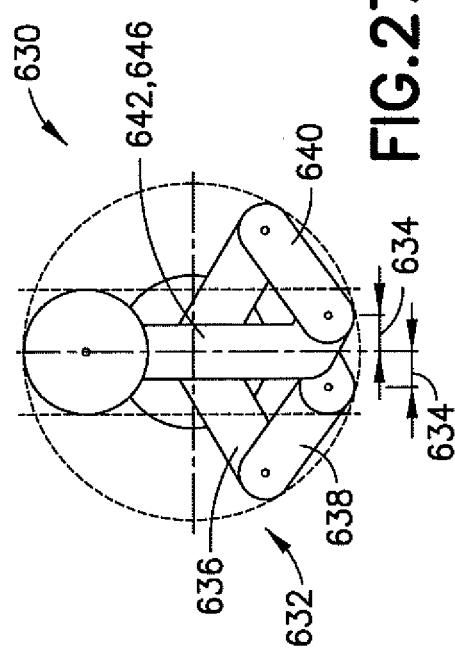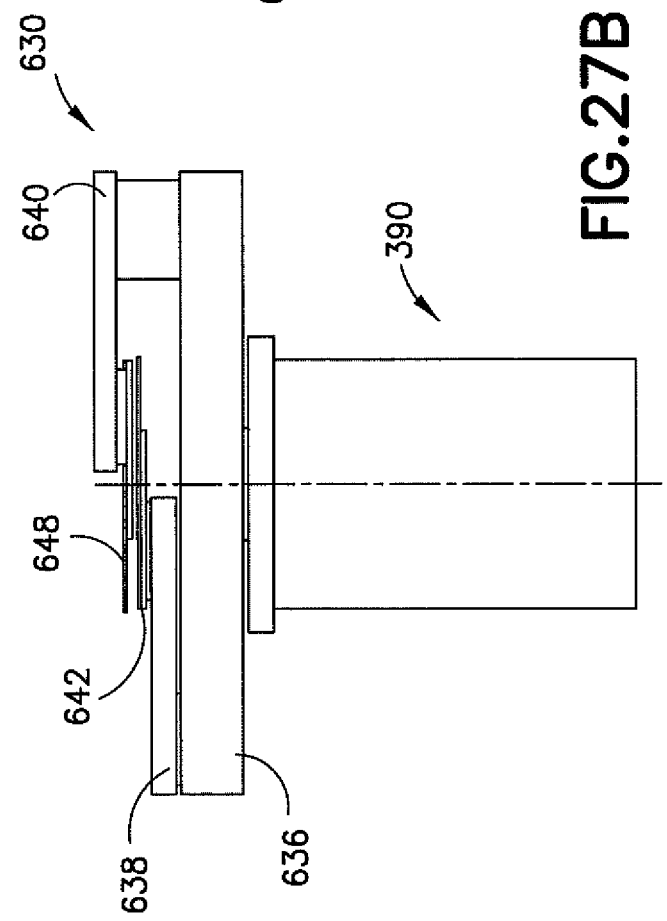

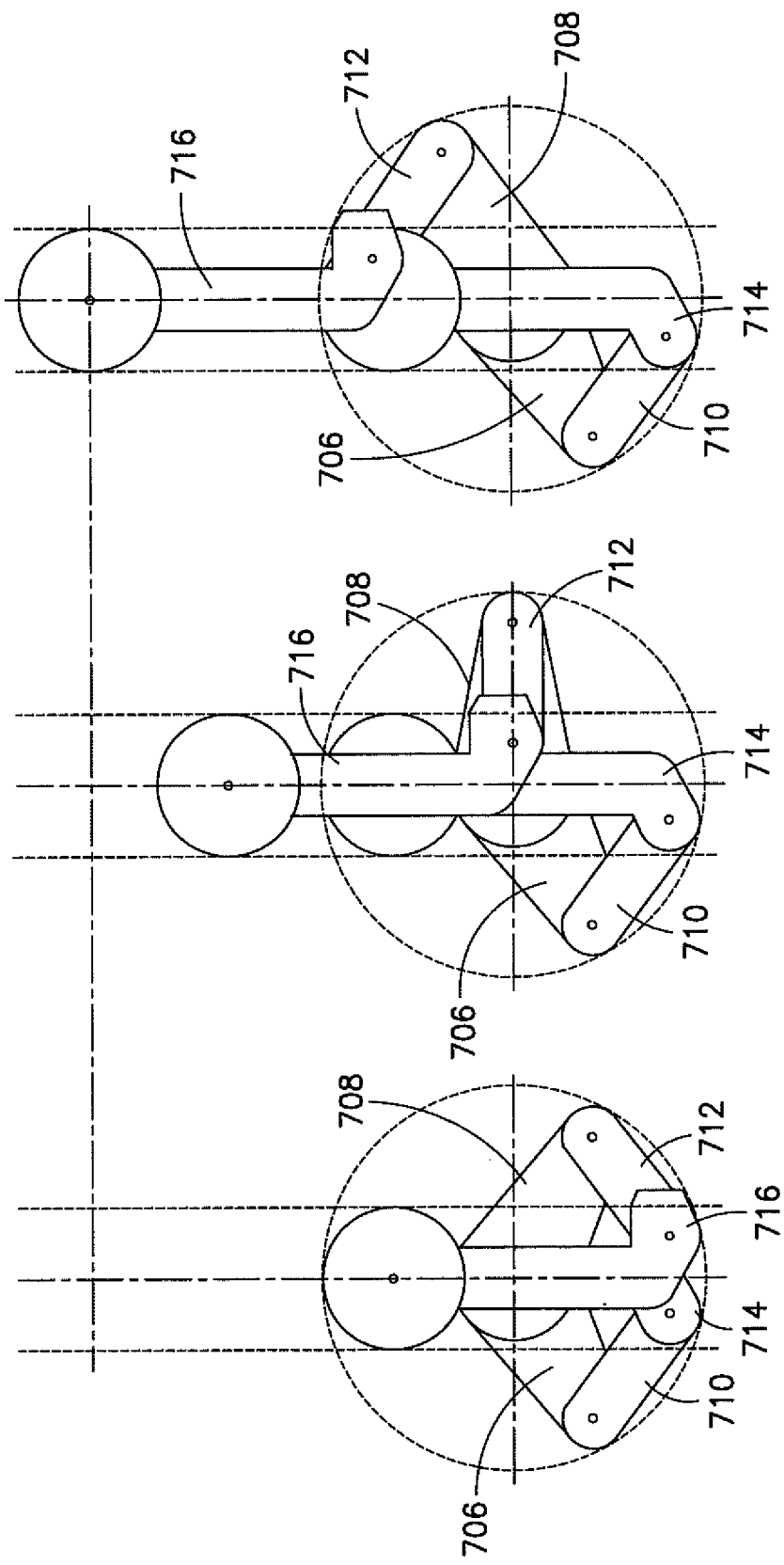

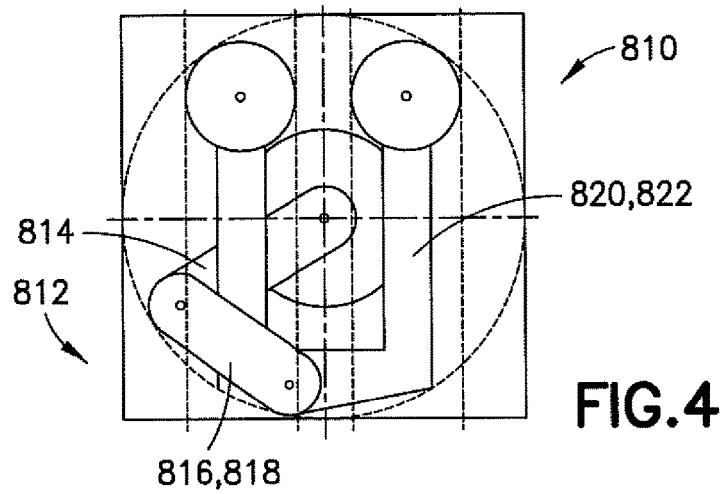
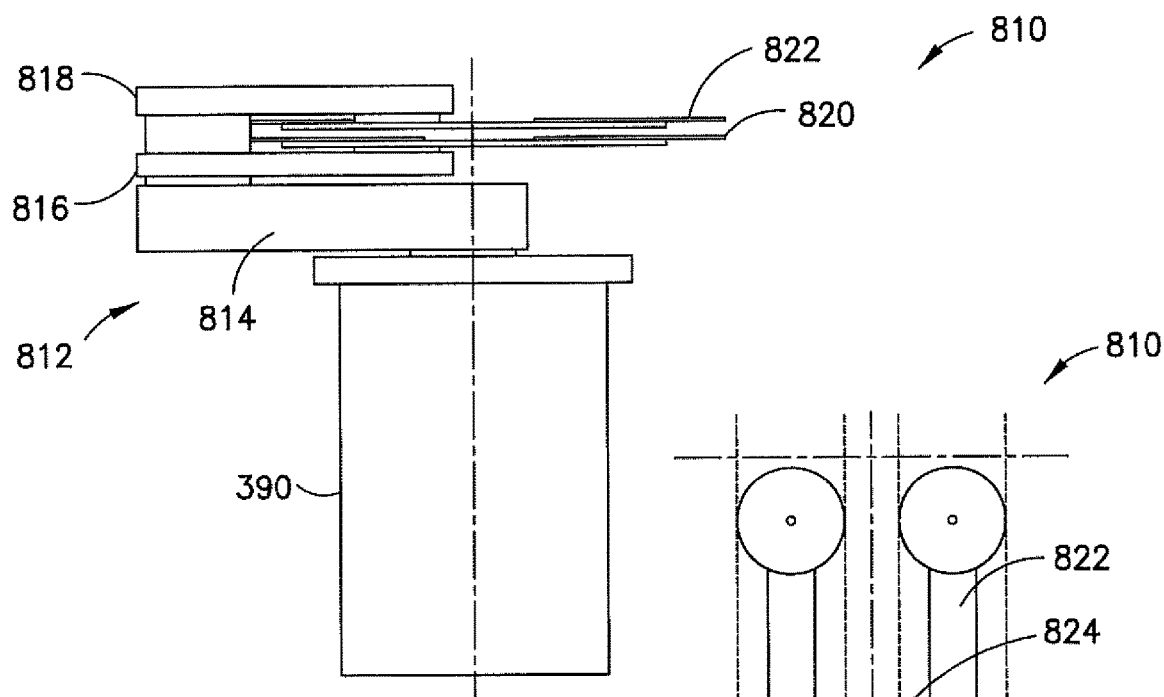
FIG.43A
FIG.43B
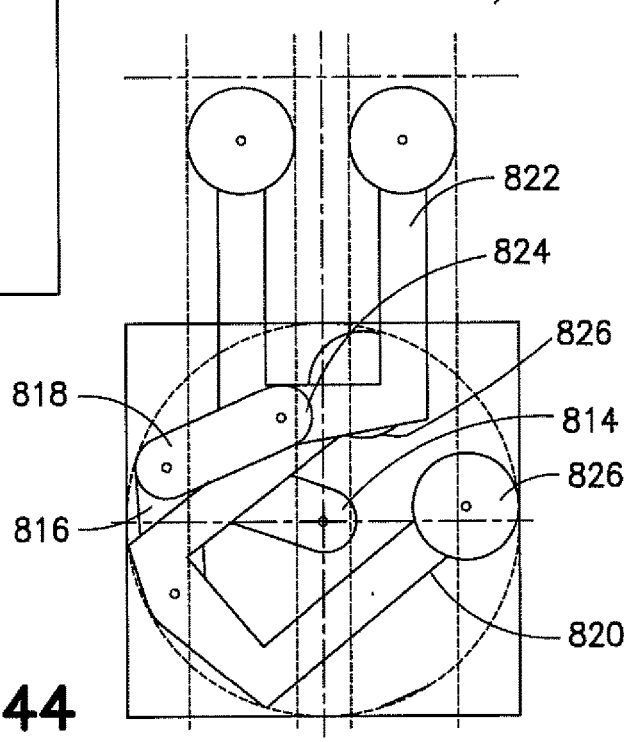
FIG.44

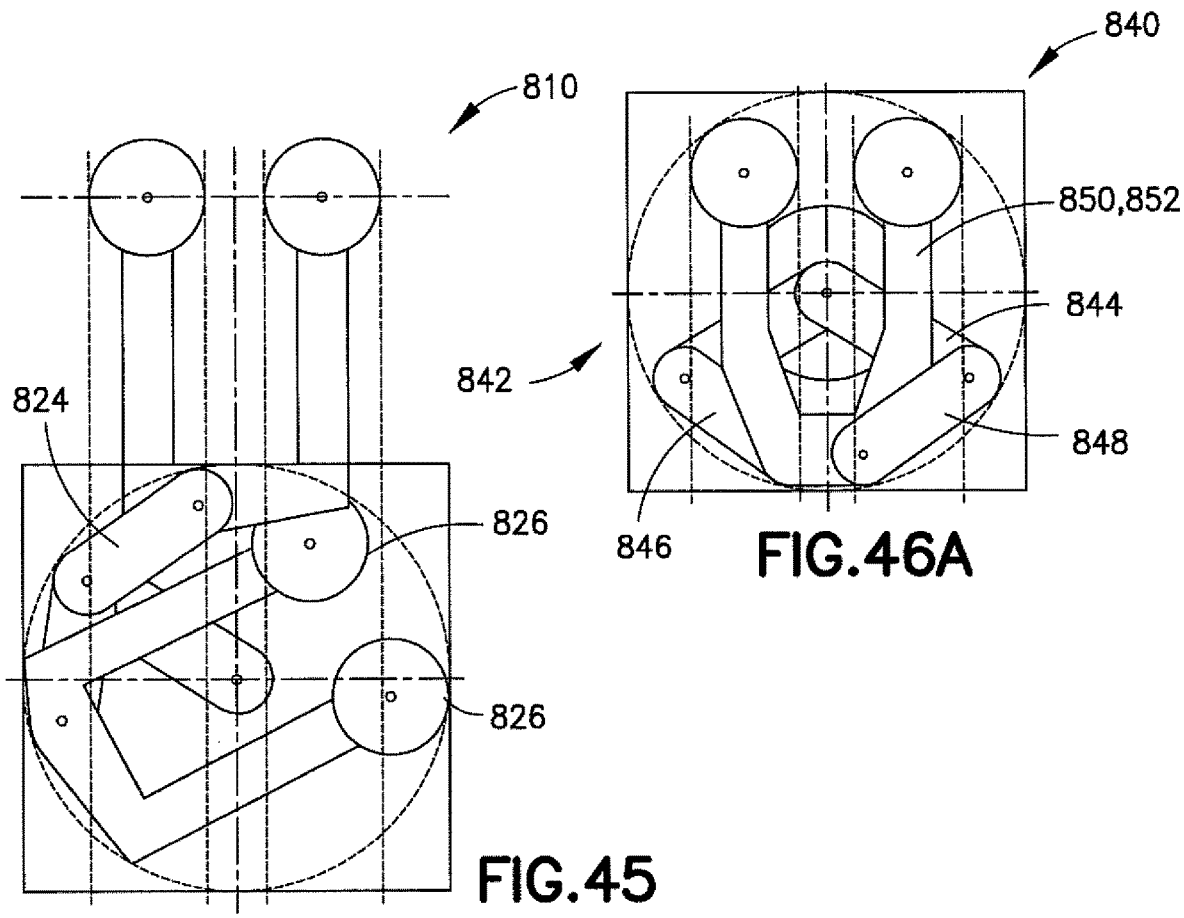
FIG.45
FIG.46A
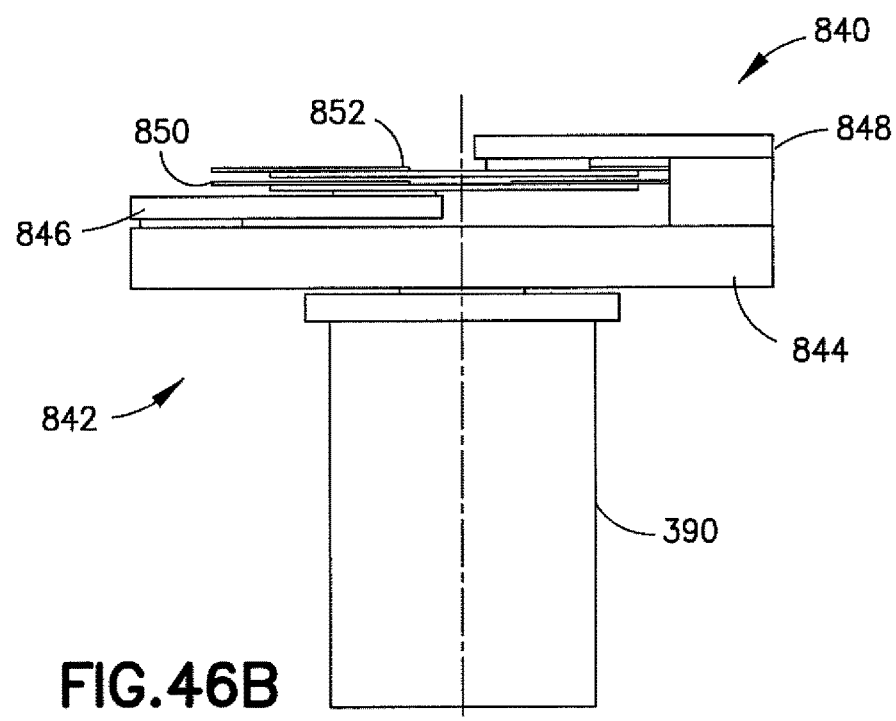
FIG.46B

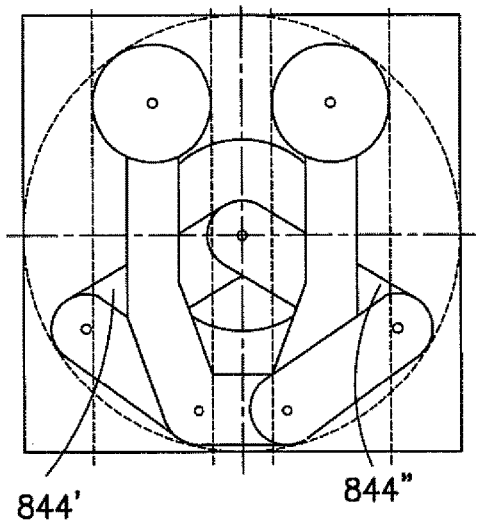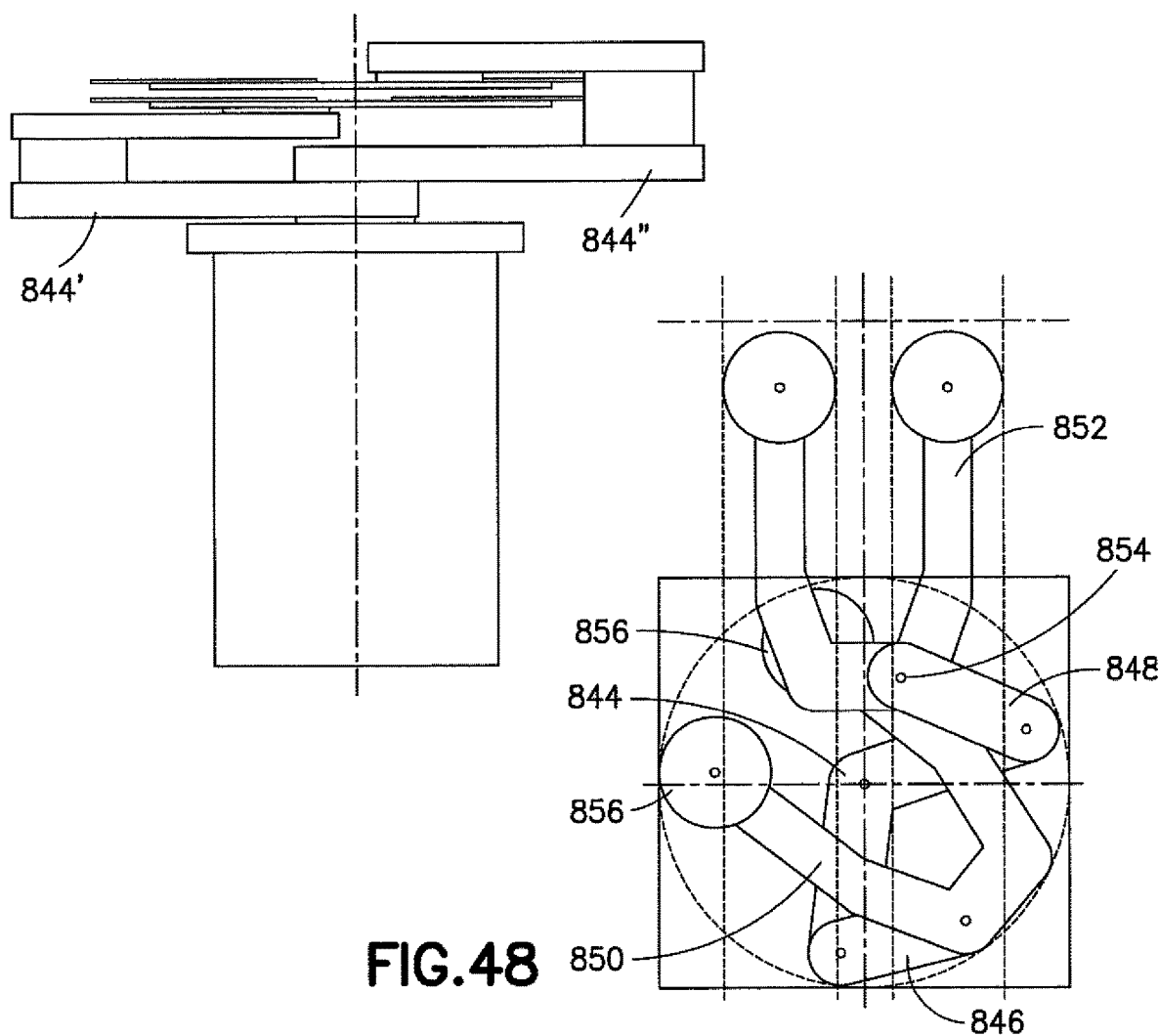

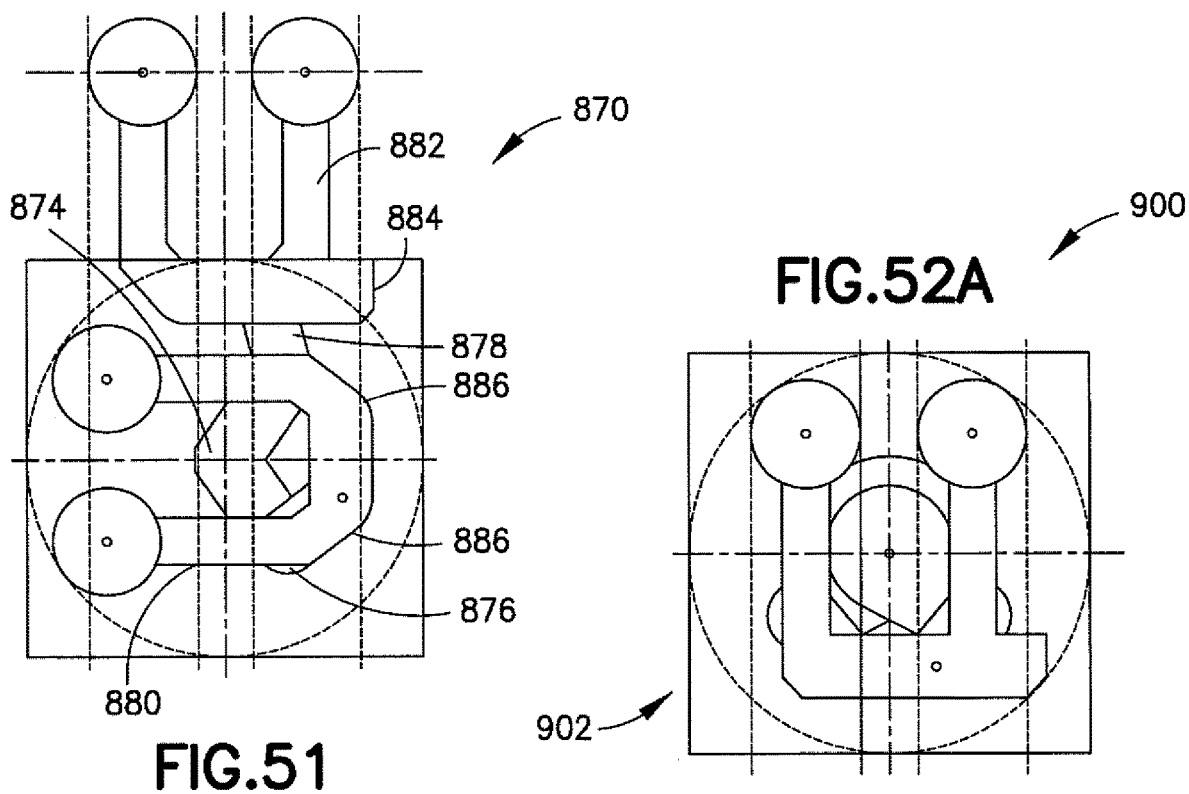
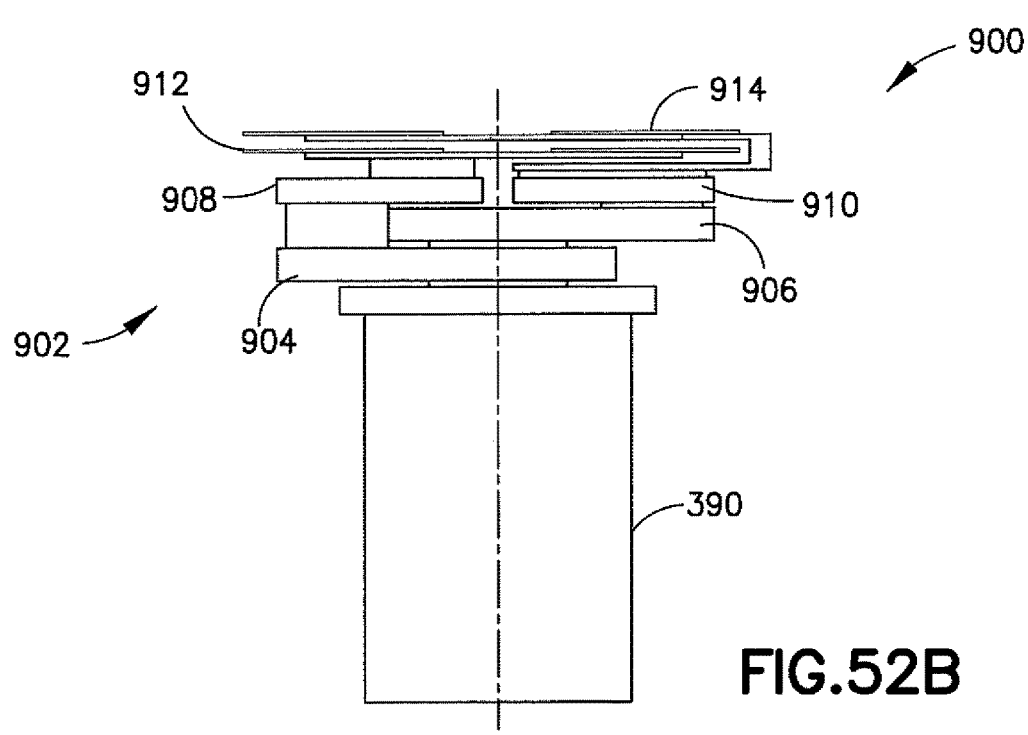
FIG.51
FIG.52A
FIG.52B

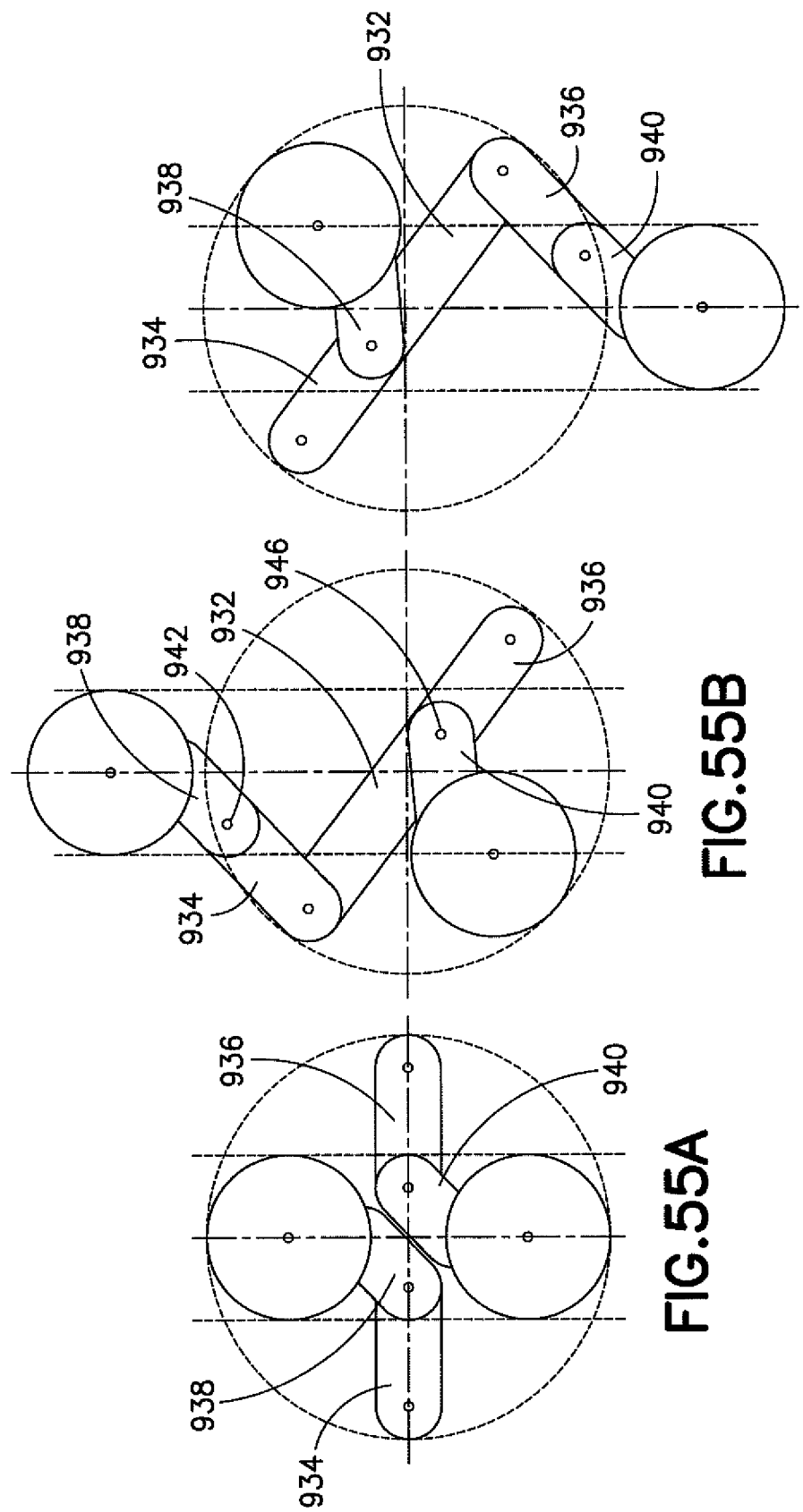

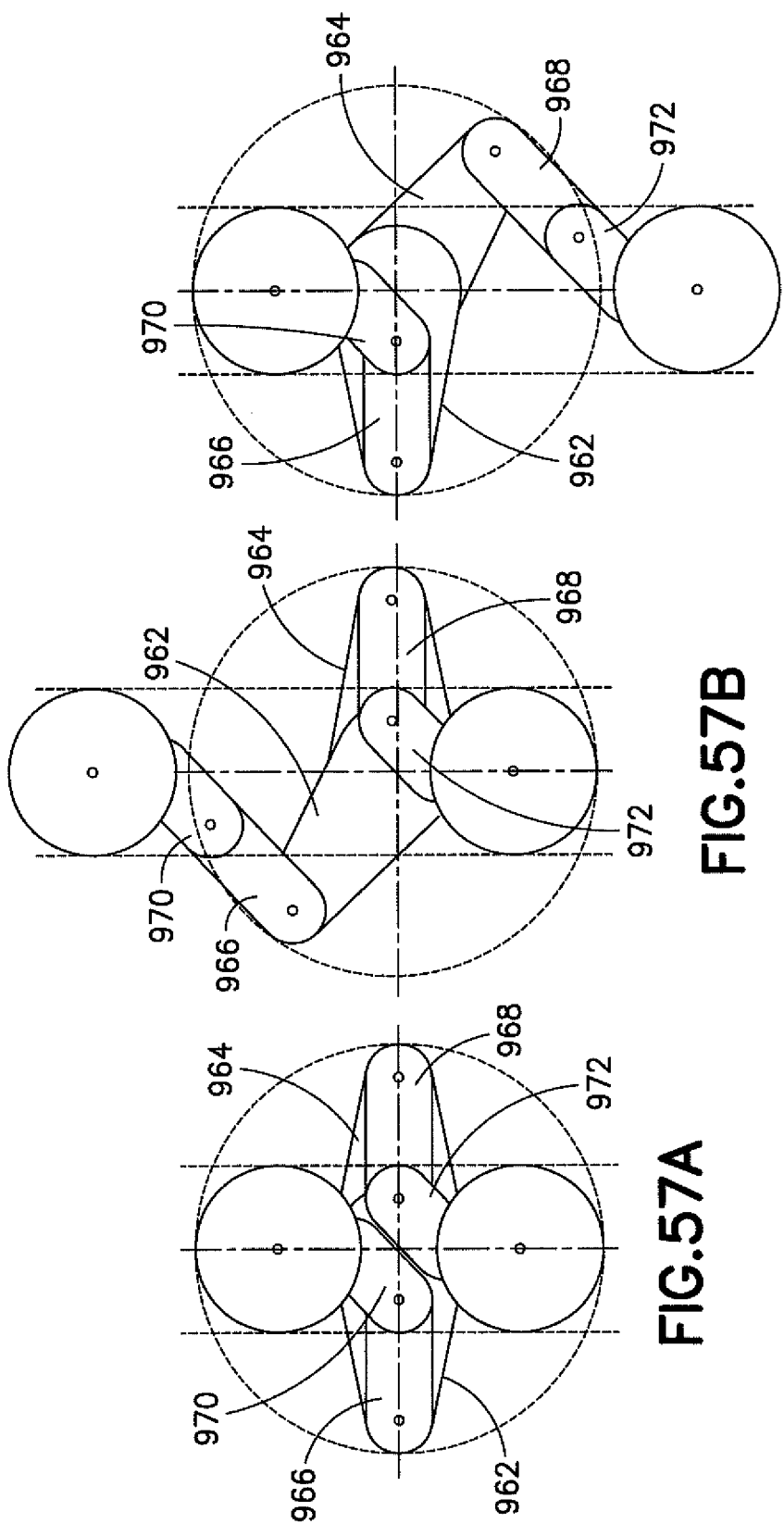

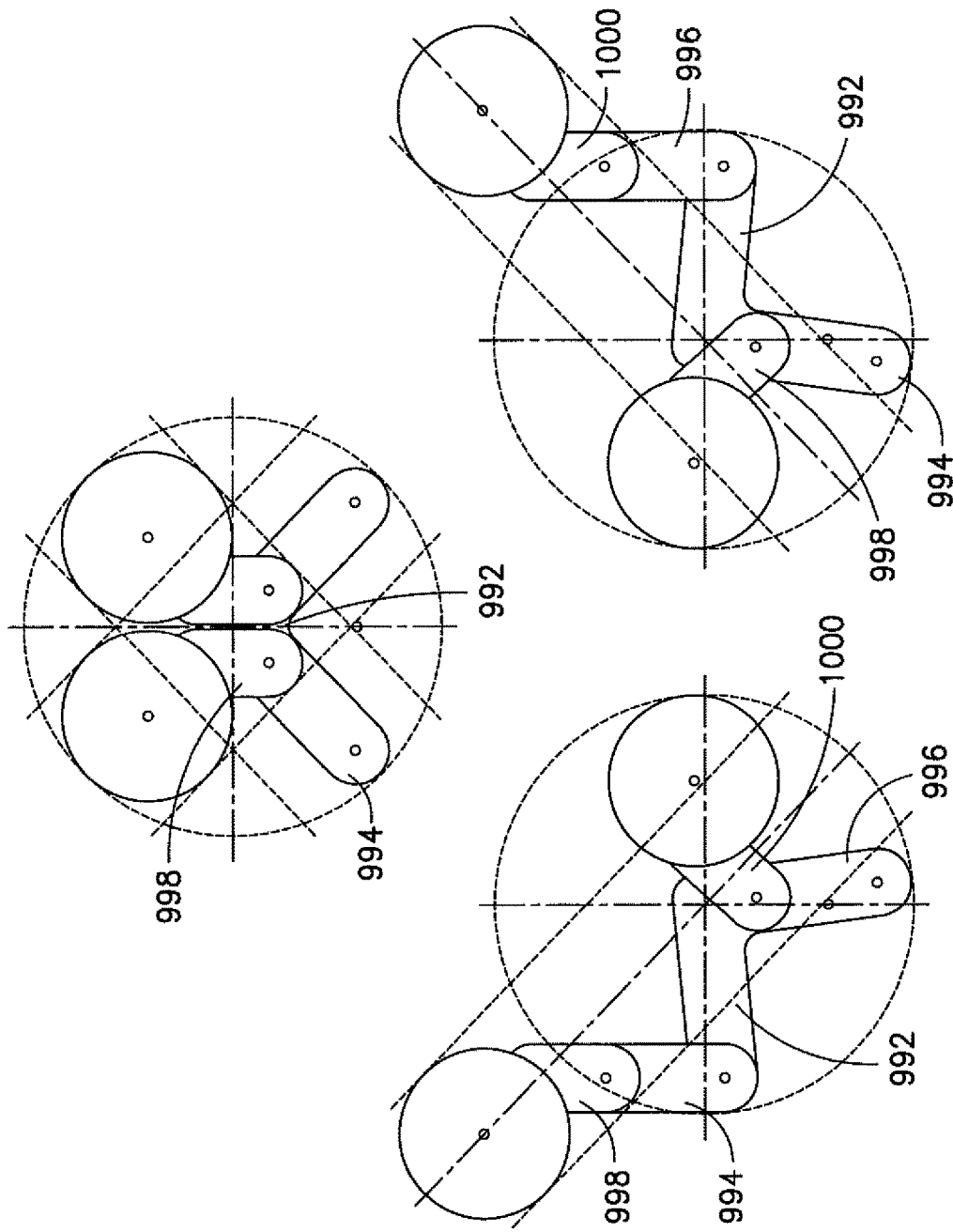

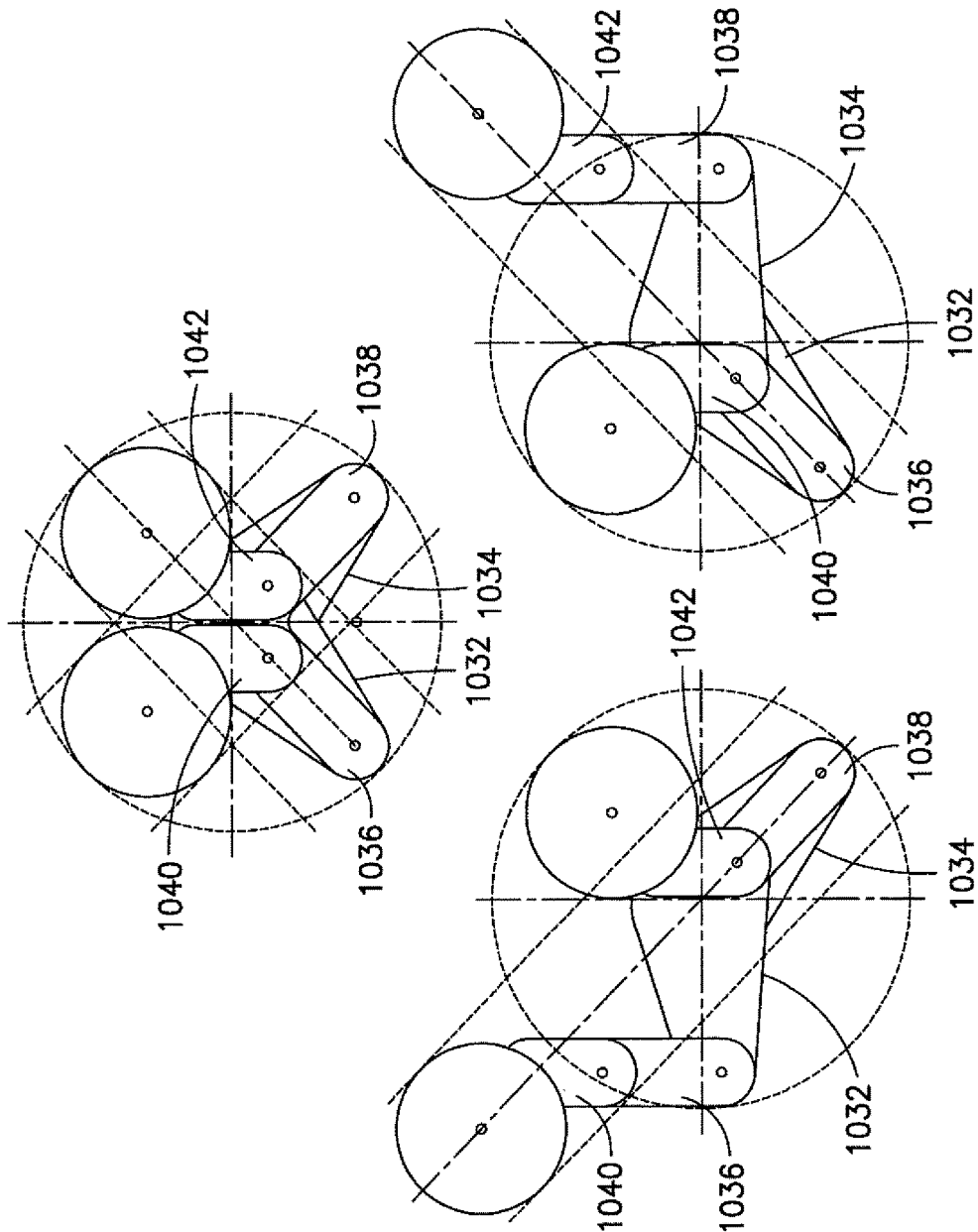

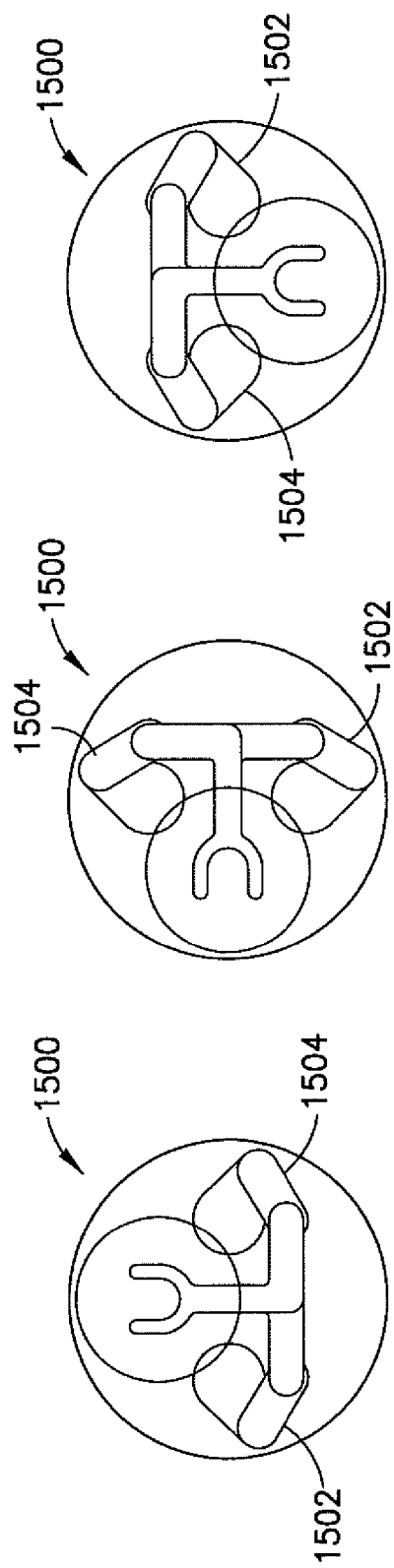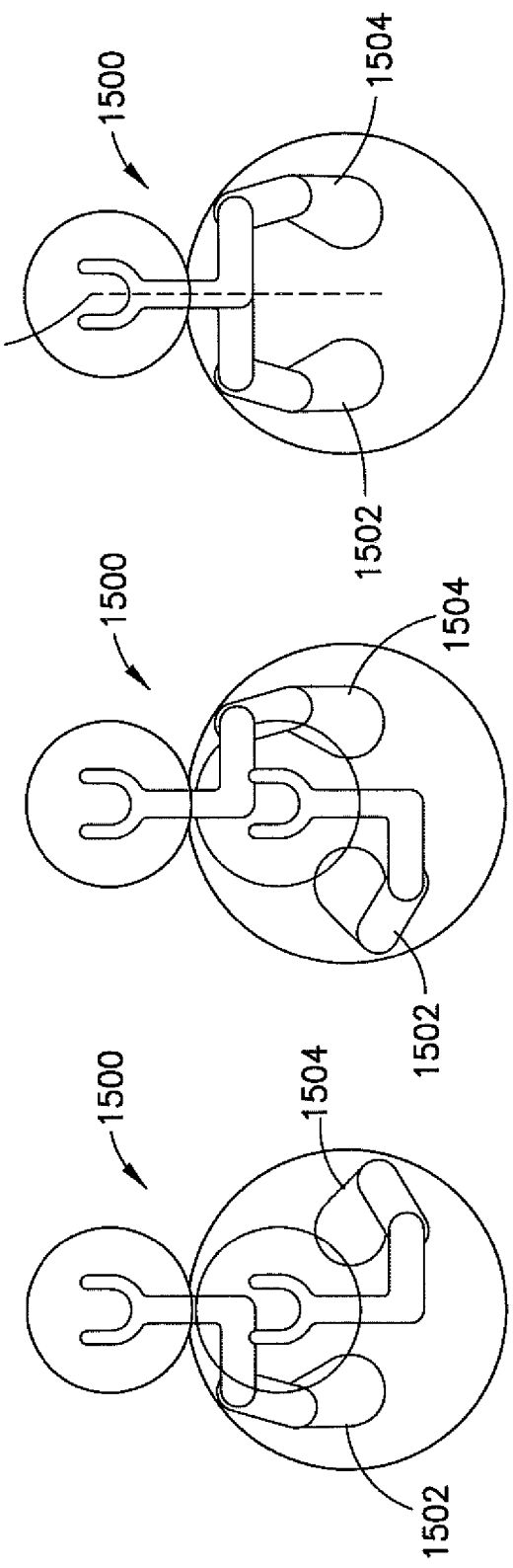

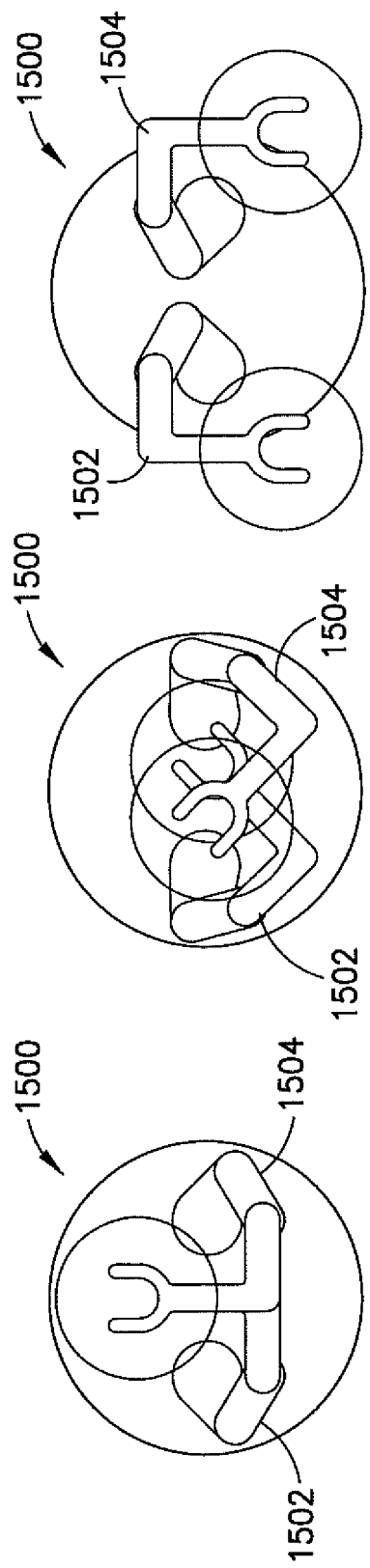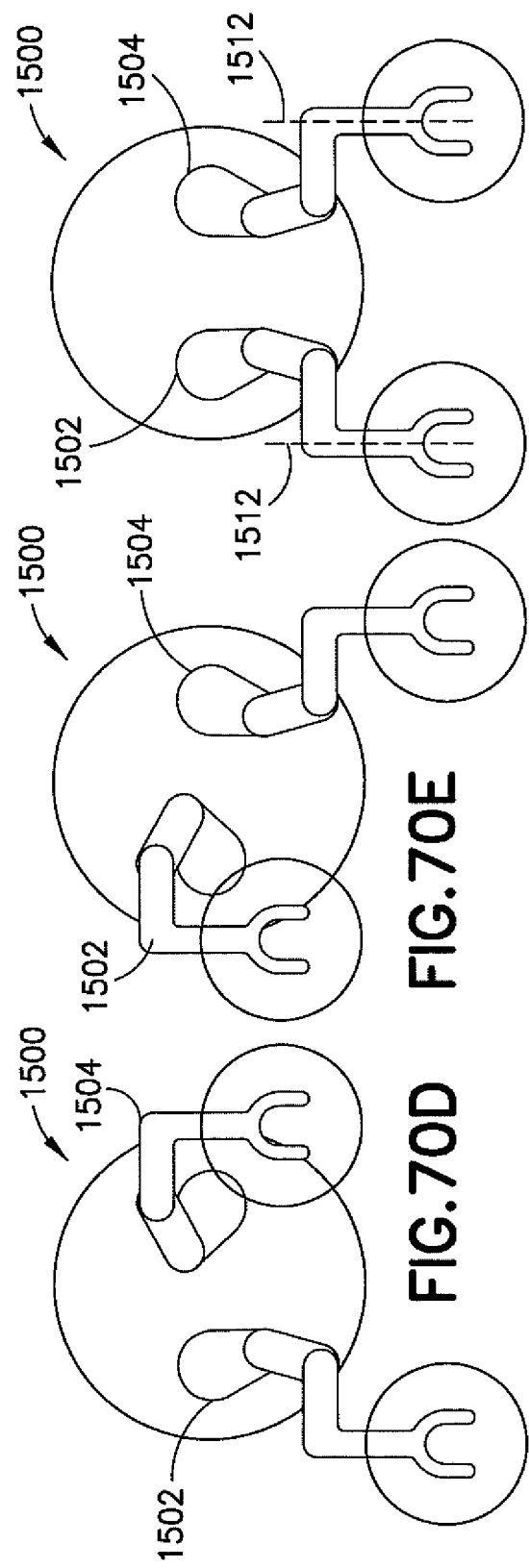

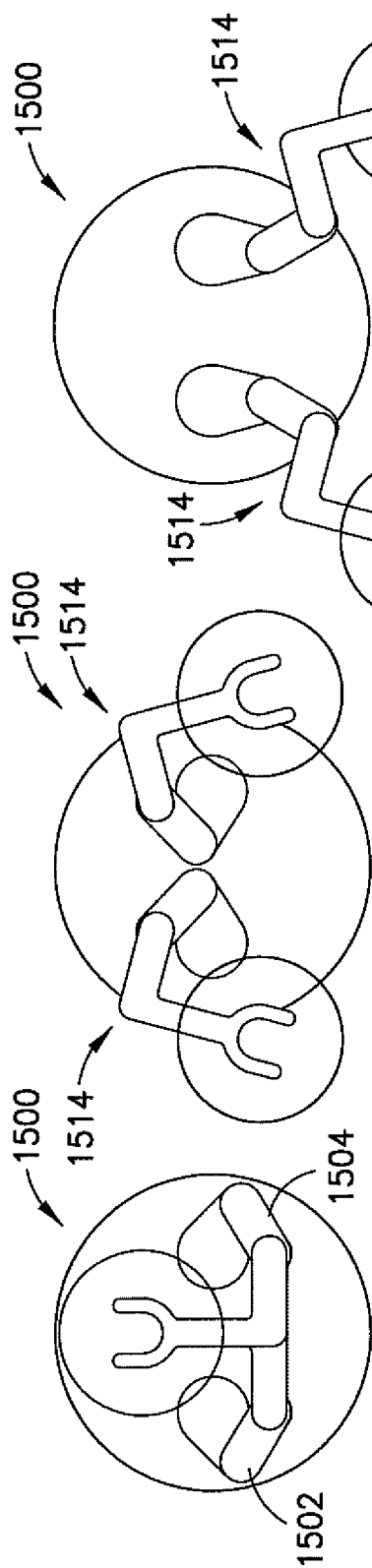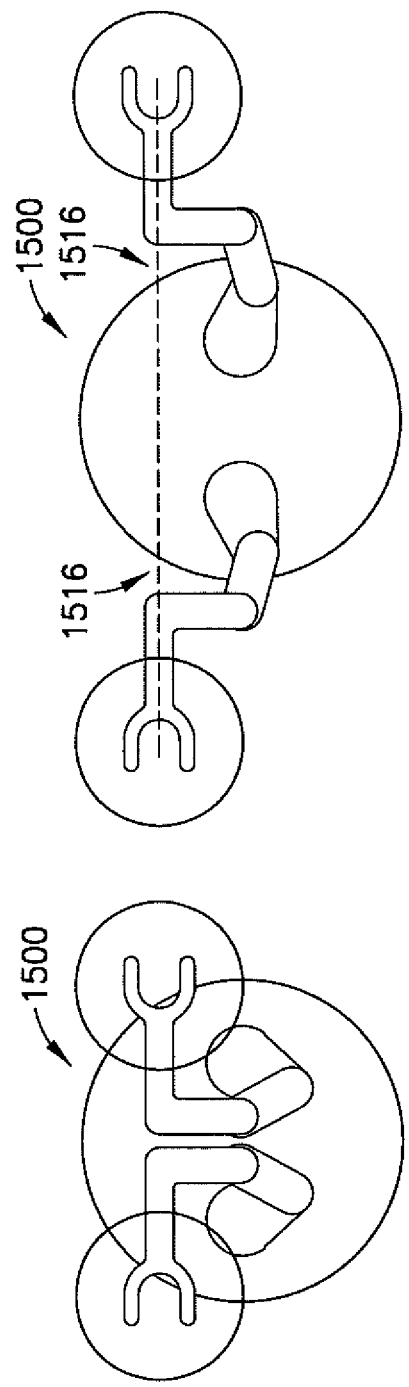

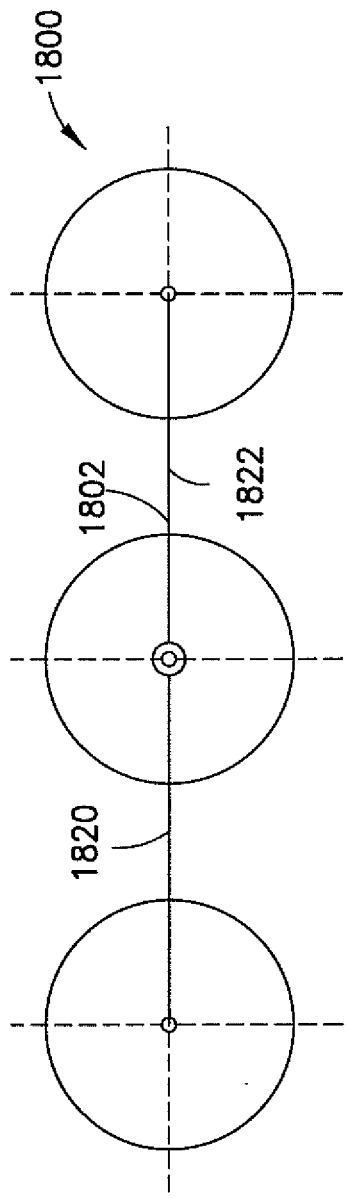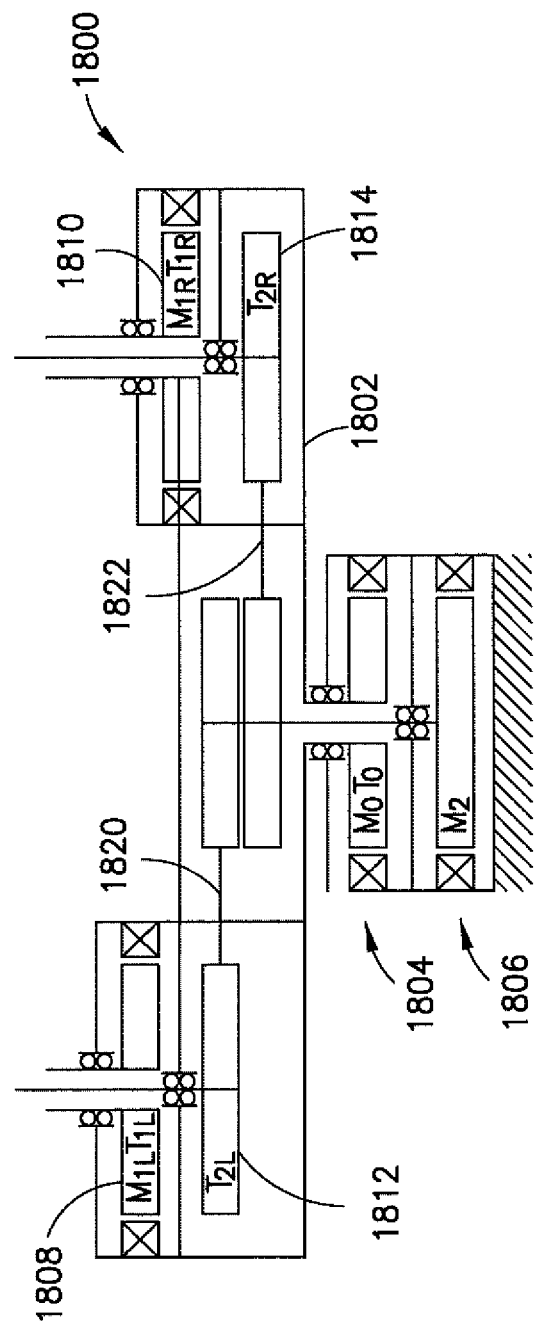

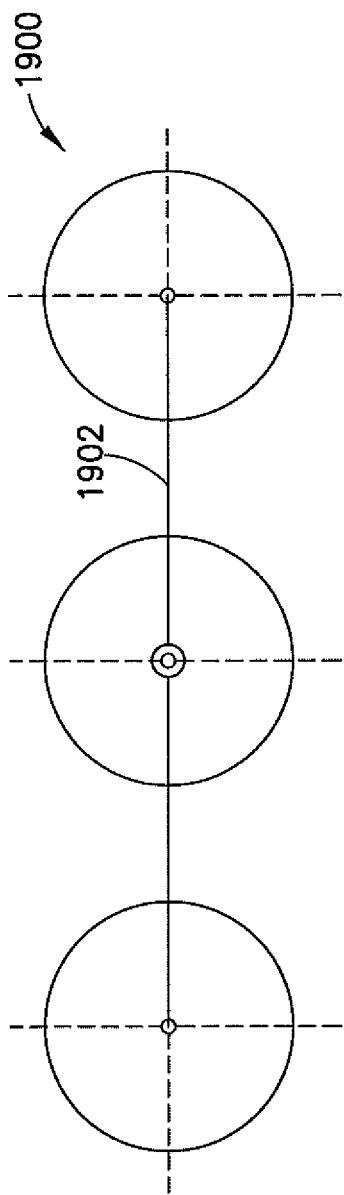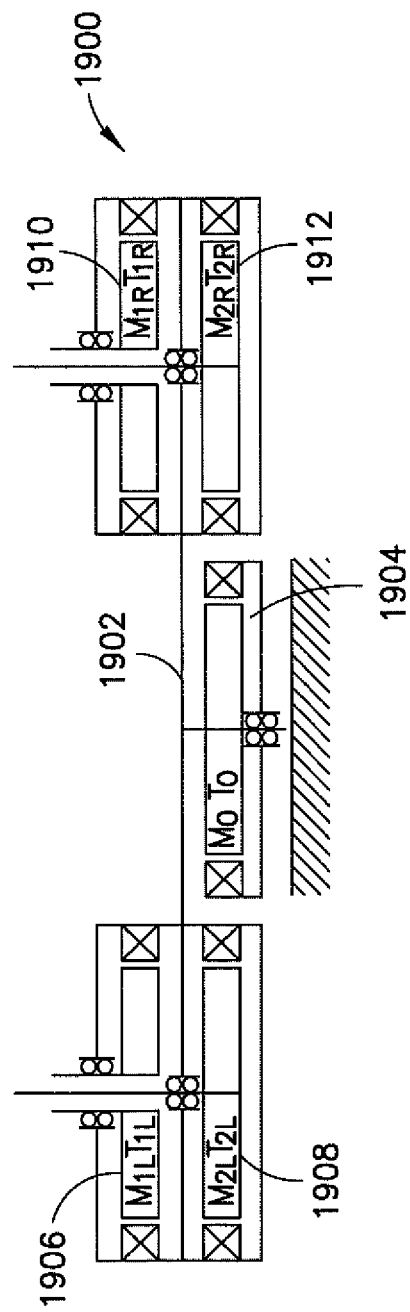

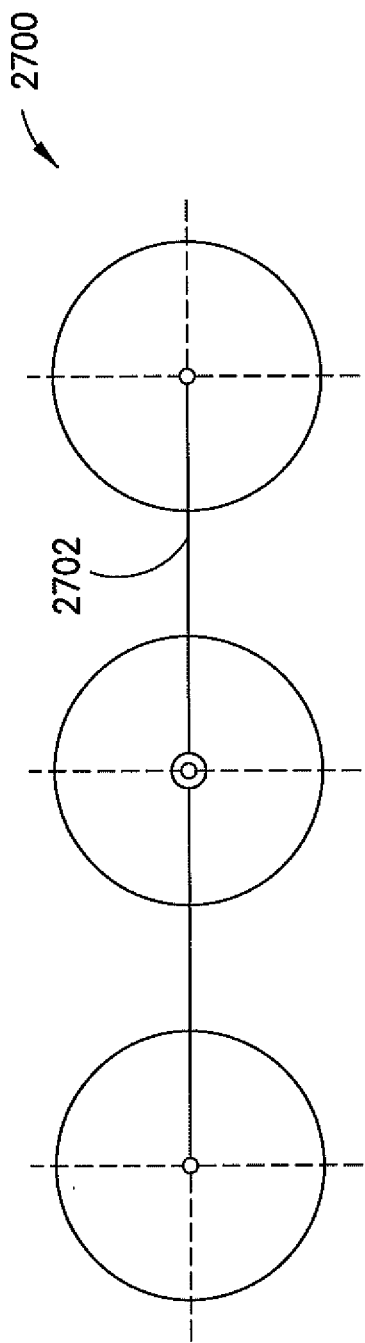
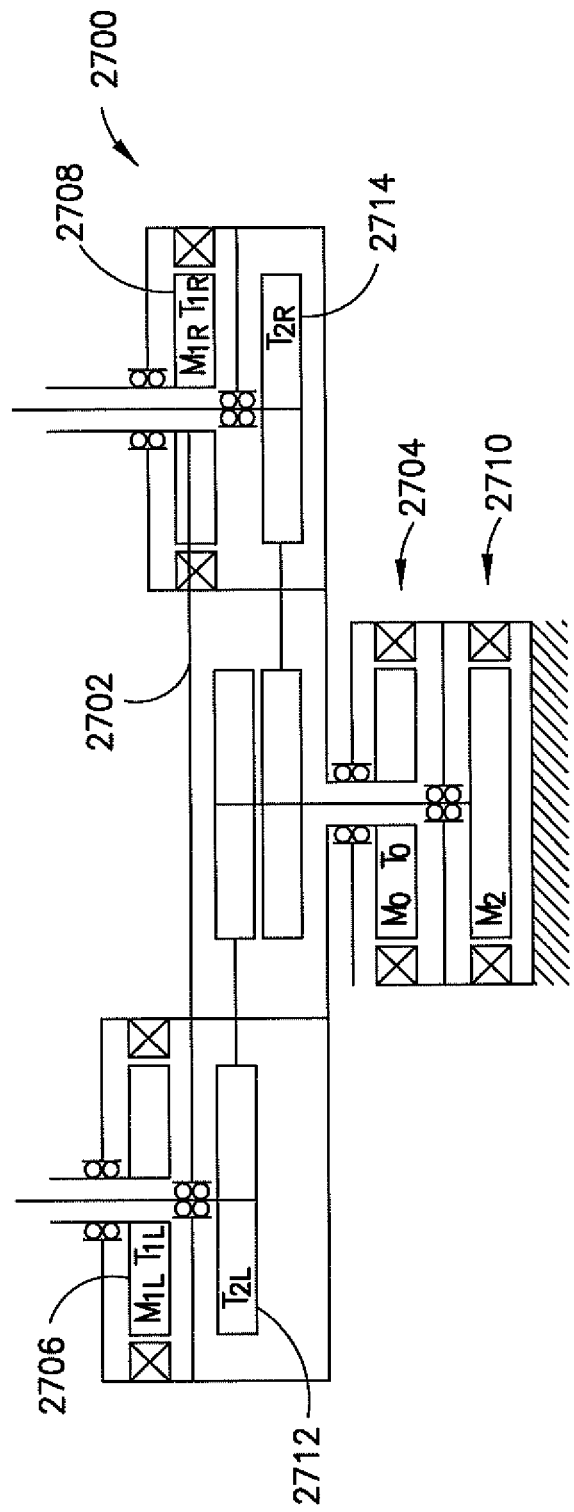
FIG.78A
FIG.78B

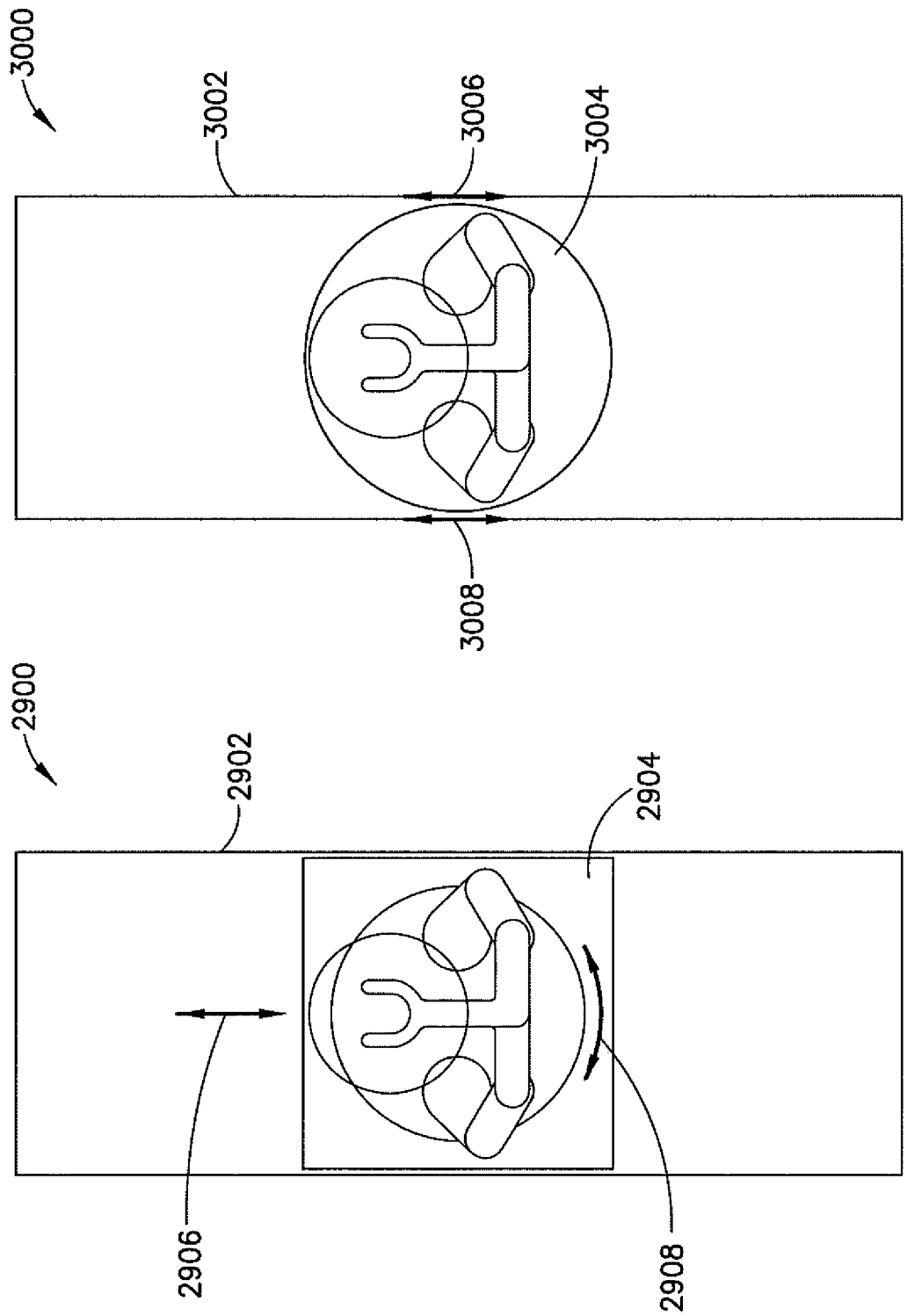

ROBOT HAVING ARM WITH PARALLEL PATHS

CROSS REFERENCE TO RELATED APPLICATIONS

This application is a divisional patent application of copending application Ser. No. 17/155,185 filed May 2, 2023, which is a divisional patent application of application Ser. No. 15/846,401 filed Dec. 19, 2017, which is a divisional application of U.S. application Ser. No. 15/017,970 filed Feb. 8, 2016, now U.S. Pat. No. 10,224,232, which claims priority under 35 USC 119(e) to U.S. provisional patent application No. 62/112,820 filed Feb. 6, 2015, and is a continuation-in-part application of U.S. patent application Ser. No. 14/827,506 filed Aug. 17, 2015, now U.S. Pat. No. 9,840,004, which is a continuation of U.S. patent application Ser. No. 13/833,732 filed Mar. 15, 2013, now U.S. Pat. No. 9,149,936, which claims priority under 35 USC 119(e) on U.S. Provisional Patent Application No. 61/754,125 filed Jan. 18, 2013 and U.S. Provisional Patent Application No. 61/762,063 filed Feb. 7, 2013 which are hereby incorporated by reference in their entireties.

BACKGROUND

Technical Field

The disclosed embodiment relates to a robot having an arm with unequal link lengths and more particularly to a robot having one or more arms with unequal link lengths, each supporting one or more substrates.

Brief Description of Prior Developments

Vacuum, atmospheric and controlled environment processing for applications such as associated with manufacturing of semiconductor, LED, Solar, MEMS or other devices utilize robotics and other forms of automation to transport substrates and carriers associated with substrates to and from storage locations, processing locations or other locations. Such transport of substrates may be moving individual substrates, groups of substrates with single arms transporting one or more substrates or with multiple arms, each transporting one or more substrate. Much of the manufacturing, for example, as associated with semiconductor manufacturing is done in a clean or vacuum environment where footprint and volume are at a premium. Further, much of the automated transport is conducted where minimization of transport times results in reduction of cycle time and increased throughput and utilization of the associated equipment. Accordingly, there is a desire to provide substrate transport automation that requires minimum footprint and workspace volume for a given range of transport applications with minimized transport times.

SUMMARY

The following summary is merely intended to be exemplary. The summary is not intended to limit the claims.

In accordance with one aspect of the exemplary embodiment, a transport apparatus has at least one drive; a first robot arm having a first upper arm, a first forearm and a first end effector. The first upper arm is connected to the at least one drive at a first axis of rotation. A second robot arm has a second upper arm, a second forearm and a second end effector. The second upper arm is connected to the at least one drive at a second axis of rotation which is spaced from the first axis of rotation. The first and second robot arms are configured to locate the end effectors in first retracted positions for stacking substrates located on the end effectors at least partially one above the another. The first and second robot arms are configured to extend the end effectors from the first retracted positions in a first direction along parallel first paths located at least partially directly one above the other. The first and second robot arms are configured to extend the end effectors in at least one second direction along second paths spaced from one another which are not located above one another. The first upper arm and the first forearm have different effective lengths. The second upper arm and the second forearm have different effective lengths.

In accordance with another aspect of the exemplary embodiment, a method is provided comprising providing a first robot arm comprising a first upper arm, a first forearm and a first end effector, where the first upper arm and the first forearm have different effective lengths; providing a second robot arm comprising a second upper arm, a second forearm and a second end effector, where the second upper arm and the second forearm have different effective lengths; connecting the first upper arm to at least one drive at a first axis of rotation; and connecting the second upper arm to the at least one drive at a second axis of rotation which is spaced from the first axis of rotation, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths at least partially located directly one above the other, and where the first and second robot arms are configured to extend the end effectors in at least one second direction along second paths spaced from one another which are not located above one another.

In accordance with another aspect of the exemplary embodiment, a method is provided comprising locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to at least one drive at a first axis of rotation, and where the second robot arm comprises a second upper arm, a second forearm and the second end effector, where the second upper arm is connected to the at least one drive at a second axis of rotation which is spaced from the first axis of rotation; moving the first and second robot arms to move the end effectors from the first retracted positions in a first direction along parallel first paths located at least partially directly one above the other; and moving the first and second robot arms to move the end effectors to extend the end effectors in at least one second direction along second paths spaced from one another which are not located above one another.

In accordance with another aspect of the exemplary embodiment, a transport apparatus has a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises only three motors for rotating first and second upper arms, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

In accordance with another aspect of the exemplary embodiment, a method comprises locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of only three motors of the drive.

In accordance with another aspect of the exemplary embodiment, a method comprises providing a first robot arm comprising a first upper arm, a first forearm and a first end effector; providing a second robot arm comprising a second upper arm, a second forearm and a second end effector; connecting the first upper arm to a drive at a first axis of rotation; and connecting the second upper arm to the drive at a second axis of rotation which is spaced from the first axis of rotation, where the first and second robot arms are configured to locate the end effectors in first retracted positions for stacking substrates located on the end effectors at least partially one above the another, where the first and second robot arms are configured to be rotated to extend the end effectors from the first retracted positions in a first direction along parallel first paths at least partially located directly one above the other, and where the first and second robot arms are configured to be rotated to extend the end effectors in at least one second direction along second paths spaced from one another which are not located above one another, where the drive comprises only three motors for rotating the first and second robot arms to extend the end effectors and for rotating the first and second robot arms about a third axis of rotation spaced from the first and second axes of rotation.

In accordance with another aspect of the exemplary embodiment, an apparatus comprises a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises five motors for rotating first and second upper arms, where a first one of the motors is connected to the first and second robot arms to rotate the first and second arms about a third axis of rotation spaced from the first and second axes of rotation, where second and third ones of the motors are connected to the first robot arm to rotate the first upper arm and the first forearm respectively, and where fourth and fifth ones of the motors are connected to the second robot arm to rotate the second upper arm and the second forearm, respectively, independently from the first robot arm, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

In accordance with another aspect of the exemplary embodiment, a method comprises locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of five motors of the drive, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

In accordance with another aspect of the exemplary embodiment, a method comprises providing a first robot arm comprising a first upper arm, a first forearm and a first end effector; providing a second robot arm comprising a second upper arm, a second forearm and a second end effector; connecting the first upper arm to a drive at a first axis of rotation; and connecting the second upper arm to the drive at a second axis of rotation which is spaced from the first axis of rotation, where the first and second robot arms are configured to locate the end effectors in first retracted positions for stacking substrates located on the end effectors at least partially one above the another, where the first and second robot arms are configured to be rotated to extend the end effectors from the first retracted positions in a first direction along parallel first paths at least partially located directly one above the other, and where the first and second robot arms are configured to be rotated to extend the end effectors in at least one second direction along second paths spaced from one another which are not located above one another, where the drive comprises five motors for rotating the first and second robot arms to extend the end effectors and for rotating the first and second robot arms about a third axis of rotation spaced from the first and second axes of rotation, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

In accordance with another aspect of the exemplary embodiment, an apparatus comprises a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises four motors for rotating first and second upper arms, where a first one of the motors is connected to the first upper arm, where a second one of the motors is connected to the second upper arm, where a third one of the motors is connected to the first forearm, where a fourth one of the motors is connected to the second forearm, where the third and fourth motors are aligned in a common axis spaced from the first and second axis, where the first motor is aligned in the first axis and where the second motor is aligned in the second axis, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

BRIEF DESCRIPTION OF THE DRAWINGS

The foregoing aspects and other features are explained in the following description, taken in connection with the accompanying drawings, wherein:

FIG. 6A is a top partial schematic view of a transport apparatus;
FIG. 7A is a top view of a transport apparatus;
FIG. 7B is a top view of a transport apparatus;
FIG. 7C is a top view of a transport apparatus;
FIG. 13 is a side section partial schematic view of a transport apparatus;
FIG. 14A is a top view of a transport apparatus;
FIG. 14B is a top view of a transport apparatus;
FIG. 14C is a top view of a transport apparatus;
FIG. 18 is a side section partial schematic view of a transport apparatus;
FIG. 19 is a side section partial schematic view of a transport apparatus;
FIG. 20A is a top view of a transport apparatus;
FIG. 20B is a top view of a transport apparatus;
FIG. 20C is a top view of a transport apparatus;
FIG. 21A is a top view of a transport apparatus;
FIG. 21B is a side view of a transport apparatus;
FIG. 22A is a top view of a transport apparatus;
FIG. 22B is a side view of a transport apparatus;
FIG. 23 is a side section partial schematic view of a transport apparatus;
FIG. 24A is a top view of a transport apparatus;
FIG. 24B is a top view of a transport apparatus;
FIG. 24C is a top view of a transport apparatus;
FIG. 26A is a top view of a transport apparatus;
FIG. 26B is a top view of a transport apparatus;
FIG. 26C is a top view of a transport apparatus;
FIG. 27A is a top view of a transport apparatus;
FIG. 27B is a side view of a transport apparatus;
FIG. 28A is a top view of a transport apparatus;
FIG. 28B is a side view of a transport apparatus;
FIG. 34A is a top view of a transport apparatus;
FIG. 34B is a top view of a transport apparatus;

FIG. 34C is a top view of a transport apparatus;
FIG. 43A is a top view of a transport apparatus;
FIG. 43B is a side view of a transport apparatus;
FIG. 44 is a top view of a transport apparatus;
FIG. 45 is a top view of a transport apparatus;
FIG. 46A is a top view of a transport apparatus;
FIG. 46B is a side view of a transport apparatus;
FIG. 47A is a top view of a transport apparatus;
FIG. 47B is a side view of a transport apparatus;
FIG. 48 is a top view of a transport apparatus;
FIG. 51 is a top view of a transport apparatus;
FIG. 52A is a top view of a transport apparatus;
FIG. 52B is a side view of a transport apparatus;
FIG. 55A is a top view of a transport apparatus;
FIG. 55B is a top view of a transport apparatus;
FIG. 55C is a top view of a transport apparatus;
FIG. 57A is a top view of a transport apparatus;
FIG. 57B is a top view of a transport apparatus;
FIG. 57C is a top view of a transport apparatus;
FIG. 59A is a top view of a transport apparatus;
FIG. 59B is a top view of a transport apparatus;
FIG. 59C is a top view of a transport apparatus;
FIG. 61A is a top view of a transport apparatus;
FIG. 61B is a top view of a transport apparatus;
FIG. 61C is a top view of a transport apparatus;
FIG. 69 A-F are top views of a transport apparatus;
FIG. 70 A-F are top views of a transport apparatus;
FIG. 71 A-E are top views of a transport apparatus;
FIG. 72 C-D are top and side views of a transport apparatus;
FIG. 73 A-B are top and side views of a transport apparatus;
FIG. 73 C-D are top and side views of a transport apparatus;
FIG. 77 C-D are top and side views of a transport apparatus;
FIG. 78 A-B are top and side views of a transport apparatus;
FIG. 80A is a top view of a transport apparatus;
and
FIG. 80B is a top view of a transport apparatus.

DETAILED DESCRIPTION OF THE EXEMPLARY EMBODIMENT

Figure 1A:
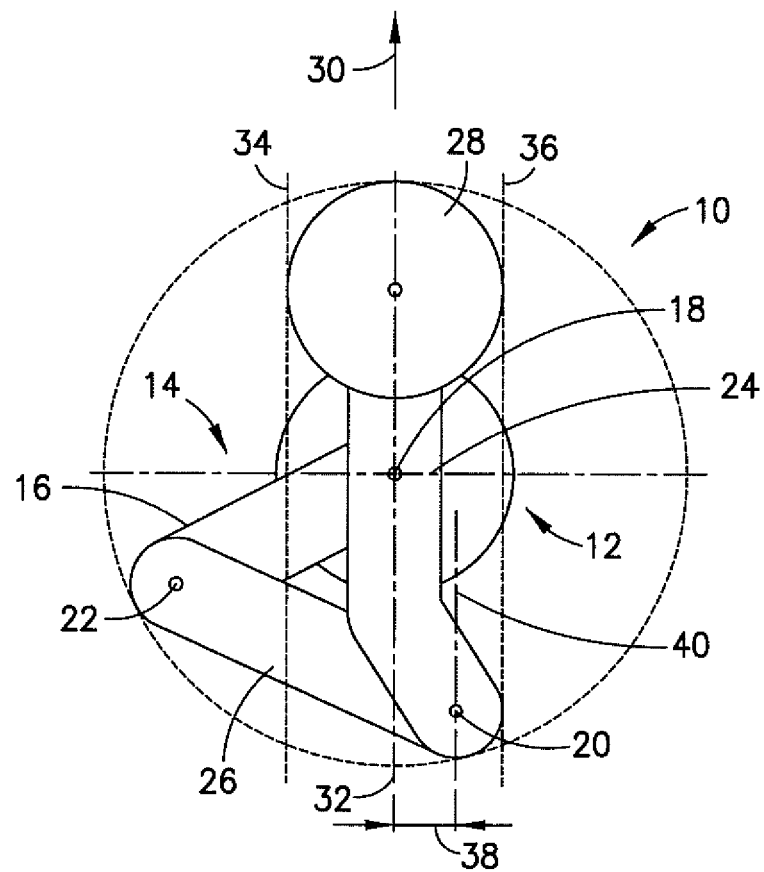
FIG. 1A is a top view of a transport apparatus.

Aside from the embodiment disclosed below, the disclosed embodiment is capable of other embodiments and of being practiced or being carried out in various ways. Thus, it is to be understood that the disclosed embodiment is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1B:
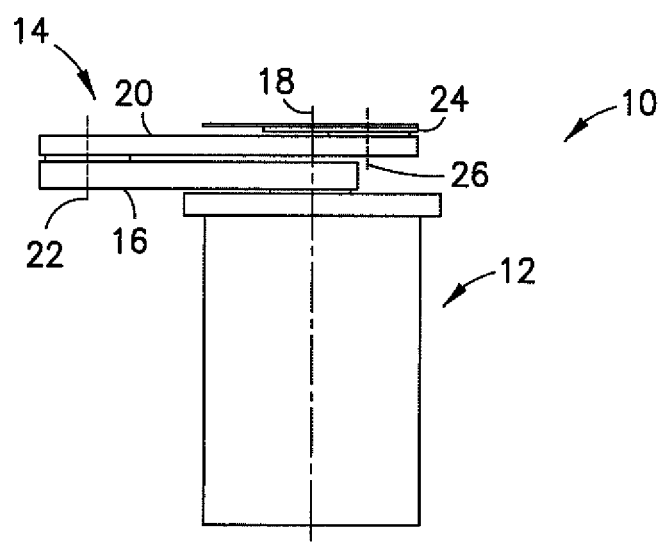
FIG. 1B is a side view of a transport apparatus.

Referring now to FIGS. 1A and 1B, there is shown top and side views respectively of robot 10 having drive 12 and arm 14. Arm 14 is shown in a retracted position. Arm 14 has upper arm or first link 16 rotatable about a central axis of rotation 18 of drive 12. Arm 14 further has forearm or second link 20 rotatable about an elbow axis of rotation 22. Arm 14 further has end effector or third link 24 rotatable about a wrist axis of rotation 26. End effector 24 supports substrate 28. As will be described, arm 14 is configured to cooperate with drive 12 such that substrate 28 is transported along a radial path 30 that may coincide with (as seen in FIG. 1A) or a path, for example, path 34, 36 or otherwise parallel to a linear path 32 that coincides with the central axis of rotation 18 of drive 12. In the embodiment shown, the joint-to-joint length of forearm or second link 20 is larger than the joint-to-joint length of the upper arm or first link 16. In the embodiment shown, the lateral offset 38 of the end-effector or third link 24 corresponds to the difference of the joint-to-joint lengths of the forearm 20 and upper arm 14. As will be described in greater detail below, the lateral offset 38 is maintained substantially constant during extension and retraction of arm 14 such that substrate 28 is moved along a linear path without rotation of substrate 28 or end effector 24 with respect to the linear path. This is accomplished with structure internal to arm 14 as will be described without the use of an additional controlled axis to control rotation of end effector 24 at wrist 26 with respect to forearm 20. In one aspect of the disclosed embodiment, with respect to FIG. 1A, the center of mass of the third link or end effector 24 may reside at the wrist centerline or axis of rotation 26. Alternately, the center of mass of the third link or end effector 24 may reside along path 40 offset 38 from the central axis of rotation 18. In this manner, the disturbance to the bands that constrain end effector 24 with respect to links 16, 18 may be minimized due to a moment applied as a result of the mass being offset otherwise during extension and retraction of the arm. Here, the center of mass may be determined with or without the substrate or may be in between. Alternately, the center of mass of the third link or end effector 24 may reside at any suitable location. In the embodiment shown, substrate transport apparatus 10 transports substrate 28 with moveable arm assembly 14 coupled to drive section 12 on central axis of rotation 18. Substrate support 24 is coupled to the arm assembly 14 on wrist axis of rotation 26 where arm assembly 14 rotates about central axis of rotation 18 during extension and retraction as will be seen with respect to FIGS. 3A-C. Wrist axis of rotation 26 moves along wrist path 40 parallel to and offset 38 or otherwise from radial path, for example, path 30, 34 or 36 relative to the central axis of rotation 18 during extension and retraction. Substrate support 24 similarly moves parallel to radial path 30 during extension and retraction without rotation. As will be described in greater detail in other aspects of the disclosed embodiment, the principles and structure that constrain the end effector to move in a substantially purely radial motion may be applied where the length of the fore arm is shorter than that of the upper arm. Further, the features may be applied where more than one substrate is being handled by the end effector. Further, the features may be applied where a second arm is used in connection with the drive handling one or more additional substrates. Accordingly, all such variations may be embraced.

Figure 2A:
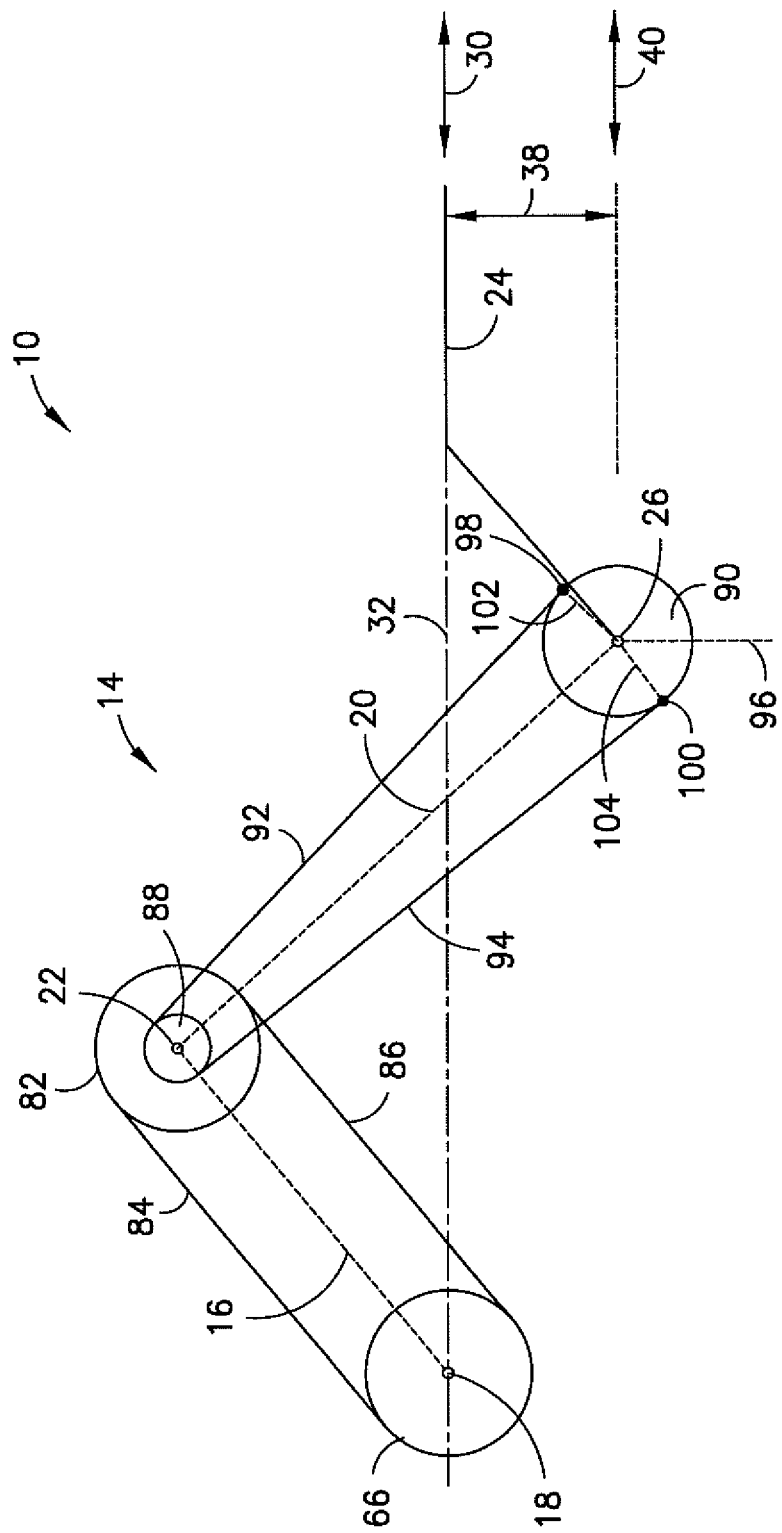
FIG. 2A is a top partial schematic view of a transport apparatus.
Figure 2B:
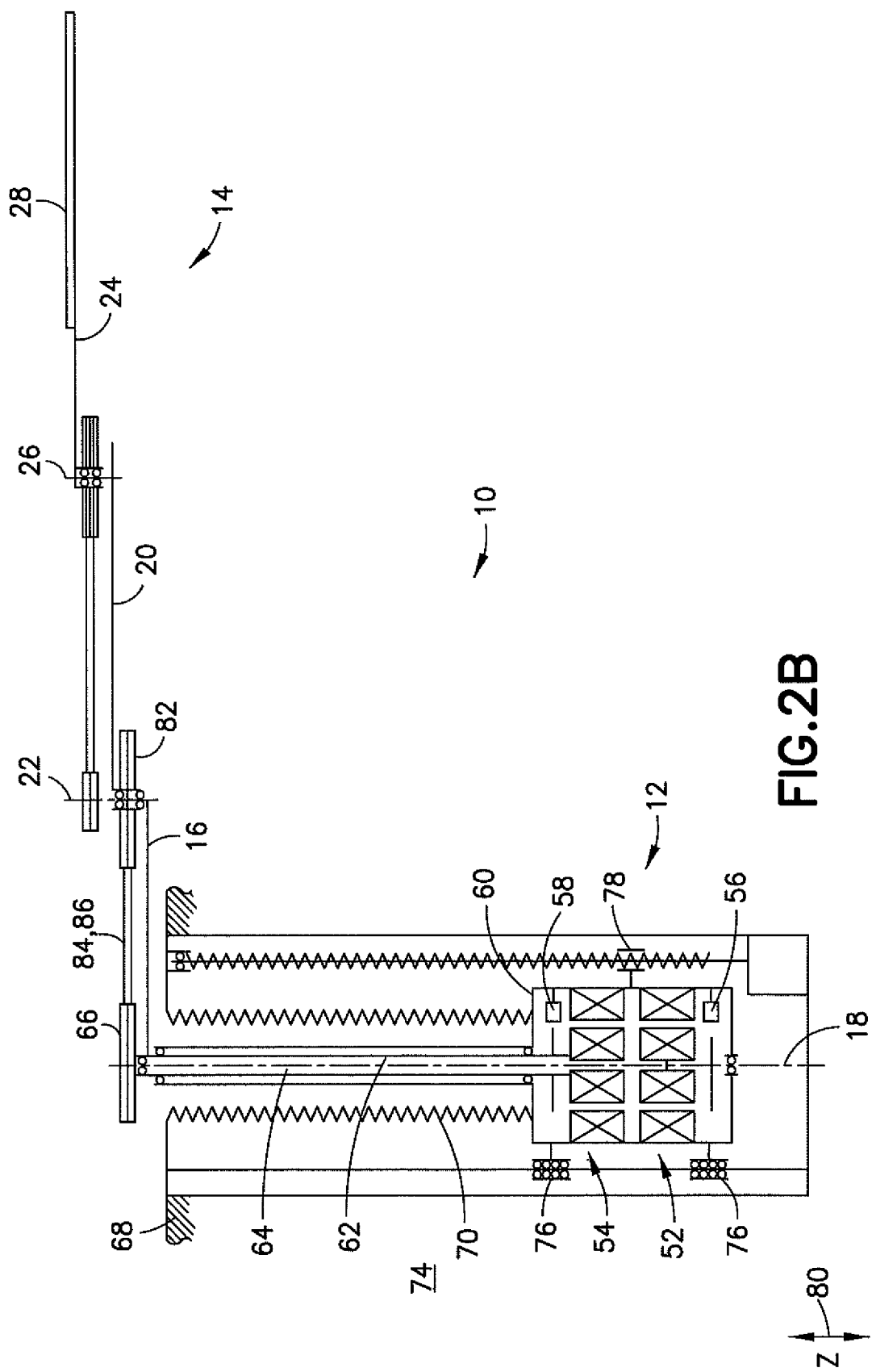
FIG. 2B is a side section partial schematic view of a transport apparatus.
Figure 3A:
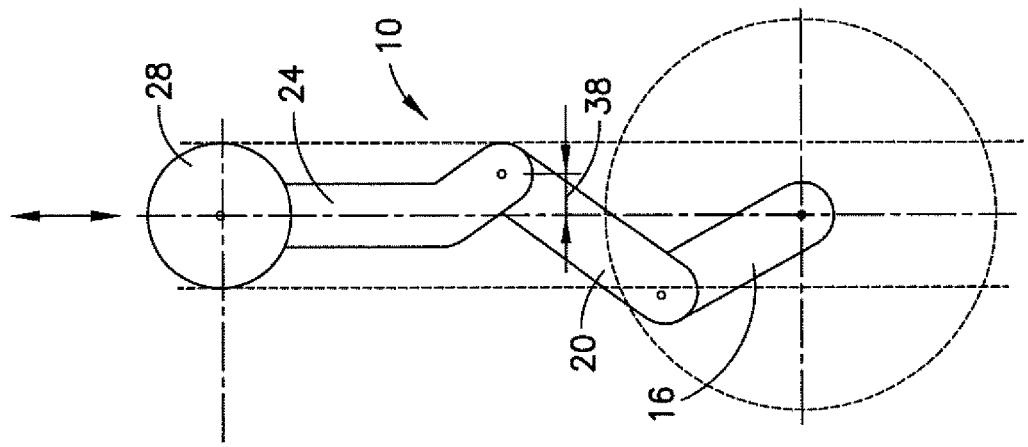
FIG. 3A is a top view of a transport apparatus.
Figure 3B:
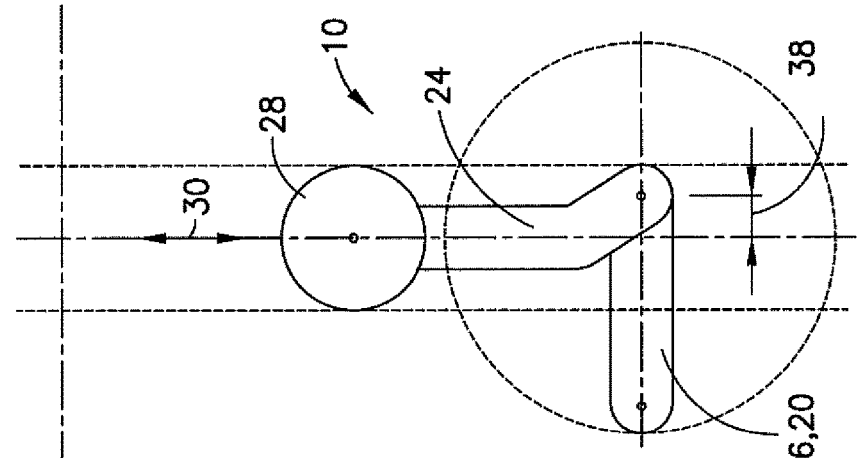
FIG. 3B is a top view of a transport apparatus.
Figure 3C:
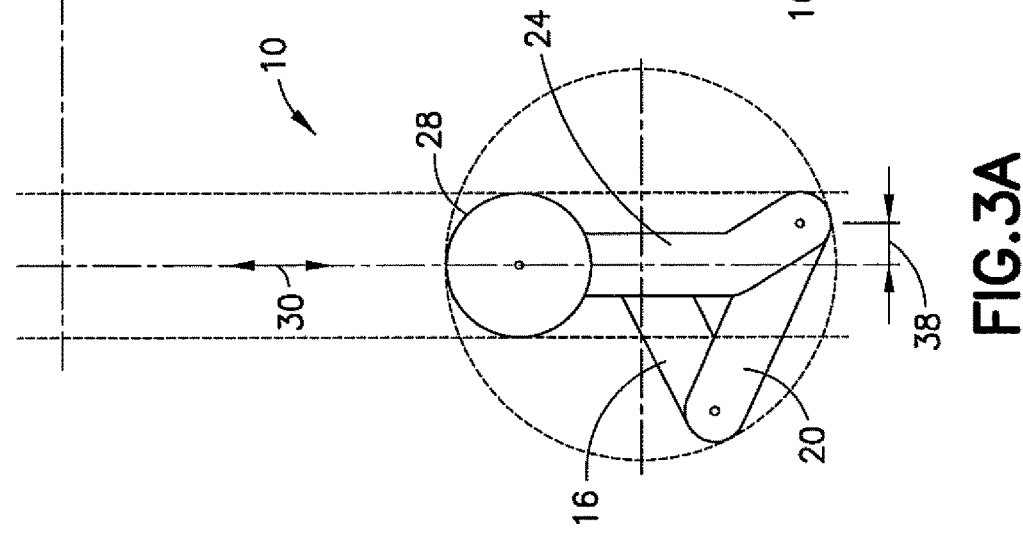
FIG. 3C is a top view of a transport apparatus.
Figure 4:
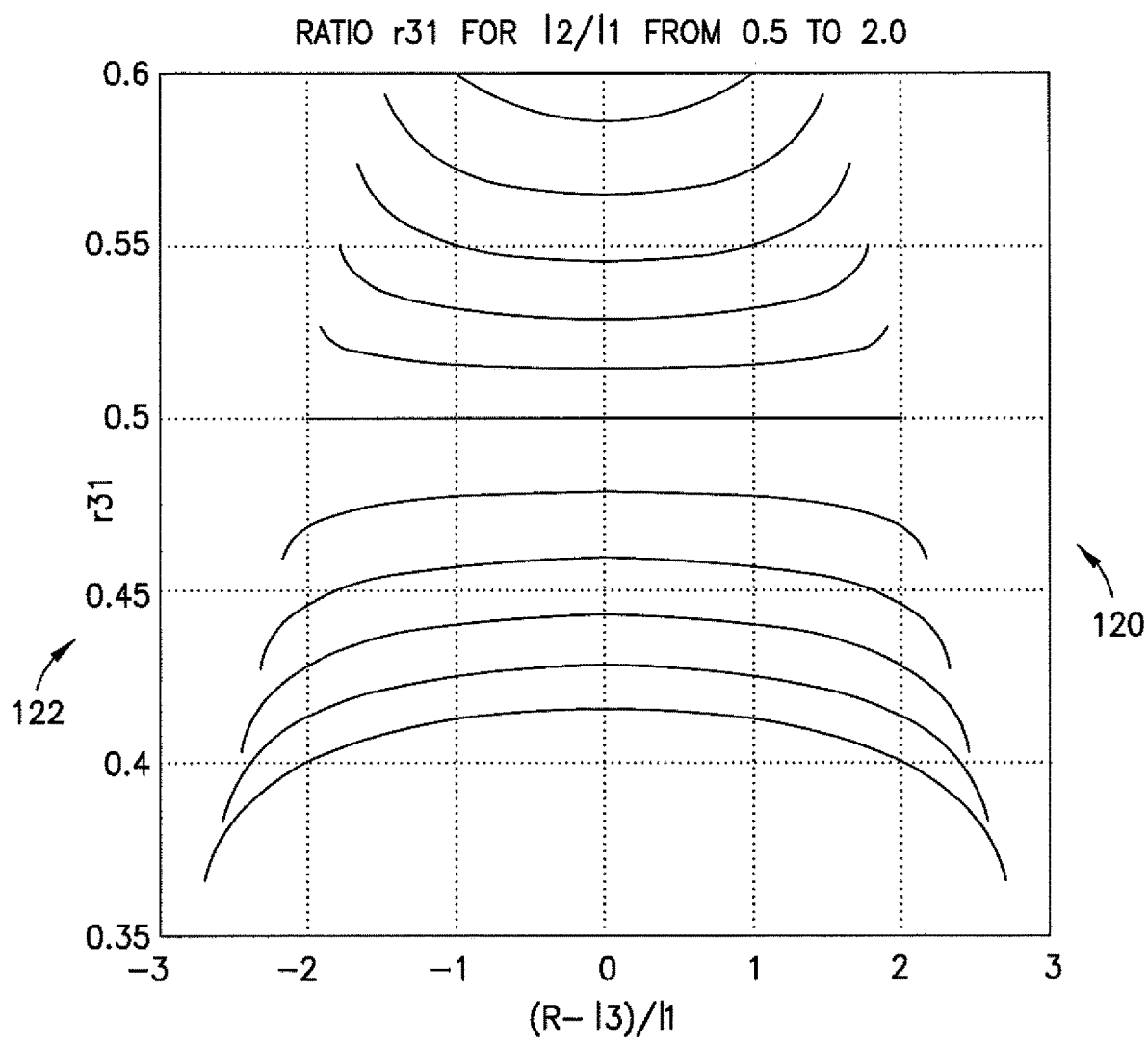
FIG. 4 is a graphical plot.

Referring also to FIGS. 2A and 2B, there are shown partial schematic top and side views respectively of system 10 showing the internal arrangements used to drive the individual links of arm 14 shown in FIGS. 1A and 1B. Drive 12 has first and second motors 52, 54 with corresponding first and second encoders 56, 58 coupled to housing 60 and respectively driving first and second shafts 62, 64. Here shaft 62 may be coupled to pulley 66 and shaft 64 may be coupled to upper arm 64 where shafts 62, 64 may be concentric or otherwise disposed. In alternate aspects, any suitable drive may be provided. Housing 60 may be in communication with chamber 68 where bellows 70, chamber 68 and an internal portion of housing 60 isolate a vacuum environment 72 from an atmospheric environment 74. Housing 60 may slide in a z direction as a carriage on slides 76 where a lead screw or other suitable vertical or linear z drive 78 may be provided to selectively move housing 60 and arm 14 coupled there to in a z 80 direction. In the embodiment shown, upper arm 16 is driven by motor 54 about the central axis of rotation 18. Similarly, forearm is driven by motor 52 through a band drive having pulleys 66, 82 and bands 84, 86 such as conventional circular pulleys and bands. In alternate aspects, any suitable structure may be provided to drive forearm 20 with respect to upper arm 16. The ratio between pulleys 66 and 82 may be 1:1, 2:1 or any suitable ratio. Third link 24 with the end-effector may be constrained by a band drive having pulley 88 grounded with respect to link 16, pulley 90 grounded with respect to end effector or third link 24 and bands 92, 94 constraining pulley 88 and pulley 90. As will be described, the ratio between pulleys 88, 90 may not be constant in order for third link 24 to track a radial path without rotation during extension and retraction of arm 14. This may be accomplished where pulleys 88, 90 may be one or more non circular pulleys, such as two non-circular pulleys or where one of pulley 88, 90 may be circular and the other being non circular. Alternately, any suitable coupling or linkage may be provided to constrain the path of third link or end effector 24 as described. In the embodiment shown, at least one non-circular pulley compensates for the effects of the unequal lengths of upper arm 16 and forearm 20 so that the end-effector 24 points radially 30 regardless of the position of the first two links 16, 20. The embodiment will be described with respect to pulley 90 being non circular and pulley 88 being circular. Alternately, pulley 88 may be non-circular and pulley 90 circular. Alternately, pulleys 88 and 92 may be non-circular or any suitable coupling may be provided to constrain the links of arm 14 as described. By way of example, non-circular pulleys or sprockets are described in U.S. Pat. No. 4,865,577 issued on Sep. 12, 1989 and entitled Noncircular Drive which is hereby incorporated by reference herein in its entirety. Alternately, any suitable coupling may be provided to constrain the links of arm 14 as described, for example, any suitable variable ratio drive or coupling, linkage gears or sprockets, cams or otherwise used alone or in combination with a suitable linkage or other coupling. In the embodiment shown, elbow pulley 88 is coupled to upper arm 16 and is shown round or circular where wrist pulley 90 coupled to wrist or third link 24 is shown non circular. The wrist pulley shape is non-circular and may have symmetry about a line 96 perpendicular to the radial trajectory 30 which also may coincide with or be parallel to the line between the two pulleys 88, 90 when the forearm 20 and upper arm 16 are lined up over each other with the wrist axis 26 closest to shoulder axis 18, for example as seen in FIG. 3B. The shape of pulley 90 is such that bands 92, 94 stay tight as arm 14 extends and retracts establishing points of tangency 98, 100 on opposing sides of pulley 90 having changing radial distances 102, 104 from the wrist axis of rotation 26. For example, at the orientation shown in FIG. 3B, each of the points of tangency 98, 100 of the two bands on the pulley is at an equal radial distance 102, 104 from the wrist axis of rotation 26. This will be further described with respect to FIG. 4 showing respective ratios. In order for arm 14 to rotate, both drive shafts 62, 64 of the robot need to move in the direction of rotation of the arm by the same amount. In order for the end-effector 24 to extend and retract radially along a straight-line path, the two drive shafts 62, 64 need to move in a coordinated manner, for example, in accordance with the exemplary inverse kinematic equations presented later in this section. Here, a substrate transport apparatus 10 is adapted to transport substrate 28. Forearm 20 is rotatably coupled to upper arm 16 and rotatable about elbow axis 22 being offset from central axis 18 by an upper arm link length. End effector 24 is rotatably coupled to forearm 20 and rotatable about wrist axis 26 offset from the elbow axis 22 by a forearm link length. Wrist pulley 90 is fixed to the end effector 24 and coupled to elbow pulley 88 with band 92, 94. Here, the forearm link length is different than the upper arm link length and the end effector is constrained with respect to the upper arm by the elbow pulley, the wrist pulley and the band such that the substrate moves along a linear radial path 30 with respect to the central axis 18. Here, substrate support 24 coupled to the upper arm 16 with a substrate support coupling 92 and driven about the wrist axis of rotation 26 by relative movement between the forearm 20 and the upper arm 16 about the elbow axis of rotation 22. FIGS. 3A, 3B and 3C illustrate extension motion of the robot of FIGS. 1 and 2. FIG. 3A shows the top view of the robot 10 with the arm 14 in its retracted position. FIG. 3B depicts the arm 14 partially extended with the forearm 20 aligned on top of the upper arm 16, illustrating that the lateral offset 38 of the end-effector corresponds to the difference of the joint-to-joint lengths of the forearm 20 and upper arm 16. FIG. 3C shows the arm 14 in an extended position although not full extension.

Exemplary direct kinematics may be provided. In alternate aspects, any suitable direct kinematics may be provided to correspond to alternative structure. The following exemplary equations may be used to determine the position of the end-effector as a function of the position of the motors:

$$x_2 = l_1 \cos \theta + l_2 \cos \theta_2 \quad (1.1)$$

$$y_2 = l_1 \sin \theta_1 + l_2 \sin \theta_2 \quad (1.2)$$

$$R_2 = \mathrm{sqrt}(x_2^2 + y_2^2) \quad (1.3)$$

$$T_2 = a \tan 2(y_2, x_2) \quad (1.4)$$

$$\alpha_3 = a \sin(d_3/R_2) \text{ where } d_3 = l_2 - l_1 \quad (1.5)$$

$$\alpha_{12} = \theta_1 - \theta_2 \quad (1.6)$$

If $\alpha_{12} < \pi$: $R = \mathrm{sqrt}(R_2^2 - d_3^2) + l_3, T = T_2 + \alpha_3$, else $R = -\mathrm{sqrt}(R_2^2 - d_3^2) + l_3, T = T_2 - \beta_3 + \pi$ \quad (1.7)

Exemplary inverse kinematics may be provided. In alternate aspects, any suitable inverse kinematics may be provided to correspond to alternative structure. The following exemplary equations may be utilized to determine the position of the motors to achieve a specified position of the end-effector:

$$x_3 = R \cos T \quad (1.8)$$

$$y_3 = R \sin T \quad (1.9)$$

$$x_2 = x_3 - l_3 \cos T + d_3 \sin T \quad (1.10)$$

$$y_2 = y_3 - l_3 \sin T - d_3 \cos T \quad (1.11)$$

$$R_2 = \mathrm{sqrt}(x_2^2 + y_2^2) \quad (1.12)$$

$$T_2 = a \tan 2(y_2, x_2) \quad (1.13)$$

$$\alpha_1 = a \cos((R_2^2 + l_1^2 - l_2^2)/(2R_2 l_1)) \quad (1.14)$$

$$\alpha_2 = a \cos((R_2^2 - l_1^2 + l_2^2)/(2R_2 l_2)) \quad (1.15)$$

If $R > l_3$: $\theta_1 = T_2 + \alpha_1, \theta_2 = T_2 - \alpha_2$, else: $\theta_1 = T_2 - \alpha_1, \theta_2 = T_2 + \alpha_2$ \quad (1.16)

The following nomenclature may be used in the kinematic equations:
 $d_3$=lateral offset of end-effector (m)
 $l_1$=join-to-joint length of first link (m)
 $l_2$=joint-to-joint length of second link (m)
 $l_3$=length of third link with end-effector, measured from wrist joint to reference point on end-effector (m)
 R=radial position of end-effector (m)
 $R_2$=radial coordinate of wrist joint (m)
 T=angular position of end-effector (rad)
 $T_2$=angular coordinate of wrist joint (rad)
 $x_2$=x-coordinate of wrist joint (m)
 $x_3$=x-coordinate of end-effector (in)
 $y_2$=y-coordinate of wrist joint (m)
 $y_3$=y-coordinate of end-effector (m)
 $\theta_1$=angular position of drive shaft coupled to first link (rad)
 $\theta_2$=angular position of drive shaft coupled to second link (rad)

The above exemplary kinematic equations may be used to design a suitable drive, for example, a band drive that constraints the orientation of the third link 24 so that the end-effector 24 points radially 30 regardless of the position of the first two links 16, 20 of the arm 14.

Referring to FIG. 4, there is shown a plot 120 of the transmission ratio $r_{31}$ 122 of the band drive that constraints the orientation of the third link as a function of normalized extension of the arm measured from the center of the robot to the root of the end-effector, i.e., $(R-l_3)/l_1$. The transmission ratio $r_{31}$ is defined as a ratio of the angular velocity of the pulley attached to the third link, $\omega_{32}$ over the angular velocity of the pulley attached to the first link, $\omega_{12}$, both defined relative to the second link. The figure graphs the transmission ratio $r_{31}$ for different $l_2/l_1$ (from 0.5 to 1.0 with increment of 0.1, and from 1.0 to 2.0 with increment of 0.2). The profile of the non-circular pulley(s) may be calculated to achieve the transmission ratio $r_{31}$ in accordance with FIG. 4, for example, the profile depicted in FIGS. 2A, 54A and 54B.

In the disclosed embodiment, a longer reach may be obtained compared to an equal-link arm with the same containment volume with the use of one or more with non-circular pulley(s) or other suitable device to constrain the end effector motion. In alternate aspects, the first link may be driven by a motor either directly or via any kind of coupling or transmission arrangement. Here, any suitable transmission ratio can be used. Alternately, the band drive that actuates the second link may be substituted by any other arrangement with an equivalent functionality, such as a belt drive, cable drive, gear drive, linkage-based mechanism or any combination of the above. Similarly, the band drive that constrains the third link may be substituted by any other suitable arrangement, such as a belt drive, cable drive, non-circular gears, linkage-based mechanism or any combination of the above. Here, the end-effector may but does not need to point radially. For example, the end effector may be positioned with respect to the third link with any suitable offset and point in any suitable direction. Further, in alternate aspects, the third link may carry more than one end-effector or substrate. Any suitable number of end-effectors and/or material holders can be carried by the third link. Further, in alternate aspects, the joint-to-joint length of the forearm can be smaller than the joint-to-joint length of the upper arm, for example, as seen represented by $l_2/l_1<1$ in FIG. 4 and as seen and described with respect to FIGS. 25-34 and 43-53.

Figure 5A:
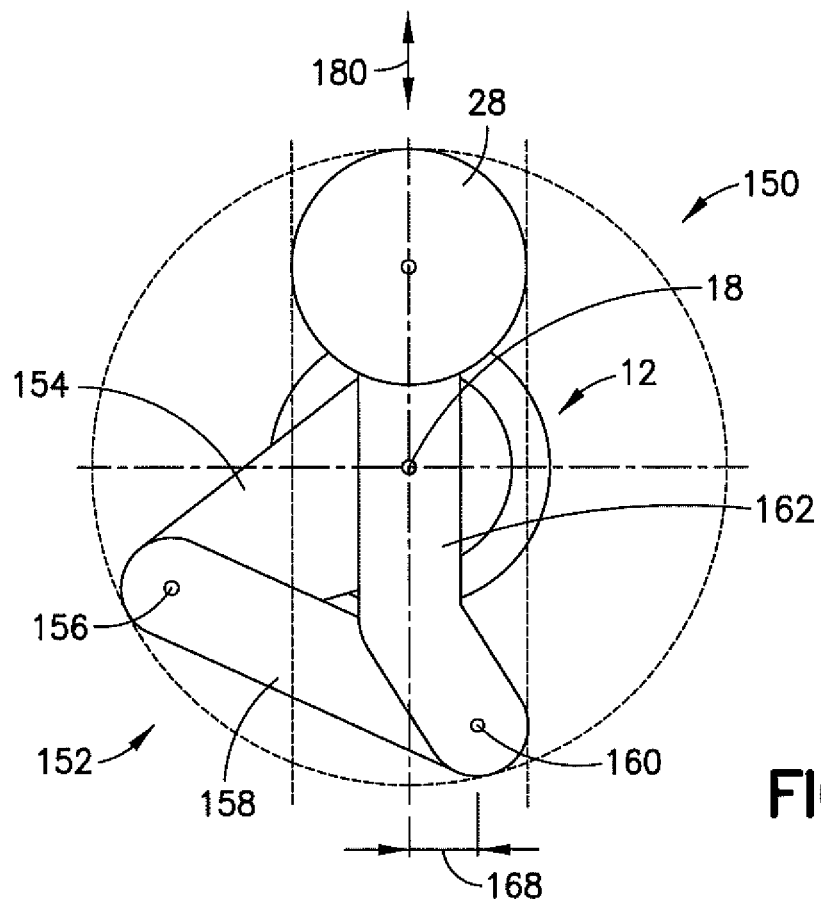
FIG. 5A is a top view of a transport apparatus.
Figure 5B:
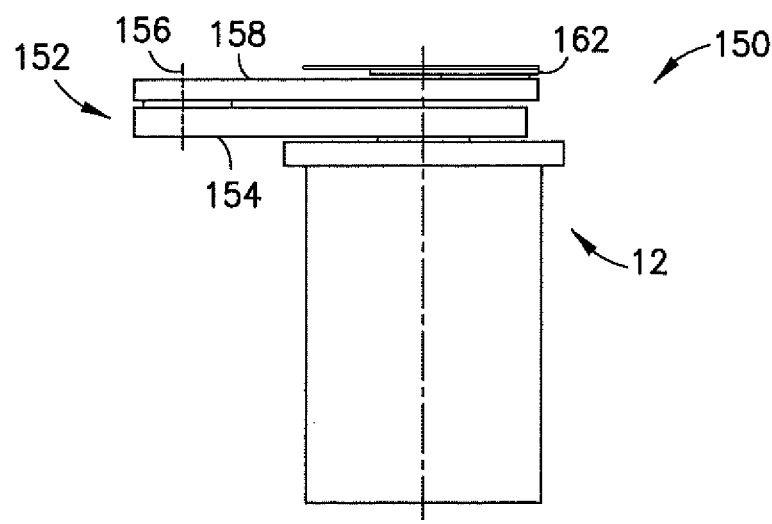
FIG. 5B is a side view of a transport apparatus.
Figure 6B:
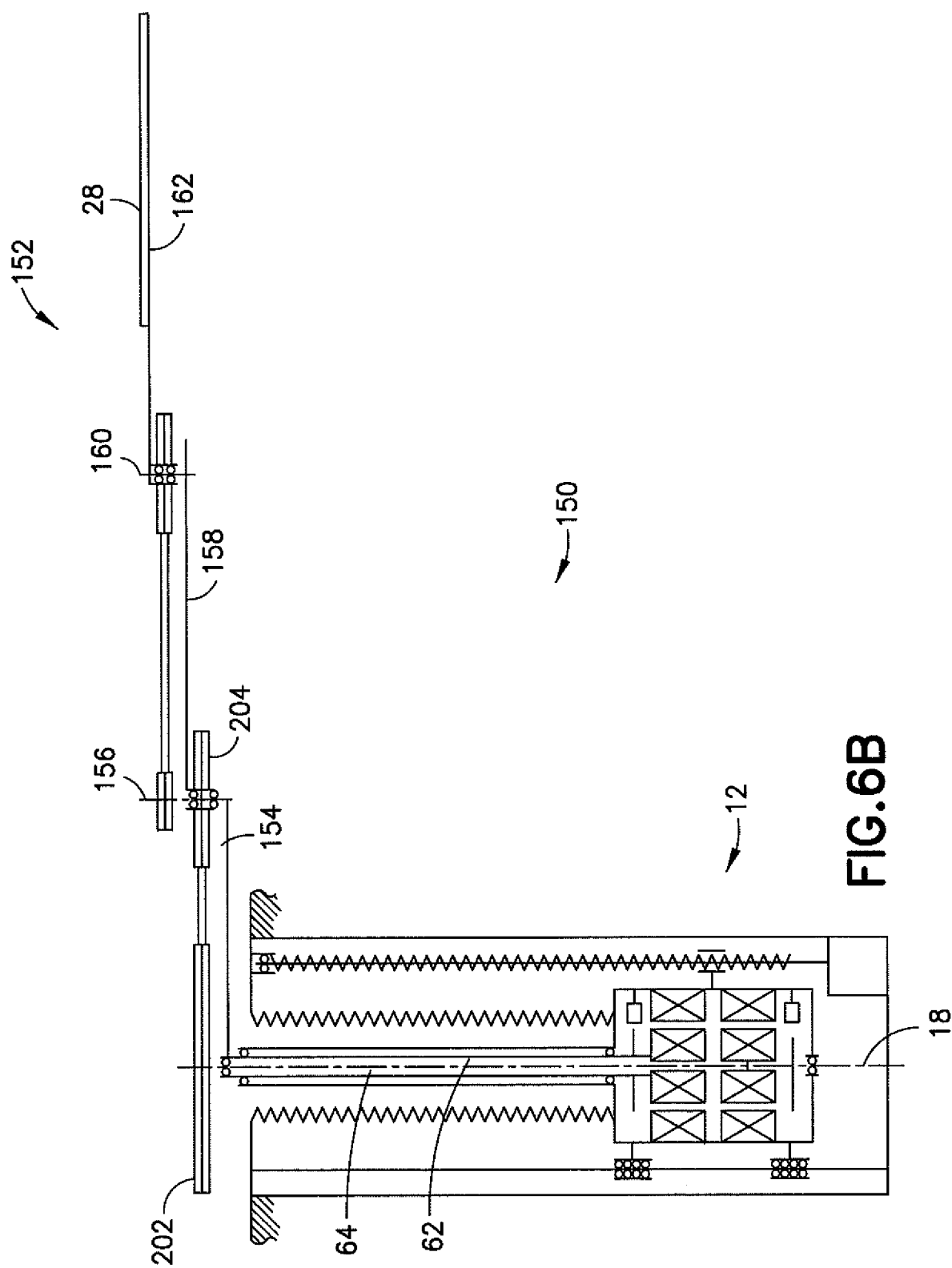
FIG. 6B is a side section partial schematic view of a transport apparatus.
Figure 8:
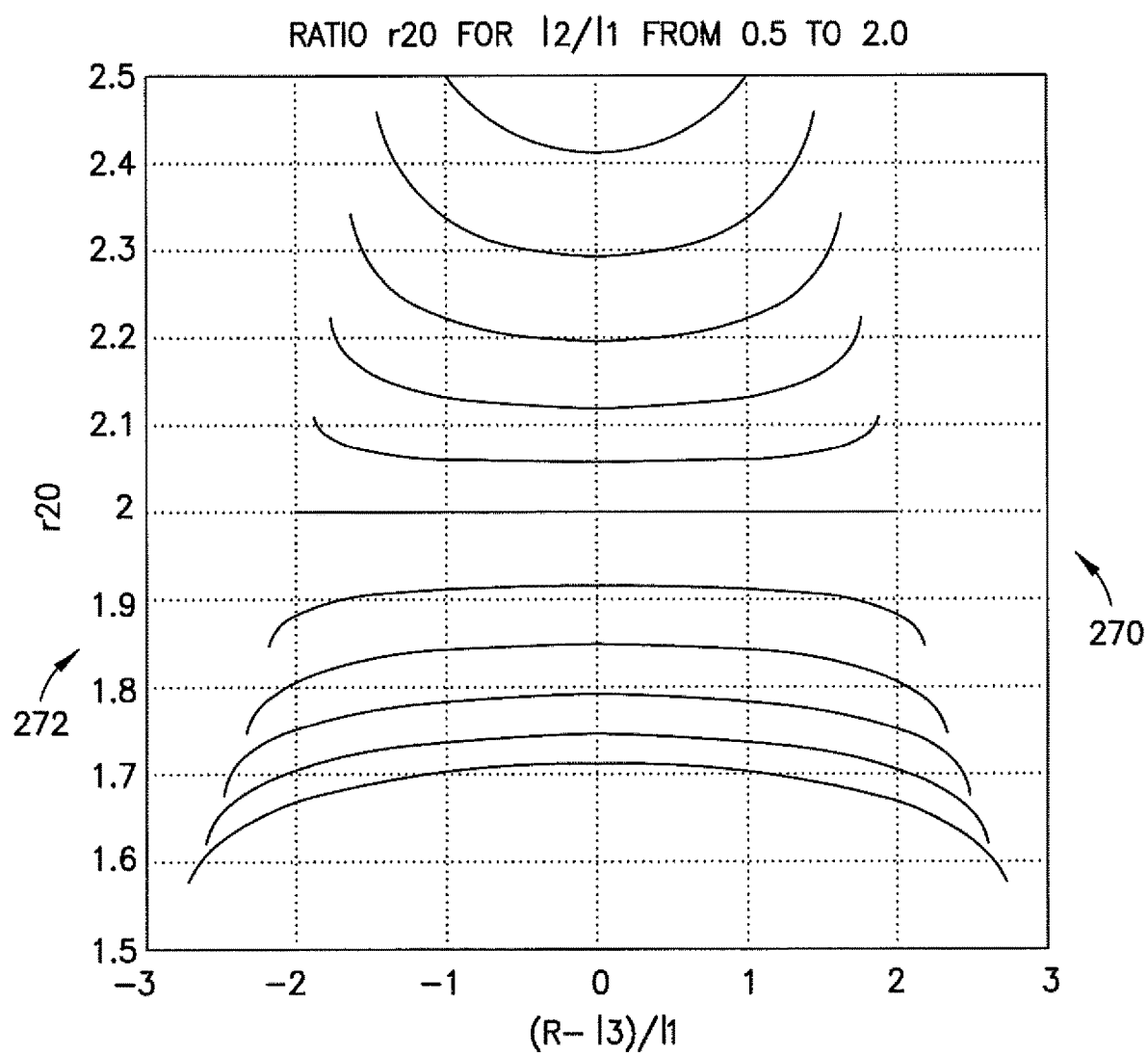
FIG. 8 is a graphical plot.

Referring now to FIGS. 5A and 5B, there are shown top and side views respectively of robot 150 incorporating some features of robot 10. Robot 150 is shown having drive 12 with arm 152 shown in a retracted position. Arm 152 has features similar to that of arm 14 except as described herein. By way of example, the joint-to-joint length of the forearm or second link 158 is larger than the joint-to-joint length of the upper arm or first link 154. Similarly, the lateral offset 168 of the end-effector or third link 162 corresponds to the difference of the joint-to-joint lengths of the forearm 158 and upper arm 154. Referring also to FIGS. 6A and 6B, there is shown drive 150 with the internal arrangements used to drive the individual links of the arm. In the embodiment shown, upper arm 154 is driven by one motor through shaft 64 as described with respect to arm 14 of FIGS. 1 and 2. Similarly, end effector or third link 162 is constrained with respect upper arm 154 by a non-circular pulley arrangement as described with respect to arm 14 of FIGS. 1 and 2. The exemplary difference between arm 152 and arm 14 is seen where forearm 158 is coupled via a band arrangement with at least one non-circular pulley to shaft 62 and another motor of drive 12. Here, the coupling or band arrangement may have features as described herein or as described with respect to pulley drive 88, 90 of FIGS. 1 and 2. The coupling or band arrangement has non circular pulley 202 coupled to shaft 62 of drive 12 and is rotatable about axis 18 with shaft 62. The band arrangement of arm 152 further has circular pulley 204 coupled to upper arm link 158 and rotatable about elbow axis 156. Circular pulley 204 is coupled to non-circular pulley 202 via bands 206, 208 where bands 206, 208 may be kept tight by virtue of the profile of non-circular pulley 202. In alternate aspects, any combination of pulleys or other suitable transmission may be provided. Pulleys 202 and 204 and bands 206, 208 cooperate such that rotation of upper arm 154 relative to pulley 202 (for example, holding pulley 202 stationary while rotating upper arm 154) causes wrist joint 160 to extend and retract along a straight line parallel to the desired radial path 180 of the end-effector and offset 168 from the path 180. Here, third link 162 with the end-effector is constrained by a band drive as described with respect to arm 14, for example, with at least one non-circular pulley so that the end-effector points radially 180 regardless of the position of the first two links 154, 158. Here, any suitable coupling may be provided to constrain the links of arm 14 as described, for example, one or more suitable variable ratio drive or coupling, linkage gears or sprockets, cams or otherwise used alone or in combination with a suitable linkage or other coupling. In the embodiment shown, elbow pulley 204 is coupled to fore arm 158 and is shown round or circular where shoulder pulley 202 coupled to shaft 62 is shown non circular. The shaft pulley shape is non-circular and may have symmetry about a line 218 perpendicular to the radial trajectory 180 which also may coincide with or be parallel to the line between the two pulleys 202, 204 when the forearm 158 and upper arm 154 are lined up over each other with the wrist axis 160 closest to shoulder axis 18, for example as seen in FIG. 7B. The shape of pulley 202 is such that bands 206, 208 stay tight as arm 152 extends and retracts establishing points of tangency 210, 212 on opposing sides of pulley 202 having changing radial distances 214, 216 from the shoulder axis of rotation 18. For example, at the orientation shown in FIG. 7B, each of the points of tangency 210, 212 of the two bands on the pulley is at an equal radial distance 214, 216 from the shoulder axis of rotation 18. This will be further described with respect to FIG. 8 showing respective ratios. In order for arm 152 to rotate, both drive shafts 62, 64 of the robot need to move in the direction of rotation of the arm by the same amount. In order for the end-effector 162 to extend and retract radially along a straight-line path, the two drive shafts 62, 64 need to move in a coordinated manner, for example, in accordance with the exemplary inverse kinematic equations presented later in this section, for example, the drive shaft coupled to the upper arm needs to move according to the inverse kinematic equations presented below while the other motor is kept stationary. FIGS. 7A, 7B and 7C illustrate extension motion of robot 150 of FIGS. 5 and 6. FIG. 7A shows the top view of the robot with the arm 152 in its retracted position. FIG. 7B depicts the arm partially extended with the forearm aligned on top of the upper arm, illustrating that the lateral offset 168 of the end-effector 162 that corresponds to the difference of the joint-to-joint lengths of the forearm 158 and upper arm 154. FIG. 7C shows the arm in an extended position although not full extension.

Exemplary direct kinematics may be provided. In alternate aspects, any suitable direct kinematics may be provided to correspond to alternative structure. The following exemplary equations may be used to determine the position of the end-effector as a function of the position of the motors:

$$d_1 = l_1 \sin(\theta_1 - \theta_2) \tag{2.1}$$

If $(\theta_1-\theta_2) < \pi/2$: $\theta_{21} = \theta_2 - l_2 a \sin((d_1+d_3)/l_2)$, else
$$\theta_{21} = \theta_2 + l_2 a \sin((d_1+d_3)/l_2) + \pi \tag{2.2}$$

$$x_2 = l_1 \cos\theta_1 + l_2 \cos\theta_{21} \tag{2.3}$$

$$y_2 = l_1 \sin\theta_1 + l_2 \sin\theta_{21} \tag{2.4}$$

$$R_2 = \mathrm{sqrt}(x_2^2 + y_2^2) \tag{2.5}$$

$$T_2 = a\tan 2(y_2, x_2) \tag{2.6}$$

If $(\theta_1-\theta_2) < \pi/2$: $R = \mathrm{sqrt}(R_2^2 - d_3^2) + l_3, T = \theta_2$, else
$$R = -\mathrm{sqrt}(R_2^2 - d_3^2) + l_3, T = \theta_2 \tag{2.7}$$

Exemplary inverse kinematics may be provided. In alternate aspects, any suitable inverse kinematics may be provided to correspond to alternative structure. The following exemplary equations may be utilized to determine the position of the motors to achieve a specified position of the end-effector:

$$x_3 = R\cos T \tag{2.8}$$

$$y_3 = R\sin T \tag{2.9}$$

$$x_2 = x_3 - l_3 \cos T + d_3 \sin T \tag{2.10}$$

$$y_2 = y_3 - l_3 \sin T - d_3 \cos T \tag{2.11}$$

$$R_2 = \mathrm{sqrt}(x_2^2 + y_2^2) \tag{2.12}$$

$$T_2 = a\tan 2(y_2, x_2) \tag{2.13}$$

$$\alpha_1 = a\cos((R_2^2 + l_1^2 - l_2^2)/(2R_2 l_1)) \tag{2.14}$$

If $R > l_3$: $\theta_1 = T_2 + \alpha_1, \theta_2 = T$, else: $\theta_1 = T_2 - \alpha_1, \theta_2 = T$ (2.15)

The following nomenclature is used in the kinematic equations:
$d_3$=lateral offset of end-effector (m)
$l_1$=join-to-joint length of first link (m)
$l_2$=joint-to-joint length of second link (m)
$l_3$=length of third link with end-effector, measured from wrist joint to reference point on end-effector (m)
R=radial position of end-effector (m)
$R_2$=radial coordinate of wrist joint (m)
T=angular position of end-effector (rad)
$T_2$=angular coordinate of wrist joint (rad)
$x_2$=x-coordinate of wrist joint (m)
$x_3$=x-coordinate of end-effector (m)
$y_2$=y-coordinate of wrist joint (m)
$y_3$=y-coordinate of end-effector (m)
$\theta_1$=angular position of drive shaft coupled to first link (rad)
$\theta_2$=angular position of drive shaft coupled to second link (rad).

The above kinematic equations may be used to design the band drive that controls the second link 158 so that rotation of the upper arm 154 causes the wrist joint 160 to extend and retract along a straight line parallel to the desired radial path 180 of the end-effector 162.

Referring now to FIG. 8, there is shown a graph 270 that shows the transmission ratio $r_{20}$ 272 of the band drive that drives the second link as a function of normalized extension of the arm measured from the center of the robot to the root of the end-effector, i.e., $(R-l_3)/l_1$. The transmission ratio $r_{20}$ is defined as a ratio of the angular velocity of the pulley attached to the second link, $\omega_{21}$, over the angular velocity of the pulley attached to the second motor, $\omega_{01}$, both defined relative to the first link. The figure graphs the transmission ratio $r_{20}$ for different $l_2/l_1$.

The profile of the non-circular pulley(s) for the band drive that drives the second link is calculated to achieve the transmission ratio $r_{20}$ 272 in accordance with FIG. 8. An example pulley profile is depicted in FIG. 6A and as will be described with respect to FIGS. 55A and 55B.

The transmission ratio $r_{31}$ of the band drive that constraints the orientation of the third link 168 may be the same as depicted in FIG. 4 for the embodiment of FIGS. 1 and 2. The transmission ratio $r_{31}$ is defined as a ratio of the angular velocity of the pulley attached to the third link, $\omega_{32}$, over the angular velocity of the pulley attached to the first link, $\omega_{12}$, both defined relative to the second link. The figure graphs the transmission ratio $r_{31}$ for different $l_2/l_1$ (from 0.5 to 1.0 with increment of 0.1, and from 1.0 to 2.0 with increment of 0.2). The profile of the non-circular pulley(s) for the band drive that constrains the third link 162 may be calculated to achieve the transmission ratio $r_{31}$ in accordance with FIG. 4. An example pulley profile is depicted in FIG. 6A.

Figure 9:
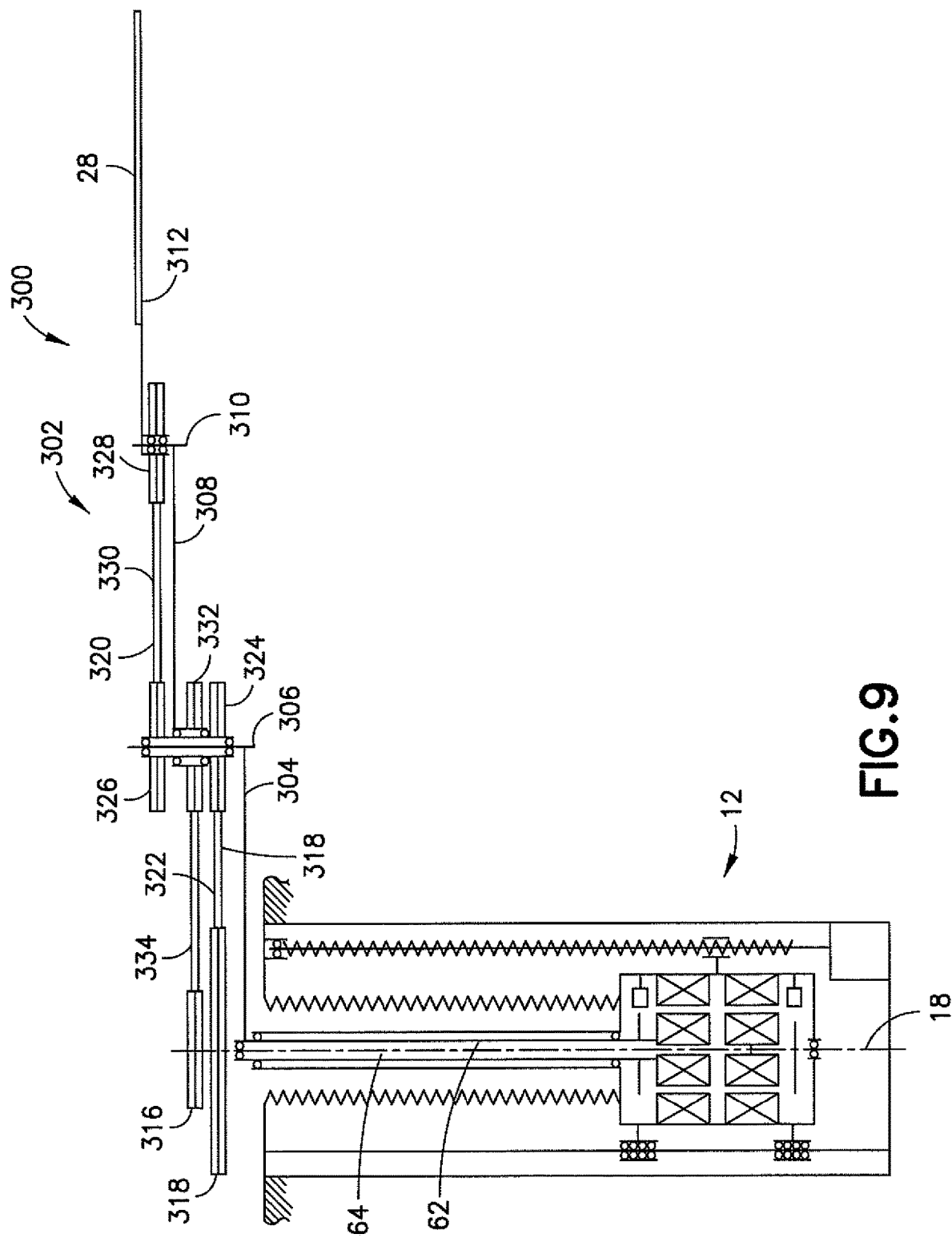
FIG. 9 is a side section partial schematic view of a transport apparatus.

In the embodiment shown, a longer reach may be obtained as compared to an equal-link arm with the same containment volume while using non-circular pulleys or other suitable mechanism to constrain the end effector as described. As compared to the embodiment disclosed in FIGS. 1 and 2, one more band drive with non-circular pulleys may be in place of conventional one at shoulder axis 18. In alternate aspects, the first link may be driven by a motor either directly or via any kind of coupling or transmission arrangement, for example, any suitable transmission ratio may be used. Alternately, the band drives that actuate the second link and constrain the third link may be substituted by any other arrangement with an equivalent functionality, such as a belt drive, cable drive, non-circular gears, linkage-based mechanism or any combination of the above. Further, the third link may be constrained to keep the end-effector radial via a conventional two stage band arrangement that synchronizes the third link to the pulley driven by the second motor, as illustrated in FIG. 9. Alternatively, the two stage band arrangement may be substituted by any other suitable arrangement, such as a belt drive, cable drive, gear drive, linkage-based mechanism or any combination of the above. In addition, the end-effector may but does not need to point radially. For example, the end effector may be positioned with respect to the third link with any suitable offset and point in any suitable direction. In alternate aspects, the third link may carry more than one end-effector or substrate. Here, any suitable number of end-effectors and/or material holders can be carried by the third link. Further, the joint-to-joint length of the forearm may be smaller than the joint-to-joint length of the upper arm, for example, as represented by $l_2/l_1 < 1$ in FIG. 8.

Referring now to FIG. 9, there is shown an alternative robot 300 where the third link may be constrained to keep the end-effector radial via a conventional two stage band arrangement that synchronizes the third link to the pulley driven by the second motor. Robot 300 is shown having drive 12 and arm 302. Arm 302 may have upper arm or first link 304 coupled to shaft 64 and rotatable about central or shoulder axis 18. Arm 302 has forearm or second link 308 rotatably coupled to upper arm 304 at elbow axis 306. Links 304, 308 may have unequal lengths as previously described. Third link or end effector 312 is rotatably coupled to second link or forearm 308 at wrist axis 310 where end effector 312 may transport a substrate 28 along a radial path without rotation with links 304, 308 having unequal link lengths as previously described. In the embodiment shown, shaft 62 is coupled to two pulleys, 314, 316 where pulley 314 may be circular and where pulley 316 may be non-circular. Here, circular pulley 314 constrains the third link 312 to keep the end-effector 312 radial via a conventional two stage 318, 320 circular band arrangement that synchronizes the third link 312 to the pulley driven by shaft 314. The two stage arrangement 318, 320 has pulley 314 coupled by bands 322 to elbow pulley 324 that is coupled to elbow pulley 326 where elbow pulley 326 is coupled to wrist pulley 328 via bands 330. Forearm 308 may further have elbow pulley 332 that may be circular and coupled to shoulder pulley 316 through bands 334 where shoulder pulley may be non-circular and coupled to pulley 314 and shaft 62.

The disclosed embodiment may be further embodied with respect to robots having robot drives with additional axis and where the arms coupled to the robot drive may have independently operable additional end effectors capable of carrying one or more substrates. By way of example, arms with two independently operable arms linkages or "dual arm" configurations may be provided where each independently operable arm may have an end effector adapted to support one, two or any suitable number of substrates. Here and as will be described below, each independently operable arm may have first and second links having different link lengths and where the end effector and supported substrate coupled to the links operate and track as described above. Here, a substrate transport apparatus may transport first and second substrates and having first and second independently moveable arm assemblies coupled to a drive section on a common axis of rotation. First and second substrate supports are coupled to the first and second arm assemblies respectively on first and second wrist axis of rotation. One or both of the first and second arm assemblies rotate about the common axis of rotation during extension and retraction. The first and second wrist axis of rotation move along first and second wrist paths parallel to and offset from a radial path relative to the common axis of rotation during extension and retraction. The first and second substrate supports move parallel to the radial path during extension and retraction without rotation. Variations on the disclosed embodiment having multiple and independently operable arms are provided below where in alternate aspects any suitable combination of features may be provided.

Figure 10A:
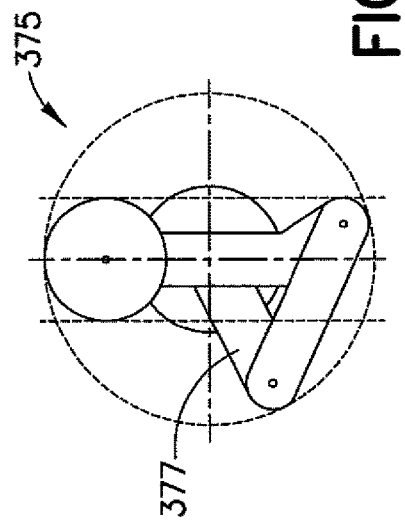
FIG. 10A is a top view of a transport apparatus.
Figure 11A:
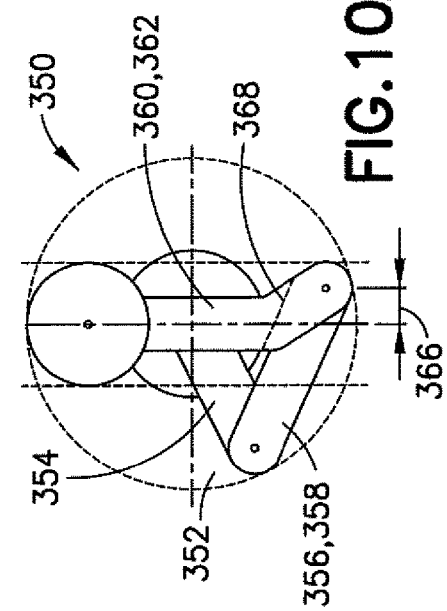
FIG. 11A is a top view of a transport apparatus.
Figure 10B:
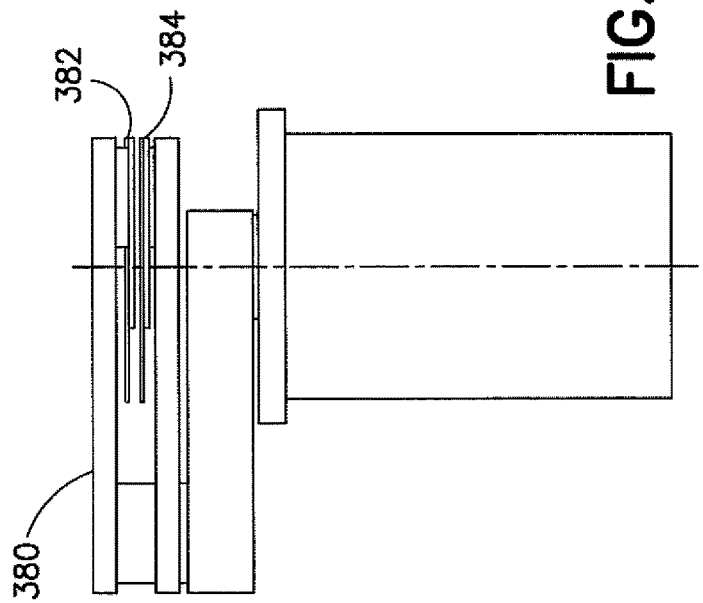
FIG. 10B is a side view of a transport apparatus.
Figure 11B:
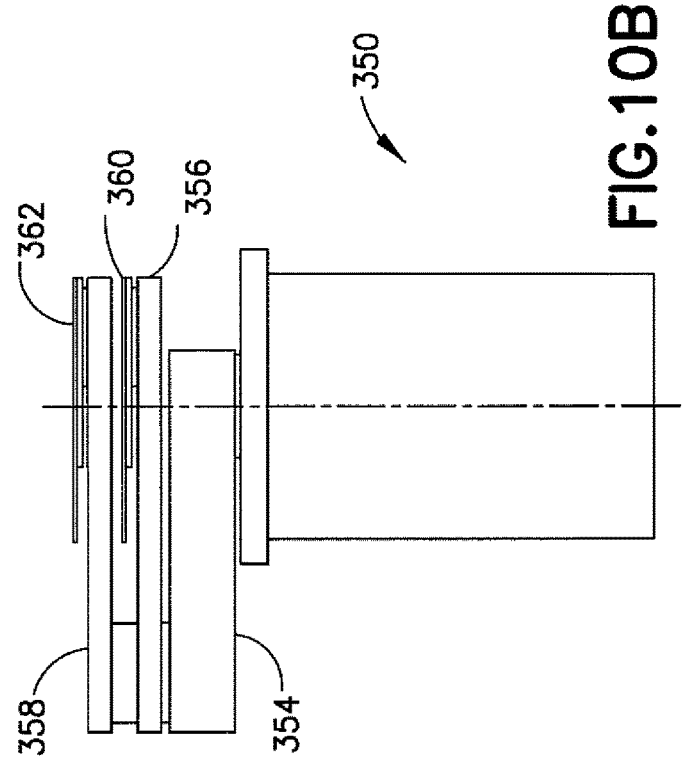
FIG. 11B is a side view of a transport apparatus.
Figure 12:
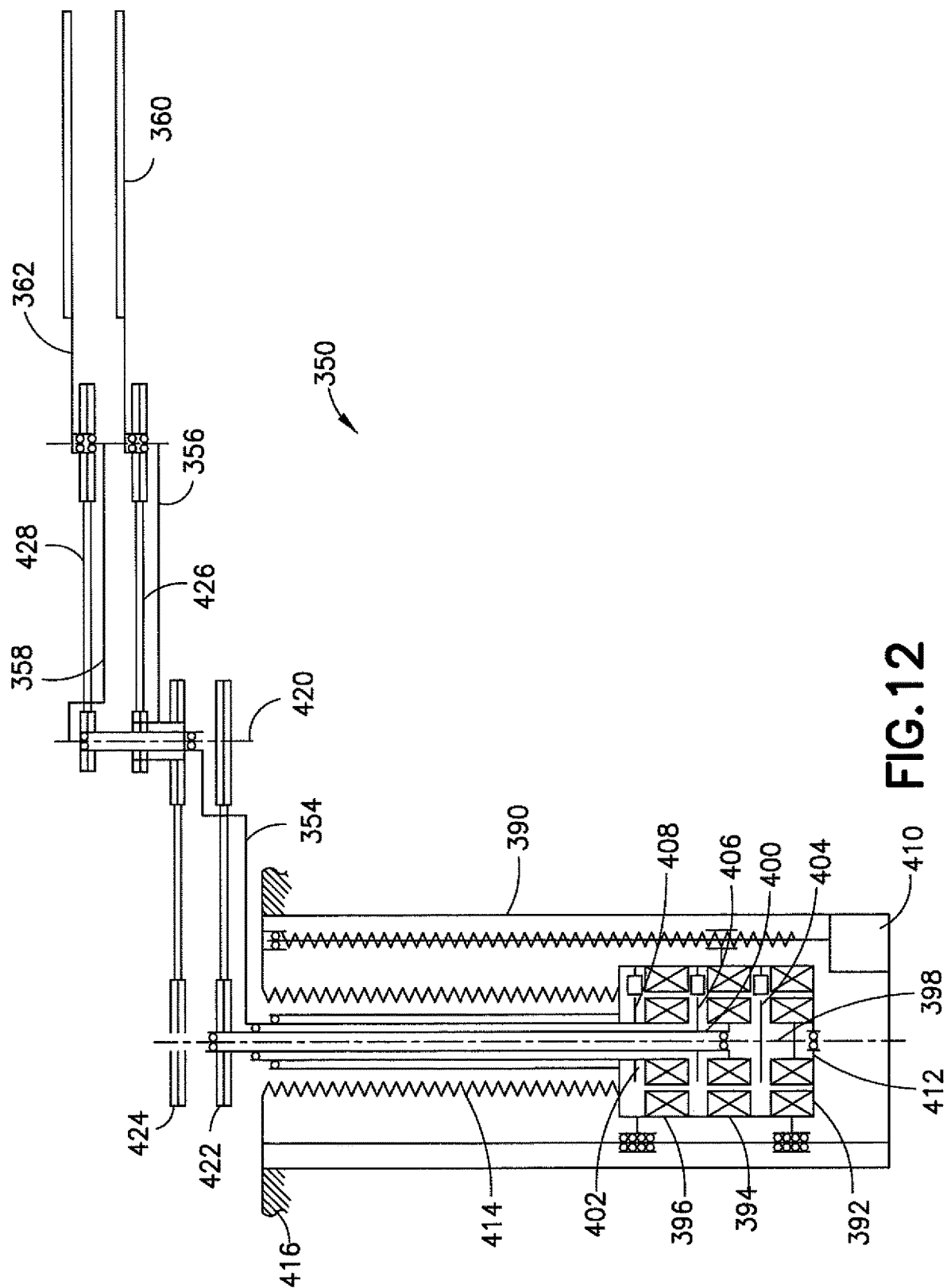
FIG. 12 is a side section partial schematic view of a transport apparatus.

Referring now to FIGS. 10A and 10B, there are shown top and side views respectively of robot 350 with a dual arm arrangement. Robot 350 has arm 352 having a common upper arm 354 and independently operable forearms 356, 358 each having respective end effectors 360, 362. In the embodiment shown, both linkages are shown in their retracted positions. The lateral offset of the end-effectors 366 corresponds to the difference of the joint-to-joint lengths of the forearm 354 and upper arms 356, 358. In the embodiment shown, the upper arms may have the same length and being longer than the forearm. Further, end effectors 360, 362 are positioned above forearms 356, 358. Referring now to FIGS. 11A and 11B show top and side views respectively of a robot 375 with the arm in an alternative configuration. In the embodiment shown, arm 377 may have features as described with respect to FIGS. 10A and 10B with both linkages are shown in their retracted positions. In this configuration, the third link with the end-effector 382 of the upper linkage is suspended underneath the forearm 380 to reduce vertical spacing between the two end-effectors 382, 384. Here, a similar effect may be achieved by stepping 368 the top end-effector 360 of the configuration of FIGS. 10A and 10B down. Referring also to FIGS. 12 and 13 there is shown the internal arrangements of robots 350, 375 respectively used to drive the individual links of the arms of FIGS. 10 and 11, respectively. In the embodiment shown, drive 390 may have first second and third driving motors 392, 394, 396 that may be rotor stator arrangements driving concentric shafts 398, 400, 402 respectively and having position encoders 404, 406, 408 respectively. Z drive 410 may drive the motors in a vertical direction where the motors may be contained partially or completely within housing 412 and where bellows 414 seals an internal volume of housing 412 to chamber 416 and where the internal volume and an interior of chamber 416 may operate within an isolated environment such as vacuum or otherwise. In the embodiment shown, the common upper arm 354 is driven by one motor 396. Each of the two forearms 356, 358 pivot on a common axis 420 at the elbow of upper arm 354 and are driven independently by motors 394, 396 respectively through band drives 422, 424 respectively that may have conventional pulleys. The third links with the end-effectors 360, 362 are constrained by band drives 426, 428 respectively, each with at least one non-circular pulley, which compensate for the effects of the unequal lengths of the upper arms and forearms. Here, the band drives in each of the linkages may be designed using the methodology described for FIGS. 1 and 2 and where the kinematic equations presented for FIGS. 1 and 2 may also be used for each of the two linkages of the dual arm. In order for the arm to rotate, all three drive shafts 398, 400, 402 of the robot need to move in the direction of rotation of the arm by the same amount. In order for one of the end-effectors to extend and retract radially along a straight-line path, the drive shaft of the common upper arm and the driveshaft coupled to the forearm associated with the active end effector need to move in a coordinated manner in accordance with the inverse kinematic equations for FIGS. 1 and 2. At the same time, the driveshaft coupled to the other forearm needs to rotate in synch with the drive shaft of the common upper arm in order for the inactive end-effector to remain retracted. Referring also to FIGS. 14A, 14B and 14C there is shown the arm of FIGS. 11A and 11B as the upper and lower linkages extend. Here, the inactive linkage 356, 360 rotates while the active linkage 358, 362 extends. By way of example, the upper linkage 358, 362 rotates as the lower linkage 356, 360 extends, and the lower linkage 356, 360 rotates as the upper linkage 358, 362 extends. In the disclosed embodiment of FIGS. 10 and 11, set up and control may be simplified where the arm arrangement may be used on a coaxial drive with no dynamic seals while providing a longer reach compared to equal-link length arms with the same containment volume. Here, no bridge is used to support any of the end-effectors. In the embodiment shown, the inactive arm rotates while the active one extends. One of the wrist joints travels above the lower end-effector (closer to wafer than in an equal-link arrangement).

Figure 15A:
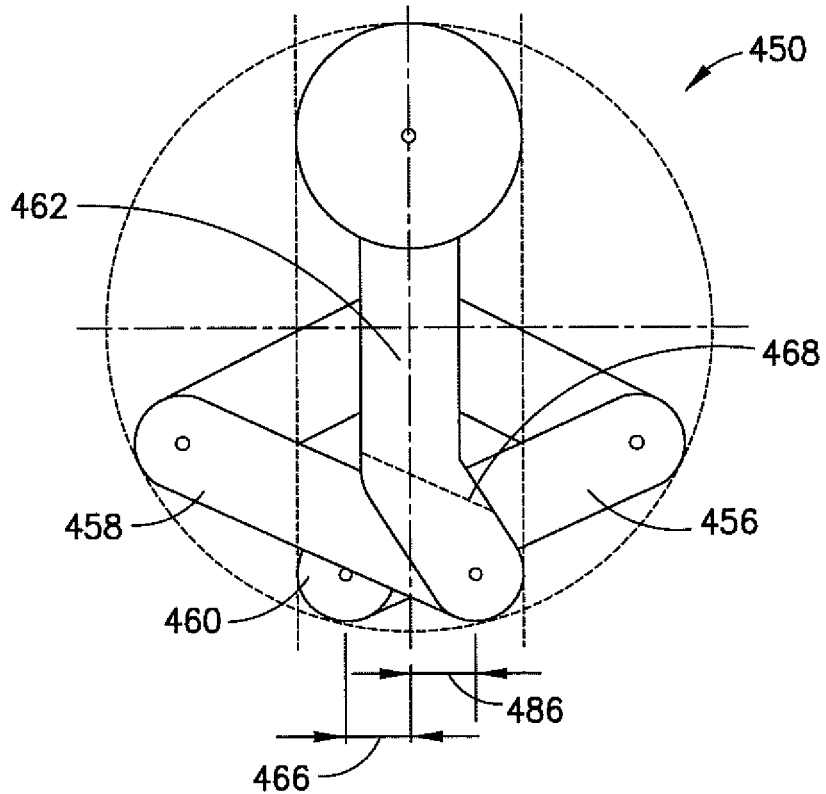
FIG. 15A is a top view of a transport apparatus.
Figure 15B:
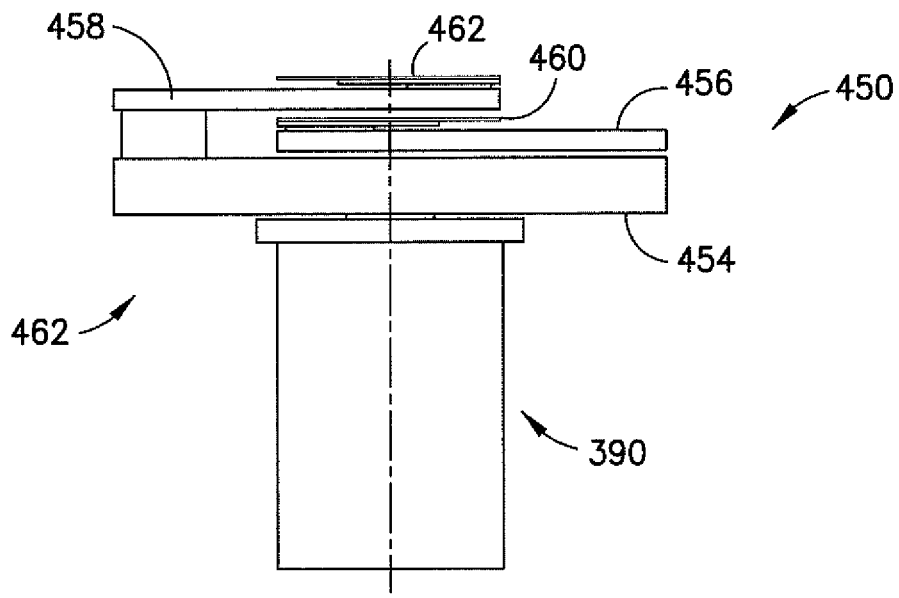
FIG. 15B is a side view of a transport apparatus.
Figure 17A:
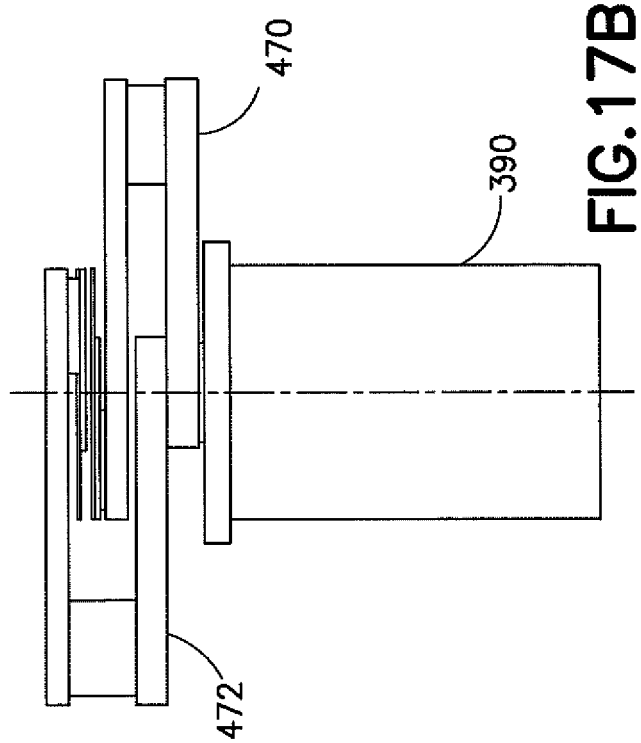
FIG. 17A is a top view of a transport apparatus.
Figure 17B:
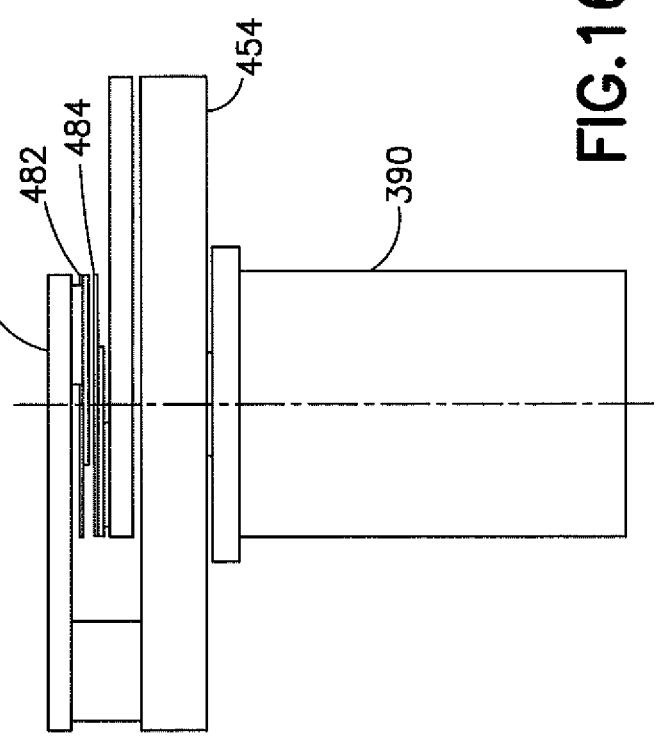
FIG. 17B is a side view of a transport apparatus.
Figure 16A:
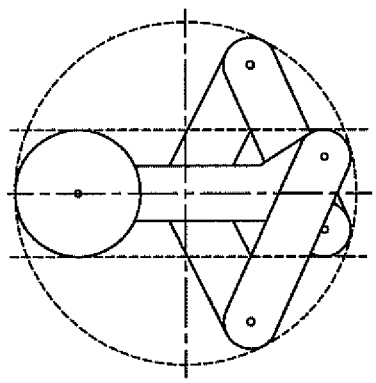
FIG. 16A is a top view of a transport apparatus.
Figure 16B:
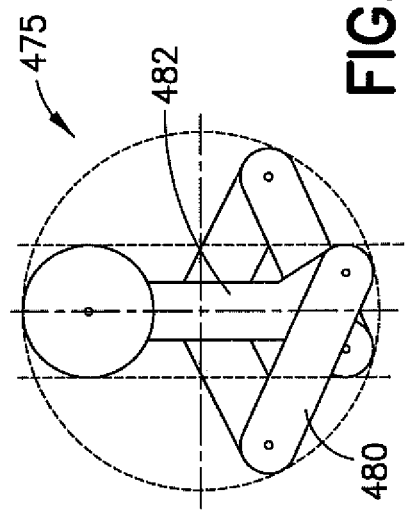
FIG. 16B is a side view of a transport apparatus.

Referring now to FIGS. 15A and 15B, there are shown top and side views respectively of robot 450 with a dual arm arrangement. Robot 450 has arm 452 having a common upper arm 454 and independently operable forearms 456, 458 each having respective end effectors 460, 462. In the embodiment shown, both linkages are shown in their retracted positions. The lateral offset of the end-effectors 466 corresponds to the difference of the joint-to-joint lengths of the forearm 454 and upper arms 456, 458. In the embodiment shown, the upper arms may have the same length and being longer than the forearm. Further, end effectors 460, 462 are positioned above forearms 456, 458. Referring also to FIGS. 16A and 16B show the top and side views of the robot 475 with the arm in an alternative configuration. Again, both linkages are shown in their retracted positions. In this configuration, the third link and the end-effector 482 of the left linkage is suspended underneath the forearm 480 to reduce vertical spacing between the two end-effectors 482, 484. A similar effect can be achieved by stepping 468 the top end-effector of the configuration of FIGS. 15A and 15B down. Alternatively, a bridge can be used to support one of the end-effectors. The combined upper arm link 454 may be a single piece as depicted in FIGS. 15 and 16 or it can be formed by two or more sections 470, 472, as shown in the example of FIGS. 17A and 17B. Here, a two-section design may be provided as lighter and using less material, with the left 472 and right 470 sections may be identical components. Here, a two piece design may also have provisions for adjustment of the angular offset between the left and right sections, which may be convenient when different retracted positions need to be supported. Referring also to FIGS. 18 and 19, there is shown the internal arrangements used to drive the individual links of the arm of FIGS. 15 and 16, respectively. The combined upper arm 554 is shown driven by one motor with shaft 402. Each of the two forearms 456, 458 is driven independently by one motor each via shafts 400, 398 respectively through band drives 490, 492 with conventional pulleys. Here, links 456, 458 rotate on separate axis' 494, 496 respectively. The third links with the end-effectors 460, 462 are constrained by band drives 498, 500 respectively, each with at least one non-circular pulley, which compensate for the effects of the unequal lengths of the upper arms and forearms. Here, band drives 498, 500 in each of the linkages 456, 460 and 458, 462 are designed using the methodology described for FIGS. 1 and 2. Here, the kinematic equations presented for FIGS. 1 and 2 may also be used for each of the two linkages 456, 460 and 458, 462 of the dual arm. In order for the arm 452 to rotate, all three drive shafts 398, 400, 402 of the robot need to move in the direction of rotation of the arm by the same amount. In order for one of the end-effectors to extend and retract radially along a straight-line path, the drive shaft of the common upper arm and the driveshaft coupled to the forearm associated with the active end effector need to move in a coordinated manner in accordance with the inverse kinematic equations presented with respect to FIGS. 1 and 2. At the same time, the driveshaft coupled to the other forearm needs to rotate in synch with the drive shaft of the common upper arm in order for the inactive end-effector to remain retracted. Referring also to FIGS. 20A, 20B and 20C, there is shown the arm of FIGS. 16A and 16B as the left 458, 462 and right 456, 460 linkages extend. Note that the inactive linkage 456, 460 rotates while the active linkage 458, 462 extends. Here, the right linkage 456, 460 rotates as the left linkage 458, 462 extends, and the left linkage 458, 462 rotates as the right linkage 456, 460 extends. The embodiment shown leverages the benefits of a solid link design being easy to set up and control and the coaxial drive, for example, with no dynamic seals while providing a longer reach compared to equal-link arms with the same containment volume. Here, no bridge is used to support any of the end-effectors. Here, the inactive arm rotates while the active one extends. One of the wrist joints travels above the lower end-effector, closer to the wafer than in an equal-link arrangement. This can be avoided by using a bridge (not shown) to support the top end-effector. In this case, the unsupported length of the bridge may be longer compared to an equal-link arm design. Further, the retract angle may be more difficult to change compared to the configuration with common elbow joint, for example, as seen in FIGS. 10 and 11 and independent dual arm, for example, as seen in FIGS. 21 and 22.

Referring now to FIGS. 21A and 21B, there is shown top and side views respectively of robot 520 with independent dual arms 522, 524. In the embodiment shown, both linkages 522, 524 are shown in their retracted positions. Arm 522 has independently operable upper arm 526, forearm 528 and third link with end effector 530. Arm 524 has independently operable upper arm 532, forearm 534 and third link with end effector 536. In the embodiment shown, forearms 528, 534 are shown longer than upper arms 526, 532 where end effectors 530, 536 are positioned above forearms 528, 534 respectively. Referring also to FIGS. 22A and 22B show the top and side views of robot 550 with features similar to that of robot 520 with the arm in an alternative configuration and with both linkages shown in their retracted positions. In this configuration, the third link and the end-effector 552 of the left linkage is suspended underneath the forearm 554 to reduce vertical spacing between the two end-effectors. A similar effect can be achieved by stepping the top end-effector of the configuration of FIG. 21 down. Alternatively, a bridge can be used to support one of the end-effectors. In FIGS. 21 and 22, the right upper arm 532 is located below the left upper arm 526. Alternatively, the left upper may be located above the right upper arm, for example, where one linkage can be nested within the other. Referring also to FIG. 23, there is shown the internal arrangements used to drive the individual links of the arm of FIGS. 21A and 21B. Here, for graphical clarity, to avoid overlap of components, the elevations of the links are adjusted. Each of the two upper arms 526, 532 is driven independently by one motor each through shafts 398, 402 respectively. The forearms 528, 534 are coupled via band arrangements 570, 572, each with at least one non-circular pulley, to a third motor via shaft 400. The third links 530, 536 with the end-effectors are constrained by band drives 574, 576, each with at least one non-circular pulley. The band drives are designed so that rotation of one of the upper arms 526, 532 causes the corresponding linkage 528, 530 and 534, 536 respectively to extend and retract along a straight line while the other linkage remains stationary. The band drives in each of the linkages may be designed using the methodology described with respect to FIGS. 5 and 6 where the kinematic equations presented for FIGS. 5 and 6 can also be used for each of the two linkages of the dual arm. In order for the arm to rotate, all three drive shafts 398, 400, 402 of the robot need to move in the direction of rotation of the arm by the same amount. In order for one of the end-effectors to extend and retract radially along a straight-line path, the drive shaft of the upper arm associated with the active end-effector needs to be rotated according to the inverse kinematic equations for FIGS. 5 and 6 and the other two drive shafts need to be kept stationary. Referring also to FIGS. 24A, 24B and 24C, there is shown the arm of FIG. 22 as the left 522 and right 524 linkages extend. Note that the inactive linkage 524 remains stationary while the active linkage 522 extends. That is, the left linkage 522 does not move while the right linkage 524 extends, and the right linkage 524 does not move when the left linkage 522 extends. The embodiment shown provides a longer reach compared to equal-link arm design with the same containment volume. Here, no bridge is used to support any of the end-effectors and the inactive linkage remains stationary while the active one extends potentially leading to higher throughput as active linkage may extend or retract faster with no load. The embodiment shown may be more complex than shown in FIGS. 15 and 16 with two more band drives with non-circular pulleys in place of conventional ones. One of the wrist joints travels above the lower end-effector as seen in FIG. 24. This can be avoided by using a bridge (not shown) to support the top end-effector. In this case, the unsupported length of the bridge is longer compared to an equal-link arm design.

Figure 25A:
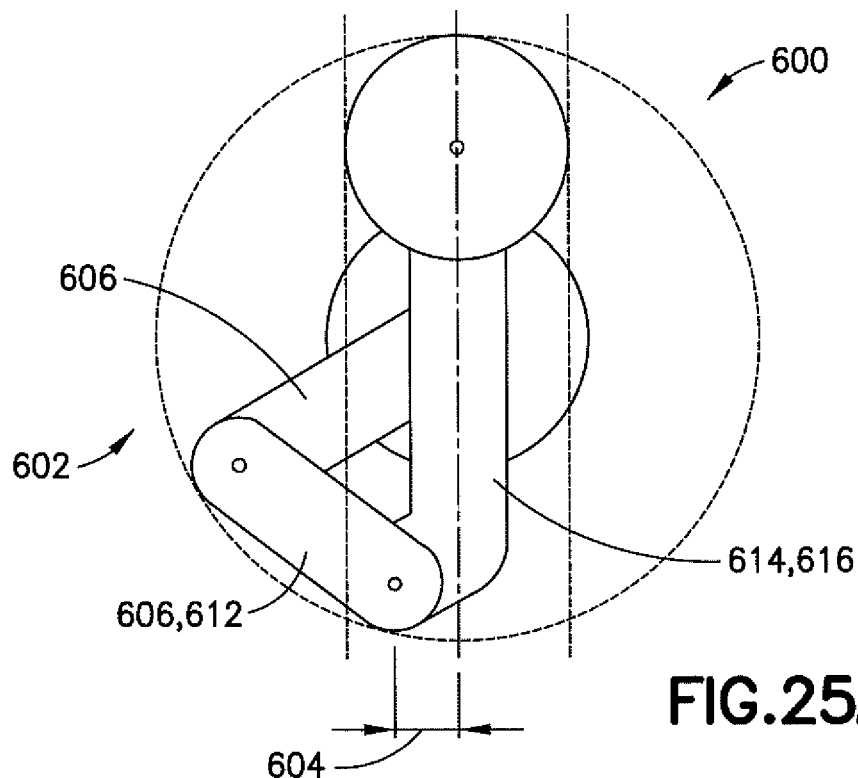
FIG. 25A is a top view of a transport apparatus.
Figure 25B:
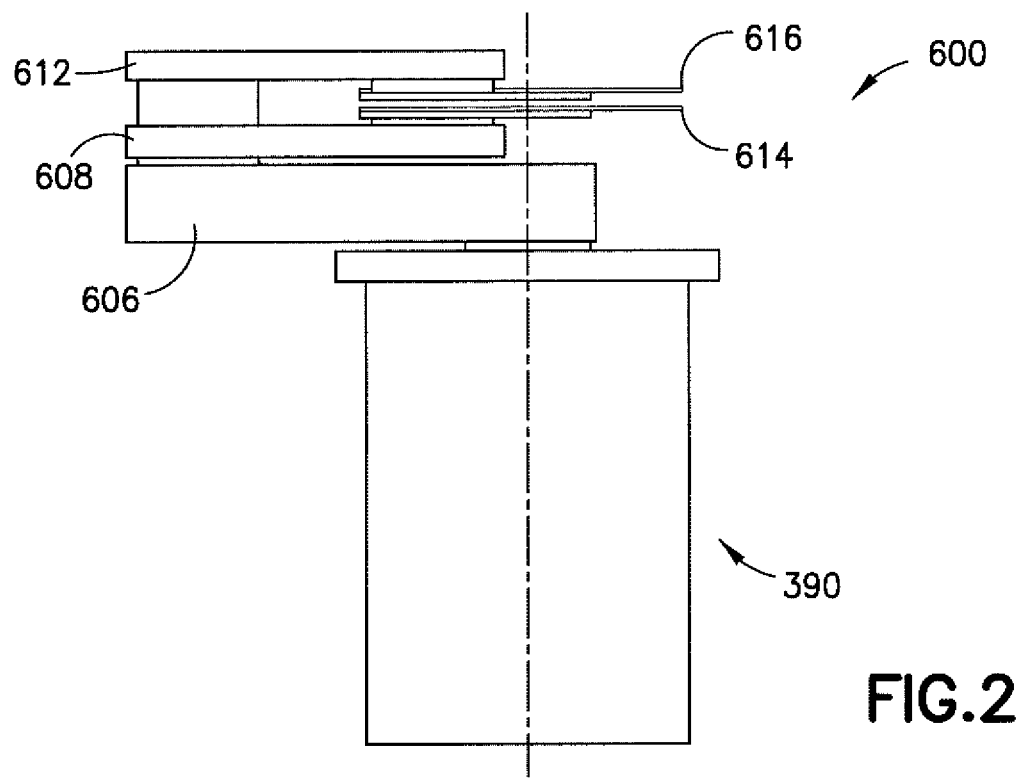
FIG. 25B is a side view of a transport apparatus.

Referring now to FIGS. 25A and 25B, there are shown top and side views respectively of robot 600 with arm 602. In the embodiment shown, both linkages are shown in their retracted positions. The lateral offset of the end-effectors 604 corresponds to the difference of the joint-to-joint lengths of the upper arm 606 and forearms 608, 612 where in this embodiment, forearms 608, 612 are shorter than the common upper arm 606. The internal arrangements used to drive the individual links of the arm may be similar to FIGS. 10-13, for example as in FIG. 13 however the forearms in this instance are shorter than the common upper arm. Here, the common upper arm is driven by one motor. Each of the two forearms is driven independently by one motor through a band drive with conventional pulleys. The third links 614, 616 with the end-effectors are constrained by band drives, each with at least one non-circular pulley, which compensate for the effects of the unequal lengths of the upper arms and forearms. The band drives in each of the linkages may be designed using the methodology described for FIGS. 1 and 2. The kinematic equations presented for FIGS. 1 and 2 may also be used for each of the two linkages of the dual arm. Referring also to FIGS. 26A, 26B and 26C, there is shown the arm of FIGS. 25A and 25B as the upper linkage 612, 616 extends. The lateral offset 604 of the end-effector corresponds to the difference of the joint-to-joint lengths of the upper arm and forearm, and the wrist joint travels along a straight line offset with respect to the trajectory of the center of the wafer by this difference. Note that the inactive linkage 608, 614 rotates while the active linkage 612, 616 extends. For instance, the upper linkage rotates as the lower linkage extends, and the lower linkage rotates as the upper linkage extends. Here, FIG. 26A depicts the arm with both linkages in the retracted positions. FIG. 26B shows the upper linkage 612, 616 partially extended in a position where the wrist joint of the upper linkage is closest to the wafer carried by the lower linkage. It is observed that the wrist joint of the upper linkage does not travel over the wafer (however, it moves in a plane above the wafer). FIG. 26C depicts farther extension of the upper linkage 612, 616. The embodiment shown may provide ease of to set up and control, and may be used on a coaxial or tri axial drive with no dynamic seals or other suitable drive. Here, no bridge may be used to support any of the end-effectors. The wrist joint of the upper linkage does not travel over the wafer on the lower end-effector, which is the case for an equal-link design (however, it moves in a plane above the wafer on the lower end-effector). Here, the inactive arm rotates while the active one extends. The elbow joint may be more complex which may translate to a larger swing radius or shorter reach. Here, the arm may be taller than that shown in FIGS. 30 and 31 and FIG. 33 due to the overlapping forearms 608, 612.

Figure 29C:
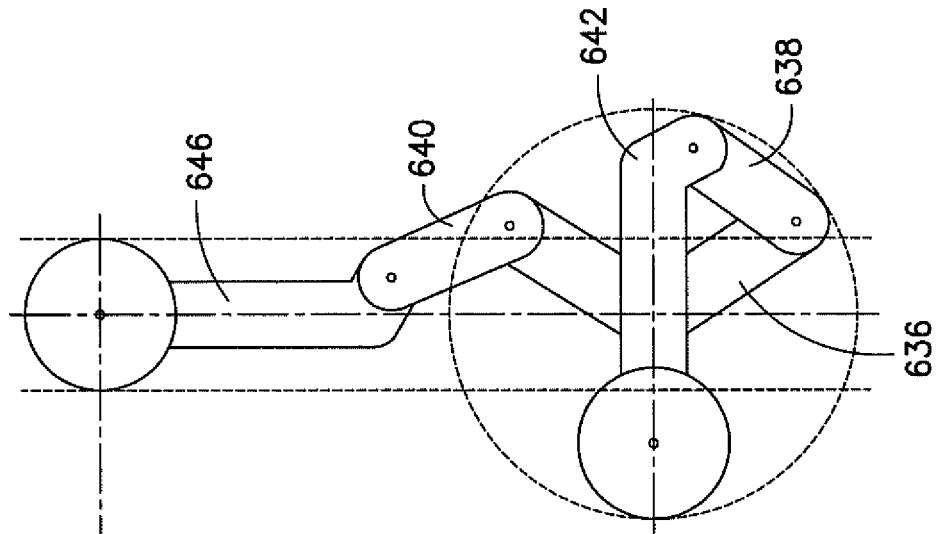
FIG. 29C is a top view of a transport apparatus.
Figure 29B:
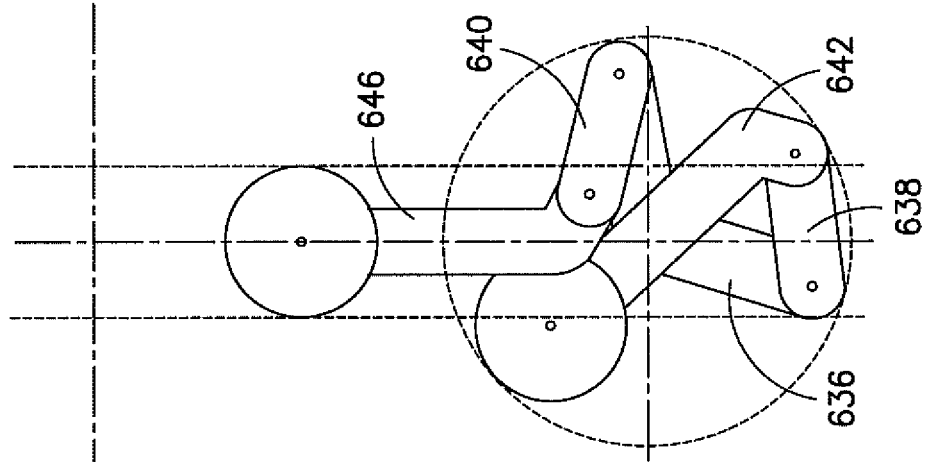
FIG. 29B is a top view of a transport apparatus.
Figure 29A:
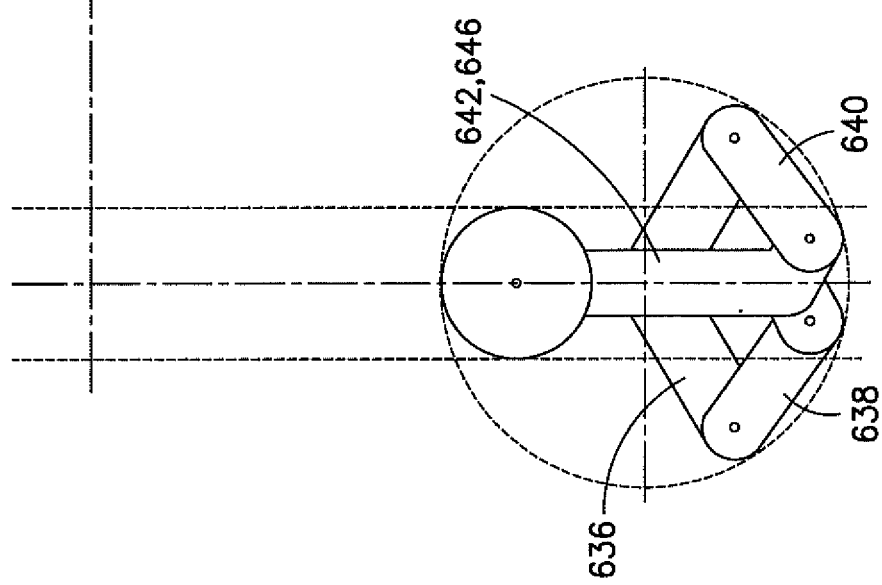
FIG. 29A is a top view of a transport apparatus.
Figure 33A:
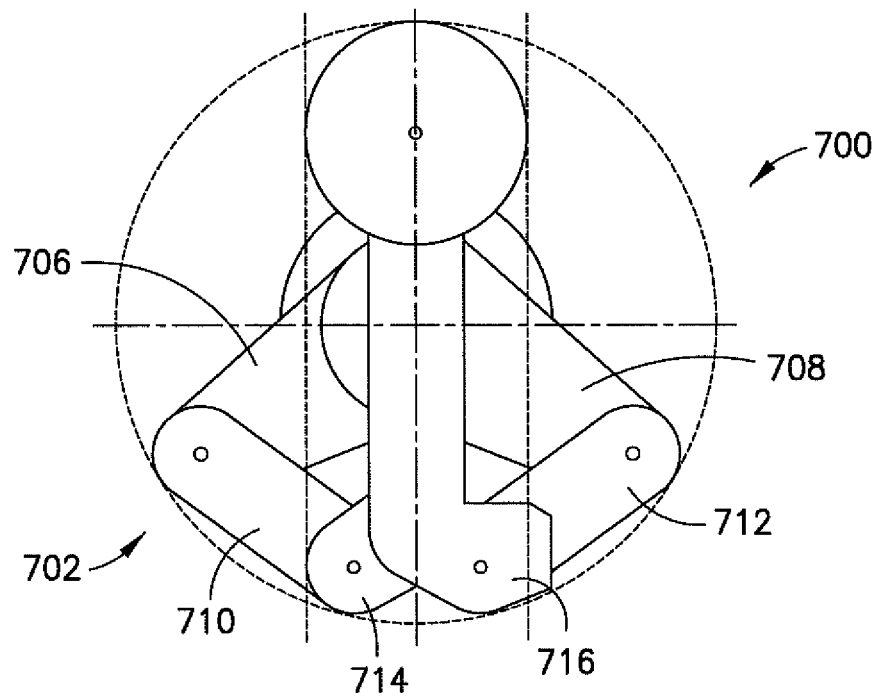
FIG. 33A is a top view of a transport apparatus.
Figure 33B:
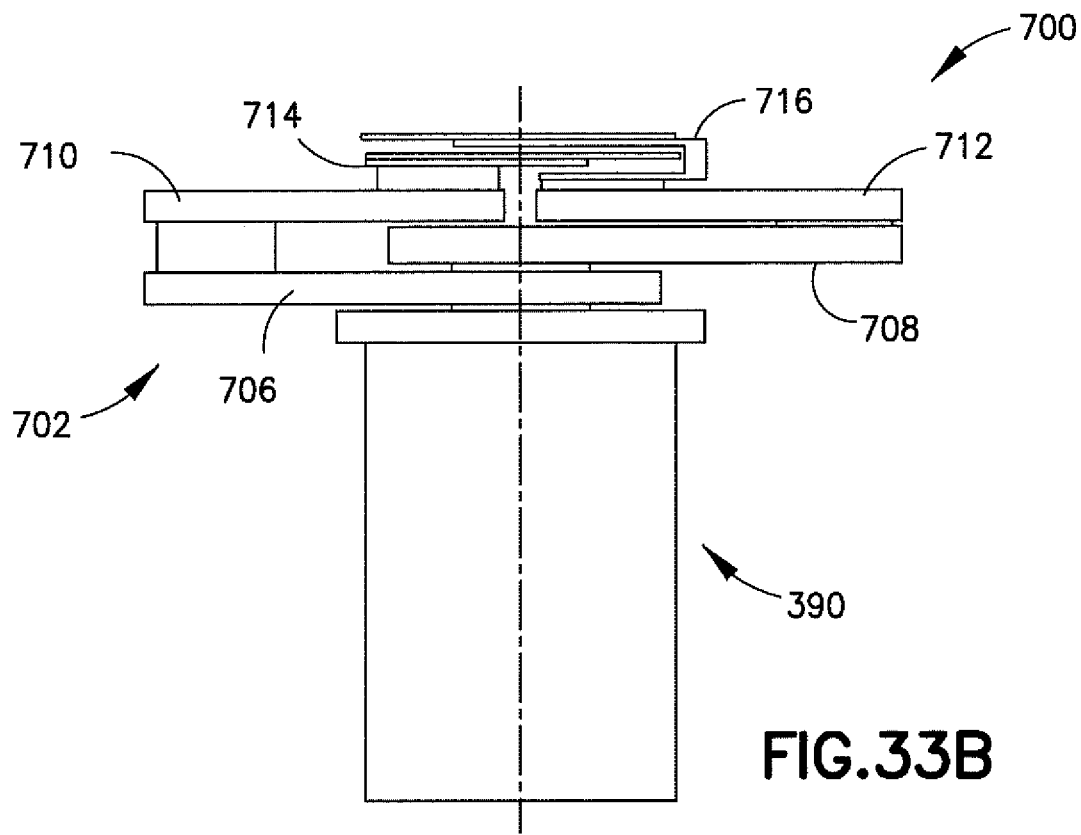
FIG. 33B is a side view of a transport apparatus.

Referring now to FIGS. 27A and 27B, there is shown top and side views respectively of robot 630 with arm 632. Arm 630 may have features similar to that disclosed with respect to FIGS. 15-19 except the forearms 636, 640 are shown with shorter link length than the upper arm 636. Both linkages are shown in their retracted positions. The lateral offset 634 of the end-effectors 642, 646 corresponds to the difference of the joint-to-joint lengths of the upper arm 636 and forearms 638, 640. The combined upper arm link 636 may be a single piece as depicted in FIGS. 27A and 27B or it can be formed by two or more sections 636', 636", as shown in the example of FIGS. 28A and 28B. A two-section design may be lighter with less material and where left 636' and right 636" sections may be identical components. Allowances for adjustment of the angular offset between the left 636' and right 636" sections may be provided, for example, where different retracted positions need to be supported. The internal arrangements used to drive the individual links of the arm 632 may be similar to that in FIGS. 15-19, for example, as seen FIG. 19. The common upper arm 636 is driven by one motor. Each of the two forearms 638, 640 is driven independently by one motor through a band drive with conventional pulleys. The third links with the end-effectors 642, 646 may be constrained by band drives, each with at least one non-circular pulley, which compensate for the effects of the unequal lengths of the upper arm 636 and forearms 638, 640. The band drives in each of the linkages may be designed using the methodology described for FIGS. 1 and 2. The kinematic equations presented for FIGS. 1 and 2 may also be used for each of the two linkages of the dual arm. Referring also to FIGS. 29A, 29B and 29C, there is shown the arm of FIGS. 27A and 27B as the right, upper linkage 640, 646 extends. The lateral offset 634 of the end-effector corresponds to the difference of the joint-to-joint lengths of the upper arm and forearm, and the wrist joint travels along a straight line offset with respect to the trajectory of the center of the wafer by this difference. Here, the inactive linkage 638, 642 rotates while the active linkage 640, 646 extends. For instance, the upper linkage rotates as the lower linkage extends, and the lower linkage rotates as the upper linkage extends. In FIGS. 29A, 29B and 29C, FIG. 29A depict the arm with both linkages in the retracted positions. FIG. 29B shows the right upper linkage 640, 646 partially extended in a position where the wrist joint of the right upper linkage 640, 646 is closest to the wafer carried by the left lower linkage 638, 642. Here the wrist joint of the right upper 640, 646 linkage does not travel over the wafer however, it moves in a plane above the wafer. FIG. 29C depicts farther extension of the right upper linkage 640, 646. The embodiment shown leverages the benefits of a solid link design, ease of set up and control and the coaxial drive, for example, no dynamic seals. No bridge is used to support any of the end-effectors. The wrist joint of the upper linkage does not travel over the wafer on the lower end-effector, which is the case for an equal-link design however, it moves in a plane above the wafer on the lower end-effector. The inactive arm 638, 642 rotates while the active arm 640, 646 extends. The retract angle is more difficult to change compared to the configuration with common elbow joint, for example as seen in FIGS. 25A and 25B and independent dual arm, for example, as seen in FIGS. 33A and 33B. Further, the arm is shown taller than FIGS. 30 and 31 and FIGS. 33A and 33B as forearm 640 is shown at a higher elevation than forearm 638.

Figure 30A:
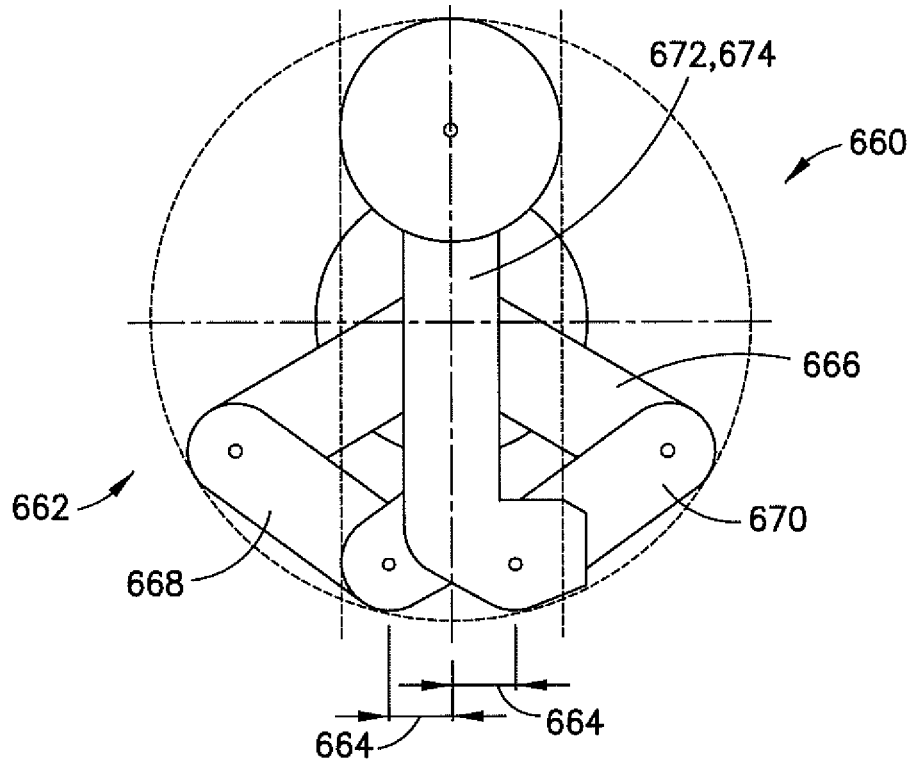
FIG. 30A is a top view of a transport apparatus.
Figure 30B:
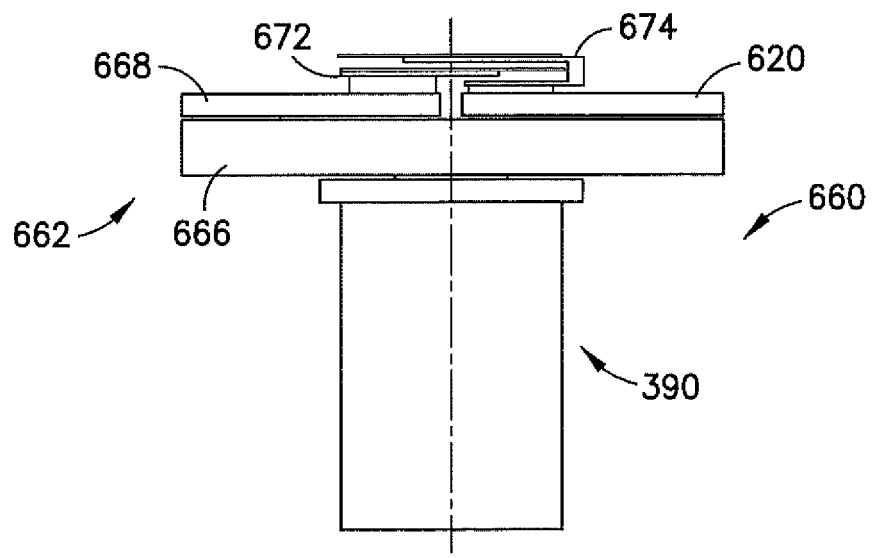
FIG. 30B is a side view of a transport apparatus.
Figure 31A:
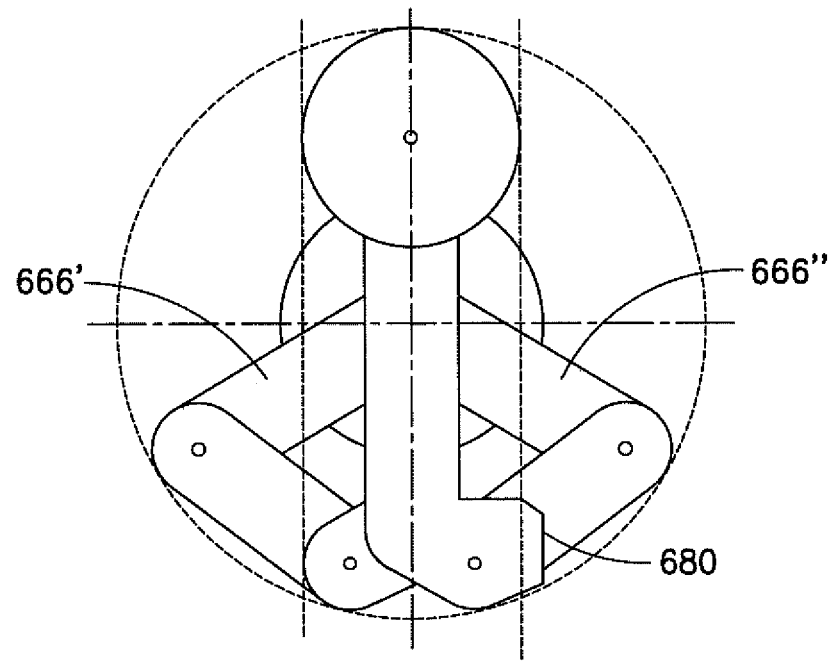
FIG. 31A is a top view of a transport apparatus.
Figure 31B:
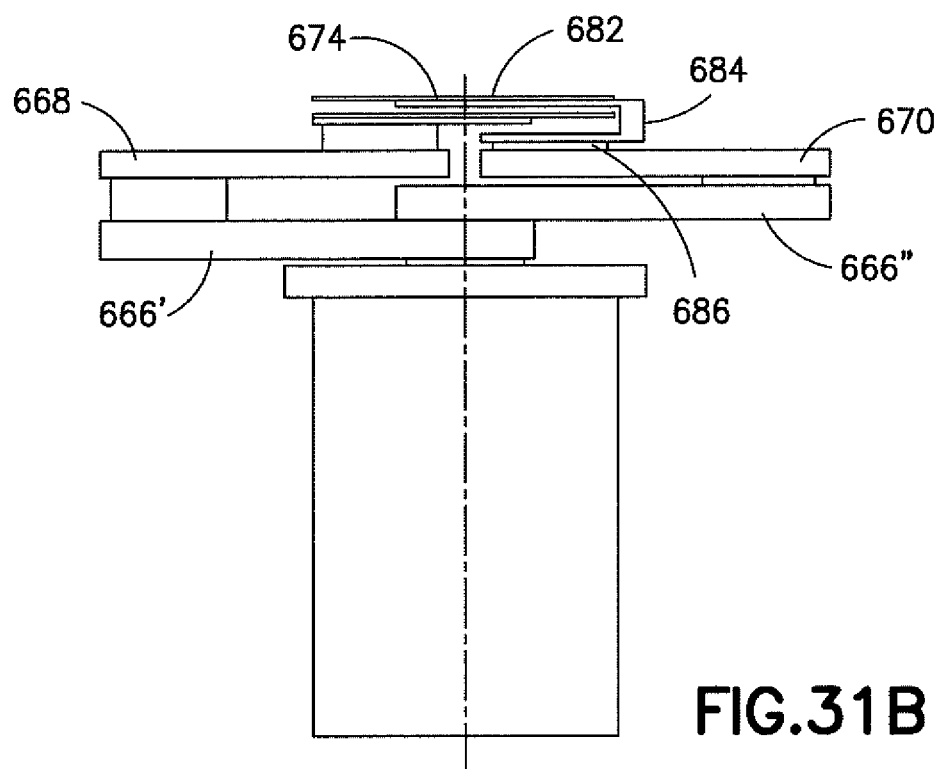
FIG. 31B is a side view of a transport apparatus.
Figure 32A:
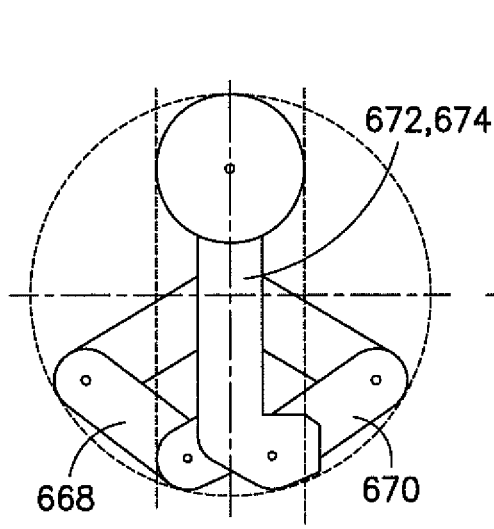
FIG. 32A is a top view of a transport apparatus.
Figure 32B:
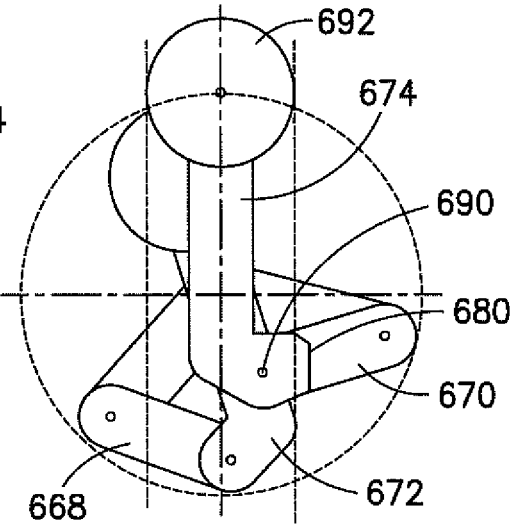
FIG. 32B is a top view of a transport apparatus.
Figure 32C:
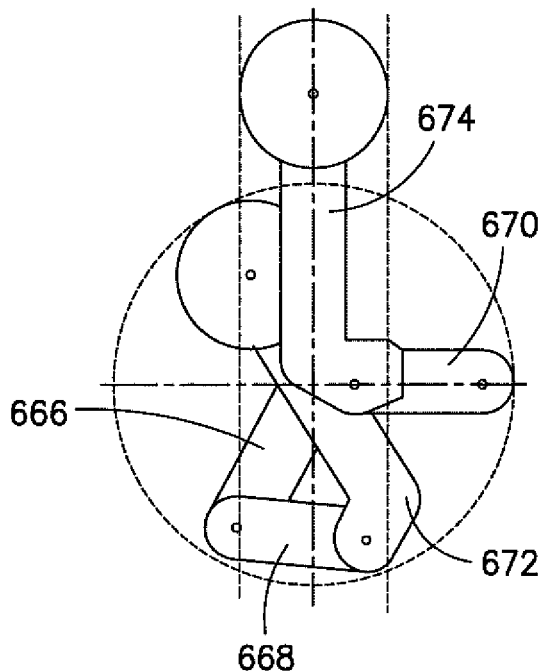
FIG. 32C is a top view of a transport apparatus.
Figure 32D:
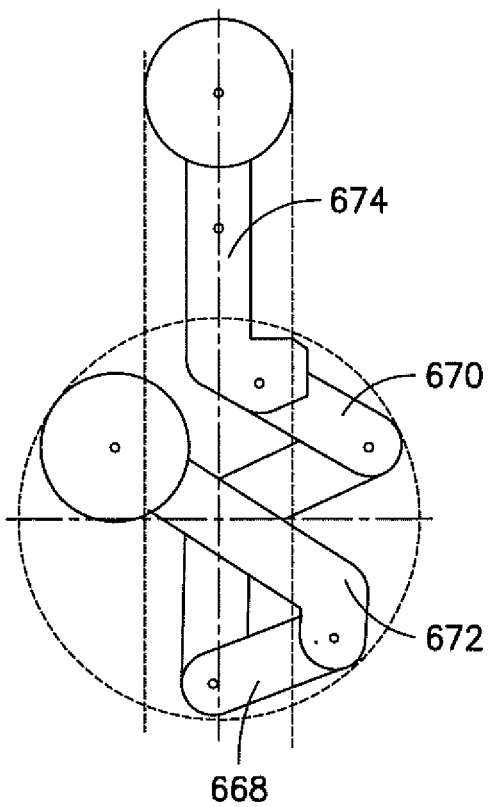
FIG. 32D is a top view of a transport apparatus.

Referring now to FIGS. 30A and 30B, there is shown the top and side views respectively of robot 660 with arm 662. Arm 662 may have features as described with respect to FIGS. 27-29 however employing a bridge and with the two forearms at the same elevation as will be described. Both linkages are shown in their retracted positions. The lateral offset 664 of the end-effectors corresponds to the difference of the joint-to-joint lengths of the upper arm 66 and forearms 668, 670. The combined upper arm link 666 can be a single piece as depicted in FIGS. 30A and 30B or it can be formed by two or more sections 666', 666", as shown in the example of FIGS. 31A and 31B. The internal arrangements used to drive the individual links of the arm may be identical to that shown for FIGS. 15-19 but where the forearms 668, 670 are shorter than the upper arm 666. The common upper arm 666 is driven by one motor. Each of the two forearms 668, 670 is driven independently by one motor through a band drive with conventional pulleys. The third links with the end-effectors 672, 674 are constrained by band drives, each with at least one non-circular pulley, which compensate for the effects of the unequal lengths of the upper arms and forearms. The band drives in each of the linkages may be designed using the methodology described for FIGS. 1 and 2. The kinematic equations presented for FIGS. 1 and 2 can also be used for each of the two linkages of the dual arm. Third link and end effector 674 has a bridge 680 that has an upper end effector portion 682, a side offset support portion 684 offset from the wrist axis between link 670 and link 674 and further has a lower support portion 686 coupling the wrist axis to the offset support portion 684. Bridge 680 allows forearms 668 and 670 to be packaged at the same level while providing clearance for the interleaved portions of third link and end effector 672 (which may include the wafer) and the bridge 680 as can be seen below with respect to FIG. 32. Bridge 680 further provides an arrangement where any moving parts, for example, associated with the two wrist joints, reside below the wafer surface during transport. Referring also to FIGS. 32A, 32B, 32C and 32D, there is shown the top view of the robot arm of FIGS. 30A and 30B as the right linkage 670, 674 extends. The lateral offset 664 of the end-effector corresponds to the difference of the joint-to-joint lengths of the upper arm 666 and forearm 670, and the wrist joint 690 travels along a straight line offset with respect to the trajectory of the center of the wafer 692 by this difference. Note that the inactive linkage 668, 672 rotates while the active linkage 670, 674 extends. For instance, the upper linkage rotates as the lower linkage extends, and the lower linkage rotates as the upper linkage extends. In FIGS. 32A, 32B, 32C and 32D, FIG. 32A depicts the arm with both linkages in the retracted positions. FIG. 32B shows the right linkage 670, 674 partially extended in a position that corresponds to the worst-case clearance (or is close to the worst-case clearance) between the bridge 680 of the right linkage 670, 674 and the end-effector 672 of the left linkage 668, 672. FIG. 32C shows the right linkage 670, 674 partially extended in a position when the forearm 670 is aligned with the upper arm 666. The lateral offset of the end-effector corresponds to the difference of the joint-to-joint lengths of the upper arm and forearm. The wrist joint 690 axis travels along a straight line offset with respect to the trajectory of the center of the wafer 692 by this difference. FIG. 32D depicts farther extension of the right linkage 670, 674. The embodiment shown combines the benefits of the side-by-side dual scara arrangement, for example, slim profile, resulting in a shallow chamber with a small volume, the solid link design and the coaxial drive. The bridge 680 on the right linkage 670, 674 is much lower and its unsupported length between vertical member 684 and wrist 690 is shorter than in a prior art coaxial dual scara arm and all of the joints are below the end-effectors. Here, the inactive arm 668, 672 rotates while the active arm 670, 674 extends. As will be described below, in other aspects of the disclosed embodiment, and arm which does not exhibit this behavior may be provided with a different band drives with noncircular pulleys in place of the conventional ones disclosed here. Alternatively, the bridge that supports the top end-effector may be eliminated by utilizing an arrangement similar to those described for FIGS. 25A and 25B and FIGS. 27 and 28 above.

Referring now to FIGS. 33A and 33B, there is shown top and side views respectively of robot 700 with arm 702. Arm 702 may have features similar to that of the arm shown in FIGS. 21-23 but with forearm lengths shorter than the upper arm lengths and employing a bridge as described with respect to bridge 680 by way of example and with the forearms located at the same elevation. Both linkages are shown in their retracted positions. In FIGS. 33A and 33B, the right upper arm 708 is located above the left upper arm 706. Alternatively, the left upper 706 may be located above the right upper arm 708. Similarly, the third link and end-effector 716 of the right linkage 712, 716 feature a bridge that extends over the third link and end-effector 714 of the left linkage 710, 714. Alternatively, the third link and end-effector 714 of the left linkage 710, 714 may feature a bridge that may extend over the third link and end-effector 716 of the right linkage 712, 716. The internal arrangements used to drive the individual links of the arm may be similar to the embodiment shown in FIGS. 21-23. Each of the two upper arms 706, 708 is driven independently by one motor. The forearms 710, 712 are coupled via band arrangements, each with at least one non-circular pulley, to a third motor. The third links 714, 716 with the end-effectors are constrained by band drives, each with at least one non-circular pulley. The band drives are designed so that rotation of one of the upper arms 706, 708 causes the corresponding linkage to extend and retract along a straight line while the other linkage remains stationary. The band drives in each of the linkages are designed using the methodology described for the embodiment shown in FIGS. 5 and 6. The kinematic equations presented for the embodiment shown in FIGS. 5 and 6 can also be used for each of the two linkages of the dual arm. Referring also to FIGS. 34A, 34B and 34C, there is shown the arm of FIGS. 33A and 33B as the right linkage 708, 712, 716 extends. Here, the inactive linkage 706, 710, 714 remains stationary while the active linkage 712, 716 extends. That is, the left linkage does not move while the right linkage extends, and the right linkage does not move when the left linkage extends. The embodiment shown combines the benefits of the side-by-side dual scara arrangement, for example, slim profile, resulting in a shallow chamber with a small volume and the coaxial drive. The bridge on the right linkage is much lower and its unsupported length is shorter than in the existing coaxial dual scara arms and all of the joints are below the end-effectors. The inactive linkage remains stationary while the active one extends potentially leading to higher throughput as active linkage may extend or retract faster with no load. Alternatively, the bridge that supports the top end-effector may be eliminated by utilizing an arrangement similar to those described for FIGS. 25, 27 and 28.

Figure 35A:
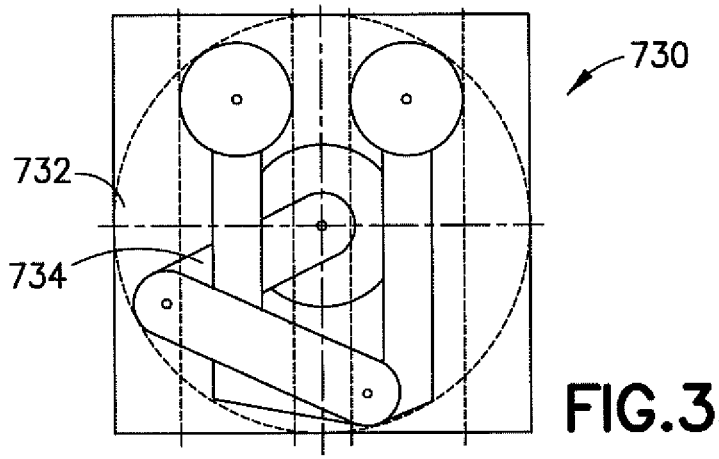
FIG. 35A is a top view of a transport apparatus.
Figure 35B:
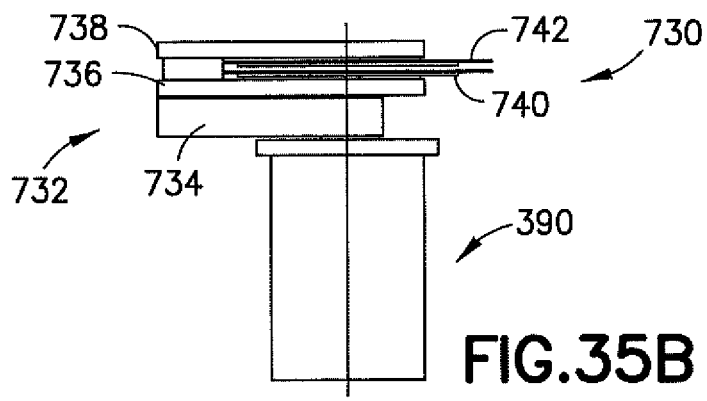
FIG. 35B is a side view of a transport apparatus.
Figure 36:
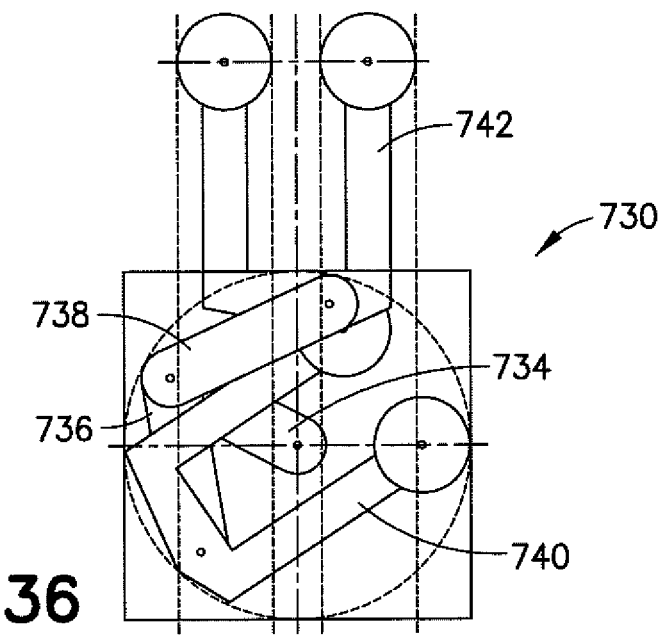
FIG. 36 is a top view of a transport apparatus.

Referring now to FIGS. 35A and 353, there is shown top and side views of robot 730 with arm 732 with both linkages shown in their retracted positions. Each linkage has a dual-holder end-effector 740, 742, each supporting two substrates offset from each other for a total of 4 substrates supportable. The internal arrangements used to drive the individual links of the arm 732 may be identical to FIGS. 10 and 11, for example, FIG. 13. The common upper arm 734 is driven by one motor. Each of the two forearms 73736, 738 is driven independently by one motor through a band drive with conventional pulleys. The third links with the end-effectors 740, 742 are constrained by band drives, each with at least one non-circular pulley, which compensate for the effects of the unequal lengths of the upper arms and forearms. The embodiment shown has forearms longer than the upper arm. Alternately, they may be shorter. The band drives in each of the linkages are designed using the methodology described for FIGS. 1 and 2. The kinematic equations presented for FIGS. 1 and 2 may also be used for each of the two linkages of the dual arm. Referring also to FIG. 36, there is shown the arm of FIGS. 35A and 35B as one linkage 738, 742 extends. Note that the inactive linkage 736, 740 rotates while the active linkage 738, 742 extends. For instance, the upper linkage rotates as the lower linkage extends, and the lower linkage rotates as the upper linkage extends. Compared to FIGS. 37 and 38, end-effector does not need to be shaped to avoid interference with opposite elbow.

Figure 38A:
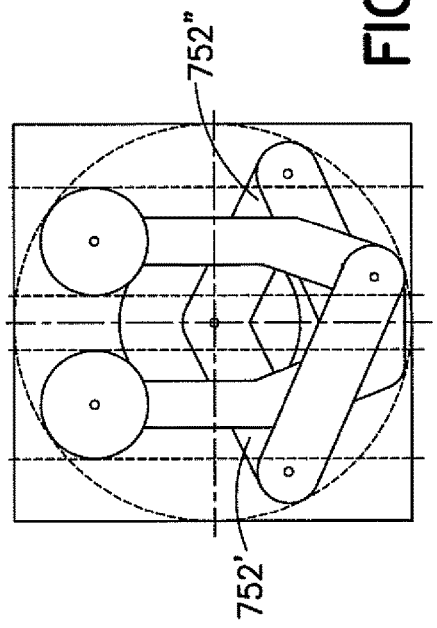
FIG. 38A is a top view of a transport apparatus.
Figure 38B:
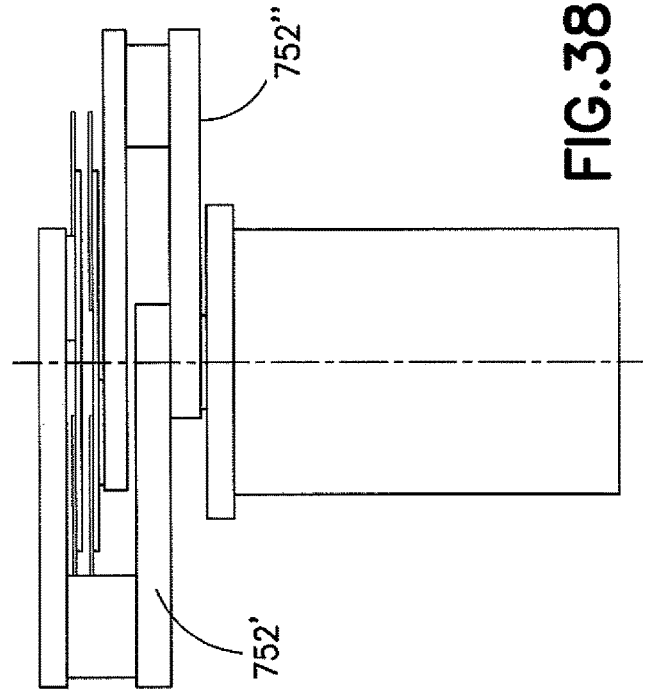
FIG. 38B is a side view of a transport apparatus.
Figure 37A:
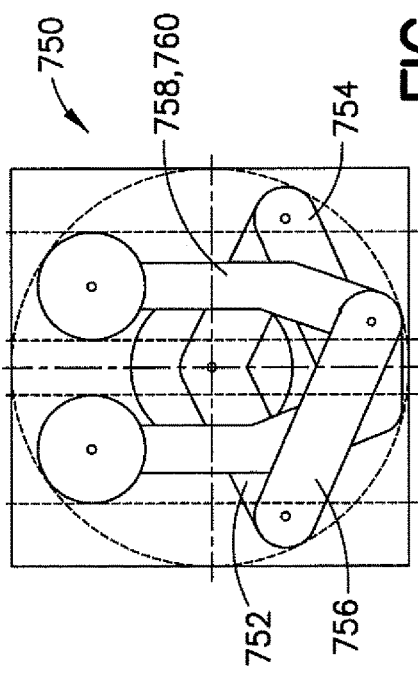
FIG. 37A is a top view of a transport apparatus.
Figure 37B:
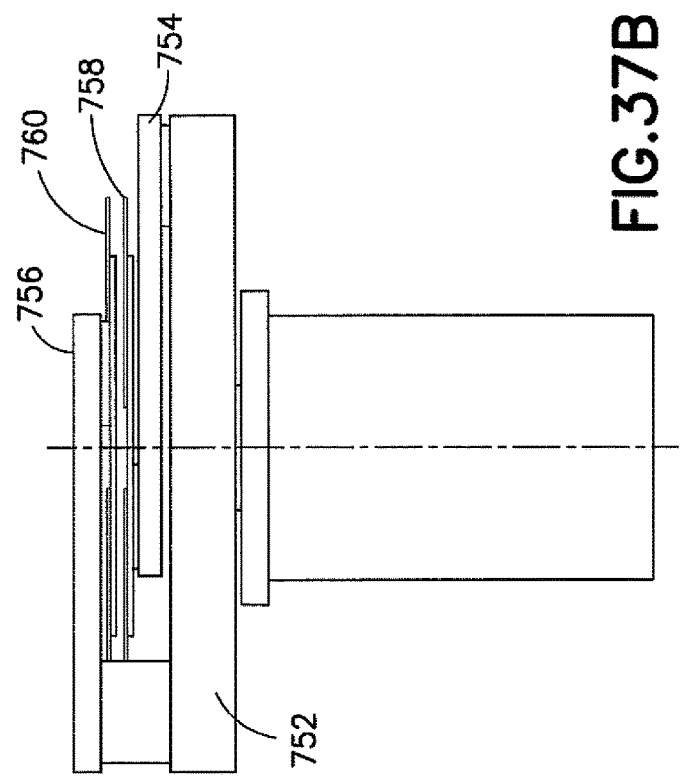
FIG. 37B is a side view of a transport apparatus.
Figure 39:
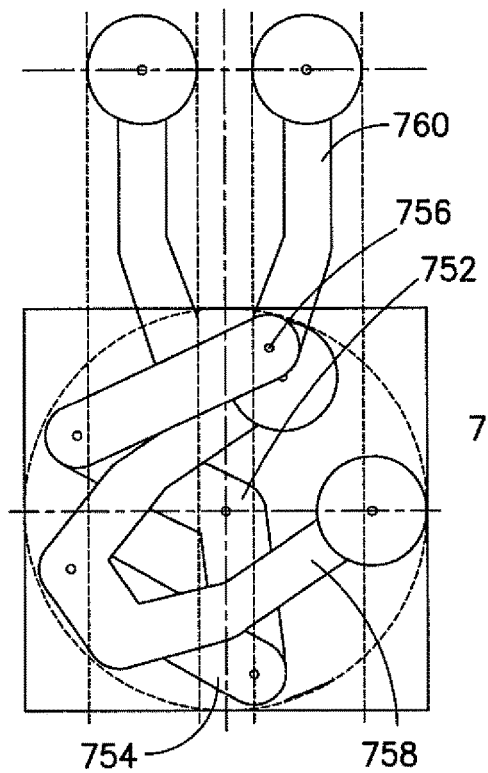
FIG. 39 is a top view of a transport apparatus.

Referring now to FIGS. 37A and 37B, there is shown top and side views respectively of robot with arm 750. Both linkages are shown in their retracted positions with each linkage having a dual-holder end-effector 758, 760. The combined upper arm link 752 can be a single piece as depicted in FIGS. 37A and 37B or it can be formed by two or more sections 752', 752'', as shown in the example of FIGS. 38A and 38B. The internal arrangements used to drive the individual links of the arm may be identical to FIGS. 15-19, for example, FIG. 19. The combined upper arms 752 are driven by one motor. Each of the two forearms 754, 756 is driven independently by one motor through a band drive with conventional pulleys. The third links 758, 760 with the end-effectors are constrained by band drives, each with at least one non-circular pulley, which compensate for the effects of the unequal lengths of the upper arms and forearms. The embodiment shown has forearms longer than the upper arm. Alternately, they may be shorter. The band drives in each of the linkages are designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm in order for the inactive linkage to remain retracted. Referring also to FIG. 39, there is shown the arm of FIGS. 37A and 37B as one linkage 756, 760 extends. Here, the inactive linkage 754, 758 rotates while the active linkage extends. For instance, the right linkage rotates as the left linkage extends, and the left linkage rotates as the right linkage extends. The embodiment shown has no bridge. The upper wrist travels over one of the wafers on the lower end-effector, Here, the arm and end-effectors need to be designed so that the top elbow clears the lower end-effector.

Figure 40A:
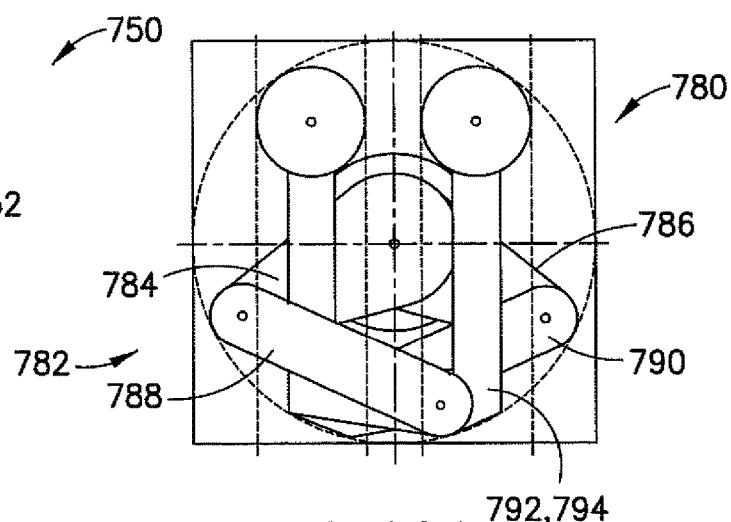
FIG. 40A is a top view of a transport apparatus.
Figure 40B:
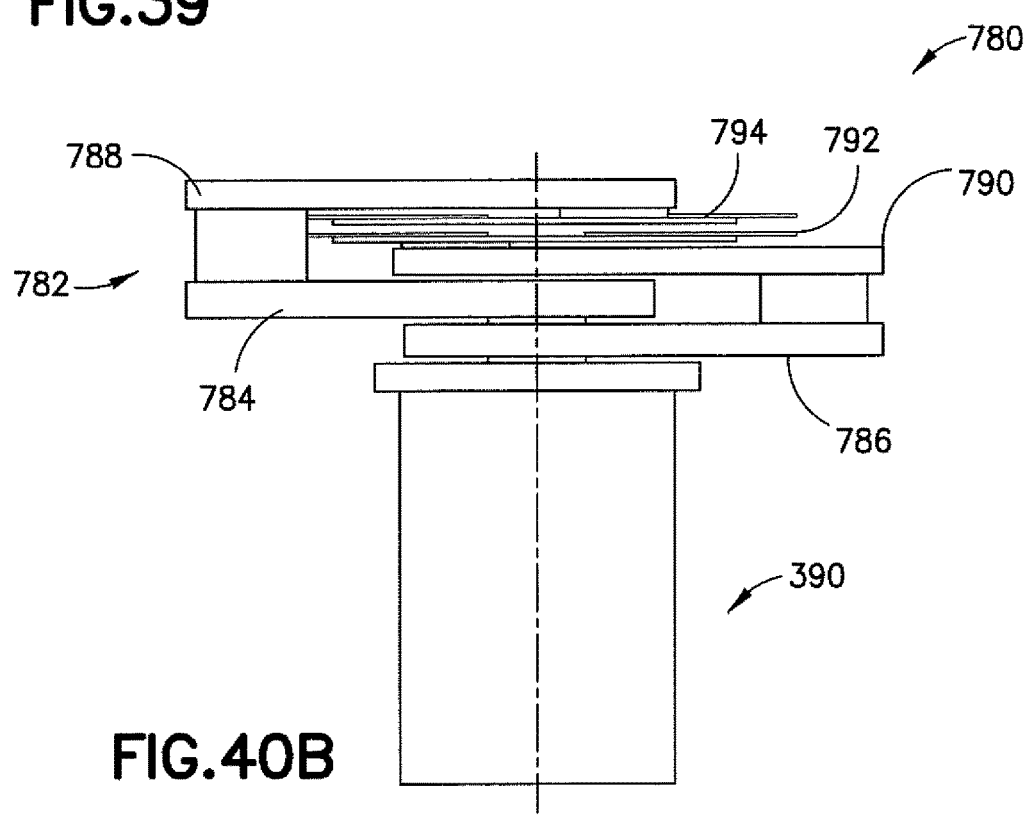
FIG. 40B is a side view of a transport apparatus.
Figure 41:
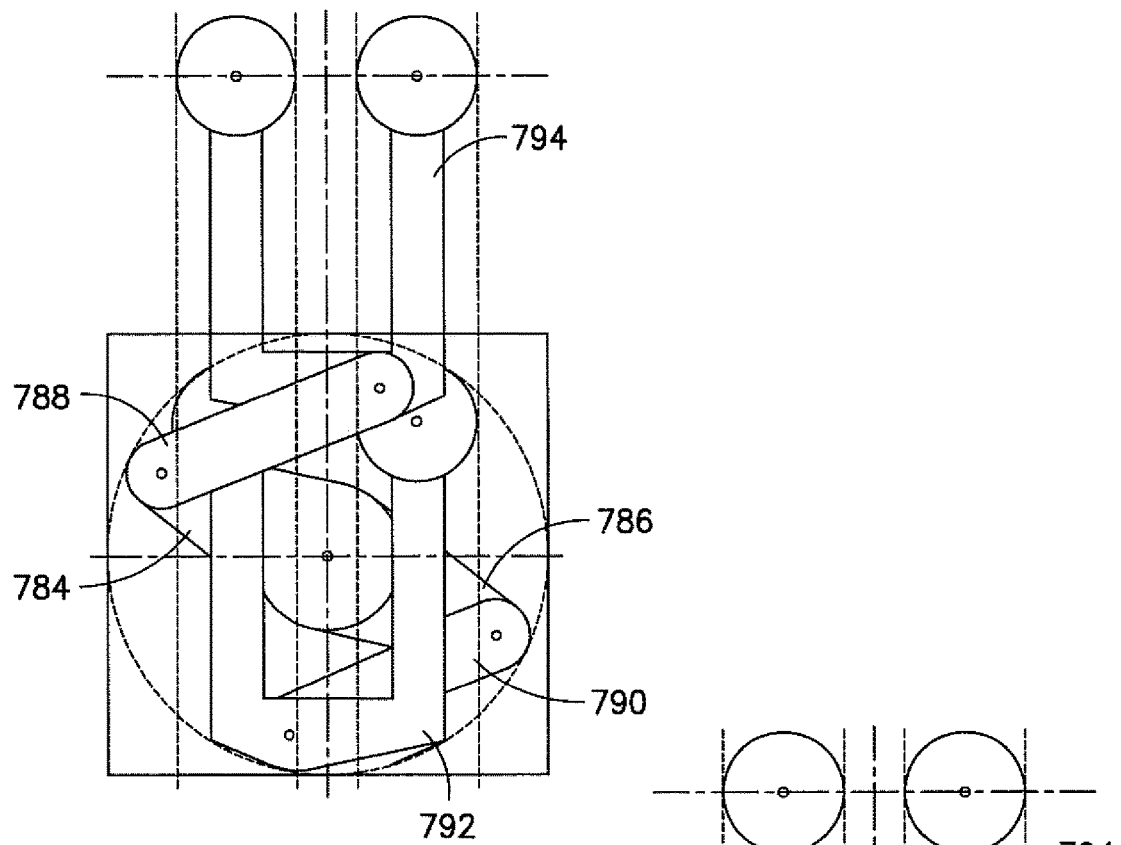
FIG. 41 is a top view of a transport apparatus.
Figure 42:
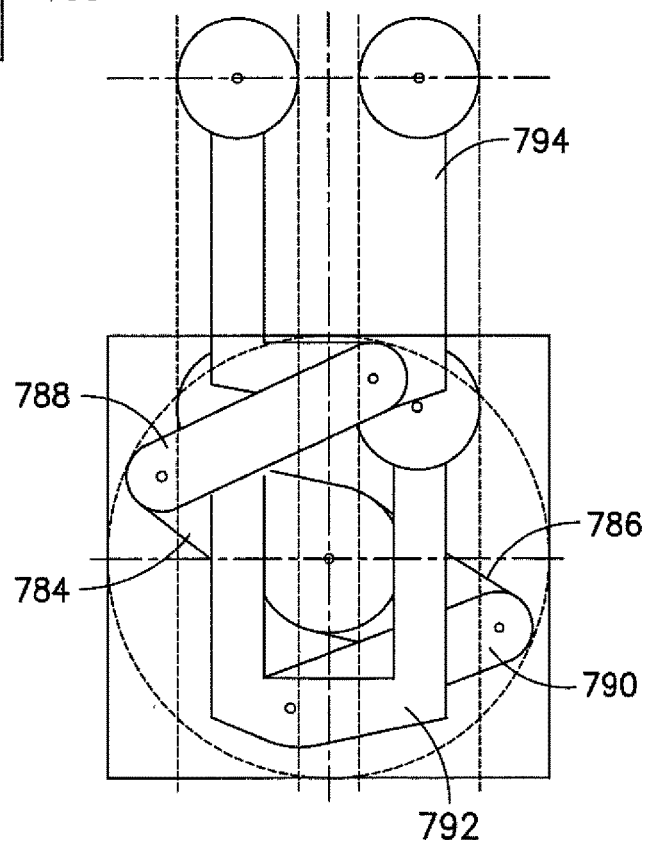
FIG. 42 is a top view of a transport apparatus.

Referring now to FIGS. 40A and 40B, there is shown top and side views respectively of robot 750 with arm 752. Both linkages are shown in their retracted positions where each linkage has a dual-holder end-effector 792, 794. The internal arrangements used to drive the individual links of the arm may be identical to FIGS. 21-23. Each of the two upper arms 784, 786 is driven independently by one motor. The forearms 788, 790 are coupled via band arrangements, each with at least one non-circular pulley, to a third motor. The third links with the end-effectors 792, 794 are constrained by band drives, each with at least one non-circular pulley. The band drives are designed so that rotation of one of the upper arms causes the corresponding linkage to extend and retract along a straight line while the other linkage remains stationary. The embodiment shown has forearms longer than the upper arm. Alternately, they may be shorter. The band drives in each of the linkages are designed using the methodology described for FIGS. 5 and 6. The kinematic equations presented for FIGS. 5 and 6 can also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the upper arm associated with the active linkage needs to be rotated according to the inverse kinematic equations for FIGS. 5 and 6, and the other two drive shafts need to be kept stationary. Referring also to FIG. 41, there is shown the arm of FIGS. 40A and 40B as one linkage 784, 788, 794 extends. Note that the inactive linkage 786, 790, 792 may remain stationary while the active linkage 794, 788, 794 extends. That is, the left linkage does not move while the right linkage extends, and the right linkage does not move when the left linkage extends. Alternately, the left and right linkages may be moved at the same time radially independently, for example as seen in FIG. 42 where the right linkage extends slightly independently as compared to FIG. 41. The motion of the elbow of the upper linkage may be limited due to potential interference with a wafer on the lower end-effector, which may limit the reach of the robot as illustrated in FIG. 41. This limitation may be mitigated by extending the lower linkage slightly to provide additional clearance and achieve full reach as shown in FIG. 42. The embodiment shown has no bridge. The wrist of the upper linkage may travel above a wafer on the lower end-effector.

Referring now to FIGS. 43A and 43B, there is shown top and side views respectively of robot 810 with arm 812. Both linkages are shown in their retracted positions with each linkage having a dual-holder end-effector 820, 822. The internal arrangements used to drive the individual links of the arm may be identical to FIGS. 10-13. The common upper arm 814 is driven by one motor. Each of the two forearms 816, 818 is driven independently by one motor through a band drive with conventional pulleys. The third links with the end-effectors 820, 822 are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages are designed using the methodology described for FIGS. 1 and 2. The kinematic equations presented for FIGS. 1 and 2 may also be used for each of the two linkages of the dual arm. Referring also to FIGS. 44 and 45, there is shown the arm of FIGS. 43A and 43B as the upper linkage 818, 822 extends. Note that the inactive linkage 816, 820 rotates while the active linkage 818, 822 extends. For instance, the upper linkage rotates as the lower linkage extends, and the lower linkage rotates as the upper linkage extends. FIGS. 44 and 45 illustrate that the wrist joint 824 of the upper linkage 818, 822 does not travel over the wafers 826 carried by the lower linkage 816, 820 of the arm. The embodiment shown has no bridge. Compared to FIGS. 46 and 47, the end-effector does not need to be shaped to avoid interference with opposite elbow.

Figure 49:
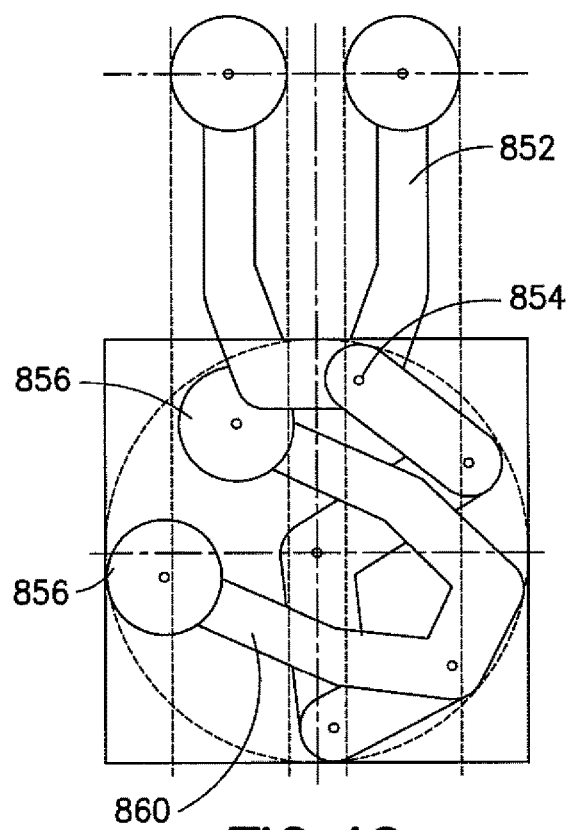
FIG. 49 is a top view of a transport apparatus.

Referring now to FIGS. 46A and 46B, there is shown top and side views respectively of robot 840 with arm 842. Both linkages are shown in their retracted positions where each linkage has a dual-holder end-effector 850, 852. The combined upper arm link 844 can be a single piece as depicted in FIGS. 46A and 46B or it can be formed by two or more sections 844', 844", as shown in the example of FIGS. 47A and 47B. The internal arrangements used to drive the individual links of the arm may be identical to FIGS. 15-19, for example FIG. 19. The combined upper arms 844 are driven by one motor. Each of the two forearms 846, 848 is driven independently by one motor through a band drive with conventional pulleys. The third links with the end-effectors 850, 852 are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages are designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm 844 and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm in order for the inactive linkage to remain retracted. Referring also to FIGS. 48 and 49, there is shown the arm of FIGS. 46A and 46B as the upper linkage 848, 852 extends. Here, the inactive linkage 846, 850 rotates while the active linkage 848, 852 extends. For instance, the upper linkage rotates as the lower linkage extends, and the lower linkage rotates as the upper linkage extends. FIGS. 48 and 49 illustrate that the wrist joint 854 of the upper linkage does not travel over the wafers 856 carried by the lower linkage of the arm. The embodiment shown has no bridge and the wrist joint of the upper linkage does not travel over a wafer carried by the lower linkage. Here, the inactive arm rotates less, allowing for a higher speed of motion when active arm extends or retracts with no load.

Figure 50A:
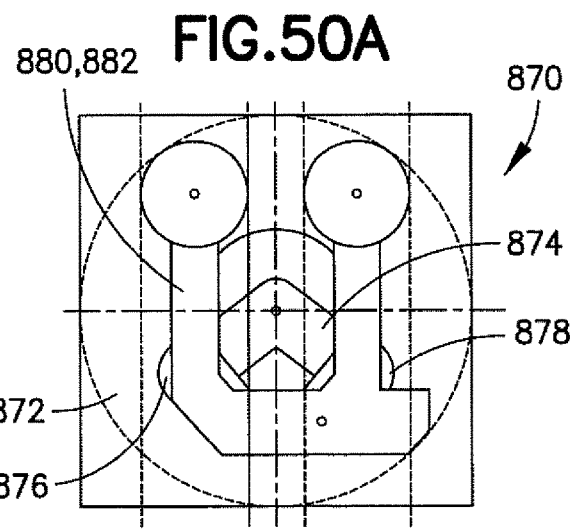
FIG. 50A is a top view of a transport apparatus.
Figure 50B:
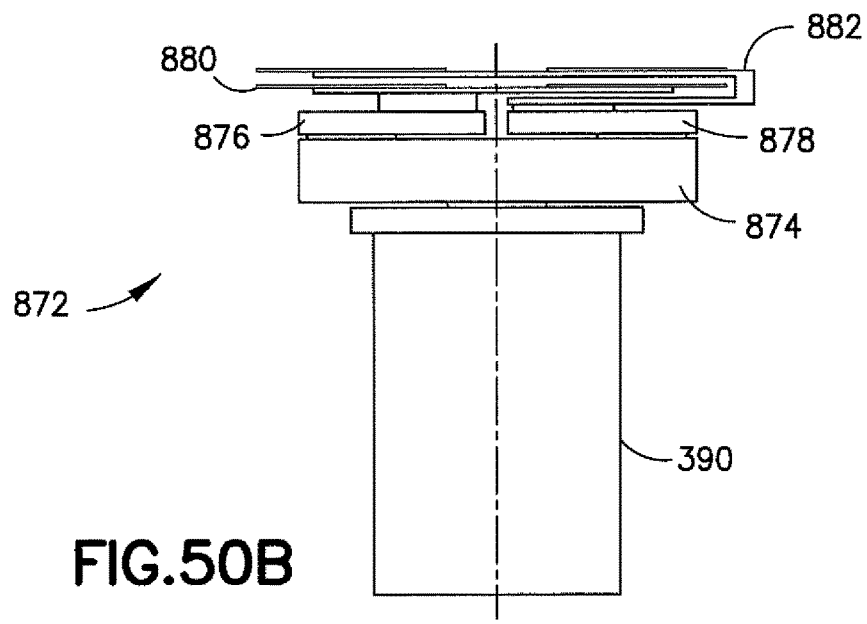
FIG. 50B is a side view of a transport apparatus.

Referring now to FIGS. 50A and 50B, there is shown top and side views of robot 870 with arm 872. Both linkages are shown in their retracted positions where each linkage has a dual-holder end-effector 880, 882. The combined upper arm link 974 can be a single piece as depicted in FIGS. 50A and 50B or it can be formed by two or more sections, as shown in the example of FIGS. 47A and 47B. The internal arrangements used to drive the individual links of the arm may be identical to FIGS. 15-19, for example, FIG. 18. The combined upper arms 874 are driven by one motor. Each of the two forearms 876, 878 is driven independently by one motor through a band drive with conventional pulleys. The third links with the end-effectors are constrained by band drives, each with at least one non-circular pulley, which compensate for the effects of the unequal lengths of the upper arms and forearms. In the embodiment shown, the forearms are shorter than the upper arm; alternately they may be longer. The band drives in each of the linkages may be designed using the methodology described for FIGS. 1 and 2. The kinematic equations presented for FIGS. 1 and 2 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the common upper arm 874 and the driveshaft coupled to the forearm associated with the active linkage need to move in a coordinated manner in accordance with the inverse kinematic equations for FIGS. 1 and 2. At the same time, the driveshaft coupled to the other forearm needs to rotate in synch with the drive shaft of the common upper arm 874 in order for the inactive linkage to remain retracted. Referring also to FIG. 51, there is shown the arm of FIGS. 50A and 50B with one linkage 878, 882 extended. Here, the inactive linkage 876, 880 rotates while the active linkage 878, 882 extends. For instance, the upper linkage rotates as the lower linkage extends, and the lower linkage rotates as the upper linkage extends. The embodiment shown has short forearm links that may be stiffer with shorter short bands and where the forearms are located side-by-side facilitating a shallow chamber. Here, the short links may cause more rotation of inactive arm compared to FIGS. 46 and 47 which may be addressed by longer upper arms. Bridge 884 is provided where the arm and end-effectors may be designed so that the bridge 884 clears the inactive end-effector 880 during an extension move. Here, the base of the end-effector features an angled shape 886 as shown.

Figure 53:
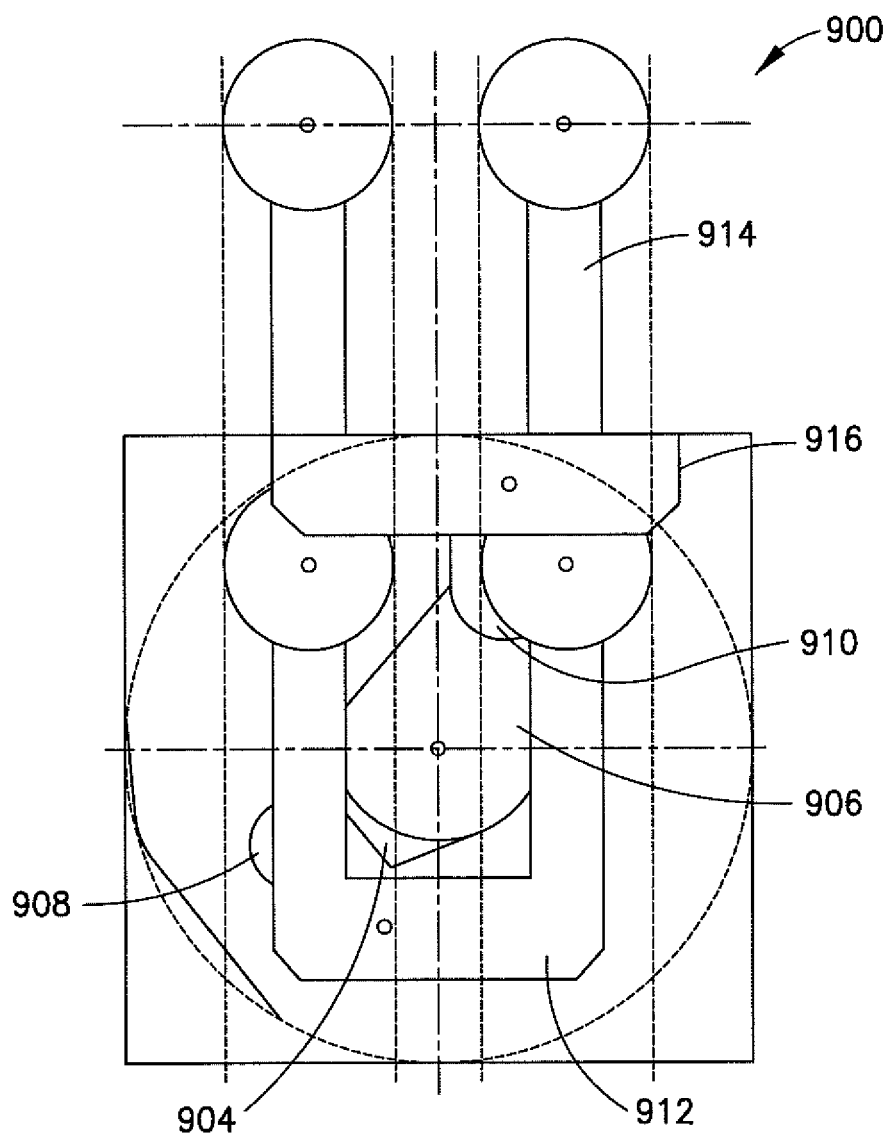
FIG. 53 is a top view of a transport apparatus.

Referring now to FIGS. 52A and 52B, there is shown top and side views respectively of robot 900 with arm 902. Both linkages are shown in their retracted positions with each linkage having a dual-holder end-effector. The internal arrangements used to drive the individual links of the arm may be identical to FIGS. 21-23. Each of the two upper arms 904, 906 is driven independently by one motor. The forearms 908, 910 are coupled via band arrangements, each with at least one non-circular pulley, to a third motor. The third links with the end-effectors 912, 914 are constrained by band drives, each with at least one non-circular pulley. The band drives are designed so that rotation of one of the upper arms 904, 906 causes the corresponding linkage to extend and retract along a straight line while the other linkage remains stationary. In the embodiment shown, the forearms are shorter than the upper arm; alternately they may be longer. The band drives in each of the linkages are designed using the methodology described for FIGS. 5-6. The kinematic equations presented for FIG. 5-6 may also be used for each of the two linkages of the dual arm. In order for the arm to rotate, all three drive shafts of the robot need to move in the direction of rotation of the arm by the same amount. In order for one of the end-effector assemblies to extend and retract radially along a straight-line path, the drive shaft of the upper arm associated with the active linkage needs to be rotated according to the inverse kinematic equations for FIGS. 5-6, and the other two drive shafts need to be kept stationary. Referring also to FIG. 53, there is shown the arm of FIGS. 52A and 52B with one linkage 906, 910, 914 extended. Note that the inactive linkage 904, 908, 912 remains stationary while the active linkage 906, 910, 914 extends with bridge 916. That is, the left linkage need not move while the right linkage extends, and the right linkage need not move when the left linkage extends although they may be moved radially independently. The embodiment shown has shorter links that may be stiffer with short bands and side-by-side forearms facilitating a shallow chamber. Alternately, the forearms may be longer than upper arms in the configuration with a bridge.

Figure 54A:
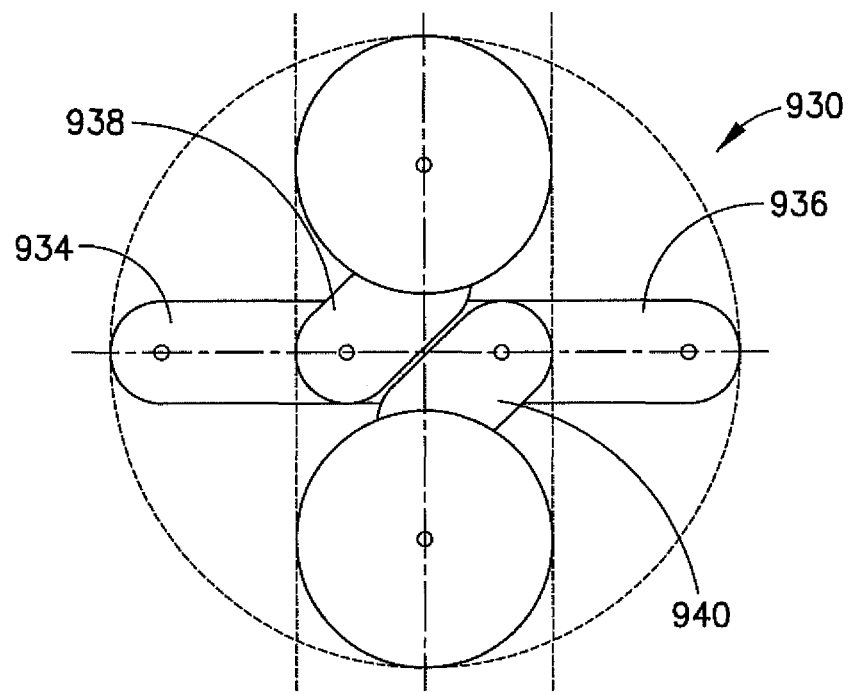
FIG. 54A is a top view of a transport apparatus.
Figure 54B:
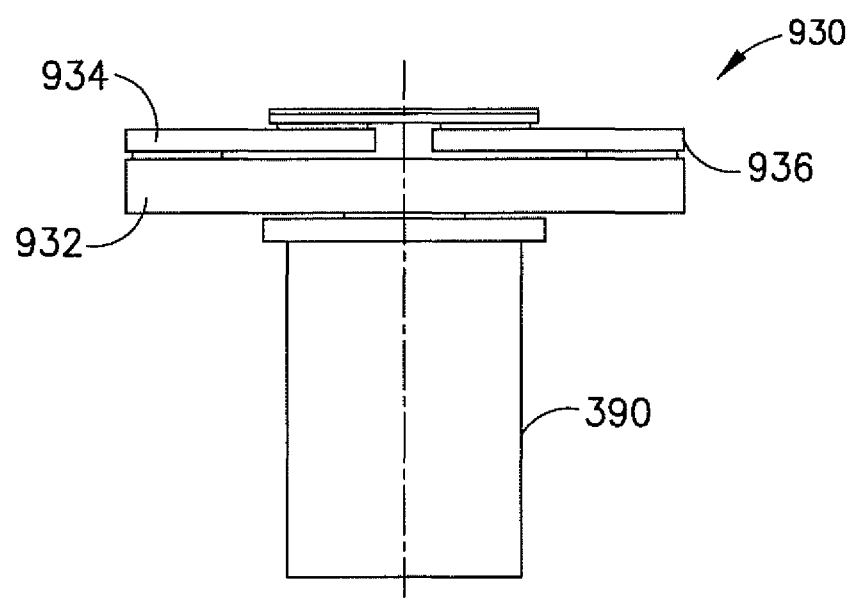
FIG. 54B is a side view of a transport apparatus.

Referring now to FIGS. 54-55 there is shown a coupled dual arm 930 with opposing end effectors 938, 940. FIGS. 54A and 54B show respectively the top and side views of the robot with the arm. Both linkages are shown in their retracted positions where the lateral offset of the end-effectors corresponds to the difference of the joint-to-joint lengths of the upper arm 932 and forearms 934, 936. The combined upper arm link 932 can be a single piece as depicted in FIG. 54 or it can be formed by two or more sections. By way of example, a two-section design may be lighter where less material, and left and right sections may be identical components. The internal arrangements used to drive the individual links of the arm may be based on that shown with respect to FIGS. 18 and 19 or otherwise. The common upper arm 932 is driven by one motor. Each of the two forearms 934, 936 is driven independently by one motor through a band drive with conventional pulleys. The third links with the end-effectors 938, 940 are constrained by band drives, each with at least one non-circular pulley, which compensate for the effects of the unequal lengths of the upper arms 934, 936 and forearm 932. The band drives in each of the linkages are designed using the methodology described with respect to FIG. 1 or otherwise. The kinematic equations presented for FIG. 1 can also be used for each of the two linkages of the dual arm. FIGS. 55A-55C shows the arm of FIG. 54 as the first 934, 938 and second 936, 940 linkages extend from the retracted position. The lateral offset of the end-effector corresponds to the difference of the joint-to-joint lengths of the upper arm 934, 936 and forearm 932, and the wrist joint 942, 944 travels along a straight line offset with respect to the trajectory of the center of the wafer by this difference. Note that the inactive linkage rotates while the active linkage extends. For instance, the second linkage rotates as the first linkage extends, and the first linkage rotates as the second linkage extends. FIG. 55A depicts the arm with both linkages in the retracted positions. FIG. 55B shows the first linkage 934, 938 extended. FIG. 55C depicts the second linkage 936, 940 extended. The arm shown has a low profile as the forearms travel in the same plane and the end-effectors travel in the same plane, allowing for a shallow vacuum chamber with a small volume. Since the retracted position of the wrist of one linkage is constrained by the wrist of the other linkage, the containment radius of the arm may be large, making the arm particularly suitable for applications with a large number of process modules where the diameter of the chamber is dictated by the size of the slot valves. Due to its low profile, the arm may replace a frogleg-type arm with opposing end-effectors. In the embodiment shown, the forearms are shorter than the upper arm; alternately they may be longer, for example, where the forearms are in different elevations and overlapping.

Figure 56A:
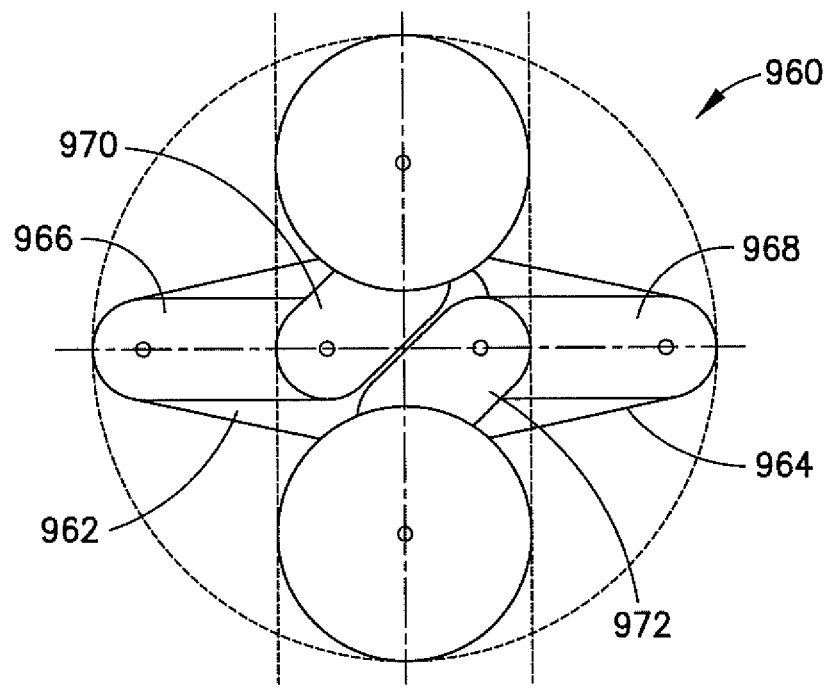
FIG. 56A is a top view of a transport apparatus.
Figure 56B:
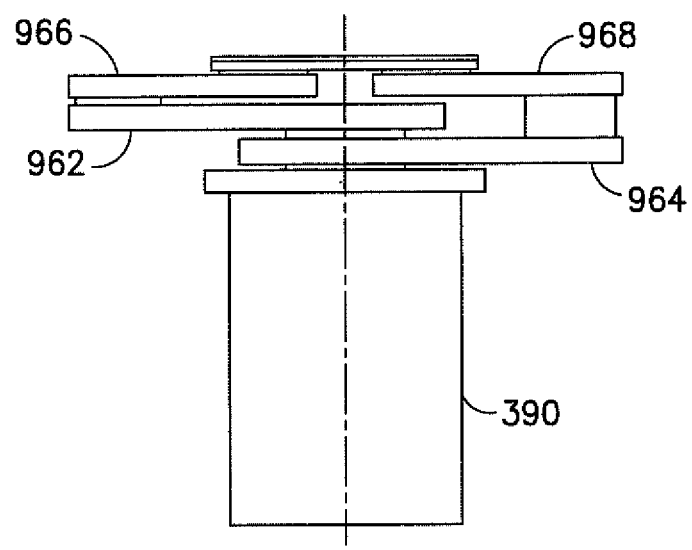
FIG. 56B is a side view of a transport apparatus.

Referring to FIGS. 56-57, there is shown an independent dual arm 960 with opposing end effectors 970, 972. FIGS. 56A and 56B show the top and side views of the robot with the arm. Both linkages are shown in their retracted positions. In FIG. 56, the upper arm 962 of the first linkage is located above the upper arm 964 of the second linkage. Alternatively, the upper arm of the second linkage may be located above the upper arm of the first linkage. The internal arrangements used to drive the individual links of the arm may be based on FIG. 23 or otherwise. Here, each of the two upper arms 962, 964 may be driven independently by one motor. The forearms 966, 968 are coupled via band arrangements, each with at least one non-circular pulley, to a third motor. The third links with the end-effectors 970, 972 are constrained by band drives, each with at least one non-circular pulley. The band drives are designed so that rotation of one of the upper arms causes the corresponding linkage to extend and retract along a straight line while the other linkage remains stationary. The band drives in each of the linkages are designed using the methodology described for FIG. 5. The kinematic equations presented for FIG. 5 can also be used for each of the two linkages of the dual arm. FIGS. 57A-57C show the arm of FIG. 56 as the first 962, 966, 970 and second 964, 968, 972 linkages extend from the retracted position. Here, that the inactive linkage remains (but not need do so) stationary while the active linkage extends. That is, the second linkage does not move while the first linkage extends, and the first linkage does not move when the second linkage extends. The arm has a low profile as the forearms travel in the same plane and the end-effectors travel in the same plane, allowing for a shallow vacuum chamber with a small volume. Since the retracted position of the wrist of one linkage is constrained by the wrist of the other linkage, the containment radius of the arm is large, making the arm particularly suitable for applications with a large number of process modules where the diameter of the chamber is dictated by the size of the slot valves. Due to its low profile, the arm can replace a frogleg-type arm with opposing end-effectors. In the embodiment shown, the forearms are shorter than the upper arm; alternately they may be longer, for example, where the forearms are in different elevations and overlapping.

Figure 58A:
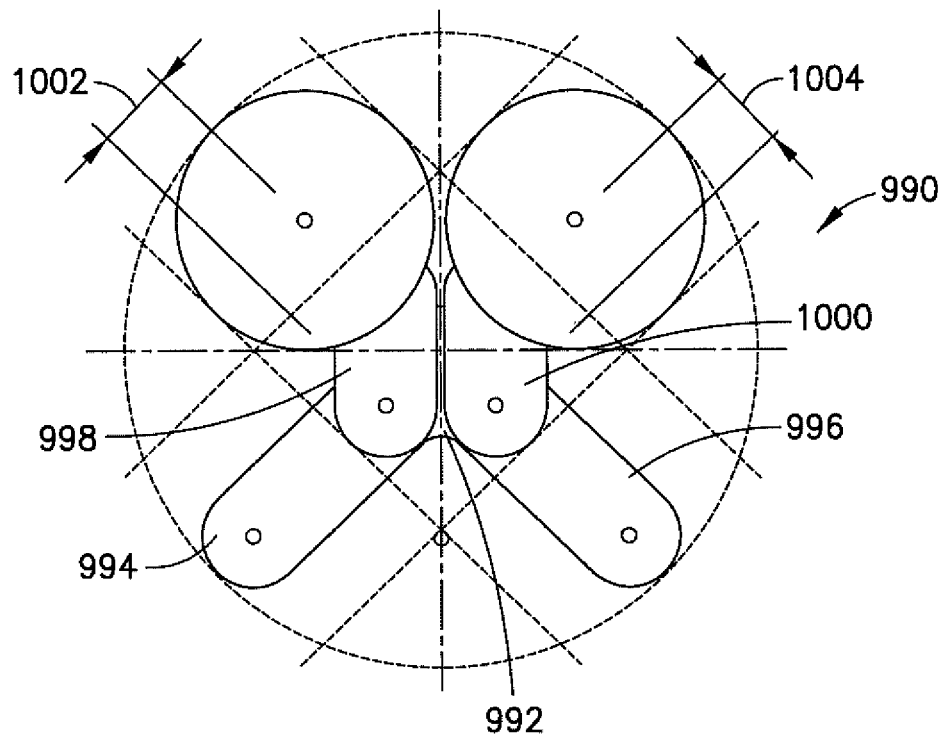
FIG. 58A is a top view of a transport apparatus.
Figure 58B:
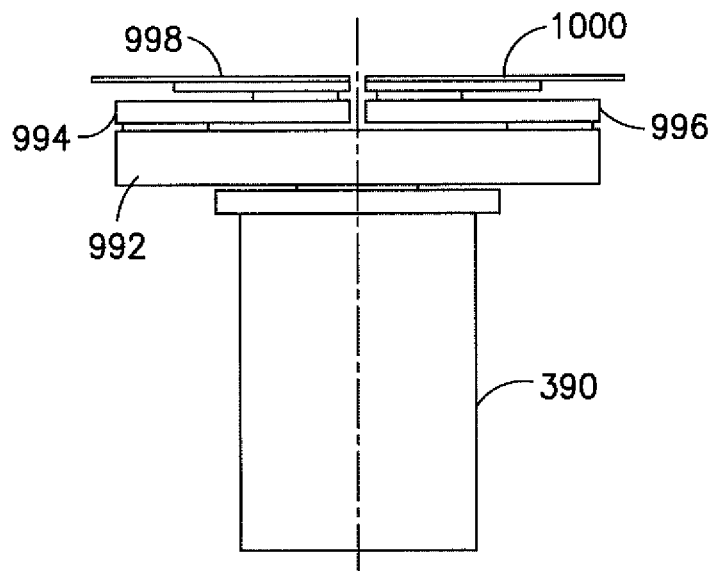
FIG. 58B is a side view of a transport apparatus.

Referring now to FIG. 58, there is shown a coupled dual arm 990 with angularly offset end effectors 998, 1000. FIGS. 58A and 58B show the top and side views of the robot with the arm. Both linkages are shown in their retracted positions. The lateral offset 1002, 1004 of the end-effectors corresponds to the difference of the joint-to-joint lengths of the upper arm 994, 996 and forearm 992. The combined upper arm link 992 can be a single piece as depicted in FIG. 59 or it can be formed by two or more sections. The internal arrangements used to drive the individual links of the arm are based on FIGS. 18 and 19 or otherwise. Here, the common upper arm 992 may be driven by one motor. Each of the two forearms 994, 996 may be driven independently by one motor through a band drive with conventional pulleys. The third links with the end-effectors 998, 1000 are constrained by band drives, each with at least one non-circular pulley, which compensate for the effects of the unequal lengths of the upper arms and forearms. The band drives in each of the linkages are designed using the methodology described for FIG. 1 or otherwise. The kinematic equations presented for FIG. 1 can also be used for each of the two linkages of the dual arm. Referring also to FIGS. 59A-C, there is shown the arm of FIG. 58 as the left 994, 998 and right 996, 1000 linkages extend. The lateral offset 1002, 1004 of the end-effector corresponds to the difference of the joint-to-joint lengths of the upper arm and forearm, and the wrist joint travels along a straight line offset with respect to the trajectory of the center of the wafer by this difference. Here, the inactive linkage rotates while the active linkage extends. For instance, the right linkage rotates as the left linkage extends, and the left linkage rotates as the right linkage extends. FIG. 59A depicts the arm with both linkages in the retracted positions. FIG. 59B shows the left linkage 994, 998 extended. FIG. 59C depicts the right linkage 996, 1000 extended. Here, the inactive arm rotates while the active one extends. In the embodiment shown, the forearms are shorter than the upper arm; alternately they may be longer, for example, where the forearms are in different elevations and overlapping. In the embodiment shown, the end effectors may be 90 degrees apart; alternately any separation angle may be provided.

Figure 60A:
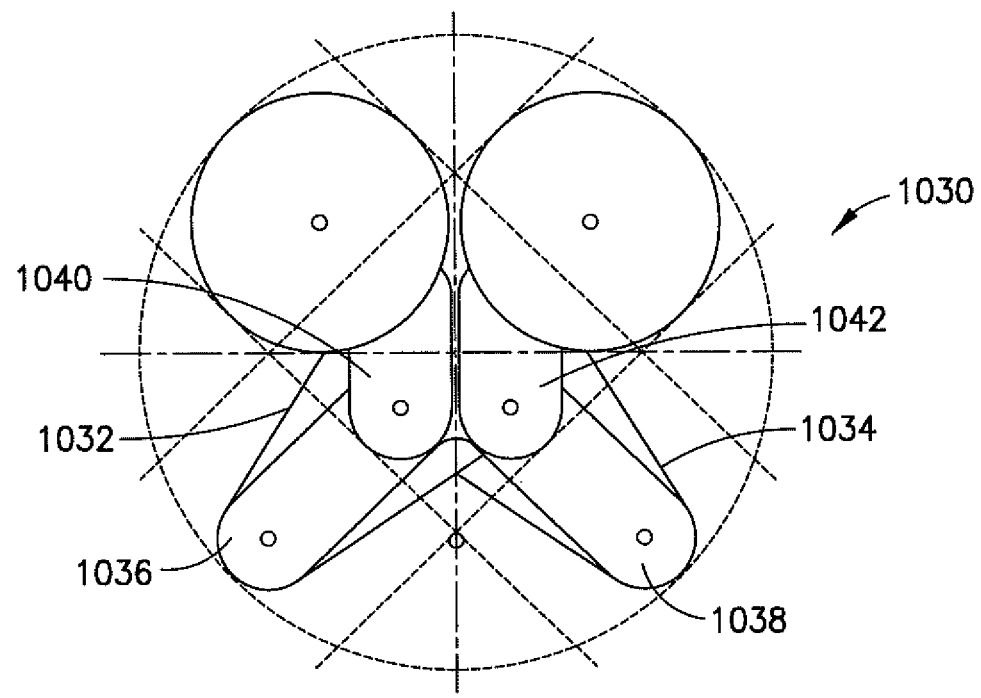
FIG. 60A is a top view of a transport apparatus.
Figure 60B:
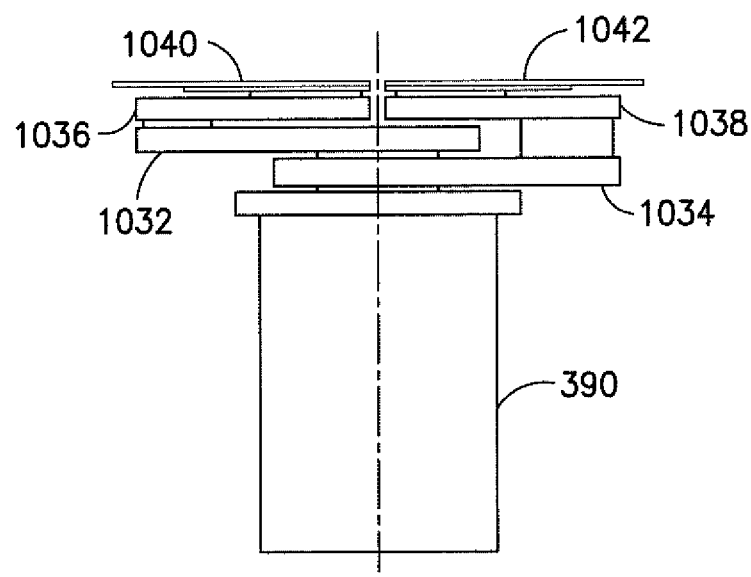
FIG. 60B is a side view of a transport apparatus.

Referring now to FIG. 60, there is shown and independent dual arm 1030 with angularly offset end effectors 1040, 1042. Here, FIGS. 60A and 60B show the top and side views of the robot with the arm. Both linkages are shown in their retracted positions. In FIG. 60, the right upper arm 1034 is located below the left upper arm 1032. Alternatively, the left upper may be located below the right upper arm. The internal arrangements used to drive the individual links of the arm may be based on FIG. 23. Each of the two upper arms 1032, 1034 may be driven independently by one motor each. The forearms are coupled via band arrangements, each with at least one non-circular pulley, to a third motor. The third links with the end-effectors 1040, 1042 are constrained by band drives, each with at least one non-circular pulley. The band drives are designed so that rotation of one of the upper arms 1032, 1034 causes the corresponding linkage to extend and retract along a straight line while the other linkage remains stationary. The band drives in each of the linkages are designed using the methodology described for FIG. 5 or otherwise. The kinematic equations presented for FIG. 5 can also be used for each of the two linkages of the dual arm. FIG. 61A-61C shows the arm of FIG. 60 as the left 1032, 1036, 1040 and then the right 1034, 1038, 1042 linkage extends. Here, the inactive linkage remains (but need not do so) stationary while the active linkage extends. That is, the left linkage does not move while the right linkage extends, and the right linkage does not move when the left linkage extends. Here, the inactive linkage remains stationary while the active one extends. In the embodiment shown, the forearms are shorter than the upper arm; alternately they may be longer, for example, where the forearms are in different elevations and overlapping. In the embodiment shown, the end effectors may be 90 degrees apart; alternately any separation angle may be provided.

Figure 62:
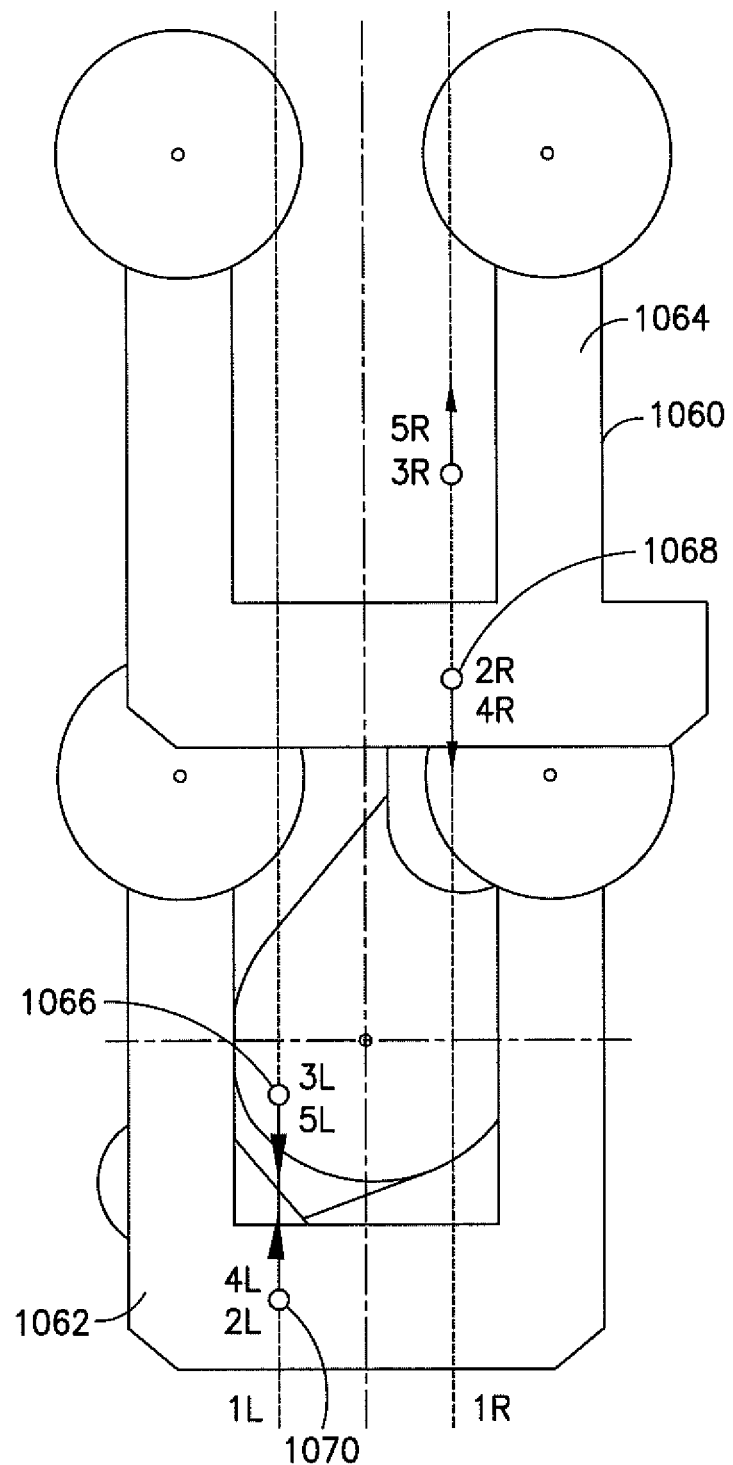
FIG. 62 is a top view of a transport apparatus.

By way of example with respect to FIG. 62 or otherwise, the third link and end-effector 1060, 1062, each of which may be referred to as a third-link assembly, may be designed so that the center of mass 1064, 1066 is on or close to the straight-line trajectory of the wrist joint 1068, 1070 respectively as the corresponding linkage of the arm extends and retracts. This reduces the moment due to the inertial force acting at the center of mass of the third-link assembly and the reaction force at the wrist joint, thus reducing the load on the band arrangement that constraints the third-link assembly. Here, the third-link assembly may further be designed so that its center of mass is on one side of the wrist joint trajectory when payload is present and on the other side of the trajectory when no payload is present. Alternatively, the third-link assembly may be designed so that its center of mass is substantially on the wrist joint trajectory when payload is present as the best straight-line tracking performance is typically required with the payload on, as illustrated in FIG. 62. In FIG. 62, 1L is the straight-line trajectory of the center of the wrist joint of the left linkage, 2L is the center 1070 of the wrist joint of the left linkage, 3L is the center of mass 1066 of the third-link assembly of the left linkage, 4L is the force acting on the third-link assembly of the left linkage as the left linkage accelerates at the beginning of an extend move (or decelerates at the end of a retract move), and 5L is the inertial force acting at the center of mass of the third-link assembly of the left linkage as the left linkage accelerates at the beginning of an extend move (or decelerates at the end of a retract move). Similarly, 1R is the straight-line trajectory of the center of the wrist joint of the right linkage, 2R is the center 1068 of the wrist joint of the right linkage, 3R is the center of mass 1064 of the third-link assembly of the right linkage, 4R is the force acting on the third-link assembly of the right linkage as the right linkage decelerates at the end of an extend move (or accelerates at the beginning of a retract move), and 5R is the inertial force acting at the center of mass of the third-link assembly of the right linkage as the right linkage decelerates at the end of an extend move (or accelerates at the beginning of a retract move). In the embodiment shown, dual wafer end effectors are provided. In alternate aspects, any suitable end effector and arm or link geometry may be provided.

In alternate aspects, the upper arms in any of the aspects of the embodiment can be driven by a motor either directly or via any kind of coupling or transmission arrangement. Any transmission ratio may be used. Alternately, the band drives that actuate the second link and constrain the third link can be substituted by any other arrangement of equivalent functionality, such as a belt drive, cable drive, circular and non-circular gears, linkage-based mechanisms or any combination of the above. Alternately, for example, in the dual and quad arm aspects of the embodiment, the third link of each linkage can be constrained to keep the end-effector radial via a conventional two stage band arrangement that synchronizes the third link to the pulley driven by the second motor, similarly to the single arm concept of FIG. 9. Alternatively, the two stage band arrangement can be substituted by any other suitable arrangement, such as a belt drive, cable drive, gear drive, linkage-based mechanism or any combination of the above. Alternately, the upper arms in the dual and quad arm aspects of the embodiment may not be arranged in a coaxial manner. They can have separate shoulder joints. The two linkages of the dual and quad arms do not need to have the same length of the upper arms and the same length of the forearms. The length of the upper arm of one linkage may be different from the length of the upper arm of the other linkage, and the length of the forearm of one linkage may be different from the length of the forearm of the other linkage. The forearm-to-upper-arm ratios can also be different for the two linkages. In the dual and quad arm aspects of the embodiment that have different elevations of the links of the left and right linkages, the left and right linkages can be interchanged. The two linkages of the dual and quad arms do not need to extend along the same direction. The arms can be configured so that each linkage extends in a different direction. The two linkages in any of the aspects of the embodiment may consist of more or less than three links (first link=upper arm, second link=forearm, third link=link with end-effector). In the dual and quad arm aspects of the embodiment, each linkage may have a different number of links. In the single arm aspects of the embodiment, the third link can carry more than one end-effector. Any suitable number of end-effectors and/or material holders can be carried by the third link. Similarly, in the dual arm aspects of the embodiment, each linkage can carry any suitable number of end-effectors. In either case, the end-effectors can be positioned in the same plane, stacked above each other, arranged in a combination of the two or arranged in any other suitable manner. Further, for dual arm configurations, each arm may be independently operable, for example, independently in rotation, extension and/or z (vertical), for example, as described with respect to pending U.S. patent application Ser. No. 13/670,004 entitled "Robot System with Independent Arms" having filing date Nov. 6, 2012 which is herein incorporated by reference in its entirety. Accordingly all such modifications, combinations and variations are embraced.

Figure 63:
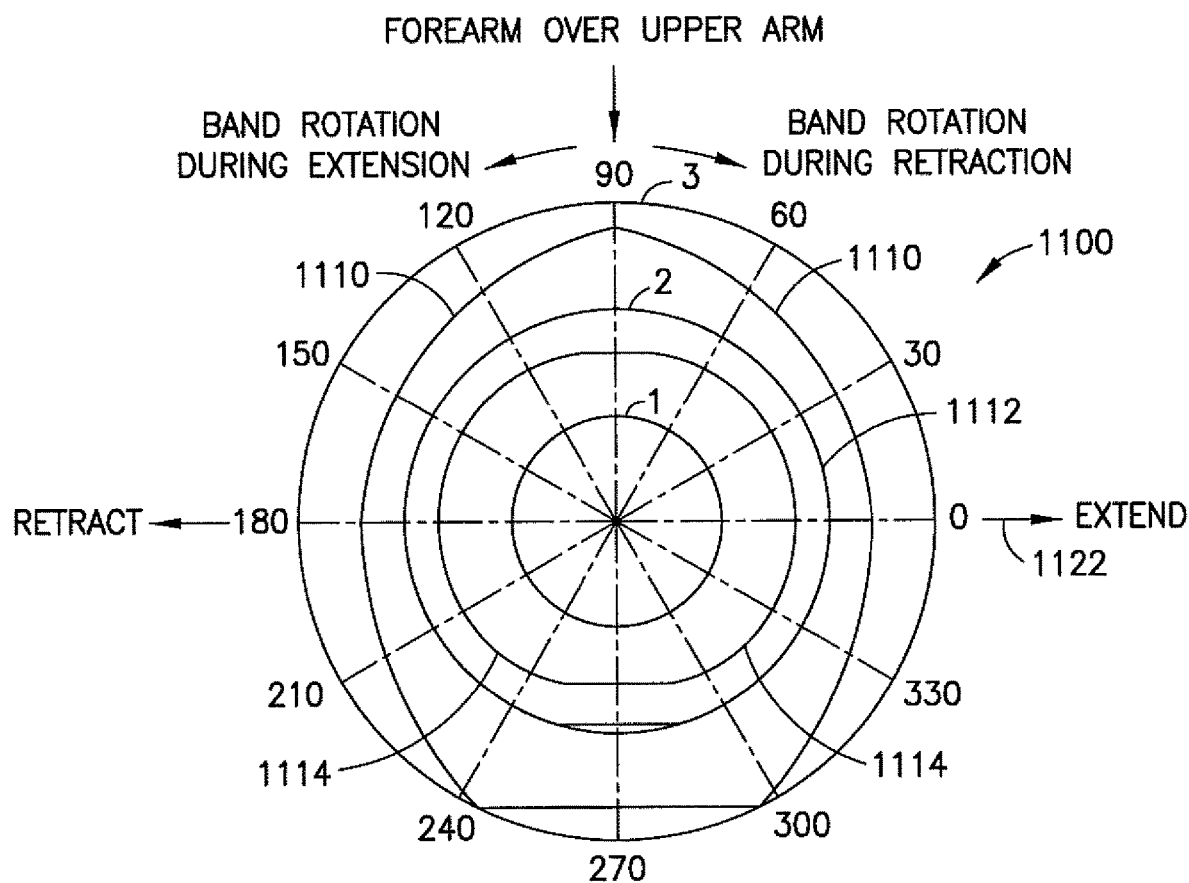
FIG. 63 is a diagram illustrating exemplary pulleys.

Referring now to FIG. 63, there is shown a graphical representation 1100 of exemplary pulleys. The exemplary pulley profiles may be for an arm with unequal link lengths as will be described. By way of example, the graph 1100 may show profiles for a wrist pulley where the elbow pulley is circular. Here, the following example design was used for the figure: Re/l2=0.2 where Re is the radius of the elbow pulley and l2 is the joint-to-joint length of the forearm. Alternately, any suitable ratio may be provided. For the purpose of clarity, the graph shows extreme design cases in comparison with a pulley for an equal-link arm. The most outer profile 1110 is for l2/l1=2, where l2 is the joint-to-joint length of the forearm and l1 is the joint-to-joint length of the upper arm, for example, this case represents a longer forearm. The middle profile 1112 is for l2/l1=1, for example, a case with equal link lengths. The most inner profile 1114 is for l2/l1=0.5, for example, this case represents a shorter forearm. In the embodiment shown, a polar coordinate system 1120 is used. Here, the radial distance is normalized with respect to the radius of the elbow pulley, for example, expressed as a multiple of the radius of the elbow pulley. In other words, Rw/Re is shown, where Rw represents polar coordinates of the wrist pulley with Re representing the elbow pulley. The angular coordinates are in deg, and the zero points along the direction 1122 of the end-effector, for example, the end-effector points to the right with respect to the figure.

Figure 64:
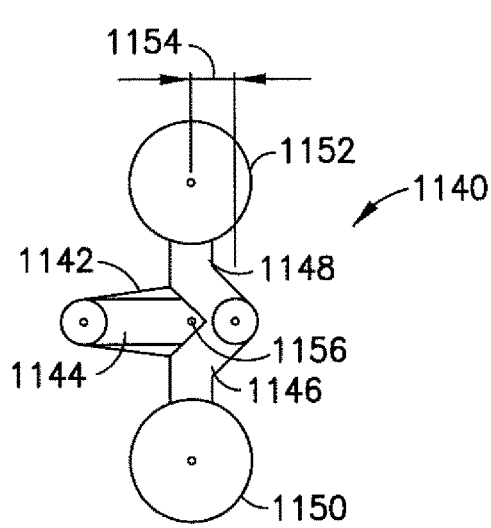
FIG. 64 is a top view of a transport apparatus.
Figure 65:
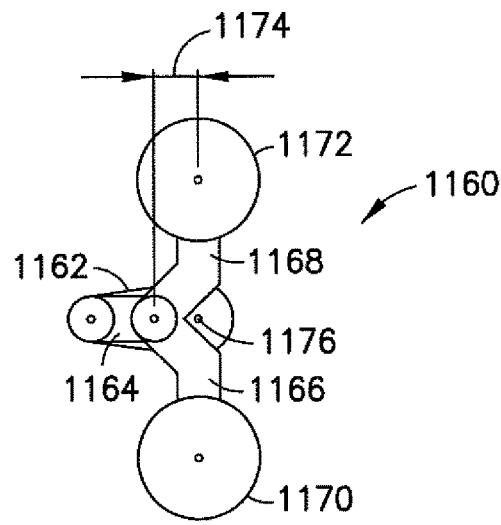
FIG. 65 is a top view of a transport apparatus.
Figure 66A:
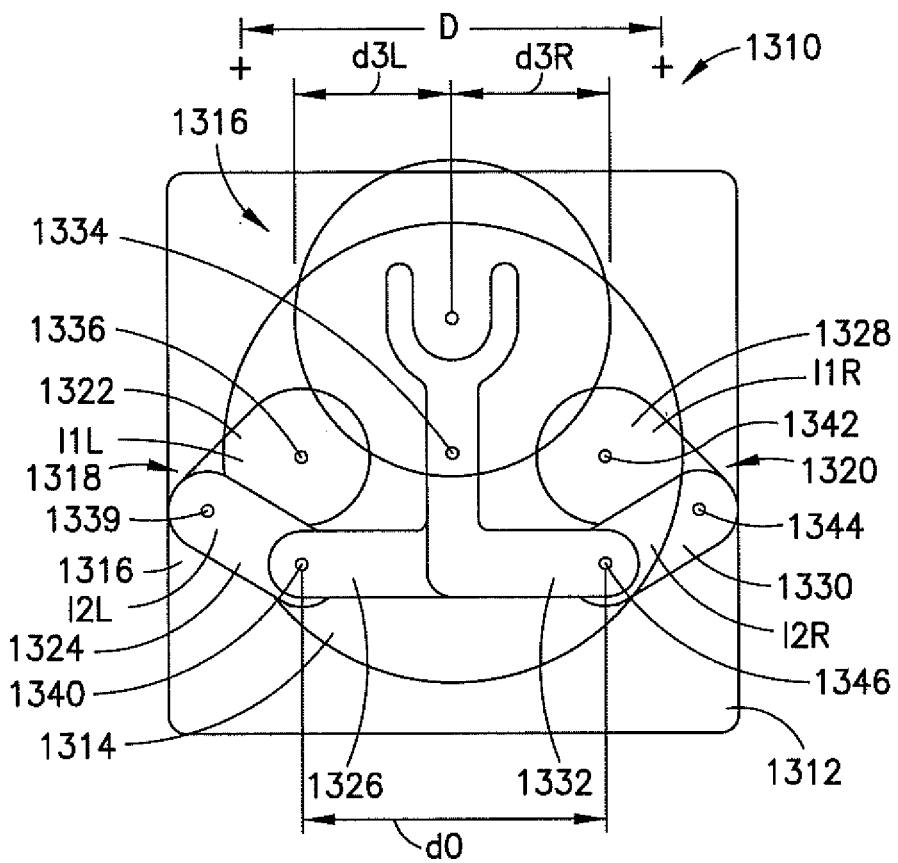
FIG. 66A is a top view of a transport apparatus.
Figure 66B:
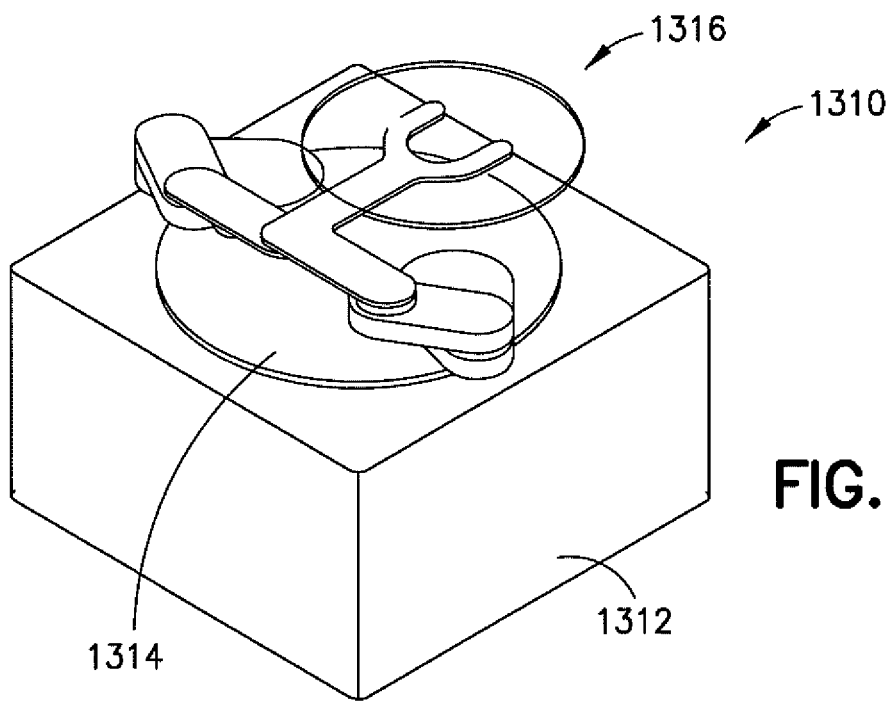
FIG. 66B is a isometric view of a transport apparatus.
Figure 66C:
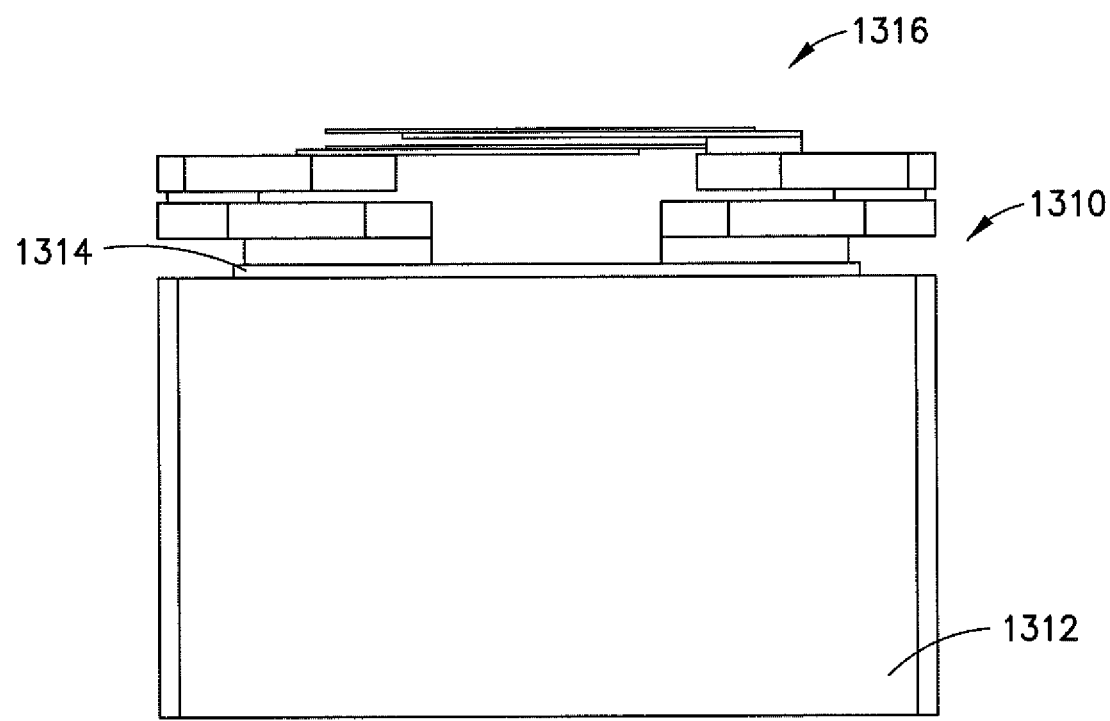
FIG. 66C is an end view of a transport apparatus.
Figure 66D:
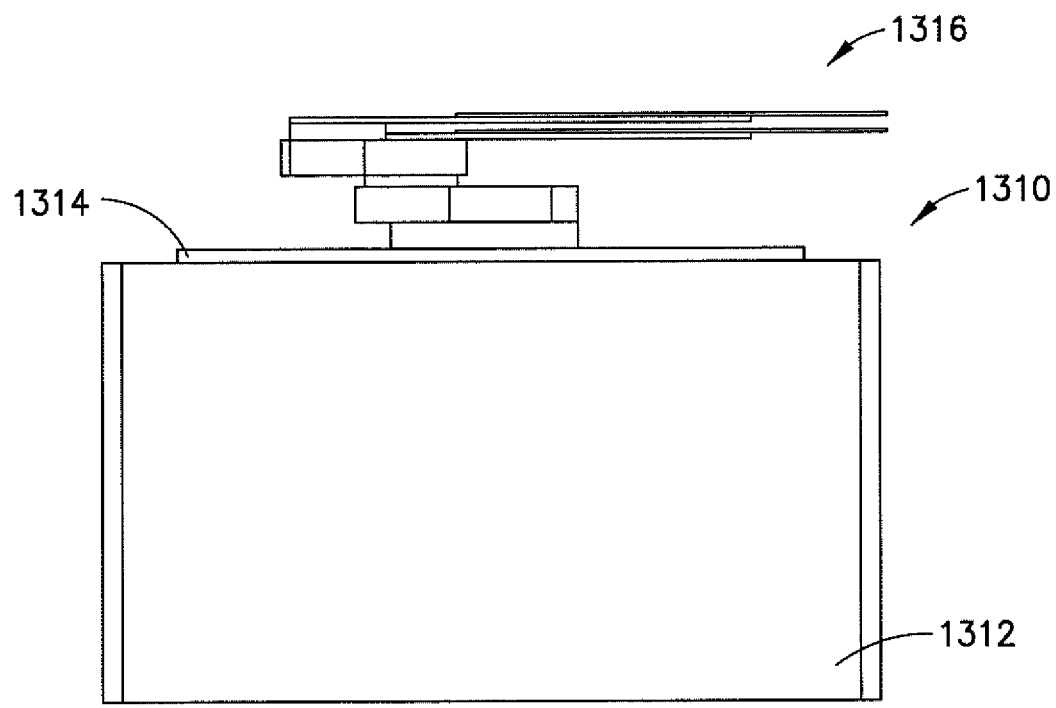
FIG. 66D is a side view of a transport apparatus.
Figure 67A:
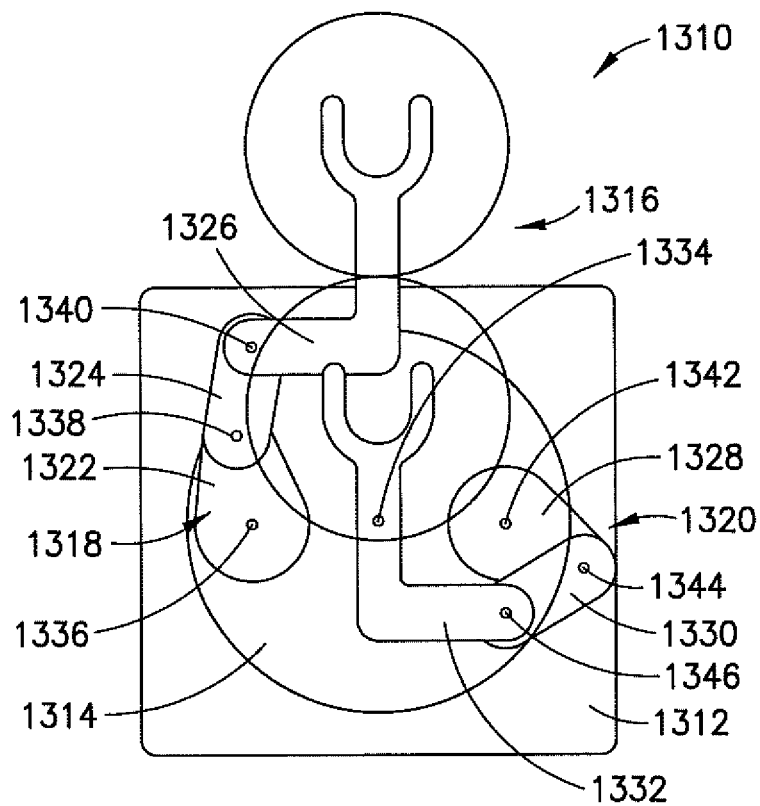
FIG. 67A is a top view of a transport apparatus.
Figure 67B:
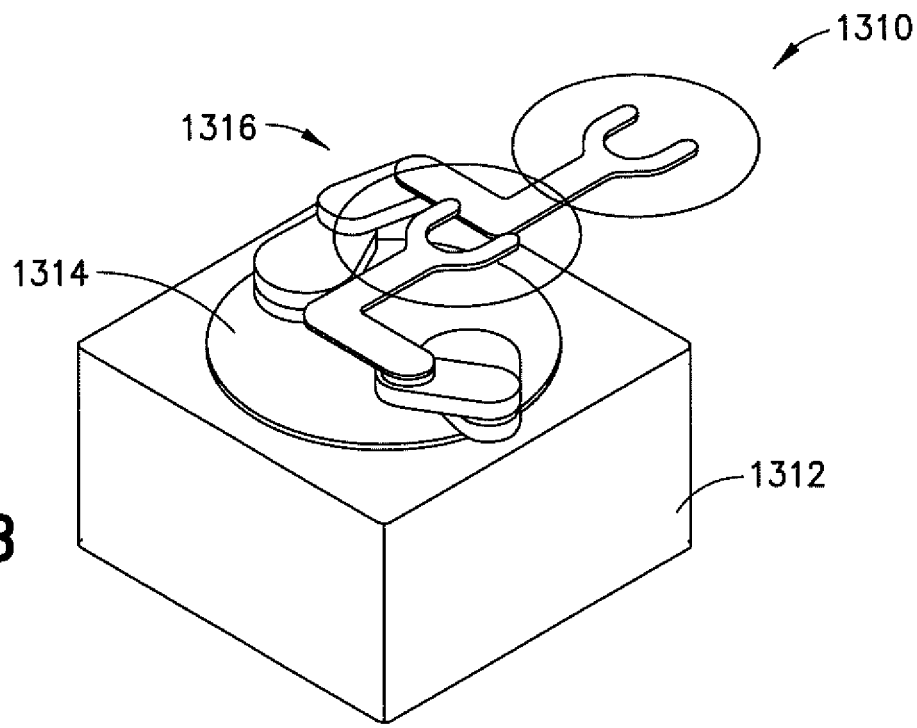
FIG. 67B is a isometric view of a transport apparatus.
Figure 67C:
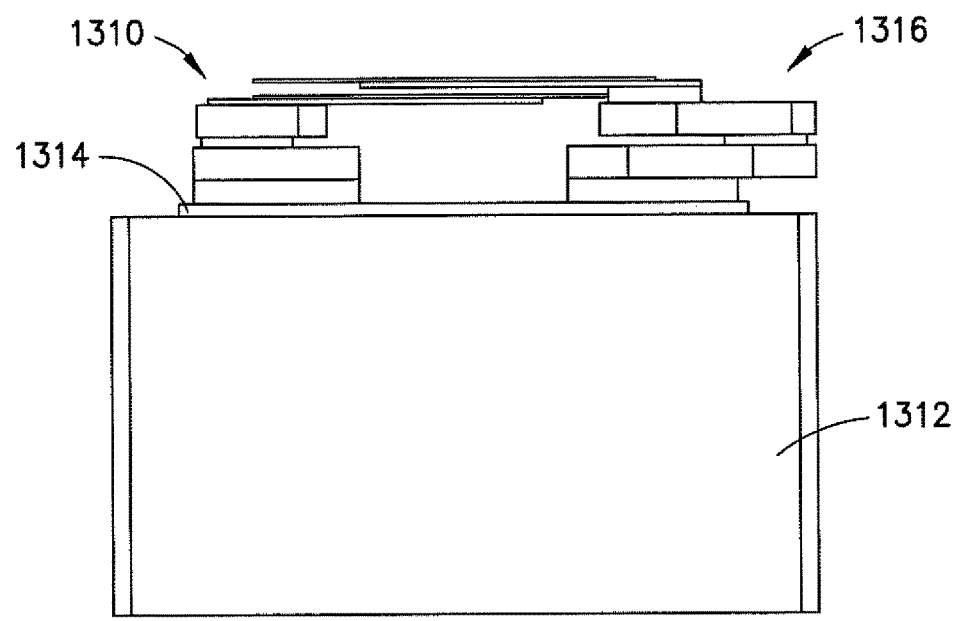
FIG. 67C is an end view of a transport apparatus.
Figure 67D:
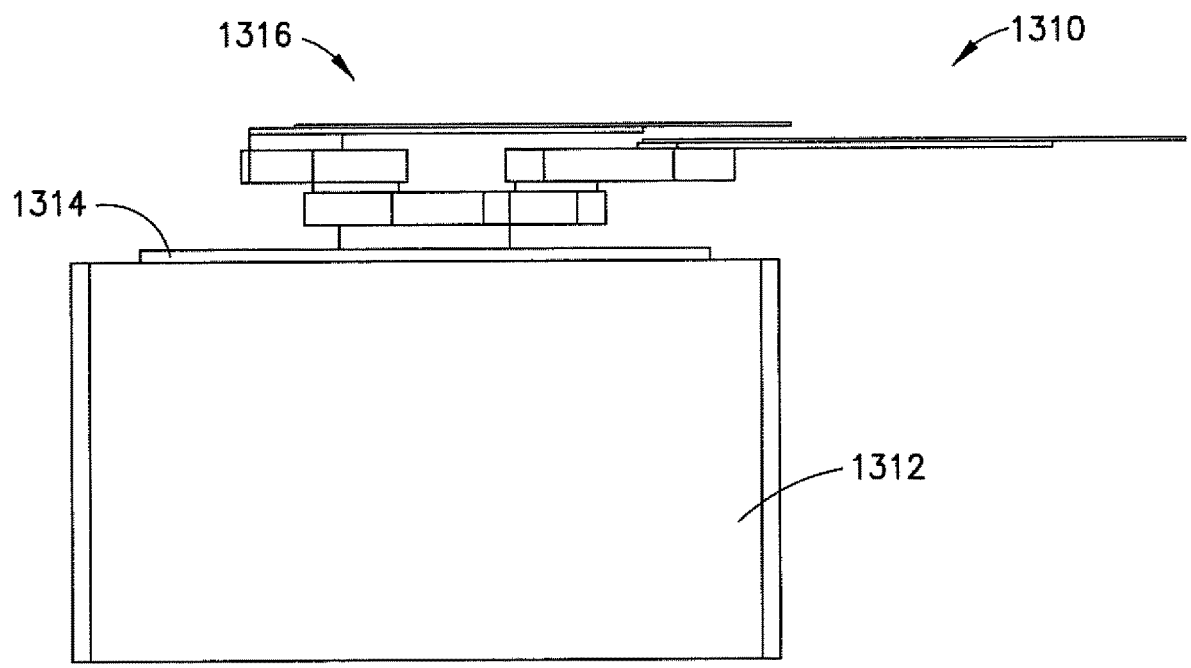
FIG. 67D is a side view of a transport apparatus.

Referring now to FIGS. 64 and 65, there is shown two additional configurations of the arm with unequal link lengths 1140 and 1150. Arm 1140 is shown with a forearm 1144 longer than upper arm 1142 where the single arm configuration may utilize the features as disclosed with respect to FIGS. 1-4 and 5-8 or otherwise. In the embodiment shown, two end-effectors 1146, 1148 supporting respective substrates 1150, 1152 are connected rigidly to each other and pointing in opposing directions. The substrates travel in a radial path that coincides with the center 1156 of robot 1140 and offset 1154 from the wrist as shown. Similarly, arm 1160 is shown with a forearm 1164 shorter than upper arm 1162 where the single arm configuration may utilize the features as disclosed with respect to FIGS. 1-4 and 5-8 or otherwise. In the embodiment shown, two end-effectors 1166, 1168 supporting respective substrates 1170, 1172 are connected rigidly to each other and pointing in opposing directions. The substrates travel in a radial path that coincides with the center 1176 of robot 1160 and offset 1174 from the wrist as shown. Here, the features of the disclosed embodiments may be similarly shared with any of the other disclosed embodiments.

Referring now to FIGS. 66 and 67, the disclosed describes a dual-arm robot 1310 with stacked and side-by-side end-effector configurations. The device may be used in combination with transport mechanisms and devices as disclosed in United States Publication No. 2013/0071218 published Mar. 21, 2103 based on U.S. patent application Ser. No. 13/618,117 filed Sep. 14, 2012 and entitled "Low Variability Robot" or U.S. patent application Ser. No. 14/601,455 filed Jan. 21, 2015 and entitled "Substrate Transport Platform" both of which are hereby incorporated by reference herein in their entirety. Alternately, the embodiment may be used in any suitable device or applications. The disclosed device may provide a robot 1310 with two end-effectors which (i) has a small footprint so that it can move and rotate in a narrow tunnel, (ii) can access the same station with both end-effectors either independently or simultaneously, and (iii) can access side-by-side offset stations either independently or simultaneously.

An example embodiment of the robot 1310 is depicted diagrammatically in FIGS. 66A-66D and 67A-67D. The robot may consist of a robot drive unit 1312 with a pivoting base 1314 about axis 1334 and a robot arm 1316. The robot arm 1316 may feature two linkages, i.e., a left linkage 1318 and a right linkage 1320. FIGS. 66A-66D show the robot with both linkages retracted, FIGS. 67A-67D show the robot with the left linkage 1318 extended.

The left linkage 1318 may consist of a left upper arm 1322, a left forearm 1324 and a left end-effector 1326. The left upper arm 1322 may be coupled to the base via a rotary joint or axis 1336, the left forearm 1324 may be coupled to the left upper arm 1322 by another rotary joint or axis 1338, and the left end-effector 1326 may be coupled to the left forearm 1324 by yet another rotary joint or axis 1340.

Similarly, the right linkage 1320 may consist of a right upper arm 1328, a right forearm 1330 and a right end-effector 1332. The right upper arm 1328 may be coupled to the base via a rotary joint or axis 1342, the right forearm 1330 may be coupled to the right upper arm 1328 by another rotary joint or axis 1344, and the right end-effector 1332 may be coupled to the right forearm 1330 by yet another rotary joint or axis 1346.

The joint-to-joint length of the left forearm may be longer than the joint-to-joint length of the left upper arm. Alternatively, the joint-to-joint length of the left forearm may be equal to the joint-to-joint length of the left upper arm. In yet another alternative, the left forearm and left upper arm may have any other suitable lengths.

Similarly, the joint-to-joint length of the right forearm may be longer than the joint-to-joint length of the right upper arm. Alternatively, the joint-to-joint length of the right forearm may be equal to the joint-to-joint length of the right upper arm. In yet another alternative, the right forearm and right upper arm may have any other suitable lengths.

In the example of FIGS. 66A-66D and 67A-67D, the joint-to-joint lengths of the left and right upper arms and left and right forearms are shown the same. Similarly, the dimensions of the left and right end-effectors, including the lengths and lateral offsets, are shown the same. However, the linkages may feature any suitable dimensions of the upper arms, forearms and end-effectors.

In order for the two end-effectors to be able to access simultaneously side-by-side offset stations, the distance between the joints that couple the left and right upper arms to the base may be selected to satisfy the following relationship:

$$D = 2d0 \quad (1)$$

where D=center-to-center distance between side-by-side offset stations (m), and d0=distance between joints that couple left and right upper arms to base (m).

In addition, in order for the two end-effectors to be able to access the same station simultaneously, the dimensions of the linkages may be selected to satisfy the following relationship:

$$d0 = l2L - l1L + d3L + l2R - l1R + d3R \quad (2)$$

The following nomenclature is used in Equation (2) above: d3L=lateral offset of left end-effector (m), d3R=lateral offset of right end-effector (m), l1L=join-to-joint length of left upper arm (m), l1R=join-to-joint length of right upper arm (m), l2L=joint-to-joint length of left forearm (m), and l2R=joint-to-joint length of right forearm (m).

When the robot arm is symmetric, i.e., the left linkage and the right linkage have the same dimensions, Equation (2) may be simplified as follows:

$$d0 = 2(l2 - l1 + d_3) \quad (3)$$

where d3=lateral offset of end-effectors (m), l1=join-to-joint length of upper arms (m), and l2=joint-to-joint length of forearms (m).

Figure 68A:
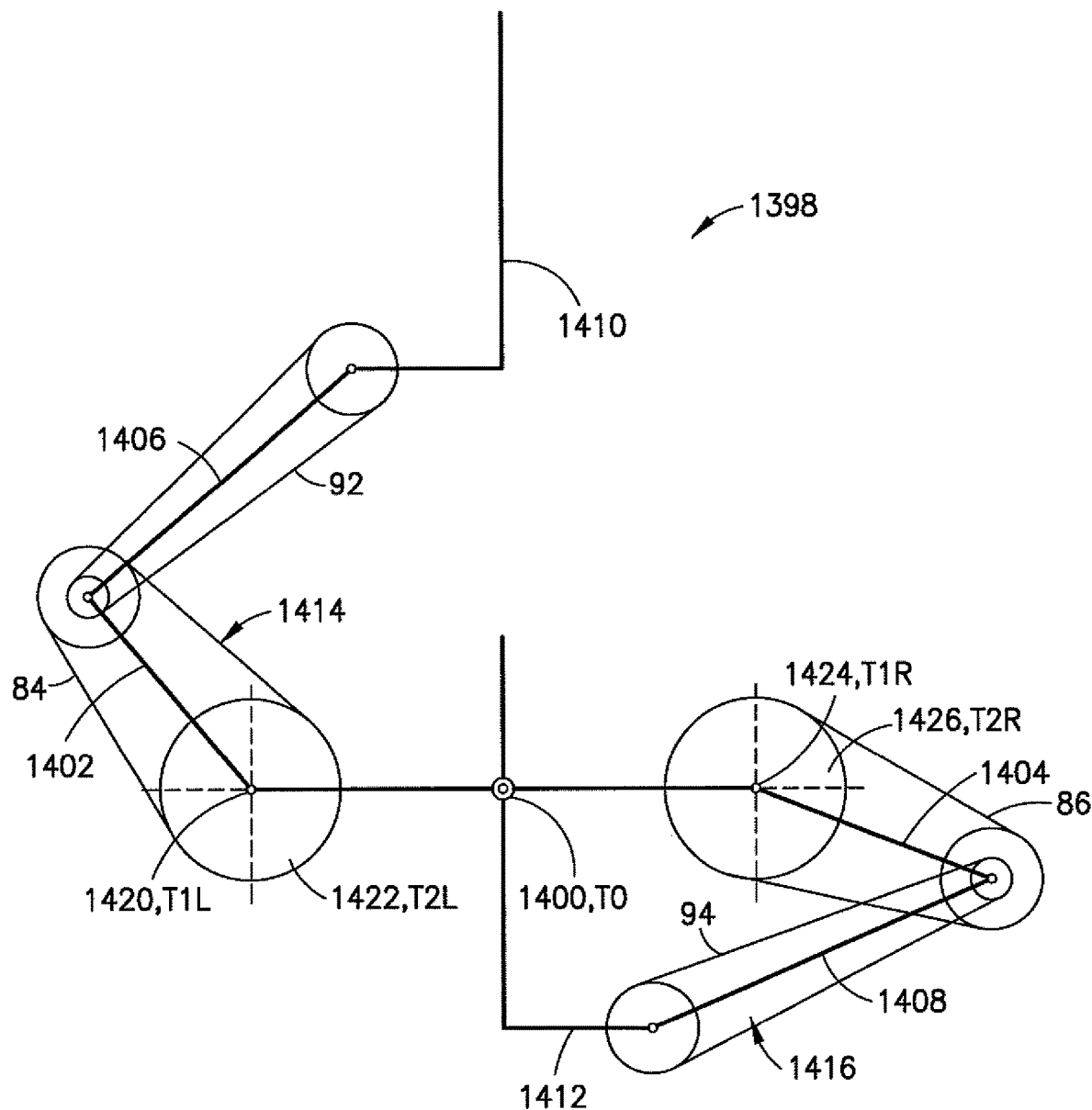
FIG. 68A is a top view of a transport apparatus.
Figure 68B:
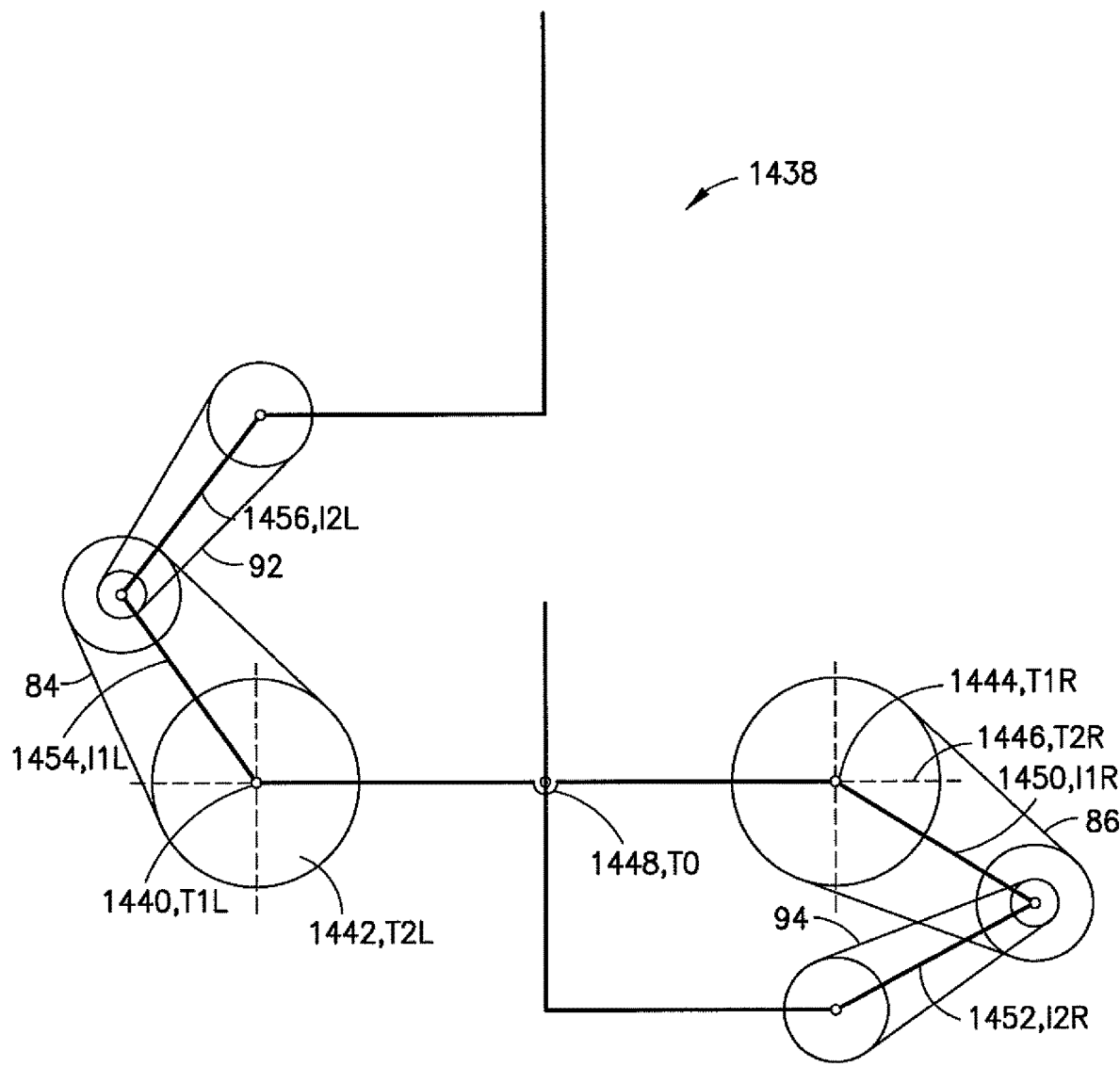
FIG. 68B is a top view of a transport apparatus.

FIGS. 68A and 68B illustrate diagrammatically an example arrangement 1398, 1438 that may be used to drive the base and individual links, i.e., upper arms, forearms and end-effectors, of the robot. As depicted in FIGS. 68A and 68B, the base may be driven by a drive shaft 1400, 1448, for example, T0.

The left upper arm 1402, 1454 may be actuated by drive shaft T1L 1420, 1440. The left forearm 1406, 1456 may be coupled via a band arrangement 84 with at least one non-circular pulley to another drive shaft, T2L 1422, 1442. The band arrangement may be designed so that rotation of the left upper arm causes the left wrist joint, i.e., the joint that couples the left end-effector to the left forearm, to extend and retract along a straight line parallel to the desired straight-line path of the left end-effector.

The left end-effector 1410 may be constrained by another band arrangement 92 with at least one non-circular pulley, which compensates for the effects of the unequal lengths of the left upper arm and left forearm so that the left end-effector may travel along a straight line while maintaining the desired orientation.

Alternatively, if l1L=l2L, conventional pulleys may be utilized, as shown in FIG. 68B. In this embodiment, the band arrangement that couples the left forearm to shaft T2L is designed so that the diameter of the pulley coupled to shaft T2L is twice the diameter of the pulley coupled to the left forearm. The band arrangement that constrains the left end-effector is designed so that the diameter of the pulley attached to the left upper arm is half of the diameter of the pulley attached to the left end-effector.

Similarly, the right upper arm 1404, 1450 may be actuated by drive shaft T1R 1424, 1444. The right forearm 1408, 1452 may be coupled via a band arrangement 86 with at least one non-circular pulley to another drive shaft, T2R 1426, 1446. The band arrangement may be designed so that rotation of the right upper arm causes the right wrist joint, i.e., the joint that couples the right end-effector to the right forearm, to extend and retract along a straight line parallel to the desired straight-line path of the right end-effector 1412.

The right end-effector may 1412 be constrained by another band arrangement 94 with at least one non-circular pulley, which compensates for the effects of the unequal lengths of the right upper arm and right forearm so that the left end-effector may travel along a straight line while maintaining the desired orientation.

Alternatively, if l1R=l2R, conventional pulleys may be utilized, as shown in FIG. 68B. In this embodiment, the band arrangement that couples the right forearm to shaft T2R is designed so that the diameter of the pulley coupled to shaft T2R is twice the diameter of the pulley coupled to the right forearm. The band arrangement that constrains the right end-effector is designed so that the diameter of the pulley attached to the right upper arm is half of the diameter of the pulley attached to the right end-effector.

In order for the entire robot arm to rotate, all drive shafts, i.e., T0, T1L, T2L, T1R and T2R, need to move in the desired direction of rotation of the arm by the same amount with respect to a fixed reference frame (or drive shaft T0 needs to move while the other drive shafts may be viewed as stationary with respect to the base). This is depicted diagrammatically in FIGS. 69A through 69C. In this particular example, the entire robot arm rotates in the counterclockwise direction by 180 deg.

In order for the left end-effector to extend and retract along a straight-line path, drive shaft T1L needs to move by an angle determined based on the inverse kinematic equations of the left linkage while shafts T0 and T2L are kept stationary. The robot 1500 with left and right arms 1502, 1504 with the left end-effector extended from the initial position of FIG. 69A is shown diagrammatically in FIG. 69D.

Similarly, in order for the right end-effector to extend and retract along a straight-line path, drive shaft T1R needs to move by an angle determined based on the inverse kinematic equations of the right linkage while shafts T0 and T2R are kept stationary. The robot with the right end-effector extended from the initial position of FIG. 69A is depicted diagrammatically in FIG. 69E.

Both left and right end-effectors of the robot may be extended and retracted simultaneously along a straight-line path by rotating drive shafts T1L and T1R in the opposite directions and, if the left and right linkages feature the same dimensions, by the same amount. The robot with both left and right end-effectors extended from the initial position of FIG. 69A is shown diagrammatically in FIG. 69F.

The motion described above with respect to FIGS. 69D-69F allows the robot to extend/retract the end-effectors to/from the same station either independently or simultaneously. Therefore, the robot is capable of picking/placing material, such as semiconductor wafers, from/to the same station independently or simultaneously with both end-effectors along a straight line path 1510.

The left and right linkages 1502, 1504 may also be rotated individually. In order for the left linkage to rotate, drive shafts T1L and T2L need to move in the desired direction of rotation by the same amount. Similarly, in order for the right linkage to rotate, drive shafts T1R and T2R need to move in the desired direction of rotation by the same amount.

When the left and right linkages rotate individually by 180 deg, the left end-effector and right end-effector become laterally offset, as depicted in the example diagrams shown in FIGS. 70A-70C. In this particular example, the left linkage 1502 rotates in the clockwise direction and the right linkage 1504 rotates simultaneously in the counterclockwise direction (preventing the risk of collision of the left and right wrist joints). However, the left and right linkages may rotate independently in sequence, in the same direction or in any other suitable manner.

As a result of the individual rotations of the left and right linkages described above, provided that the dimensions of the robot meet the conditions of Equations (1) and (2), the arm becomes reconfigured such that the centers of the left and right end-effectors are laterally offset by distance D.

In case that the above end-effector offset reconfiguration by individual rotations of the left and right linkages precedes or follows a rotation of the entire arm, the moves may be conveniently blended to minimize the overall duration.

Once in the position of the diagram of FIG. 70C, the left end-effector may again be extended and retracted along a straight-line path 1512 by moving drive shaft T1L while holding shafts T0 and T2L stationary. Similarly, the right end-effector may be extended and retracted along a straight-line path by moving drive shaft T1R while holding shafts T0 and T2R stationary. And, finally, both left and right end-effectors of the robot may be extended and retracted simultaneously along straight-line paths by rotating drive shafts T1L and T1R in opposite directions and, if the left and right linkages feature the same dimensions, by the same amount. The robot with the left end-effector extended from the initial position of FIG. 70C is shown diagrammatically in FIG. 70D; the robot with the right end-effector extended from the initial position of FIG. 70C is depicted diagrammatically in FIG. 70E; and the robot with both left and right end-effectors extended from the initial position of FIG. 70C is shown diagrammatically in FIG. 70F.

The motion described above with respect to FIGS. 70E-70F allows the robot to extend/retract the end-effectors to/from two side-by-side offset stations. Therefore, the robot is capable of picking/placing material, such as semiconductor wafers, from/to two side-by-side offset stations either independently or simultaneously.

In case that the access paths to the side-by-side offset stations are not parallel, for example, path 1514 or 1516 in FIG. 71, the robot may individually rotate the left and right linkages so that the directions of their extension/retraction paths align with the access paths to the stations. An example of such a scenario is illustrated diagrammatically in the diagrams of FIGS. 71A-71C. Assuming the initial position of diagram 71A, the left and right linkages may be rotated to reconfigure the arm so that the end-effectors are laterally and angularly offset as depicted in diagram 71B. In this particular example, the angular offset between the left and right end-effectors is 30 deg. From the retracted position of diagram 71B, the left linkages may be extended, either independently or simultaneously, as shown in diagram 71C.

The robot may also access stations 180 deg apart, either independently or simultaneously, as depicted in the example diagrams 71D and 71E. In this particular example, assuming the starting position of diagram 71A, the left and right linkages may first be rotated to the configuration of diagram 71D, and then the left end-effector and/or the right end-effector may be extended, either independently or simultaneously, as shown in diagram 71E.

While both left and right linkages are shown extended in the diagram FIG. 71E, in alternate aspects only one of the two linkages may extend. Here, the reach of the linkages (measured from the center of the robot, which is represented by the axis of drive shaft T0) is longer in the configuration shown in diagram 71E and, therefore, this configuration may be utilized for stations located further away from the robot.

The robot may be driven using three- to five-axis drive arrangement, depending on the number of degrees of freedom required in a particular application.

A 3-axis drive arrangement may include three independently controlled motors, M0, M1 and M2, as illustrated by the two examples 1600, 1700 of FIGS. 72A and 72B and FIGS. 72C and 72D.

In FIGS. 72A-72D, diagrams 72A and 72B show the top and side views, respectively, of an example arrangement 1600 of the robot drive unit and arm base 1618 where motor M0 is directly coupled to shaft T0 1602, which actuates the base 1618, motor M1 1604 is directly attached to shaft T1L 1610, driving the left upper arm, and motor M2 1606 is directly attached to shaft T2R 1616, which is coupled to the right forearm. Furthermore, two belt arrangements 1620, 1622 are utilized so that shafts T1L 1610 and T1R 1614 rotate in opposite directions than shafts T2L 1612 and T2R 1616, respectively. This is achieved via a crossover band arrangement 1620 between shafts T1L and T1R, and, similarly, by another crossover band arrangement 1622 between shafts T2L and T2R.

Alternatively, drive 1700 may have motors M0 1702, M1 1704 and M2 1706 arranged in the drive unit, and motion may be transmitted from motors M1 and M2 to shafts T1L 1710, T1R 1714 and T2L 1712, T2R 1716, respectively, using band drives 1720, 1722, as illustrated in the example of diagrams 72C and 72D.

In yet another alternative, any suitable combination of direct coupling and band arrangements between the motors and drive shafts may be employed. In general, any suitable means of transmission of motion between the motors and drive shafts, which provides the desired motion relationship, may be used.

When a 3-axis drive arrangement according to the examples of FIG. 72A-72D is utilized, the robot may perform all operations defined in FIGS. 69-71 except for independent extensions and retractions of the left and right linkages (diagrams D and E in FIGS. 69 and 70).

A 4-axis drive arrangement may include four independently controlled motors, as illustrated in the examples 1800, 1900 of the diagrams FIGS. 73A and 73B. Diagrams 73A and 73B show the top and side views of the robot drive unit and arm base 1802. Motors M0 1804, M1L 1808 and M1R 1810 may be utilized to actuate shafts T0 1804, T1L 1808 and T1R 1810, respectively, in an independent manner. Motor M2 1806 may be used to actuate shafts T2L 1812 and T2R 1814 so that the two shafts rotate in opposite directions. In the particular example of the diagrams in FIGS. 73A and 731B, this is achieved via a straight band arrangement 1820 between a pulley coupled to motor M2 and shaft T2L, and a crossover band arrangement 1822 between another pulley coupled to motor M2 and shaft T2R.

Alternatively, any combination of direct coupling and band arrangements or any other suitable means of transmission of motion between the motor and drive shafts, which facilitates independent actuation of shafts T0, T1L and T1R and coupled actuation of shafts T2L and T2R, may be employed.

When such a 4-axis drive arrangement is utilized, the robot may perform all operations according to FIGS. 69-71, including independent extensions and retractions of the left and right linkages.

Figure 72A:
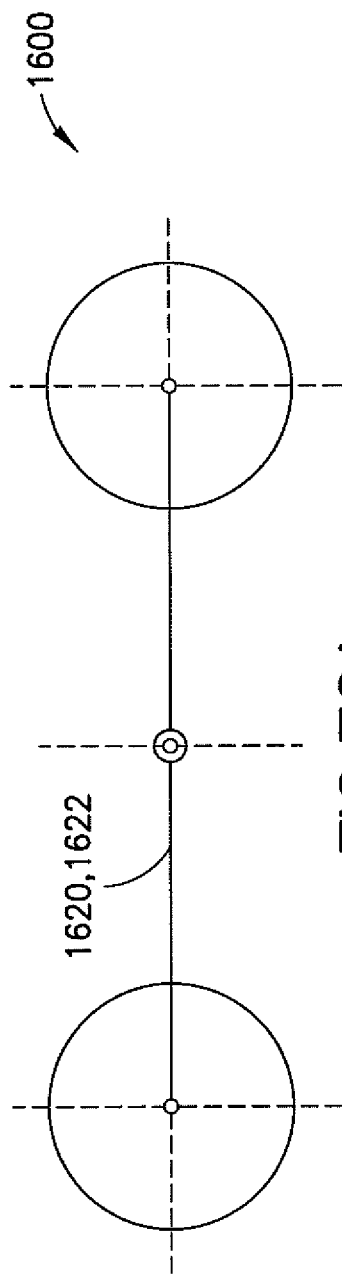
FIG. 72 A-B are top and side views of a transport apparatus.
Figure 72B:
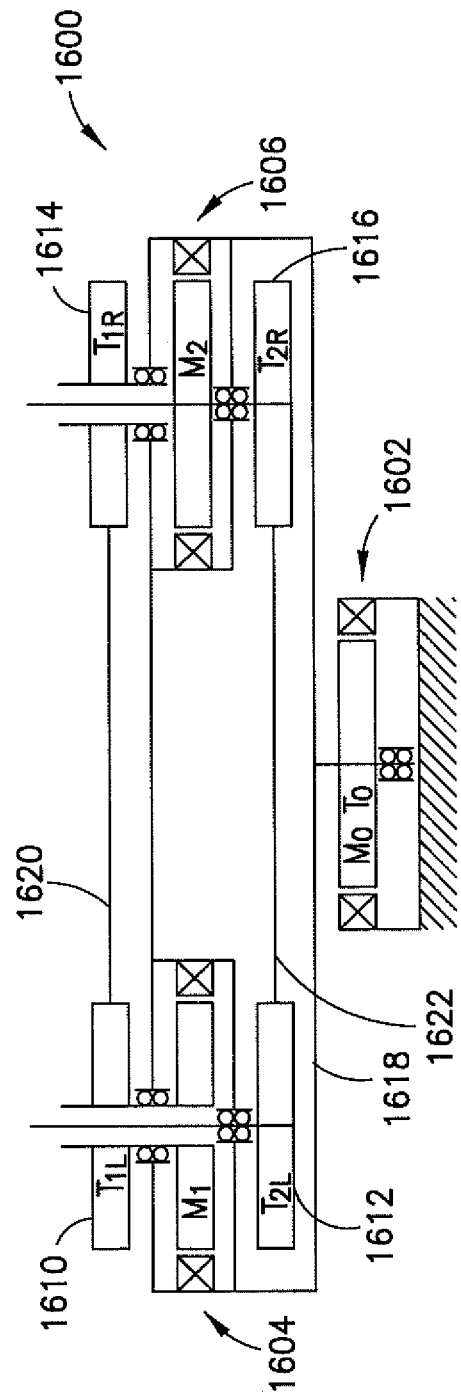
Figure 72C:
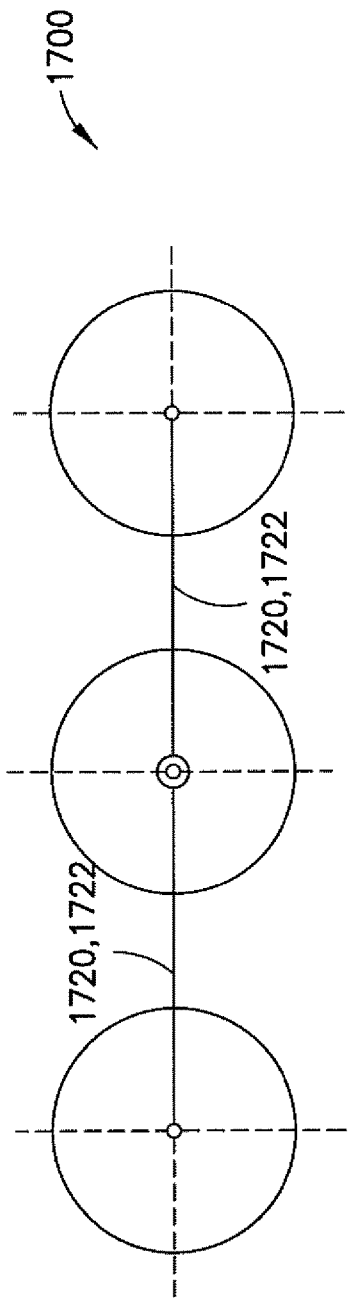
Figure 72D:
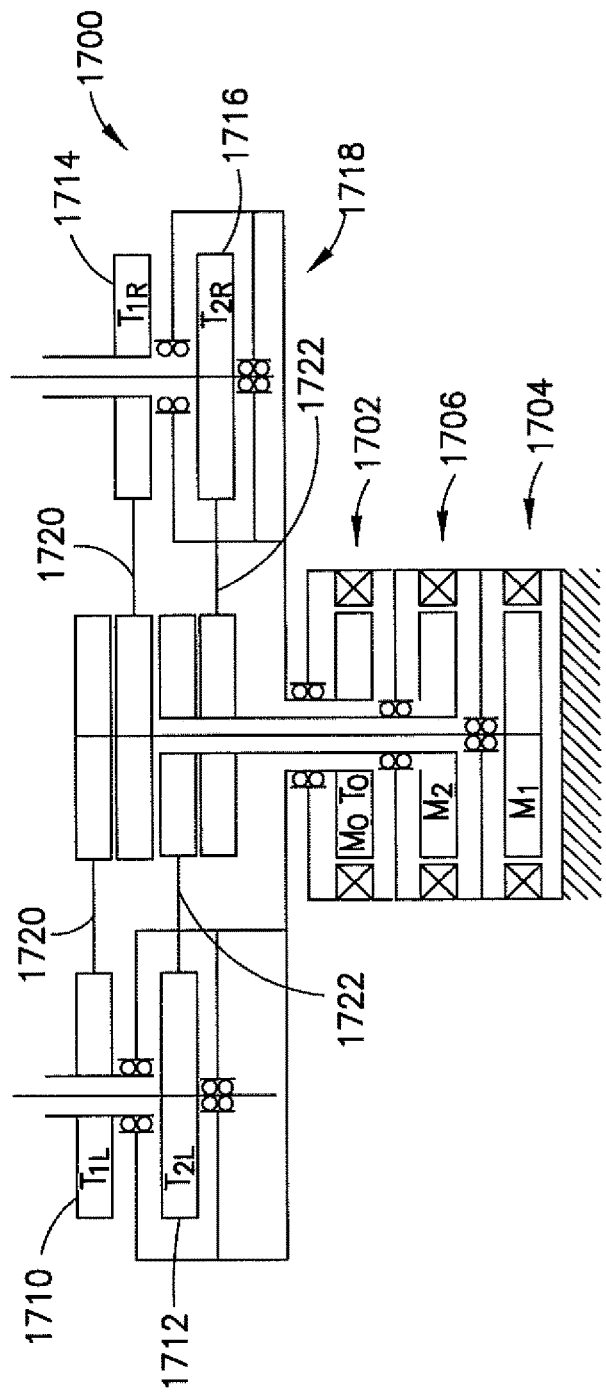

A 5-axis drive arrangement 1900 may include five independently controlled motors, M0 1904, M1L 1906, M2L 1908, M1R 1910 and M2R 1912, that may be coupled to drive shafts T0, T1L, T2L, T1R and T2R directly, as depicted in the example of the diagrams in FIGS. 73C and 73D, where diagram 73C illustrates the top view and diagram 73D shows the side view of the drive unit 1900 and base 1902; via band drives by extending the example of the diagrams in FIGS. 72C and 72D; using a combination of direct coupling and band arrangements, or in any other suitable manner that may facilitate transmission of motion form the motors to the drive shafts.

When a 5-axis drive arrangement is utilized, the robot may perform all operations according to FIGS. 69 to 71. In addition, the left and right linkages can be operated in a completely independent manner, including independent rotations, which cannot be supported with 3-axis and 4-axis drive arrangements.

Figure 74A:
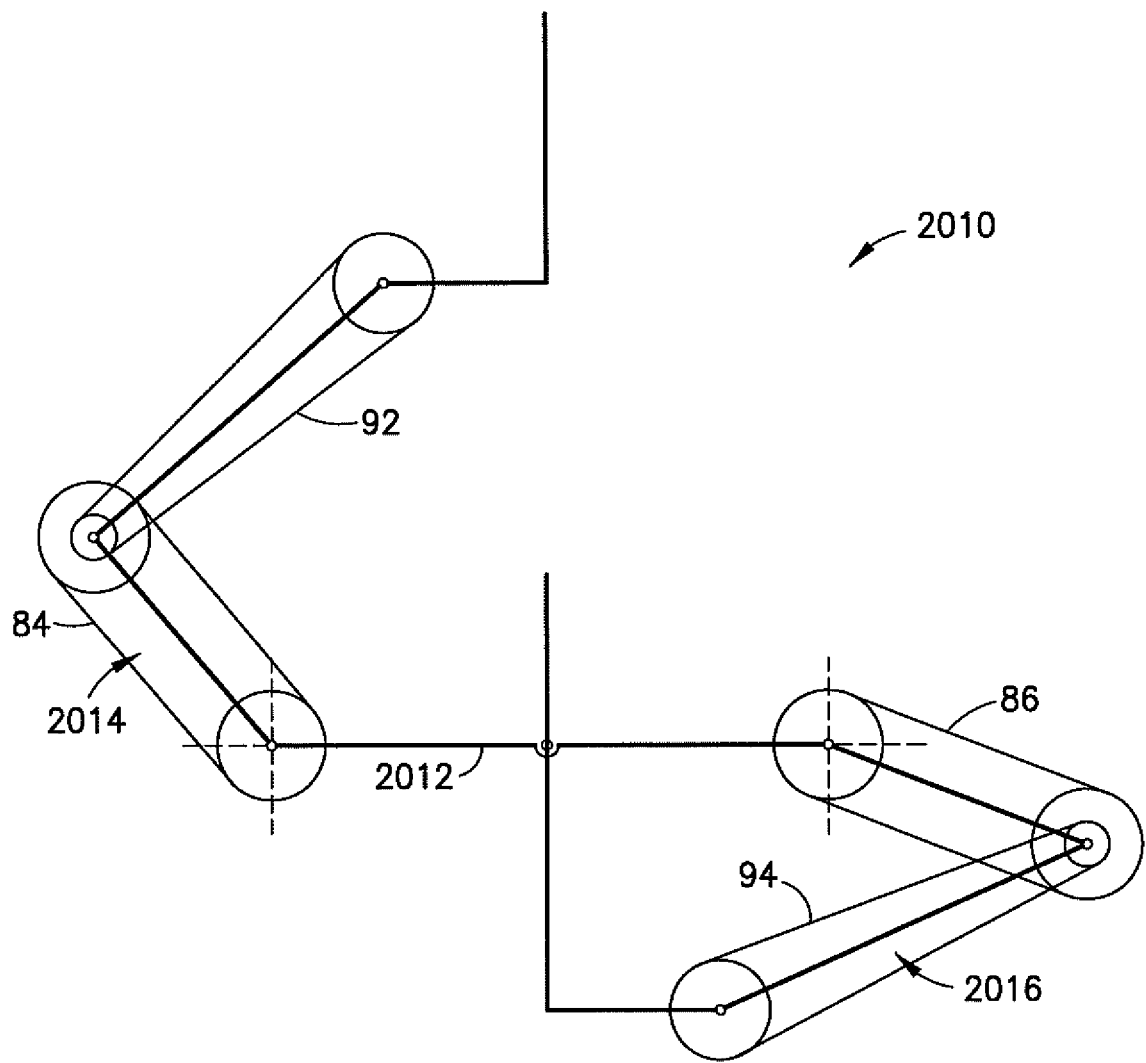
FIG. 74A is a top view of a transport apparatus.

Another example internal arrangement of the base and linkages of the robot 2010 of FIG. 66 is depicted diagrammatically in FIG. 74A. Again, the base 2012 may be driven by drive shaft T0.

Figure 74B:
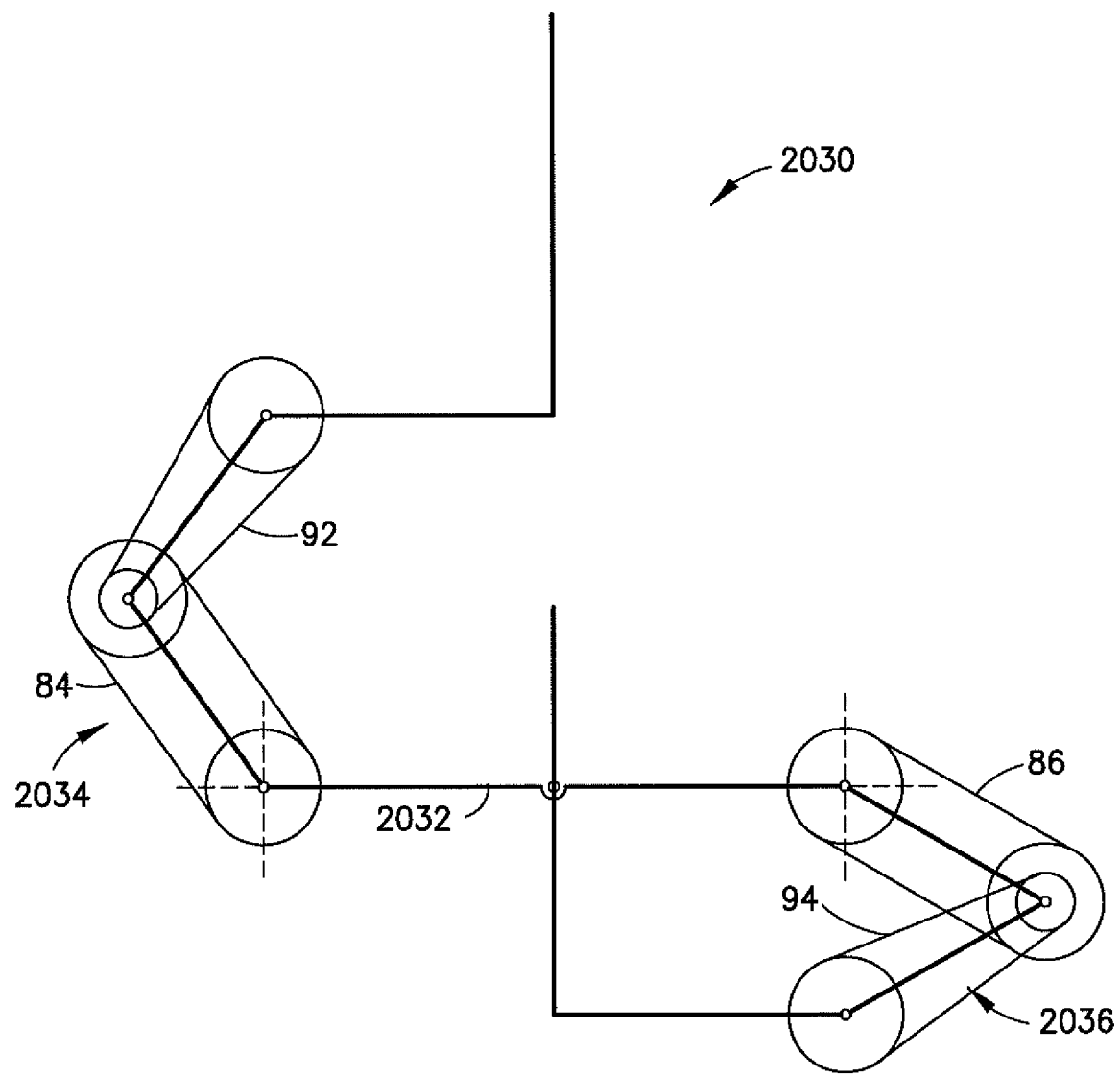
FIG. 74B is a top view of a transport apparatus.

The left 2014 upper arm may be actuated by drive shaft T1L, The left forearm may be driven by another drive shaft, T2L, through a band arrangement 84 with conventional pulleys. The left end-effector may be constrained by another band arrangement 92 with at least one non-circular pulley, which compensates for the effects of the unequal lengths of the left upper arm and left forearm so that the left end-effector may travel along a straight line while maintaining the desired orientation. Alternatively, if l1L=l2L, conventional pulleys may be utilized, as shown in FIG. 74B with arm 2030 having base 2032, left arm 2034 and right arm 2036.

Similarly, the right 2016 upper arm may be actuated by drive shaft T1R. The right forearm may be driven by another drive shaft, T2R, through a band arrangement 86 with conventional pulleys. The right end-effector may be constrained by another band arrangement 94 with at least one non-circular pulley, which compensates for the effects of the unequal lengths of the right upper arm and right forearm so that the right end-effector may travel along a straight line while maintaining the desired orientation. Alternatively, if l1R=l2R, conventional pulleys may be utilized, as shown in FIG. 74B.

In order for the entire robot arm to rotate, all drive shafts, i.e., T0, T1L, T2L, T1R and T2R, need to move in the desired direction of rotation of the arm by the same amount with respect to a fixed reference frame (or drive shaft T0 needs to move while the other drive shafts are stationary with respect to the base).

In order for the left end-effector to extend and retract along a straight-line path, drive shafts T1L and T2L need to move in a coordinated manner in accordance with the inverse kinematic equations of the left linkage. Similarly, in order for the right end-effector to extend and retract along a straight-line path, drive shafts T1R and T2R need to move in a coordinated manner in accordance with the inverse kinematic equations of the right linkage. Example kinematic equations can be found above.

Both end-effectors of the robot may be extended and retracted along a straight-line path by rotating drive shafts T1L, T2L and T1R, T2R simultaneously in a manner described above for independent extension of the left and right end-effectors.

The left and right linkages may also be rotated individually. In order for the left linkage to rotate, drive shafts T1L and T2L need to move in the desired direction of rotation by the same amount. Similarly, in order for the right linkage to rotate, drive shafts T1R and T2R need to move in the desired direction of rotation by the same amount. Similarly to FIGS. 68A and 68B, when the left and right linkages rotate individually by 180 deg, the left end-effector and right end-effector become laterally offset, see diagrams 70A through 70C.

Considering the above motion capabilities, the robot with the internal arrangement according to FIGS. 74A and 74B may perform the same operations as, as outlined in FIGS. 69-71.

The base and linkages with the internal arrangements of FIGS. 74A and 74B may be driven by the 3-axis and 5-axis drive arrangements of FIGS. 72 and 73C, 73D respectively.

Figure 75A:
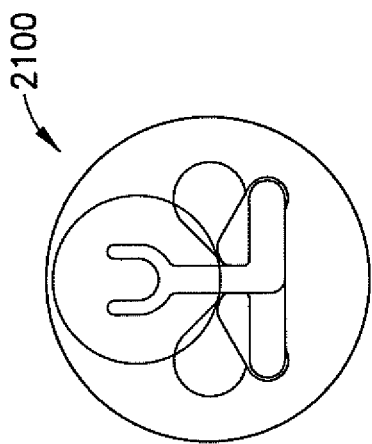
FIG. 75 A-F are top views of a transport apparatus.
Figure 75B:
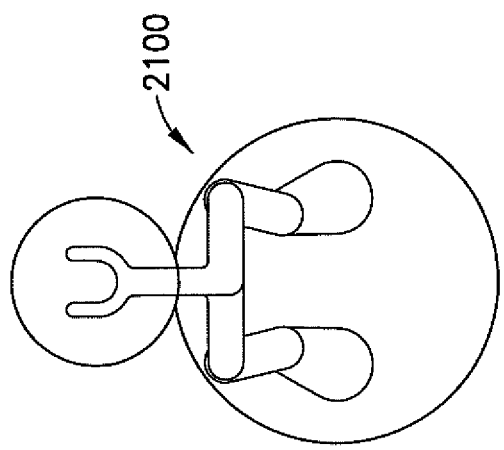

Another example embodiment of the robot 2100 is depicted in the diagrams of FIGS. 75A and 75B. Diagram (75A shows a top view of the robot with both linkages retracted, diagram 75B depicts the robot with both end-effectors extended.

Figure 76A:
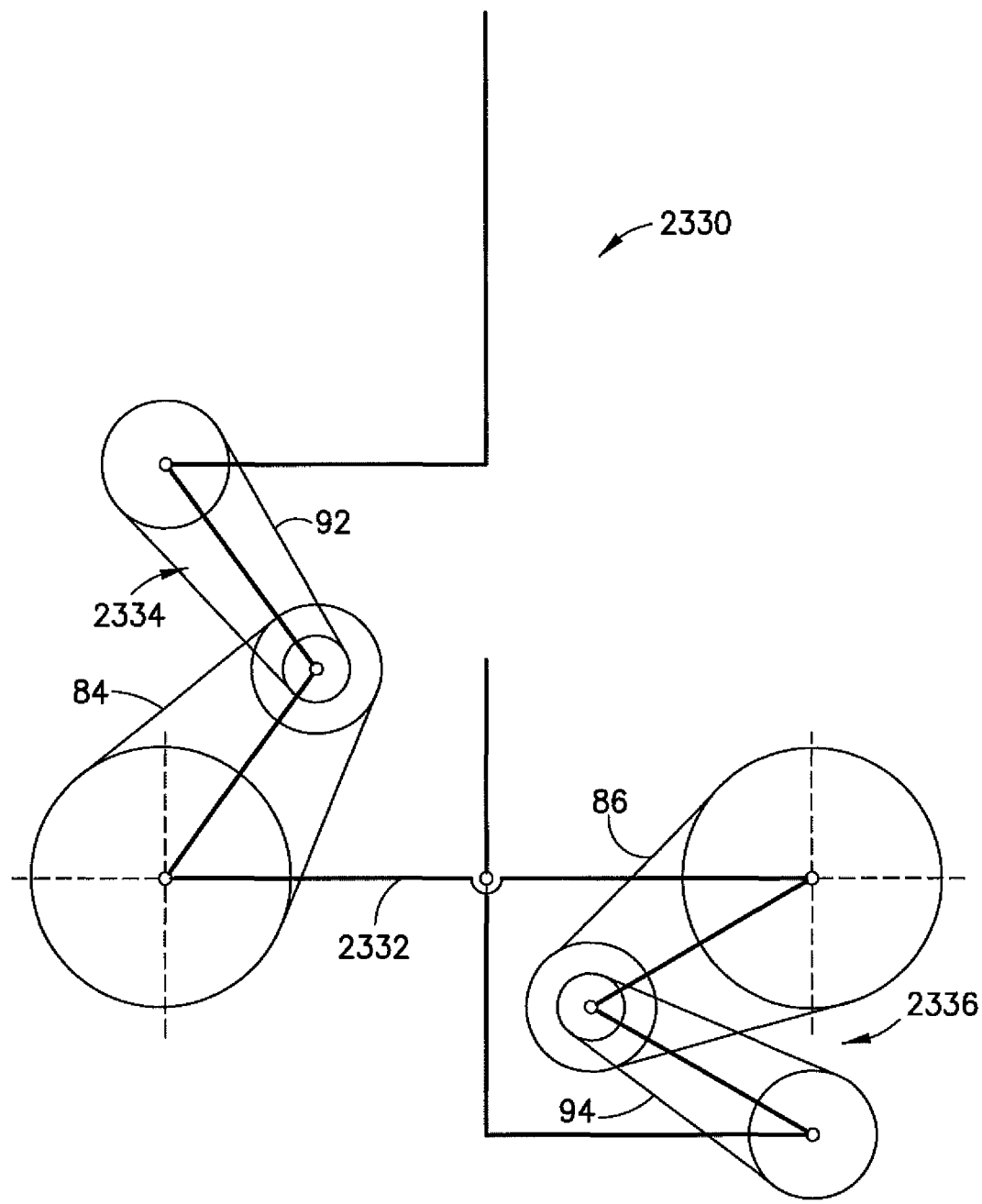
FIG. 76A is a top view of a transport apparatus.

An example internal arrangement of the robot is illustrated diagrammatically 2330 in FIG. 76A. In the figure, base 2332 with linkages 2334, 2336 with equal length of the upper arms and forearms and circular pulleys are shown; however, unequal lengths and non-circular pulleys may be utilized.

The robot may be actuated by the drive arrangements described earlier with reference to FIGS. 72 and 73.

Figure 76B:
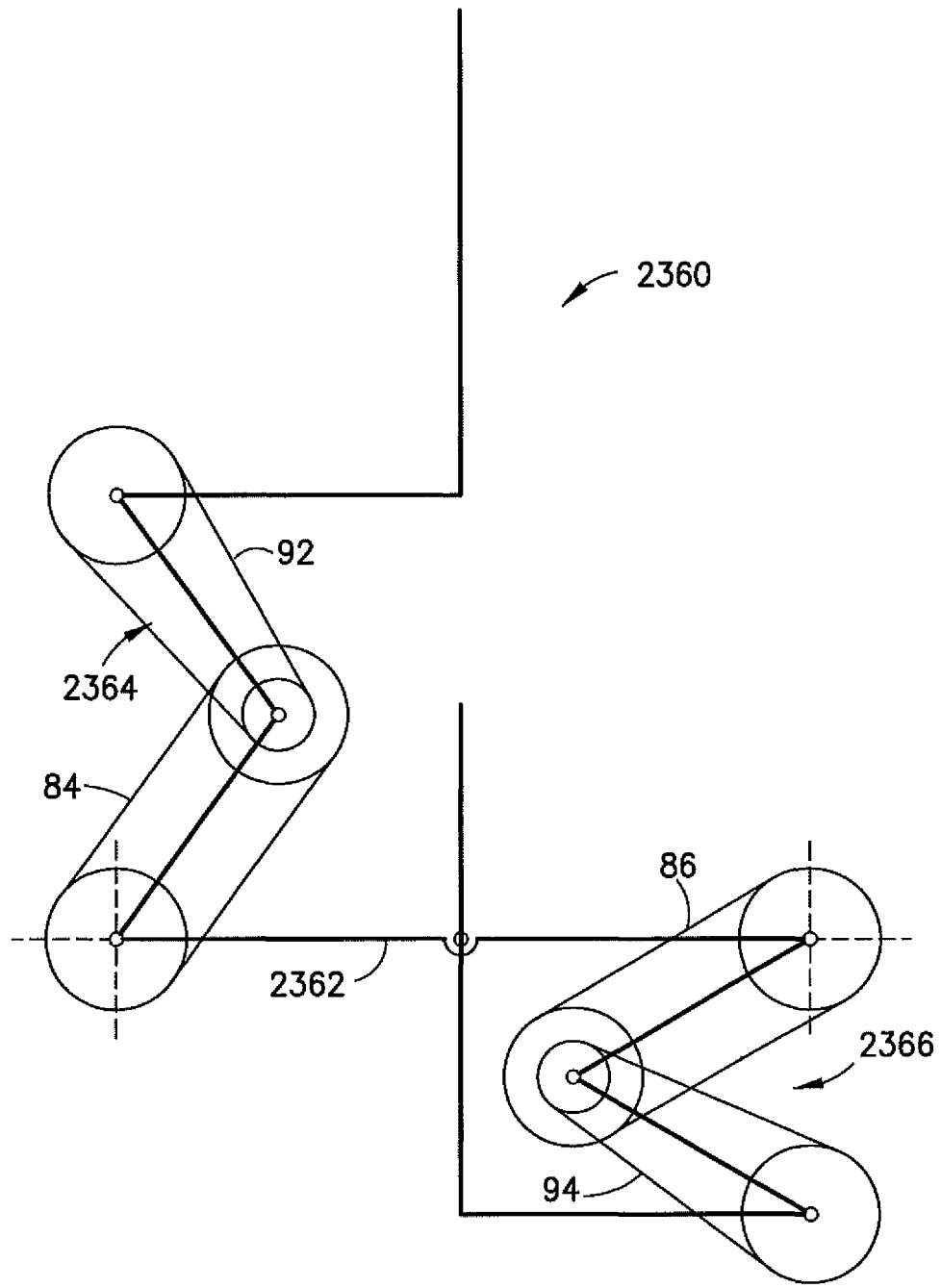
FIG. 76B is a top view of a transport apparatus.

An alternative internal arrangement of the robot of diagrams 75A and 75B is shown diagrammatically 2360 in FIG. 76B. In the figure, base 2362 and linkages 2364, 2366 with equal length of the upper arms and forearms and with circular pulleys are shown; however, unequal lengths and non-circular pulleys may be utilized.

Figure 75C:
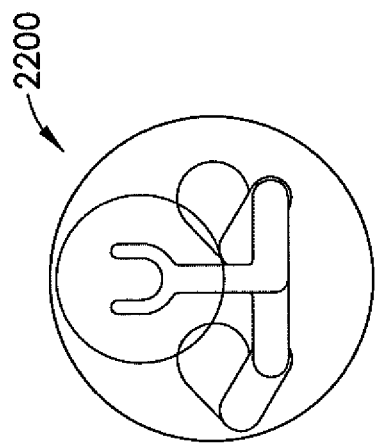
Figure 75D:
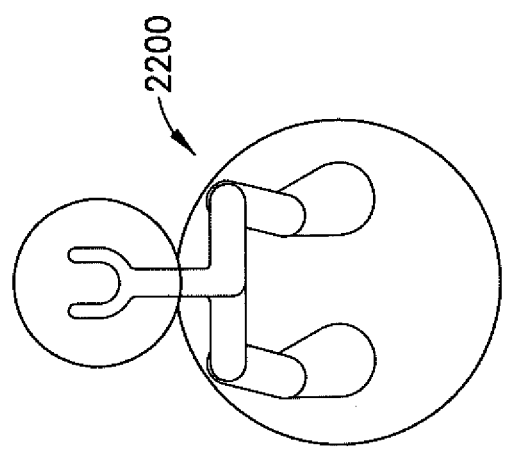
Figure 75E:
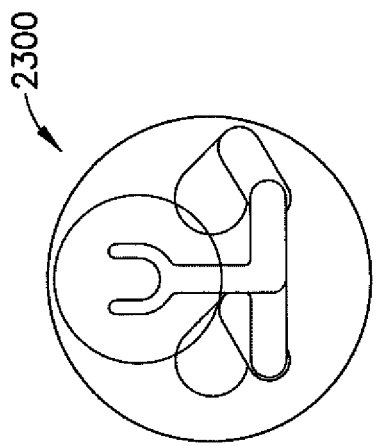
Figure 75F:
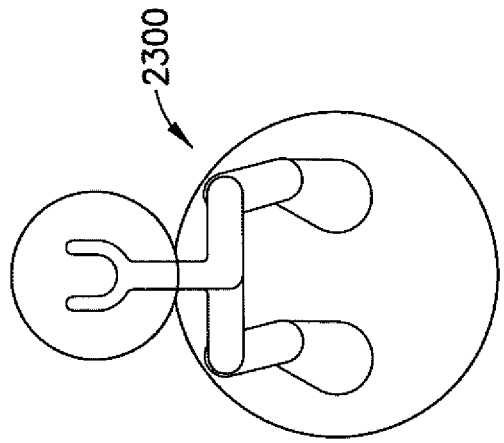

The robot may be actuated by the drive arrangements according to FIGS. 72. and 73C, 73D Yet another example embodiment of the robot 2200 is depicted in the diagrams of FIGS. 75C and 75D. Diagram 75C shows a top view of the robot with both linkages retracted, diagram 75D depicts the robot with both end-effectors extended. Diagrams 75C and 75D show the linkages of the robot in a left handed configuration. Alternatively, the linkages may be configured in a right-handed arrangement, as shown in diagrams 75E and 75F with robot 2300.

Figure 76C:
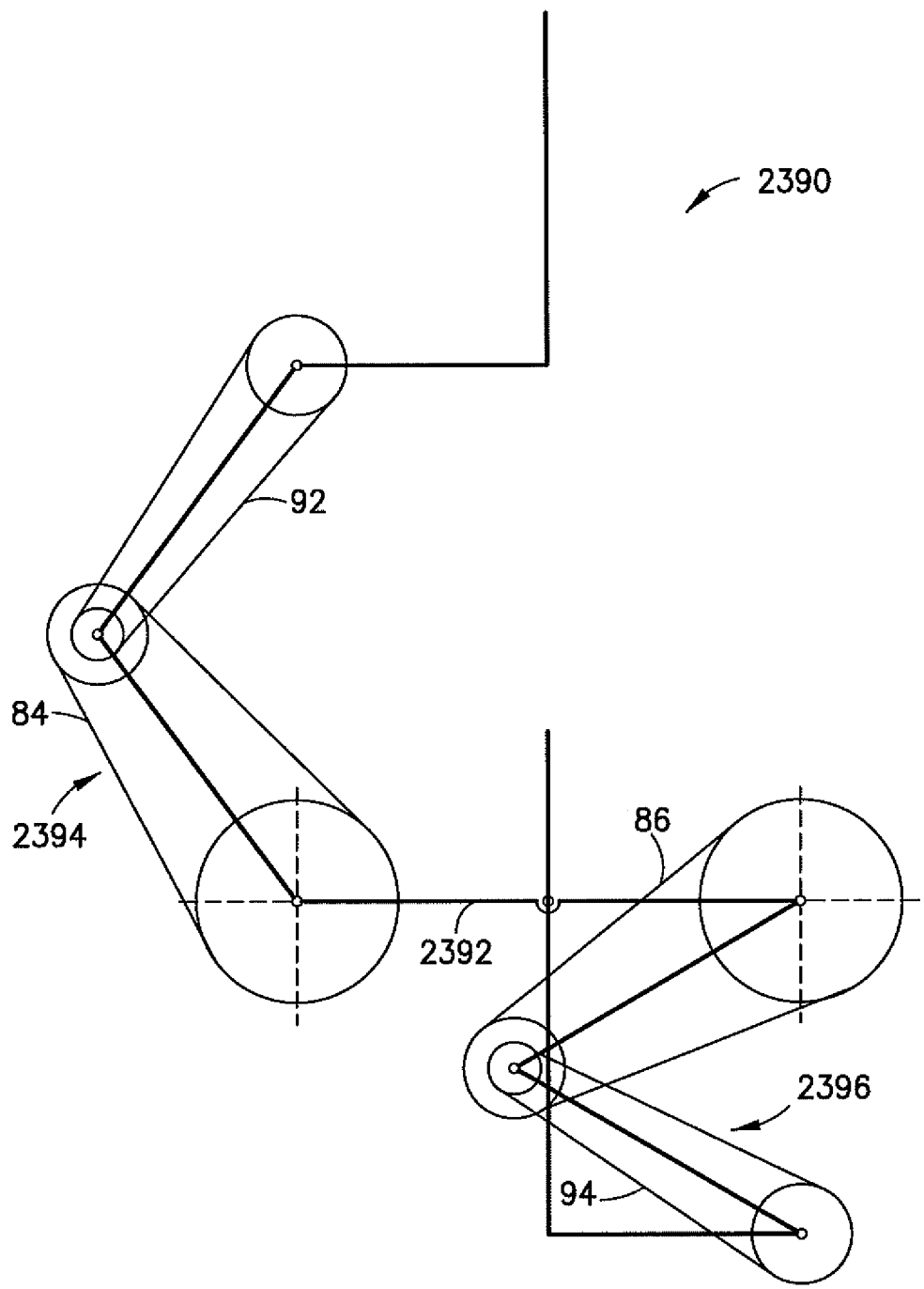
FIG. 76C is a top view of a transport apparatus.
Figure 76D:
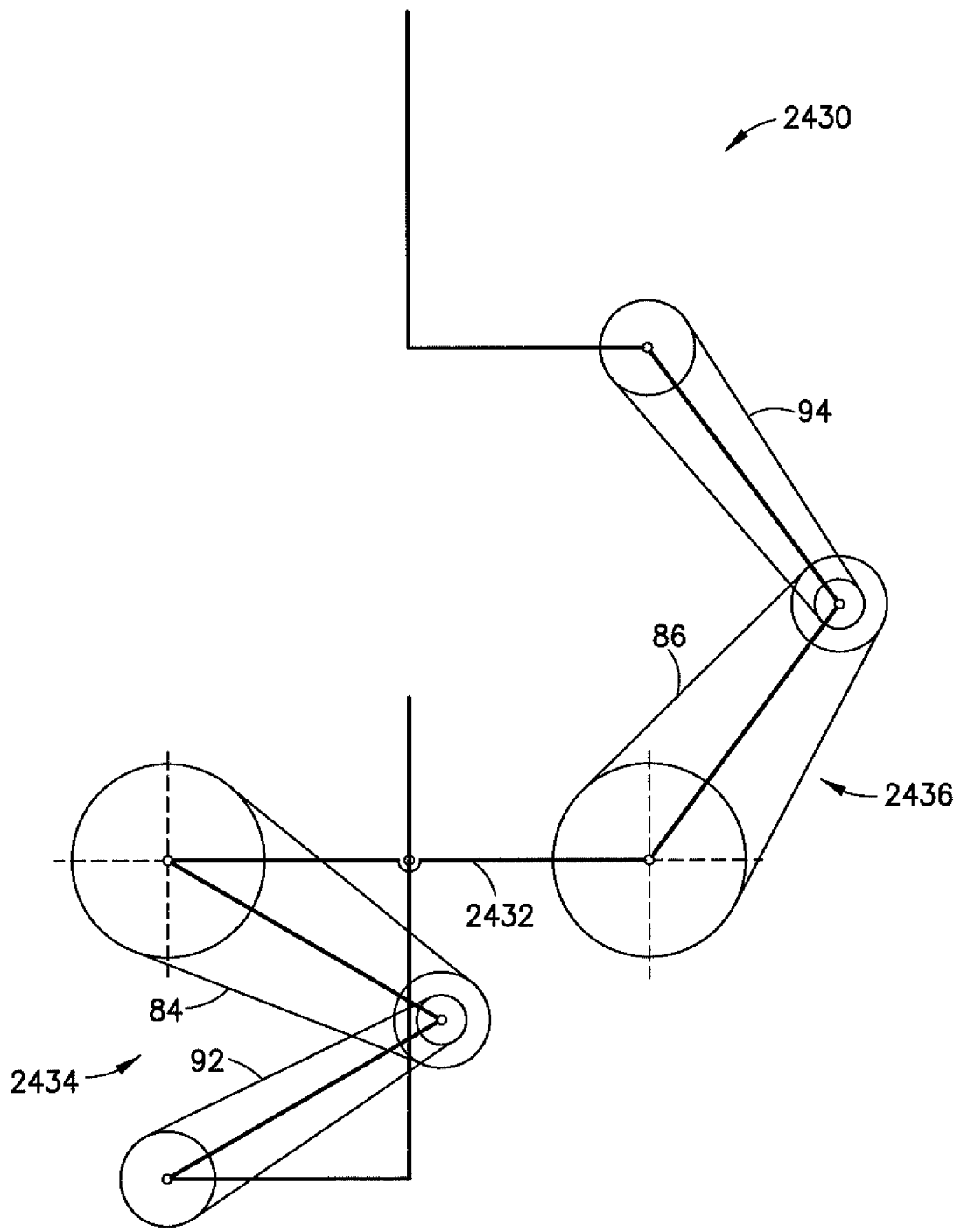
FIG. 76D is a top view of a transport apparatus.

An example internal arrangement of the embodiments according to diagrams 75C and 75D is illustrated diagrammatically 2390 in FIG. 76C. Similarly, an example internal arrangement of the embodiment according to diagrams 75E and 75F is illustrated diagrammatically 2430 in FIG. 76D. In FIGS. 76C and 76D, linkages 2394, 2396, 2434, 2436 with equal length of the upper arms and forearms and with circular pulleys are shown; however, unequal lengths and non-circular pulleys may be utilized.

Figure 77A:
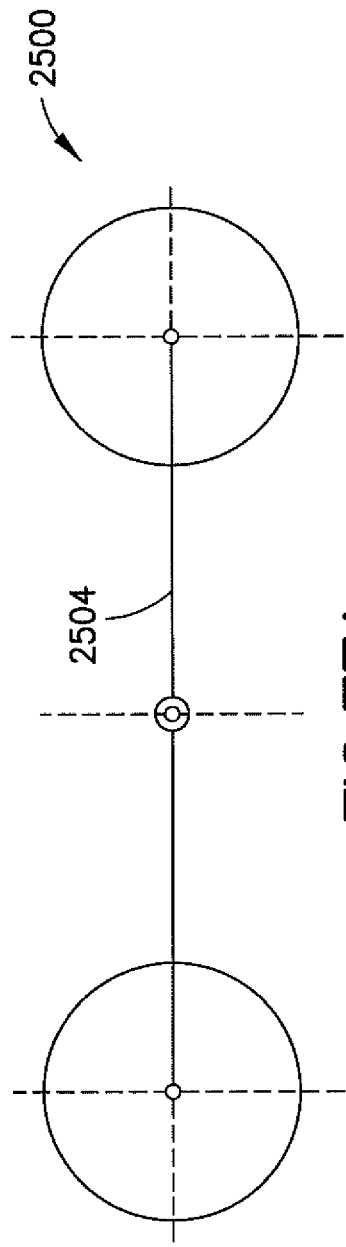
FIG. 77 A-B are top and side views of a transport apparatus.
Figure 77B:
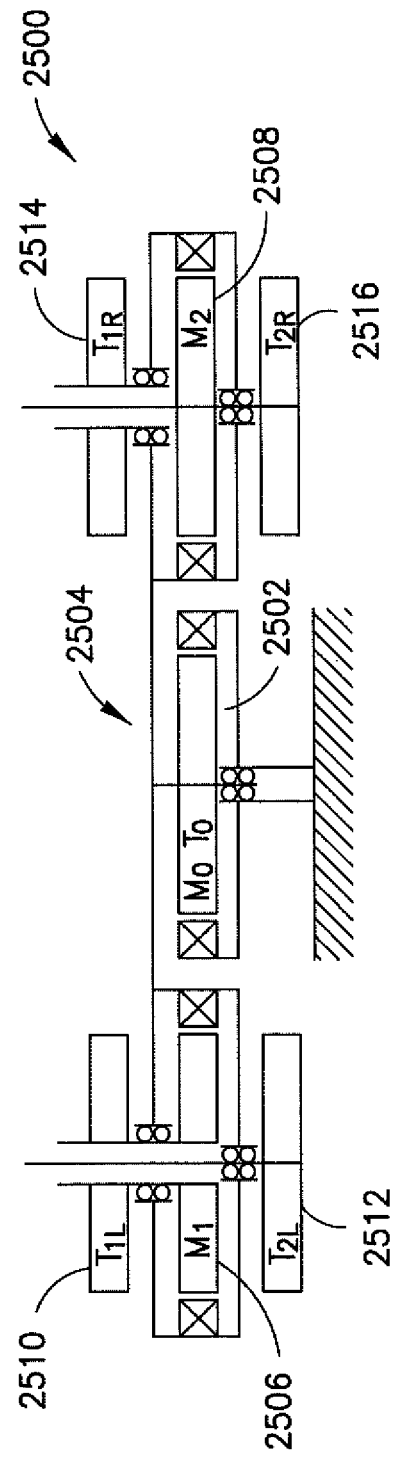
Figure 77C:
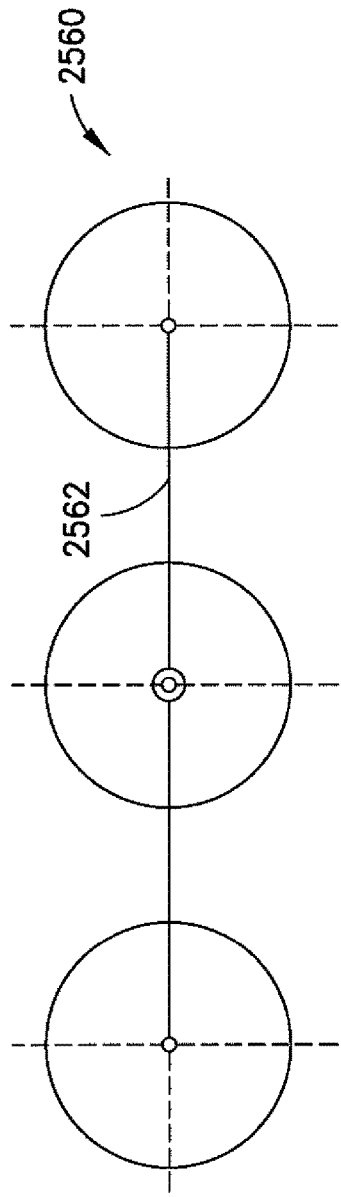
Figure 77D:
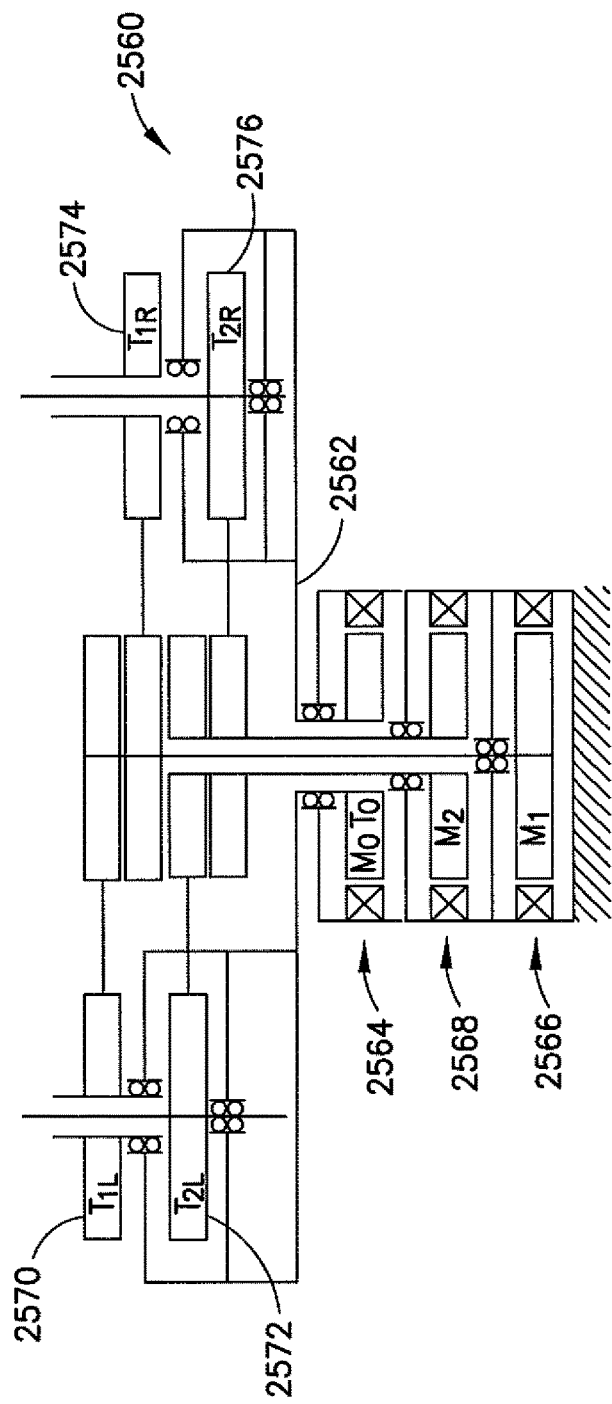

The robot may be actuated by the drive arrangements according to FIGS. 77A-77D, 78A-78B and 73C and 73D. In FIGS. 77A and 77B, drive 2500 has base 2504 driven by motor M0 2502. M1 2506 drives T1l 2510 while M2 2508 drives T2r 2516 with T1l 2510 and t1r 2514 constrained by a band and T2l 2512 and T2r 2516 constrained by a band. In FIGS. 77C and 77D, drive 2560 has base 2562 driven by motor M0 2564. M1 2566 drives T1l 2570 while M2 2568 drives T2r 2576 with T1l 2570 and t1r 2574 constrained by a band and T2l 2572 and T2r 2576 constrained by a band. In FIGS. 78A and 78B, drive 2700 has base 2702 driven by motor M0 2704. M1l 2706 drives T1l while M1r 2708 drives T1r and M2 2710 drives T2r 2714 and T2l 2712 by a band.

When a 3-axis drive arrangement, for instance, according to the examples of FIG. 77 is utilized, the robot may perform all operations defined in FIGS. 69 and 70 except for independent extensions and retractions of the left and right linkages (diagrams D and E in FIGS. 69 and 70). It may not perform simultaneous extensions and retractions along non-parallel and opposing paths of FIG. 71.

When a 4-axis drive arrangement, such as the example of FIG. 78, is used, the robot may perform all operations according to FIGS. 69 and 70, including independent extensions and retractions of the left and right linkages. It may not perform simultaneous extensions and retractions along non-parallel and opposing paths of FIG. 71.

When a 5-axis drive arrangement is utilized, the robot may perform all operations according to FIGS. 69 to 71. In addition, the left and right linkages can be operated in a completely independent manner, including independent rotations, which cannot be supported with 3-axis and 4-axis drive arrangements.

The disclosed shows a favorable reach-to-containment ratio. In combination with the 3-axis driving arrangement of FIGS. 77A and 77B, it also offers a low profile and low complexity. In addition, in combination with a 4-axis drive arrangement, the disclosed supports independent extension of left and right linkages.

Figure 79A:
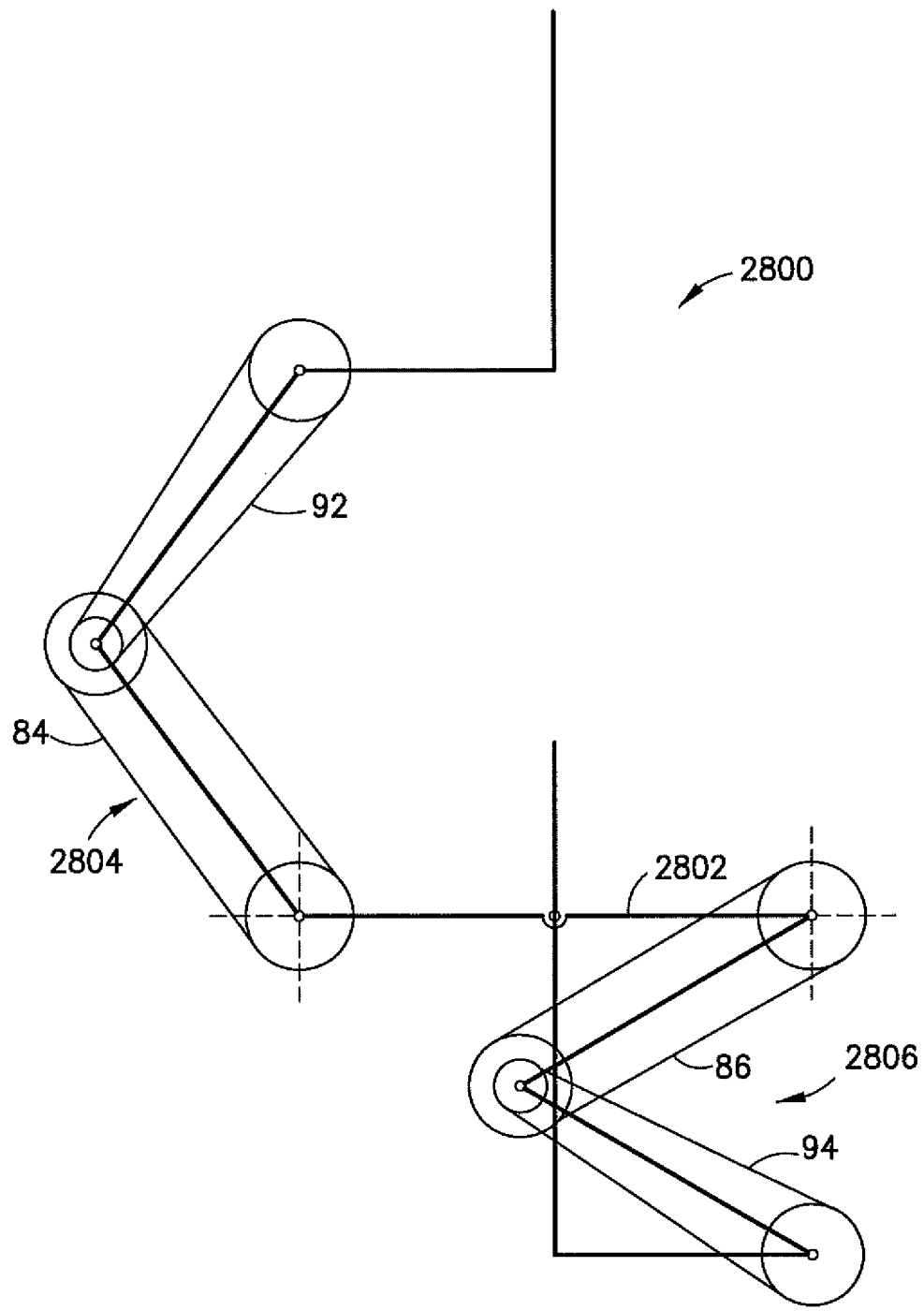
FIG. 79A is a top view of a transport apparatus.
Figure 79B:
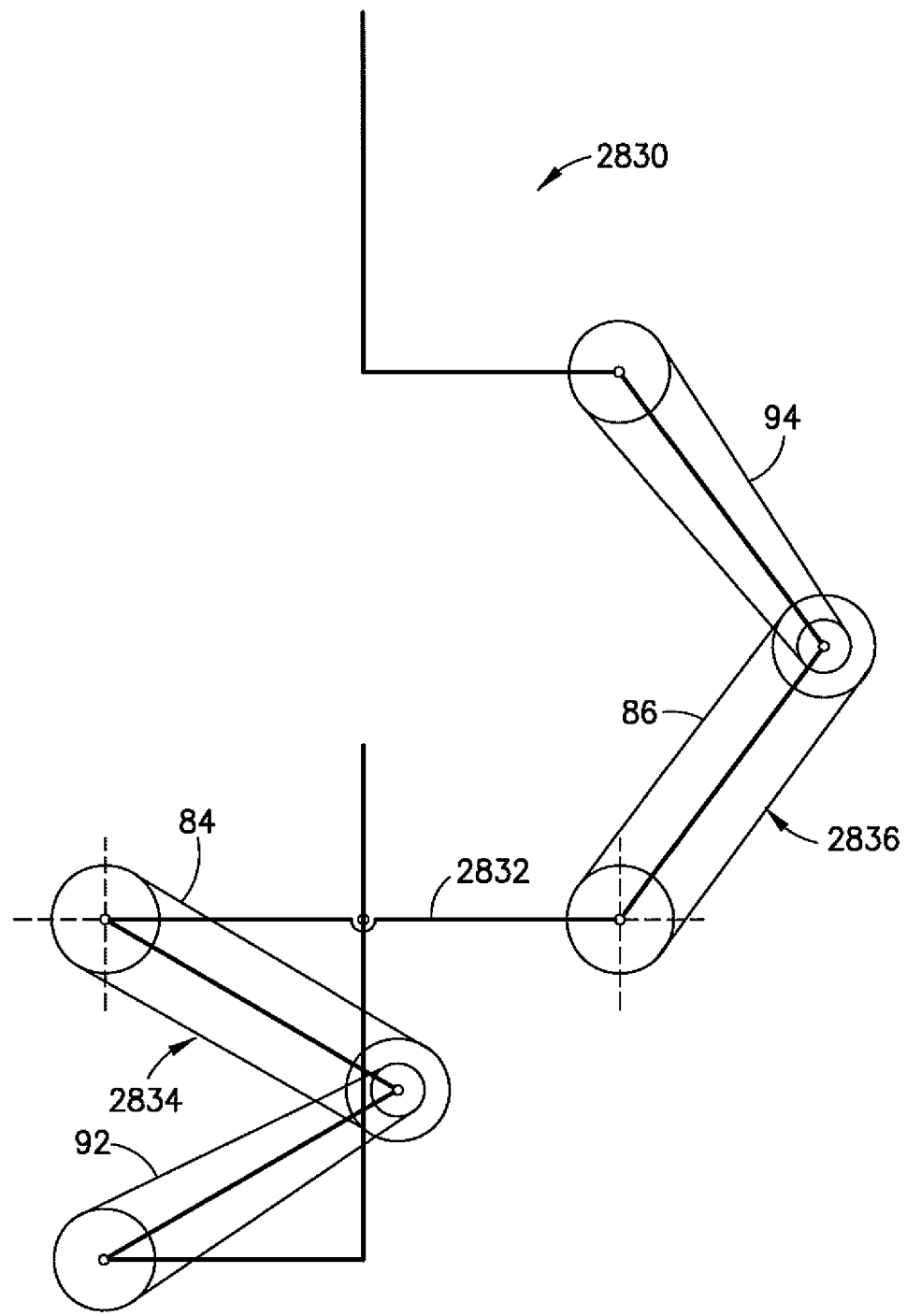
FIG. 79B is a top view of a transport apparatus.

Alternative internal arrangement of the example embodiments of the diagrams of FIGS. 75A-75D are shown diagrammatically 2800, 2830 in FIGS. 79A and 79B respectively. In the figures, base 2802, 2832 with linkages 2804, 2806, 2834, 2836 with equal length of the upper arms and forearms and with circular pulleys are shown; however, unequal lengths and non-circular pulleys may be utilized.

The robot may be actuated by the drive arrangements in accordance with FIGS. 77 and 73C and 73D.

Although the left and right linkages are shown in the figures with the same dimensions, the left linkage may have different dimensions than the right linkage, and the drive unit may be configured to reflect the differences in the dimensions.

The robot arm may be designed so that some of its links, such as the upper arms and/or forearms, are below one or both of the end-effectors and other links are above one or both of the end-effectors.

When the terms band arrangements and band drives are used, they refer generally to the means of transmitting motion, force and/or torque, including bands, belts, cables, gears or any other suitable arrangement.

While the motors of the robot are shown as attached directly to the shafts, pulleys and other driven components in the figures throughout the text, the motors may be coupled to the driven components through additional bands, belts, cables, gears or any other suitable arrangement that can transmit motion, force and/or torque.

Although the motors of the robot are depicted in the drive unit or base in the figures throughout the text, the motors may be located within the robot arm, e.g., as part of the upper arm(s) or forearm(s), or integrated into the rotary joints of the robot.

The drive unit of the robot may further include a vertical lift mechanism to adjust elevation of the entire robot arm. Alternatively, the drive unit may comprise two vertical lift mechanisms, one of the left linkage and the other for the right linkage, to adjust the elevation of the left and right linkages independently. Here, the end effectors may be stacked or set at the same level or otherwise be independently positioned in a z axis.

In an alternative embodiment, any number and any type of suitable mechanisms may be used within the robot drive and/or the robot arm to control the elevation of the left and right end-effectors of the robot.

The robot may further include a traverser mechanism that may allow the robot, e.g., to move along the tunnel in which it is installed.

In another embodiment, the robot may be designed to operate in an upside-down configuration, e.g., with support provided from the top rather than from the bottom.

The robot may be combined with another robot of the same or similar type, e.g., in an upside-down configuration, to provide a system with four end-effector, which can support fast material exchange.

The robot may be design for operation in special environments, e.g., in vacuum, which may include the use of static and/or dynamic seals and other means of isolating some of the components of the robot from the environment in which it operates.

FIG. 80A shows a system 2900 with a robot. The robot drive unit 2904 may be configured to be movable with respect to the stationary part 2902 of the system as indicated by the arrow 2906, 2908. As an example, the robot drive unit may be on rails, linear bearings, magnetic bearings or may be coupled to the stationary part of the system in any suitable manner that allows the robot drive unit to move with respect to the stationary part of the system. As an example, the robot drive unit may be actuated by an electric linear motor with windings in the drive unit, by an electric linear motor with windings in the stationary part of the system, via a magnetic coupling, using a pneumatic or hydraulic actuator, via a ball-screw, via a cable or belt, or utilizing any other suitable arrangement that may actuate the robot drive unit with respect to the stationary part of the system. As described in the original write-up, the robot drive unit may include a pivoting base and a robot arm. In the diagram (a), the pivoting base is actuated with respect to the robot drive unit, as indicated by the arrow.

FIG. 80B shows system 3000 with an arrangement where the pivoting base 3004 is actuated directly with respect to the stationary part 3002 of the system as indicated by the arrows 3006, 3008 on the sides of the pivoting base. When both sides of the pivoting base are actuated in sync by the same amount in the same direction, the entire robot translates in the corresponding direction. When the sides of the pivoting base are actuated in sync by the same amount in the opposite directions, the pivoting base rotates while its center remains stationary. Any combination of translation and rotation may be achieved by actuating the sides of the pivoting base accordingly. As an example, the base may be actuated by an electric linear motor with windings in the pivoting base, by an electric linear motor with windings in the stationary part of the system, via magnetic couplings, via ball-screws, via cables or belts, or utilizing any other suitable arrangement that may actuate the pivoting base with respect to the stationary part of the system.

In accordance with one aspect of the exemplary embodiment, an apparatus comprises at least one drive; a first robot arm comprising a first upper arm, a first forearm and a first end effector, where the first upper arm is connected to the at least one drive at a first axis of rotation; and a second robot arm comprising a second upper arm, a second forearm and a second end effector, where the second upper arm is connected to the at least one drive at a second axis of rotation which is spaced from the first axis of rotation; where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another, where the first upper arm and the first forearm have different effective lengths, and where the second upper arm and the second forearm have different effective lengths.

In accordance with another aspect, the apparatus comprises at least one non-circular pulley and a first band connecting the at least one drive to the first forearm at a first joint between the first upper arm and the first forearm.

In accordance with another aspect, the apparatus comprises a second band connecting the first end effector, at a wrist joint of the first end effector to the first forearm, to the first joint.

In accordance with another aspect, the apparatus comprises where the first and second end effectors each have a general L shape.

In accordance with another aspect, the apparatus comprises a first circular pulley and a first band connecting the at least one drive to a second circular pulley at a first joint between the first upper arm and the first forearm, where the first and second pulleys have different diameters.

In accordance with another aspect, the apparatus comprises where the first paths are along a straight line from the first retracted positions.

In accordance with another aspect, the apparatus comprises where the first and second robot arms are configured to provide second retracted positions to locate the end effectors such that the substrates located on the end effectors are not stacked one above the another.

In accordance with another aspect, the apparatus comprises a controller configured to controller the at least one drive to move the first and second robot arms substantially simultaneously from the first retracted positions along the first paths and move the first and second robot arms individually or simultaneously along the second paths.

In accordance with another aspect, a method comprises providing a first robot arm comprising a first upper arm, a first forearm and a first end effector, where the first upper arm and the first forearm have different effective lengths; providing a second robot arm comprising a second upper arm, a second forearm and a second end effector, where the second upper arm and the second forearm have different effective lengths; connecting the first upper arm to at least one drive at a first axis of rotation; and connecting the second upper arm to the at least one drive at a second axis of rotation which is spaced from the first axis of rotation, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths at least partially located directly one above the other, and where the first and second robot arms are configured to extend the end effectors in at least one second direction along second paths spaced from one another which are not located above one another.

In accordance with another aspect, the method comprises at least one non-circular pulley at the first axis of rotation and a first band connecting the at least one drive to the first forearm at a first joint between the first upper arm and the first forearm.

In accordance with another aspect, the method comprises a second band connecting the first end effector, at a wrist joint of the first end effector to the first forearm, to the first joint.

In accordance with another aspect, the method comprises a first circular pulley and a first band connecting the at least one drive to a second circular pulley at a first joint between the first upper arm and the first forearm, where the first and second pulleys have different diameters.

In accordance with another aspect, the method comprises where the first and second robot arms are configured to provide the first paths along a straight line from the first retracted positions.

In accordance with another aspect, the method comprises where the first and second arms are configured to provide second retracted positions to locate the end effectors such that the substrates located on the end effectors are not stacked one above the another.

In accordance with another aspect, the method comprises connecting a controller to the at least one drive configured to controller the at least one drive to move the first and second robot arms substantially simultaneously from the first retracted positions along the first paths and move the first and second arms individually or simultaneously along the second paths.

In accordance with another aspect, a method comprises locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to at least one drive at a first axis of rotation, and where the second robot arm comprises a second upper arm, a second forearm and the second end effector, where the second upper arm is connected to the at least one drive at a second axis of rotation which is spaced from the first axis of rotation; moving the first and second robot arms to move the end effectors from the first retracted positions in a first direction along parallel first paths located at least partially directly one above the other; and moving the first and second robot arms to move the end effectors to extend the end effectors in at least one second direction along second paths spaced from one another which are not located above one another.

In accordance with another aspect, the method comprises where moving the first and second robot arms comprises at least one non-circular pulley and a first band connecting the at least one drive to the first forearm at a first joint between the first upper arm and the first forearm.

In accordance with another aspect, the method comprises where moving the first and second robot arms comprises a second band connecting the first end effector, at a wrist joint of the first end effector to the first forearm, to the first joint.

In accordance with another aspect, the method comprises where moving the first and second robot arms comprises a first circular pulley and a first band connecting the at least one drive to a second circular pulley at a first joint between the first upper arm and the first forearm, where the first and second pulleys have different diameters.

In accordance with another aspect, the method comprises a controller controlling the at least one drive to move the first and second robot arms substantially simultaneously from the first retracted positions along the first paths and move the first and second robot arms individually or simultaneously along the second paths.

In accordance with another aspect, an apparatus comprises a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises only three motors for rotating first and second upper arms, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

In accordance with another aspect, the apparatus comprises where the first upper arm and the first forearm have different effective lengths, and where the second upper arm and the second forearm have different effective lengths.

In accordance with another aspect, the apparatus comprises at least one non-circular pulley and a first band connecting the drive to the first forearm at a first joint between the first upper arm and the first forearm.

In accordance with another aspect, the apparatus comprises a second band connecting the first end effector, at a wrist joint of the first end effector to the first forearm, to the first joint.

In accordance with another aspect, the apparatus comprises where the first and second end effectors each have a general L shape.

In accordance with another aspect, the apparatus comprises a first circular pulley and a first band connecting the drive to a second circular pulley at a first joint between the first upper arm and the first forearm, where the first and second pulleys have different diameters.

In accordance with another aspect, the apparatus comprises where the first paths are along a straight line from the first retracted positions.

In accordance with another aspect, the apparatus comprises where the first and second robot arms are configured to provide second retracted positions to locate the end effectors such that the substrates located on the end effectors are not stacked one above the another.

In accordance with another aspect, the apparatus comprises a controller configured to control the drive to move the first and second robot arms substantially simultaneously from the first retracted positions along the first paths and move the first and second robot arms individually or simultaneously along the second paths.

In accordance with another aspect, the apparatus comprises where the three motors are aligned in a common axis.

In accordance with another aspect, the apparatus comprises where the three motors are located in three respective spaced axes.

In accordance with another aspect, the apparatus comprises a z-axis motor connected to the drive to move the drive and the first and second robot arms vertically.

In accordance with another aspect, a method comprises locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of only three motors of the drive.

In accordance with another aspect, the method comprises where moving the first and second robot arms comprises at least one non-circular pulley and a first band connecting the drive to the first forearm at a first joint between the first upper arm and the first forearm.

In accordance with another aspect, the method comprises where moving the first and second robot arms comprises a second band connecting the first end effector, at a wrist joint of the first end effector to the first forearm, to the first joint.

In accordance with another aspect, the method comprises where moving the first and second robot arms comprises a first circular pulley and a first band connecting the drive to a second circular pulley at a first joint between the first upper arm and the first forearm, where the first and second pulleys have different diameters.

In accordance with another aspect, the method comprises where further comprising a controller controlling the motors of the drive to move the first and second robot arms substantially simultaneously from the first retracted positions along the first paths and move the first and second robot arms individually or simultaneously along the second paths.

In accordance with another aspect, a method comprises providing a first robot arm comprising a first upper arm, a first forearm and a first end effector; providing a second robot arm comprising a second upper arm, a second forearm and a second end effector; connecting the first upper arm to a drive at a first axis of rotation; and connecting the second upper arm to the drive at a second axis of rotation which is spaced from the first axis of rotation, where the first and second robot arms are configured to locate the end effectors in first retracted positions for stacking substrates located on the end effectors at least partially one above the another, where the first and second robot arms are configured to be rotated to extend the end effectors from the first retracted positions in a first direction along parallel first paths at least partially located directly one above the other, and where the first and second robot arms are configured to be rotated to extend the end effectors in at least one second direction along second paths spaced from one another which are not located above one another, where the drive comprises only three motors for rotating the first and second robot arms to extend the end effectors and for rotating the first and second robot arms about a third axis of rotation spaced from the first and second axes of rotation.

In accordance with another aspect, the method comprises where the first robot arm is provided with the first upper arm and the first forearm have different effective lengths, and where the second robot arm is provided with the second upper arm and the second forearm have different effective lengths.

In accordance with another aspect, the method comprises at least one non-circular pulley at the first axis of rotation and a first band connecting the drive to the first forearm at a first joint between the first upper arm and the first forearm.

In accordance with another aspect, the method comprises a second band connecting the first end effector, at a wrist joint of the first end effector to the first forearm, to the first joint.

In accordance with another aspect, the method comprises a first circular pulley and a first band connecting the drive to a second circular pulley at a first joint between the first upper arm and the first forearm, where the first and second pulleys have different diameters.

In accordance with another aspect, the method comprises where the first and second robot arms are configured to provide the first paths along a straight line from the first retracted positions.

In accordance with another aspect, the method comprises where the first and second arms are configured to provide second retracted positions to locate the end effectors such that the substrates located on the end effectors are not stacked one above the another.

In accordance with another aspect, the method comprises connecting a controller to the drive configured to controller the drive to move the first and second robot arms substantially simultaneously from the first retracted positions along the first paths and move the first and second arms individually or simultaneously along the second paths.

In accordance with another aspect, an apparatus comprises a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises five motors for rotating first and second upper arms, where a first one of the motors is connected to the first and second robot arms to rotate the first and second arms about a third axis of rotation spaced from the first and second axes of rotation, where second and third ones of the motors are connected to the first robot arm to rotate the first upper arm and the first forearm respectively, and where fourth and fifth ones of the motors are connected to the second robot arm to rotate the second upper arm and the second forearm, respectively, independently from the first robot arm, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

In accordance with another aspect, the apparatus comprises where the first upper arm and the first forearm have different effective lengths, and where the second upper arm and the second forearm have different effective lengths.

In accordance with another aspect, the apparatus comprises at least one non-circular pulley and a first band connecting the drive to the first forearm at a first joint between the first upper arm and the first forearm.

In accordance with another aspect, the apparatus comprises a second band connecting the first end effector, at a wrist joint of the first end effector to the first forearm, to the first joint.

In accordance with another aspect, the apparatus comprises where the first and second end effectors each have a general L shape.

In accordance with another aspect, the apparatus comprises a first circular pulley and a first band connecting the drive to a second circular pulley at a first joint between the first upper arm and the first forearm, where the first and second pulleys have different diameters.

In accordance with another aspect, the apparatus comprises where the first paths are along a straight line from the first retracted positions.

In accordance with another aspect, the apparatus comprises where the first and second robot arms are configured to provide second retracted positions to locate the end effectors such that the substrates located on the end effectors are not stacked one above the another.

In accordance with another aspect, the apparatus comprises a controller configured to controller the drive to move the first and second robot arms substantially simultaneously from the first retracted positions along the first paths and move the first and second robot arms individually or simultaneously along the second paths.

In accordance with another aspect, the apparatus comprises a z-axis motor connected to the drive to move the drive and the first and second robot arms vertically.

In accordance with another aspect, a method comprises locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of five motors of the drive, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

In accordance with another aspect, a method or apparatus comprises where the first motor is aligned in the third axis, the second and third motors are aligned with each other in the first axis and the fourth and fifth motors are aligned with each other in the second axis.

In accordance with another aspect, a method comprises providing a first robot arm comprising a first upper arm, a first forearm and a first end effector; providing a second robot arm comprising a second upper arm, a second forearm and a second end effector; connecting the first upper arm to a drive at a first axis of rotation; and connecting the second upper arm to the drive at a second axis of rotation which is spaced from the first axis of rotation, where the first and second robot arms are configured to locate the end effectors in first retracted positions for stacking substrates located on the end effectors at least partially one above the another, where the first and second robot arms are configured to be rotated to extend the end effectors from the first retracted positions in a first direction along parallel first paths at least partially located directly one above the other, and where the first and second robot arms are configured to be rotated to extend the end effectors in at least one second direction along second paths spaced from one another which are not located above one another, where the drive comprises five motors for rotating the first and second robot arms to extend the end effectors and for rotating the first and second robot arms about a third axis of rotation spaced from the first and second axes of rotation, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

In accordance with another aspect, an apparatus comprises a first robot arm comprising a first upper arm, a first forearm and a first end effector; a second robot arm comprising a second upper arm, a second forearm and a second end effector; and a drive connected to the first and second robot arms, where the first upper arm is connected to the drive at a first axis of rotation, where the second upper arm is connected to the drive at a second axis of rotation which is spaced from the first axis of rotation, where the drive comprises four motors for rotating first and second upper arms, where a first one of the motors is connected to the first upper arm, where a second one of the motors is connected to the second upper arm, where a third one of the motors is connected to the first forearm, where a fourth one of the motors is connected to the second forearm, where the third and fourth motors are aligned in a common axis spaced from the first and second axis, where the first motor is aligned in the first axis and where the second motor is aligned in the second axis, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located at least partially directly one above the other, and where the first and second robot arms are configured to extend the end effectors in at least one second direction along second paths spaced from one another which are not located above one another.

In one example embodiment an apparatus is provided comprising at least one processor; and at least one non-transitory memory including computer program code, the at least one memory and the computer program code configured to, with the at least one processor, cause the apparatus to: locate a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; move the first and second robot arms to move the end effectors from the first retracted positions in a first direction along parallel first paths located at least partially directly one above the other; move the first and second robot arms to move the end effectors to extend the end effectors in at least one second direction along second paths spaced from one another which are not located above one another; rotate the first and second robot arms together about a third axis of rotation which is spaced from the first and second axes of rotation, where the moving from the first retracted positions in the first direction, the moving to extend the end effectors in the at least one second direction, and the rotating is with use of only three motors of the drive.

In accordance with one example embodiment, an apparatus is provided comprising non-transitory program storage device readable by a machine, tangibly embodying a program of instructions executable by the machine for performing operations, the operations comprising: locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of only three motors of the drive.

In one example embodiment an apparatus is provided comprising at least one processor; and at least one non-transitory memory including computer program code, the at least one memory and the computer program code configured to, with the at least one processor, cause the apparatus to: locate a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; move the first and second robot arms to move the end effectors from the first retracted positions in a first direction along parallel first paths located at least partially directly one above the other; move the first and second robot arms to move the end effectors to extend the end effectors in at least one second direction along second paths spaced from one another which are not located above one another; rotate the first and second robot arms together about a third axis of rotation which is spaced from the first and second axes of rotation, where the moving from the first retracted positions in the first direction, the moving to extend the end effectors in the at least one second direction, and the rotating is with use of five motors of the drive, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

In accordance with one example embodiment, an apparatus is provided comprising non-transitory program storage device readable by a machine, tangibly embodying a program of instructions executable by the machine for performing operations, the operations comprising: locating a first end effector and a second end effector of first and second respective robot arms at first retracted positions for stacking substrates located on the end effectors at least partially one above the another, where the first robot arm comprising a first upper arm, a first forearm and the first end effector, where the first upper arm is connected to a drive at a first axis of rotation, and where the second robot arm comprises a second upper arm, a second forearm and the second end effector, where the second upper arm is connected to the drive at a second axis of rotation which is spaced from the first axis of rotation; moving the first and second robot arms to move the end effectors from the first retracted positions in a first direction along parallel first paths located at least partially directly one above the other; moving the first and second robot arms to move the end effectors to extend the end effectors in at least one second direction along second paths spaced from one another which are not located above one another; rotating the first and second robot arms together about a third axis of rotation which is spaced from the first and second axes of rotation, where the moving from the first retracted positions in the first direction, the moving to extend the end effectors in the at least one second direction, and the rotating is with use of five motors of the drive, where a first one of the motors is connected to the first and second robot arms to rotate the first and second arms about the third axis of rotation, where second and third ones of the motors are connected to the first robot arm to rotate the first upper arm and the first forearm respectively, and where fourth and fifth ones of the robot arms are connected to the second robot arm to rotate the second upper arm and the second forearm respectively independently from the first robot arm.

Any combination of one or more computer readable medium(s) may be utilized as the memory. The computer readable medium may be a computer readable signal medium or a non-transitory computer readable storage medium. A non-transitory computer readable storage medium does not include propagating signals and may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

It should be seen that the foregoing description is only illustrative. Various alternatives and modifications can be devised by those skilled in the art. Accordingly, the present embodiment is intended to embrace all such alternatives, modifications, and variances. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a robot comprising at least one rotational robot drive and at least two robot arms connected to the at least one rotational robot drive; and
   a linear robot transport configured to move the robot along a linear path,
   where a first one of the at least two robot arms comprises a first upper arm, a first forearm and a first end effector, where the first upper arm is connected to the at least one rotational robot drive at a first axis of rotation, where a second one of the at least two robot arms comprises a second upper arm, a second forearm and a second end effector, where the second upper arm is connected to the at least one rotational robot drive at a second axis of rotation which is coaxial with the first axis of rotation, where the first and second robot arms are configured to locate the end effectors in first retracted positions for stacking substrates located on the end effectors at least partially one above the another, where the first and second robot arms are configured to extend the end effectors from the first retracted positions in a first direction along parallel first paths located, at least partially, directly one above the other, and where the first and second robot arms are configured to extend the end effectors in at least one second direction along second paths spaced from one another which are not located above one another.

2. The apparatus as claimed in claim 1 where the first upper arm and the first forearm have different effective lengths, and where the second upper arm and the second forearm have different effective lengths.

3. The apparatus as claimed in claim 1 where the linear robot transport comprises a stationary part and a movable part having a rotor mounted to the movable part.

4. The apparatus as claimed in claim 3 where the linear robot transport comprises at least one of rails, linear bearings, or magnetic bearings.

5. The apparatus as claimed in claim 3 where the linear robot transport comprises at least one of:
an electric linear motor with windings in the movable part,
an electric linear motor with windings in the stationary part,
a magnetic coupling,
a pneumatic actuator,
a hydraulic actuator,
a ball-screw, or
a cable or belt.

6. The apparatus as claimed in claim 1 where the robot is on a pivoting base, and where the pivoting base is on a robot drive unit of the linear robot transport, where the pivoting base is configured to rotate the robot on the robot drive unit.

7. The apparatus as claimed in claim 3 where the movable part comprises a pivoting base having the robot mounted to the pivoting base, and where the pivoting base mounted to the stationary part for both rotatable motion on the stationary part and linear motion on the stationary part.

8. The apparatus as claimed in claim 1 further comprising a mechanical drive transmission connecting the at least one drive to the first forearm at a first joint between the first upper arm and the first forearm for the at least one drive to rotate the first forearm, where the mechanical drive transmission comprises at least one non-circular pulley and a first band.

9. The apparatus as claimed in claim 8 further comprising a second band connecting the first end effector, at a wrist joint of the first end effector to the first forearm, to the first joint.

10. The apparatus as claimed in claim 1 further comprising a first circular pulley and a first band connecting the at least one drive to a second circular pulley at a first joint between the first upper arm and the first forearm, where the first and second pulleys have different diameters.

11. The apparatus as claimed in claim 1 where the first and second robot arms are configured to provide second retracted positions to locate the end effectors such that the substrates located on the end effectors are not stacked one above the another.

12. The apparatus as claimed in claim 1 further comprising a controller configured to controller the at least one drive to move the first and second robot arms substantially simultaneously from the first retracted positions along the first paths and move the first and second robot arms individually or simultaneously along the second paths.

13. The apparatus as claimed in claim 1 where the second axis of rotation is laterally offset from and parallel to the first axis of rotation.

14. The apparatus as claimed in claim 1 where the second paths are at least partially laterally offset from one another and parallel to one another.

15. The apparatus as claimed in claim 1 where the second paths are at least partially laterally offset from one another and angled relative to one another.

16. The apparatus as claimed in claim 1 where the first end effector comprises at least two spaced substrate holding areas.

17. The apparatus as claimed in claim 16 where the at least two spaced substrate holding areas are laterally spaced relative to one another.

18. The apparatus as claimed in claim 16 where the first end effector has a general "U" shape, and where the first forearm is connected to the first end effector at an off-center location on the general "U" shape.

19. The apparatus as claimed in claim 16 where the second end effector comprises at least two spaced substrate holding areas.

20. The apparatus as claimed in claim 19 where the at least two spaced substrate holding areas are laterally spaced relative to one another.

21. The apparatus as claimed in claim 20 where the second end effector has a general "U" shape, and where the second forearm is connected to the second end effector at an off-center location on the general "U" shape.

22. An apparatus comprising:
a robot comprising at least one rotational robot drive and at least two robot arms connected to the at least one rotational robot drive; and
a linear robot transport configured to move the robot along a linear path,
where a first one of the at least two robot arms comprises a first upper arm, a first forearm and a first end effector,
where a second one of the at least two robot arms comprises a second upper arm, a second forearm and a second end effector, and
where the at least one rotational robot drive is connected to the first and second robot arms, where the first upper arm is connected to the drive at a first axis of rotation, where the second upper arm is connected to the drive at a second axis of rotation which is coaxial with the first axis of rotation,
where the first and second robot arms are configured to locate the end effectors in first retracted positions for stacking substrates located on the end effectors at least partially one above the another,
where the first and second robot arms are configured to extend the end effectors from the first retracted positions in a first direction along parallel first paths located, at least partially, directly one above the other, and where the first and second robot arms are configured to extend the end effectors in at least one second direction along second paths spaced from one another which are not located above one another.

23. The apparatus as claimed in claim 22 where the first end effector comprises at least two spaced substrate holding areas.

24. The apparatus as claimed in claim 23 where the at least two spaced substrate holding areas are laterally spaced relative to one another.

25. The apparatus as claimed in claim 23 where the first end effector has a general "U" shape, and where the first forearm is connected to the first end effector at an off-center location on the general "U" shape.

26. The apparatus as claimed in claim 23 where the second end effector comprises at least two spaced substrate holding areas.

27. The apparatus as claimed in claim 26 where the at least two spaced substrate holding areas are laterally spaced relative to one another.

28. The apparatus as claimed in claim 27 where the second end effector has a general "U" shape, and where the second forearm is connected to the second end effector at an off-center location on the general "U" shape.

29. An apparatus comprising:
a robot comprising at least one rotational robot drive and at least two robot arms connected to the at least one rotational robot drive; and
a linear robot transport configured to move the robot along a linear path,
where a first one of the at least two robot arms comprises a first upper arm, a first forearm and a first end effector,
where a second one of the at least two robot arms comprises a second upper arm, a second forearm and a second end effector,
where the at least one rotational robot drive is connected to the first and second robot arms,
where the first upper arm is connected to the drive at a first axis of rotation,
where the second upper arm is connected to the drive at a second axis of rotation which is coaxial with the first axis of rotation,
where the at least one rotational robot drive comprises motors for rotating first and second upper arms, where a first one of the motors is connected to the first and second robot arms to rotate the first and second arms about a third axis of rotation coaxial with the first and second axes of rotation, where at least one second one of the motors is connected to the first robot arm to rotate the first upper arm and the first forearm respectively, and where at least one third one of the motors is connected to the second robot arm to rotate the second upper arm and the second forearm, respectively, independently from the first robot arm,
where the first and second robot arms are configured to locate the end effectors in first retracted positions,
where the first and second robot arms are configured to extend the end effectors from the first retracted positions in a first direction along parallel first paths, and where the first and second robot arms are configured to extend the end effectors in at least one second direction along second paths spaced from one another which are not located above one another.

30. The apparatus as claimed in claim 29 where the first and second robot arms are configured to locate the end effectors in the first retracted positions for stacking substrates located on the end effectors at least partially one above the another.

31. The apparatus as claimed in claim 29 where the first and second robot arms are configured to extend the end effectors from the first retracted positions in the first direction along parallel first paths located, at least partially, directly one above the other.

32. The apparatus as claimed in claim 29 where the first upper arm and the first forearm have different effective lengths relative to each other, and where the second upper arm and the second forearm have different effective lengths relative to each other.

33. The apparatus as claimed in claim 29 where the motors comprise only three motors for rotating the first and second upper arms.

34. The apparatus as claimed in claim 29 where the motors comprise only four motors for rotating the first and second upper arms.

35. The apparatus as claimed in claim 29 where the motors comprise only five motors for rotating the first and second upper arms.

36. The apparatus as claimed in claim 29 where the first end effector comprises at least two spaced substrate holding areas.

37. The apparatus as claimed in claim 36 where the at least two spaced substrate holding areas are laterally spaced relative to one another.

38. The apparatus as claimed in claim 37 where the first end effector has a general "U" shape, and where the first forearm is connected to the first end effector at an off-center location on the general "U" shape.

39. The apparatus as claimed in claim 38 where the second end effector comprises at least two spaced substrate holding areas.

40. The apparatus as claimed in claim 39 where the at least two spaced substrate holding areas of the second end effector are laterally spaced relative to one another.

41. The apparatus as claimed in claim 40 where the second end effector has a general "U" shape, and where the second forearm is connected to the second end effector at an off-center location on the general "U" shape.

* * * * *